United States Patent [19]

Batchelor

[11] 4,186,299
[45] Jan. 29, 1980

[54] REPRODUCTION MACHINE WITH DIFFERENT OPERATING PROGRAMS

[75] Inventor: Phillip J. Batchelor, Fairport, N.Y.

[73] Assignee: Xerox Corporation, Stamford, Conn.

[21] Appl. No.: 829,025

[22] Filed: Aug. 30, 1977

[51] Int. Cl.² .......................................... G06F 11/04
[52] U.S. Cl. ............................... 235/304.1; 355/14 R
[58] Field of Search ................. 235/304, 304.1, 302; 355/14; 364/200, 900, 706, 518

[56] References Cited

U.S. PATENT DOCUMENTS

| | | | |
|---|---|---|---|
| 3,979,057 | 9/1976 | Katz et al. | 364/706 |
| 4,034,194 | 7/1977 | Thomas et al. | 235/302 |
| 4,035,072 | 7/1977 | Deetz et al. | 355/14 |
| 4,062,061 | 12/1977 | Batchelor et al. | 364/900 |
| 4,104,726 | 8/1978 | Fisk et al. | 364/518 |

*Primary Examiner*—Charles E. Atkinson
*Attorney, Agent, or Firm*—John E. Beck; Frederick McMullen; Ronald F. Chapuran

[57] ABSTRACT

An electrostatographic type copying or reproduction machine incorporating a programmable digital computer to operate various machine components. The computer includes a memory which contains a plurality of different operating programs with each program instructing the machine to operate in a different manner. In one embodiment, one of the programs is utilized to produce copies, whereas other selectively accessable programs operate the machine components in such manner to diagnose machine malfunctions.

2 Claims, 58 Drawing Figures

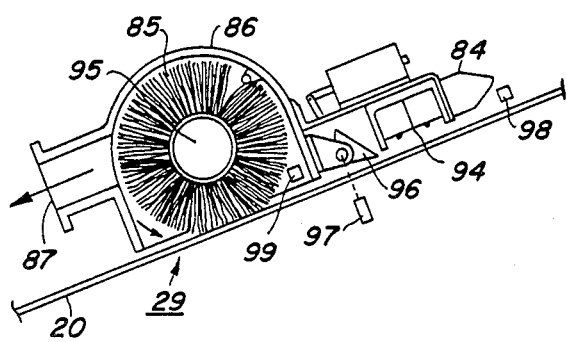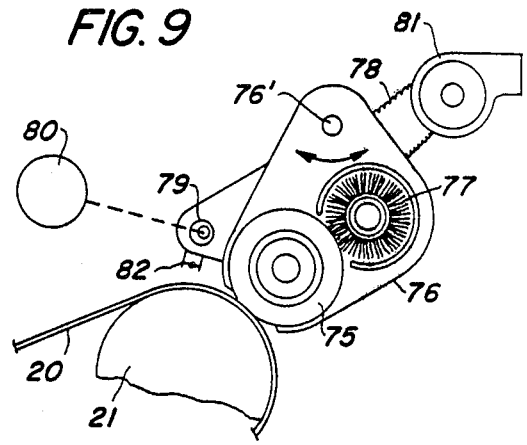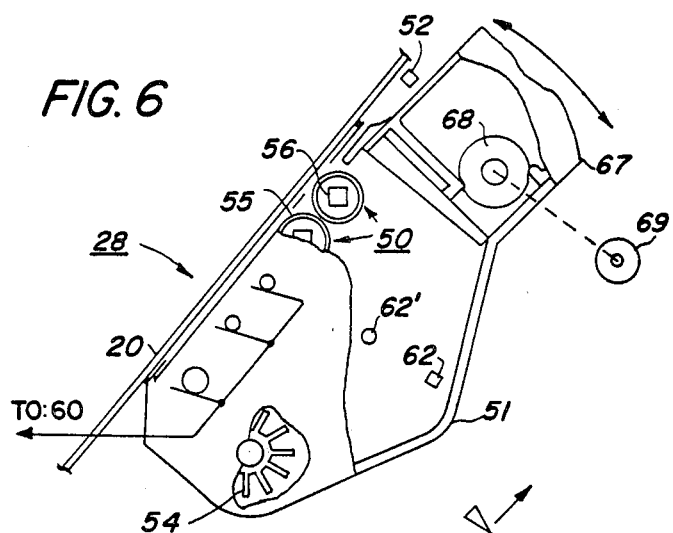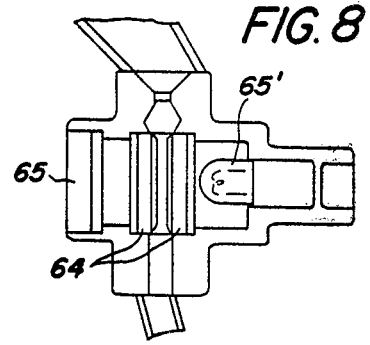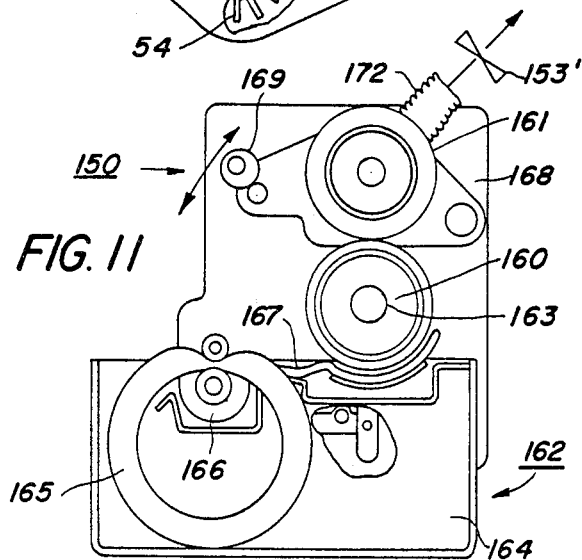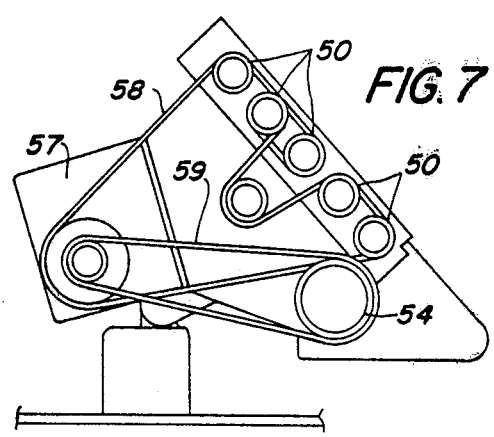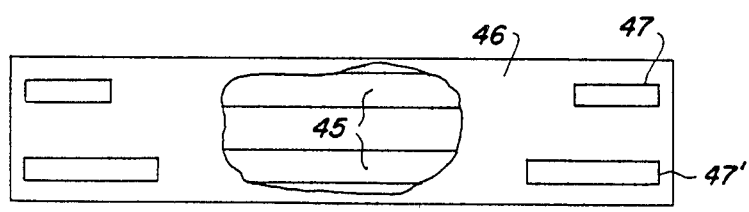

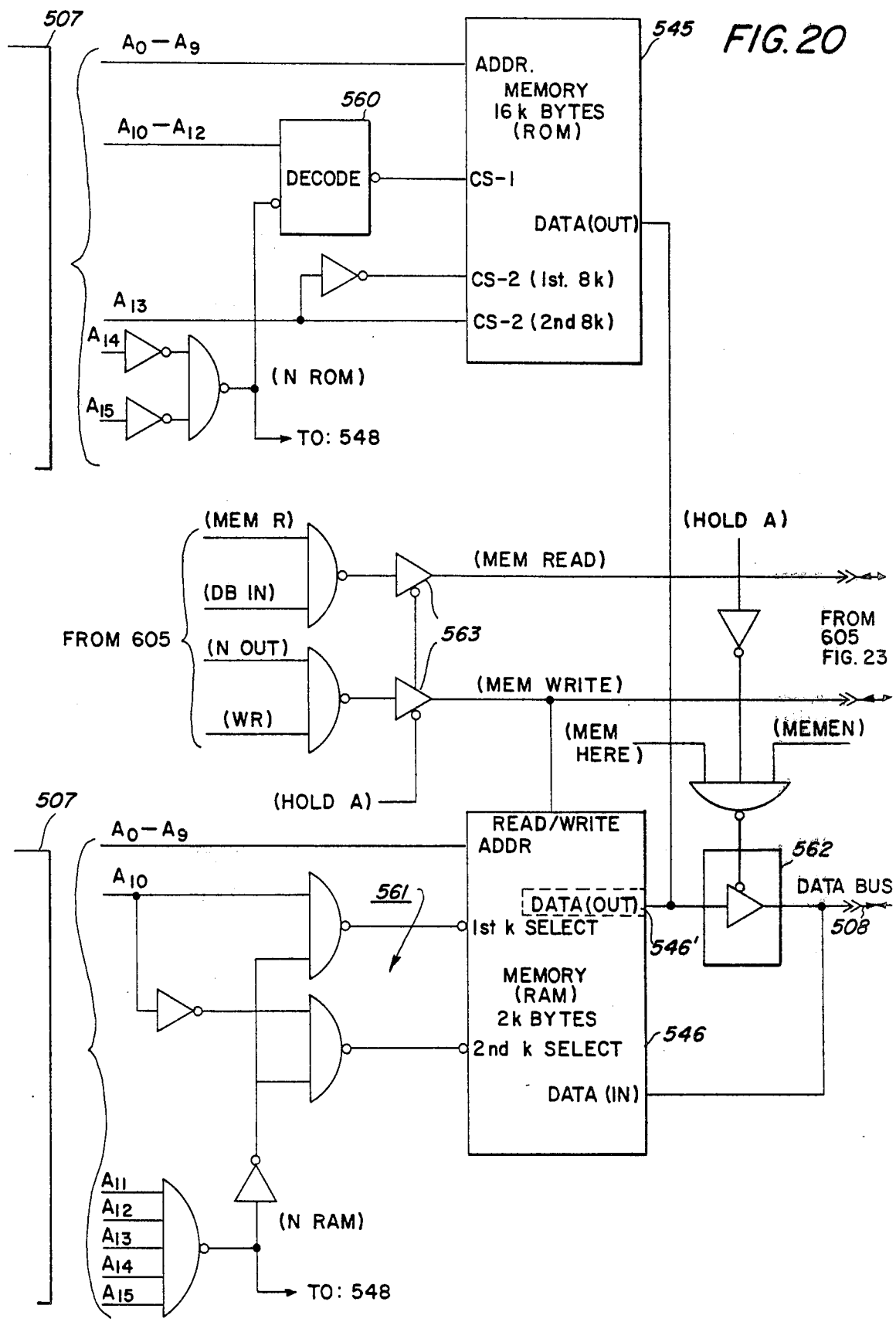

MEMORY READY

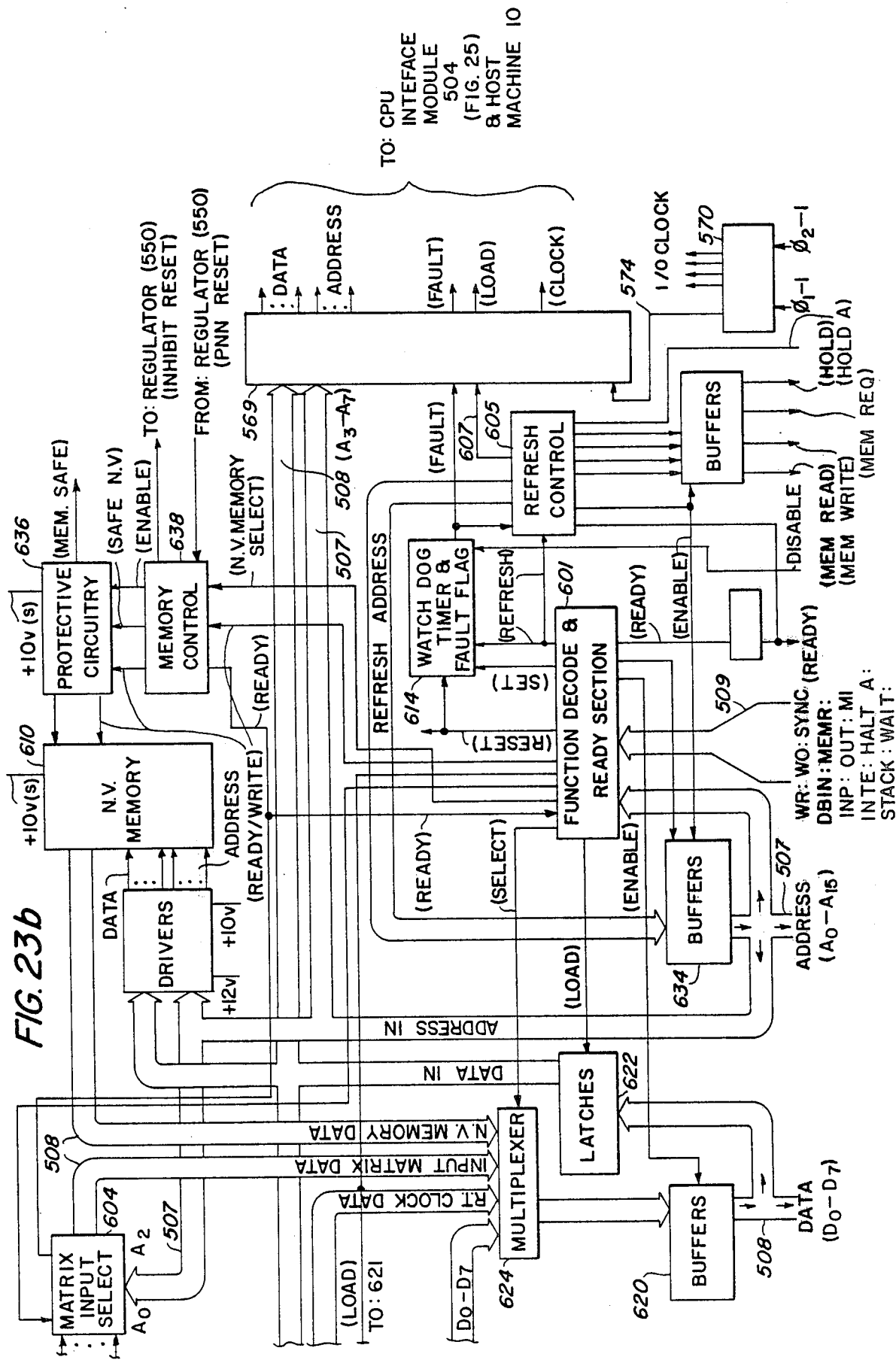

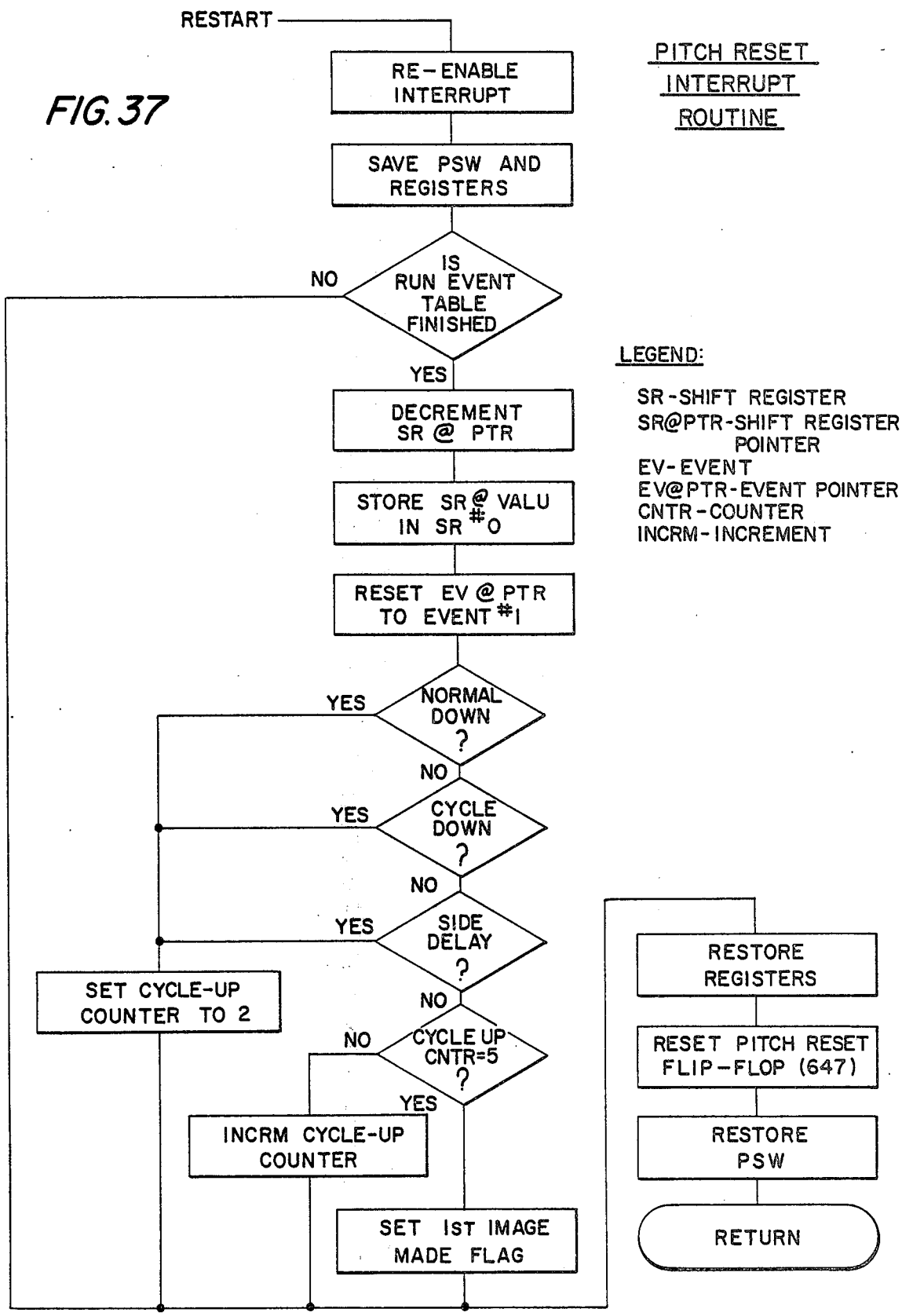
FIG. 37 — PITCH RESET INTERRUPT ROUTINE

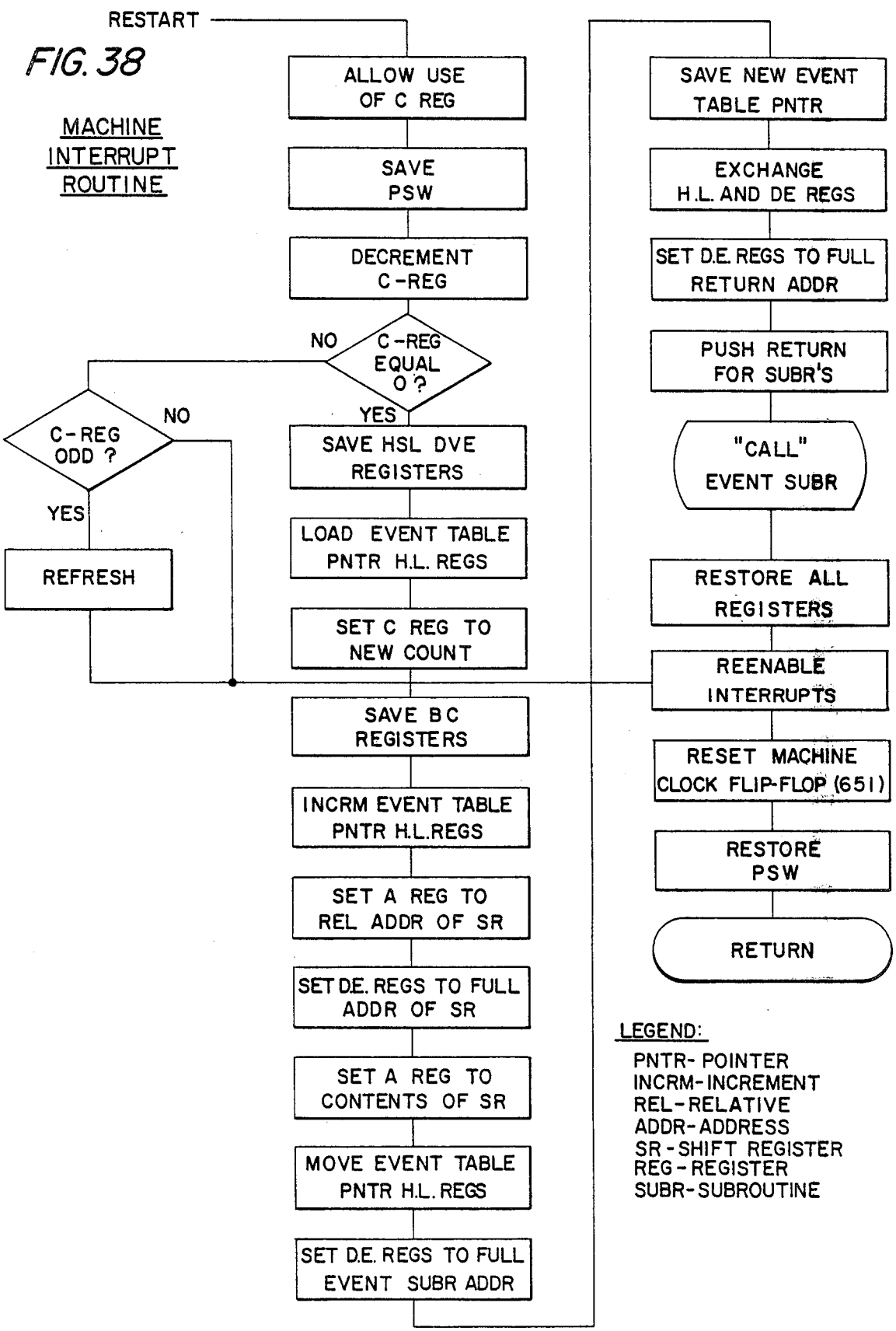

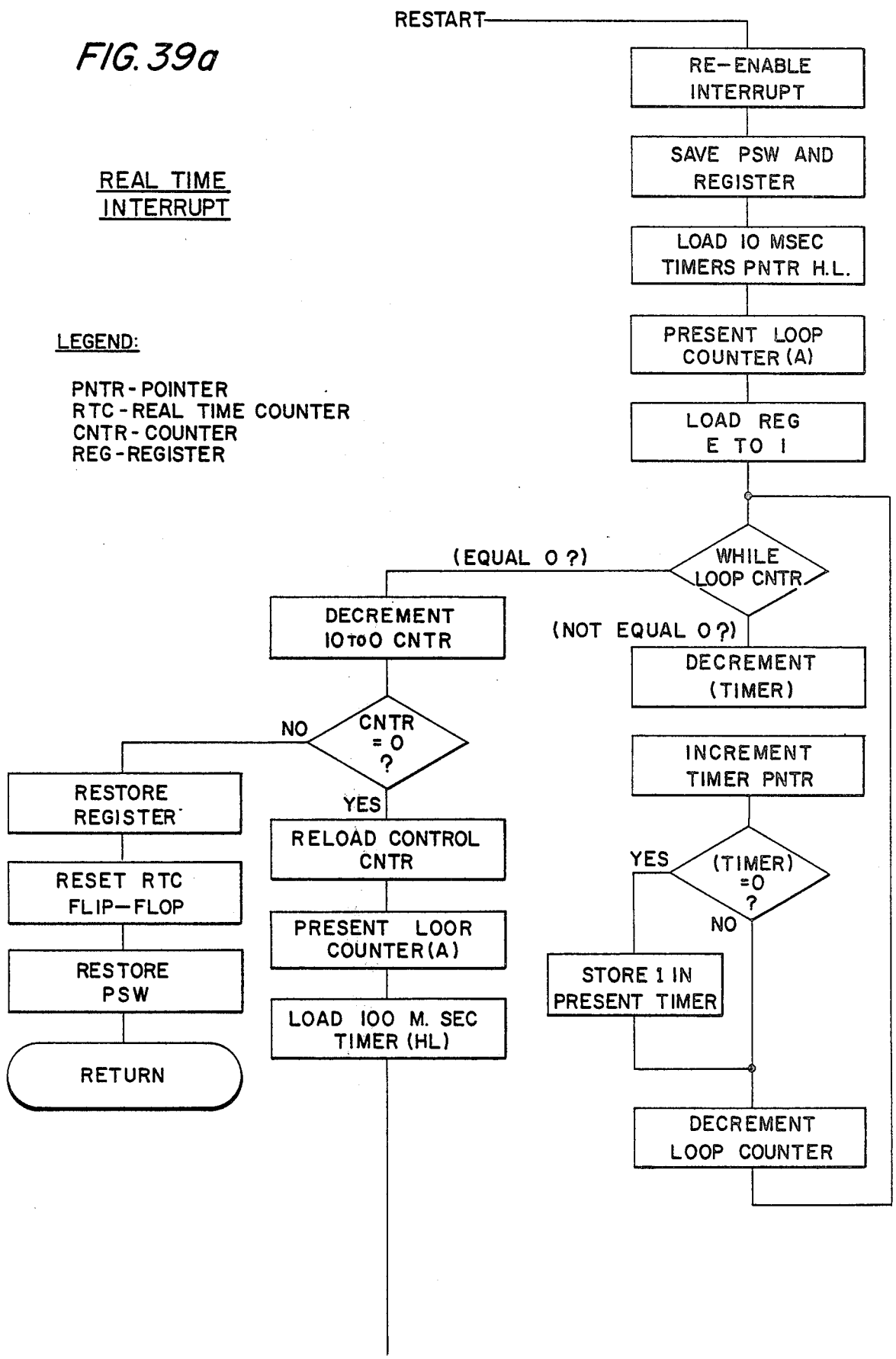

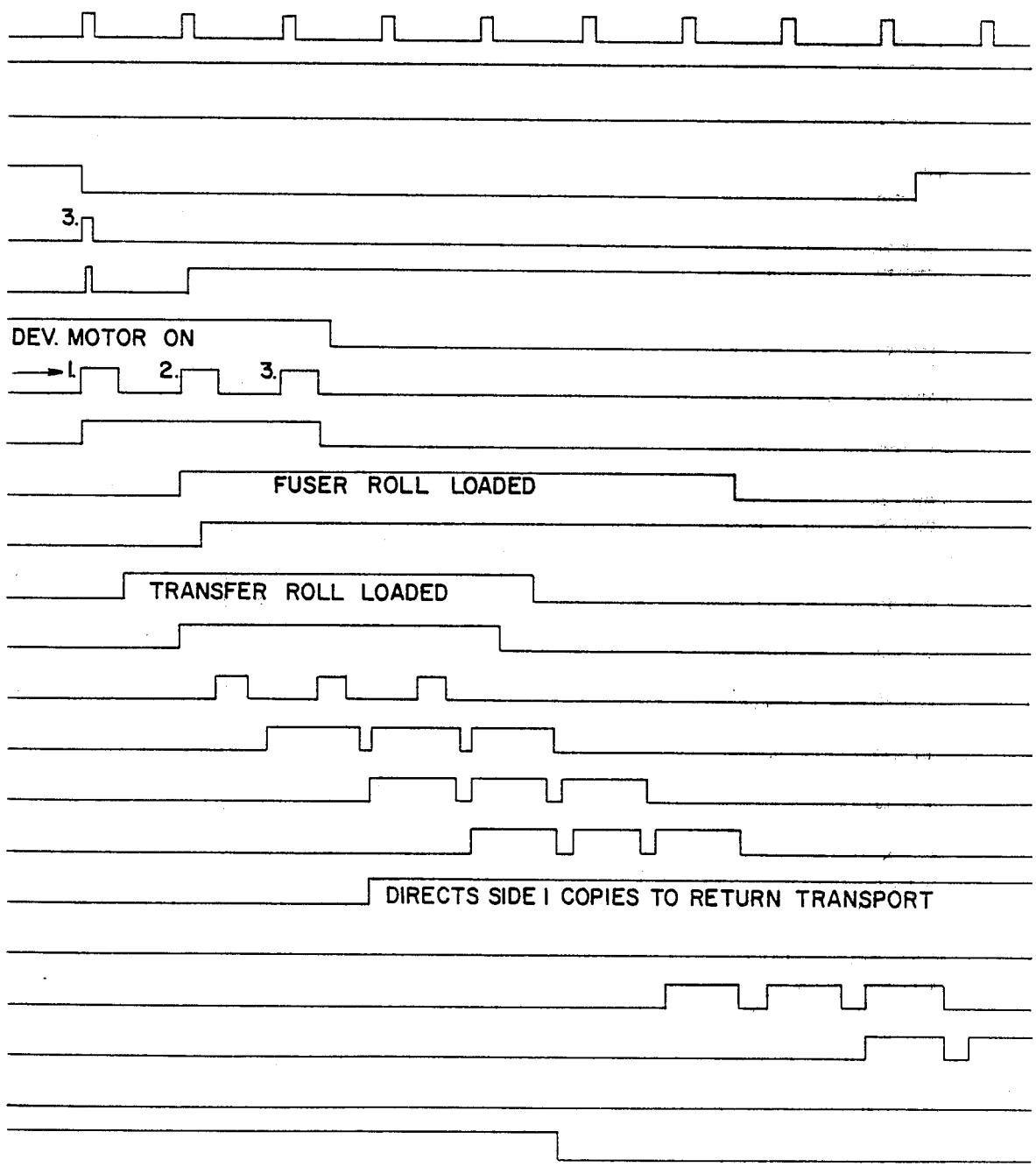

REPRODUCTION MACHINE WITH DIFFERENT OPERATING PROGRAMS

BACKGROUND OF THE INVENTION

This invention relates to electrostatographic xerographic type reproduction machines, and more particularly, to an improved control system for such machines.

Present day reproduction machines are extremely complex devices. They often include, in addition to the processor, input/output devices such as automatic original document handlers, sorters, staplers, and other finishing devices designed to minimize operator time in producing copies. Accordingly, these machines contain a large number of components which must be activated in a strict timed sequence to insure proper operations. It has been suggested to utilize a programmable controller or digital computer to accomplish this task. However, such computers heretofore contained only one operating program specifically designed to only control the operation of the machine to produce copies in one particular manner. Therefore, these machines have not possessed the necessary flexibility to perform other tasks which differ from the set machine operation for the particular machine configuration.

Unfortunately, as the complexity of these machines increase, so does the potential for malfunctions. Accordingly, it would be desirable to provide a means for operating the machine in a different manner, not to make copies, but for diagnosing the cause of the malfunction which has heretofore been a burdensome task due to the complexity of the machine.

OBJECTS AND SUMMARY OF THE INVENTION

Therefore, it is an object of this invention to provide a plurality of selectively accessible operating programs for instructing a digital computer to operate the machine in a different manner.

It is another object of this invention to provide at least one selectively accessible program for use in diagnosing machine malfunctions.

It is still another object of this invention to accomplish the above objectives wherein the operating programs are accessible through an operator console on the machine.

It is a further object of this invention to provide a plurality of diagnostic programs, only some of which are accessible by the user.

It is still another object of this invention to provide means for expanding or restricting the number of programs accessible to the user.

These and other objects of this invention are accomplished by storing at least two different operating programs in a memory, with each program instructing a computer to control the operation of machine components in a different manner. Means are also provided to permit the user to selectively access the program desired, preferably by activating selection devices in the operator console. In one embodiment, one of the programs is accessed and utilized to control the machine to make copies, whereas at least one other program operates the machine components in a preselected sequence so as to permit identification of the cause of machine malfunctions. Another feature of this invention selectively permits the operator to gain access to some of the programs, while denying access to others. Moreover, means are provided to expanding or restricting the number of programs to which the user may gain access.

BRIEF DESCRIPTION OF THE DRAWINGS

Other objects and advantages will be apparent from the ensuing description and drawings in which:

FIG. 5 is an enlarged view showing details of the photoreceptor edge fadeout mechanism for the apparatus shown in FIG. 1;

FIG. 6 is an enlarged view showing details of the developing mechanism for the apparatus shown in FIG. 1;

FIG. 7 is an enlarged view showing details of the developing mechanism drive;

FIG. 8 is an enlarged view showing details of the developability control for the apparatus shown in FIG. 1;

FIG. 9 is an enlarged view showing details of the transfer roll support mechanism for the apparatus shown in FIG. 1;

FIG. 10 is an enlarged view showing details of the photoreceptor cleaning mechanism for the apparatus shown in FIG. 1;

FIG. 11 is an enlarged view showing details of the fuser for the apparatus shown in FIG. 1;

FIG. 19b is a chart illustrating the output wave form of the clock shown in FIG. 19a;

FIG. 20 is a logic schematic of the CPU memory;

FIGS. 23a and 23b comprise a block diagram of the controller I/O module;

FIG. 37 is a flow charge of the pitch interrupt routine;

FIG. 38 is a flow chart of the machine clock interrupt routine;

FIGS. 39a and 39b comprise a flow chart of the real time interrupt routines;

FIGS. 40a, 40b, 40c comprise a timing chart of the principal operating components of the host machine in an exemplary copy run;

DETAILED DESCRIPTION OF THE PREFERRED EMBODIMENT OF THE INVENTION

Figure 1:
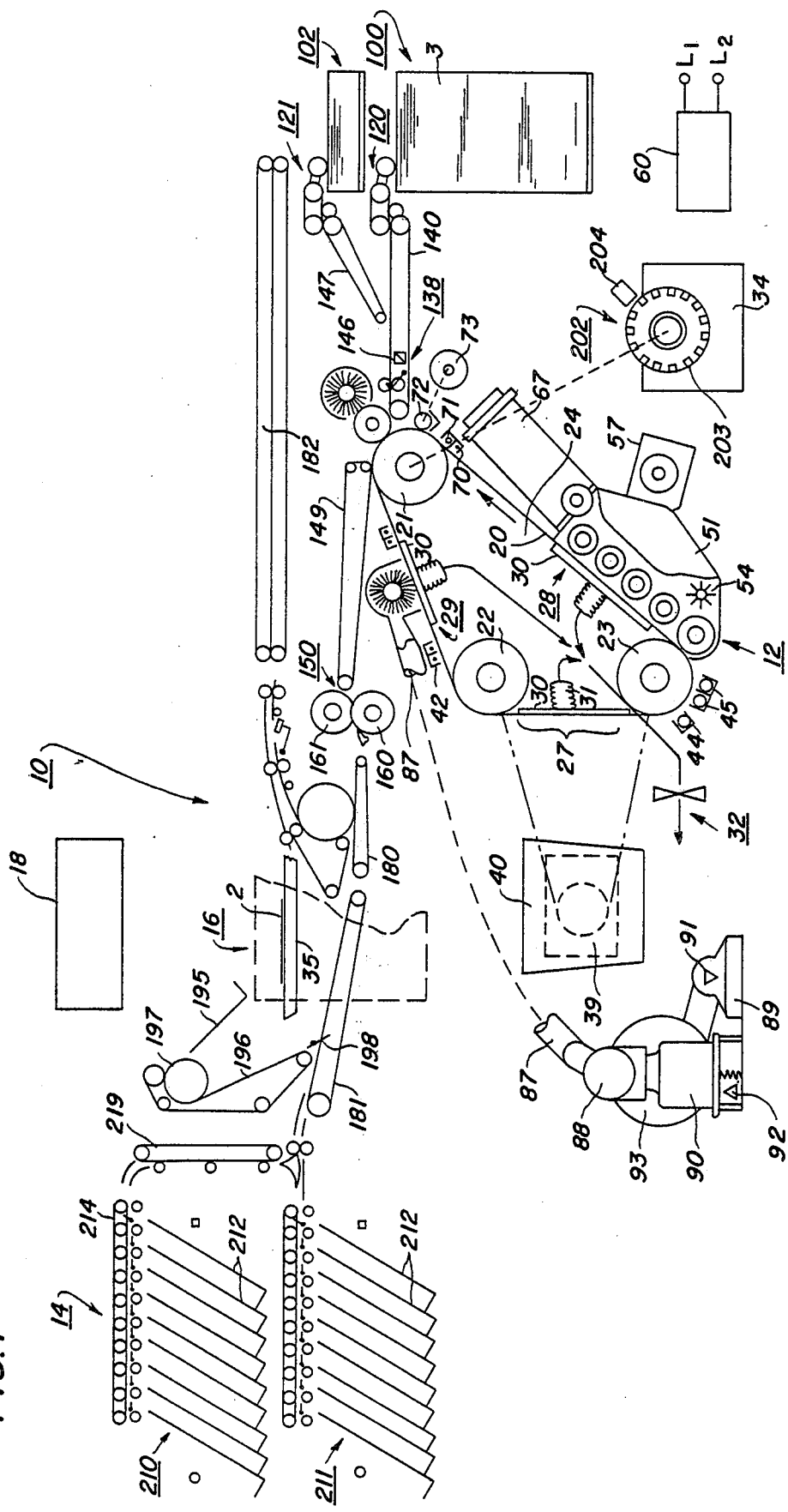
FIG. 1a is a schematic representation of an exemplary reproduction apparatus incorporating the control system of the present invention
FIG. 1b is an isometric view showing a portion of the reproduction apparatus housing.
Figure 2:
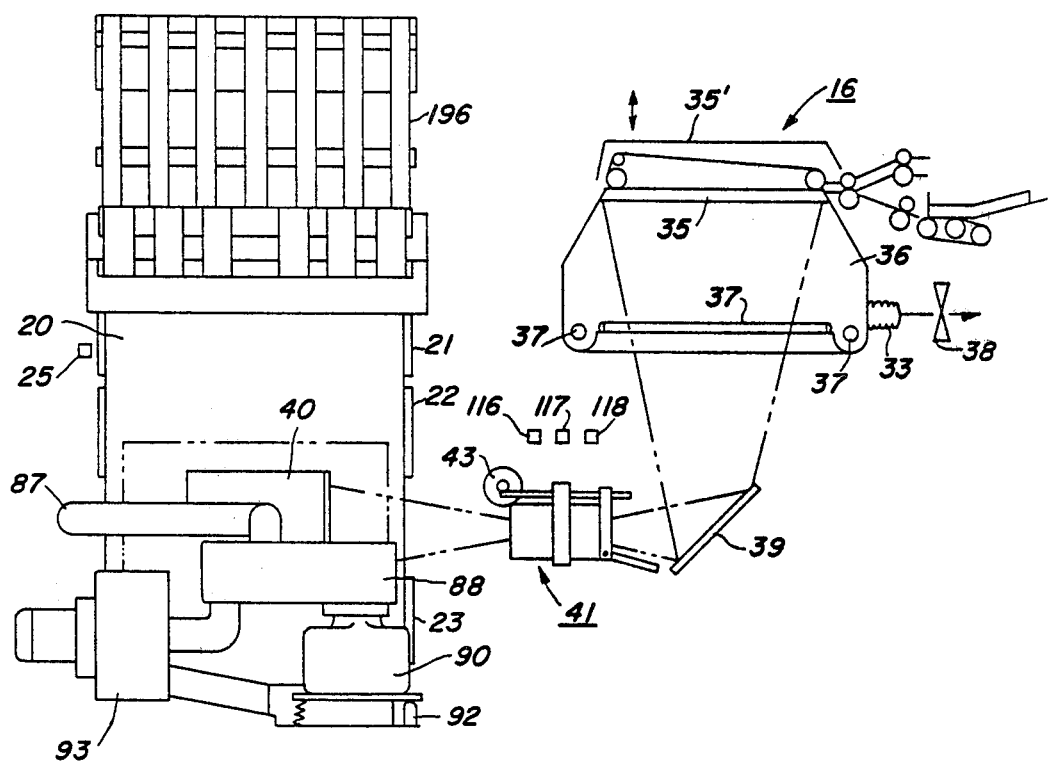
FIG. 2 is a vertical sectional view of the apparatus shown in FIG. 1 along the image plane.
Figure 3:
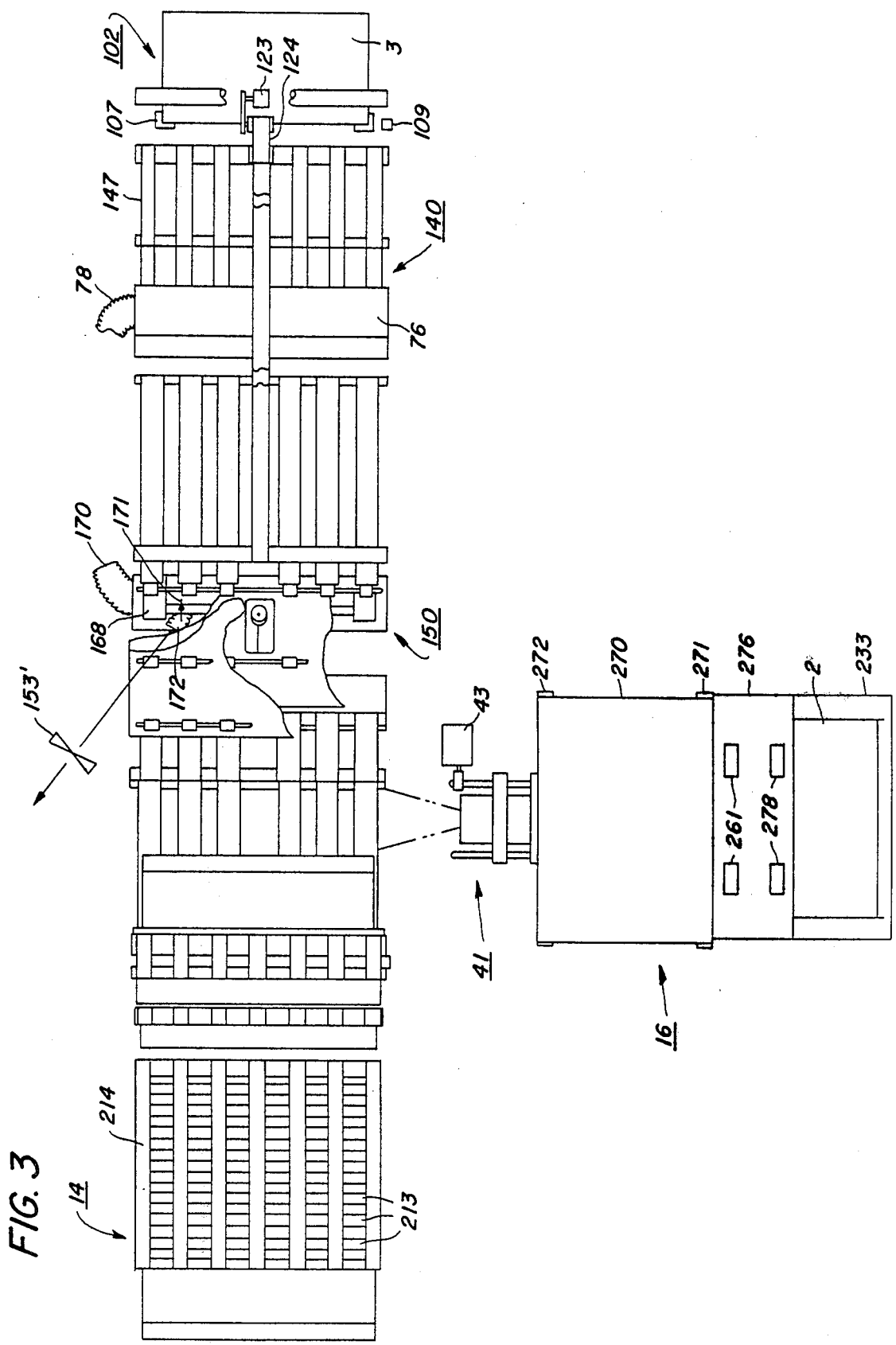
FIG. 3 is a top plane view of the apparatus shown in FIG. 1.

Referring particularly to FIGS. 1a, 2 and 3 of the drawings, there is shown, in schematic outline, an electrostatic reproduction system or host machine, identified by numeral 10, incorporating the control arrangement of the present invention. To facilitate description, the reproduction system 10 is divided into a main electrostatic xerographic processor 12, sorter 14, document handler 16, and controller 18. Other processor, sorter and/or document handler types and constructions, and different combinations thereof may instead by envisioned.

PROCESSOR

Processor 12 utilizes a photoreceptor in the form of an endless photoconductive belt 20 supported in generally triangular configuration by rolls 21, 22, 23. Belt supporting rolls 21, 22, 23 are in turn rotatably journaled on subframe 24.

In the exemplary processor illustrated, belt 20 comprises a photoconductive layer of selenium, which is the light receiving surface and imaging medium, on a conductive substrate. Other photoreceptor types and forms, such as comprising organic materials or of multilayers or a drum may instead be envisioned. Still other forms may comprise scroll type arrangements wherein webs of photoconductive material may be played in and out of the interior of supporting cylinders.

Figure 4:
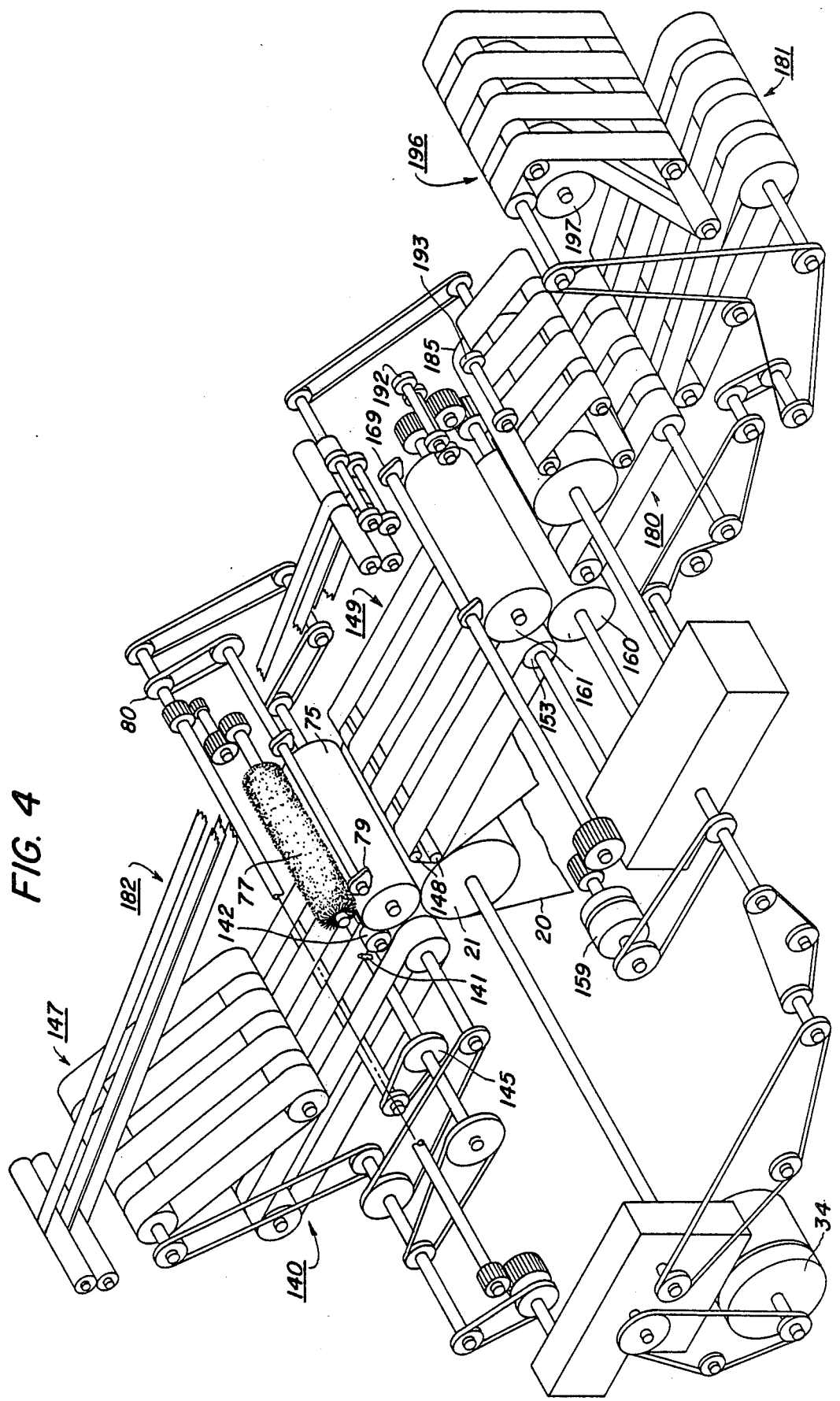
FIG. 4 is an isometric view showing the drive train for the apparatus shown in FIG. 1.

Suitable biasing means (not shown) are provided on subframe 24 to tension the photoreceptor belt 20 and insure movement of belt 20 along a prescribed operating path. Belt tracking switch 25 (shown in FIG. 2) monitors movement of belt 20 from side to side. Belt 20 is supported so as to provide a trio of substantially flat belt runs opposite exposure, developing, and cleaning stations 27, 28, 29 respectfully. To enhance belt flatness at these stations, vacuum platens 30 are provided under belt 20 at each belt run. Conduits 31 communicate vacuum platens 30 with a vacuum pump 32. Photoconductive belt 20 moves in the direction indicated by the solid line arrow, drive thereto being effected through roll 21, which in turn is driven by main drive motor 34, as seen in FIG. 4.

Processor 12 includes a generally rectangular, horizontal transparent platen 35 on which each original 2 to be copied is disposed. A two or four sided illumination assembly, consisting of internal reflectors 36 and flash lamps 37 (shown in FIG. 2) disposed below and along at least two sides of platen 35, is provided for illuminating the original 2 on platen 35. To control temperatures within the illumination space, the assembly is coupled through conduit 33 with a vacuum pump 38 which is adapted to withdraw overly heated air from the space. To retain the original 2 in place on platen 35 and prevent escape of extraneous light from the illumination assembly, a platen cover 35' may be provided.

The light image generated by the illumination system is projected via mirrors 38, 40 and a variable magnification lens assembly 41 onto the photoreceptive belt 20 at the exposure station 27. Reversible motor 43 is provided to move the main lens and add on lens elements that comprise the lens assembly 41 to different predetermined positions and combinations to provide the preselected image sizes corresponding to push button selectors 818, 819, 820 on operator module 800. (See FIG. 32) Sensors 116, 117, 118 signal the present disposition of lens assembly 41. Exposure of the previously charged belt 20 selectively discharges the photoconductive belt to produce on belt 20 an electrostatic latent image of the original 2. To prepare belt 20 for imaging, belt 20 is uniformly charged to a preselected level by charge corotron 42 upstream of the exposure station 27.

To prevent development of charged but unwanted image areas, erase lamps 44, 45 are provided. Lamp 44, which is referred to herein as the pitch fadeout lamp, is supported in transverse relationship to belt 20, lamp 44 extending across substantially the entire width of belt 20 to erase (i.e. discharge) areas of belt 20 before the first image, between successive images, and after the last image. Lamps 45, which are referred to herein as edge fadeout lamps, serve to erase areas bordering each side of the images. Referring particularly to FIG. 5, edge fadeout lamps 45, which extend transversely to belt 20, are disposed within a housing 46 having a pair of transversely extending openings 47, 47' of differing length adjacent each edge of belt 20. By selectively actuating one or the other of the lamps 45, the width of the area bordering the sides of the image that is erased can be controlled.

Referring to FIGS. 1, 6 and 7, magnetic brush rolls 50 are provided in a developer housing 51 at developing station 28. Housing 51 is pivotally supported adjacent the lower end thereof with interlock switch 52 to sense disposition of housing 51 in operative position adjacent belt 20. The bottom of housing 51 forms a sump within which a supply of developing material is contained. A rotatable auger 54 in the sump area serves to mix the developing material and bring the material into operative relationship with the lowermost of the magnetic brush rolls 50.

As will be understood by those skilled in the art, the electrostatically attractable developing material commonly used in magnetic brush developing apparatus of the type shown comprises a pigmented resinous powder, referred to as toner, and larger granular beads referred to as carrier. To provide the necessary magnetic properties, the carrier is comprised of a magnetizable material such as steel. By virtue of the magnetic fields established by developing rolls 50 and the interrelationship therebetween, a blanket of developing material is formed along the surfaces of developing rolls 50 adjacent the belt 20 and extending from one roll to another. Toner is attracted to the electrostatic latent image from the carrier bristles to produce a visible powder image on the surface of belt 20.

Magnetic brush rolls 50 each comprise a rotatable exterior sleeve 55 with relatively stationary magnet 56 inside. Sleeves 55 are rotated in unison and at substantially the same speed as belt 20 by a developer drive motor 57 through a belt and pulley arrangement 58. A second belt and pulley arrangement 59 drives auger 54.

To regulate development of the latent electrostatic images on belt 20, magnetic brush sleeves 55 are electrically biased. A suitable power supply 60 is provided for this purpose with the amount of bias being regulated by controller 18.

Developing material is returned to the upper portion of developer housing 51 for reuse. A photocell 62 monitors the level of developing material in housing 51 with lamp 62′ therefor spaced opposite to the photocell 62. The disclosed machine is also provided with automatic developability control which maintains an optimum proportion of toner-to-carrier material by sensing toner concentration and replenishing toner, as needed. As shown in FIG. 8, the automatic developability control comprises a pair of transparent plates 64 mounted in spaced, parallel arrangement in developer housing 51 such that a portion of the returning developing material passes therebetween. A suitable circuit, not shown, alternately places a charge on the plates 64 to attract toner thereto. Photocell 65 on one side of the plate pair senses the developer material as the material passes therebetween. Lamp 65′ on the opposite side of plate pair 64 provides reference illumination. In this arrangement, the returning developing material is alternately attracted and repelled to and from plates 64. The accumulation of toner, i.e. density determines the amount of light transmitted from lamp 65′ to photocell 65. Photocell 65 monitors the density of the returning developing material with the signal output therefrom being used by controller 18 to control the amount of fresh or make-up toner to be added to developer housing 51 from toner supply container 67.

To discharge toner from container 67, rotatable dispensing roll 68 is provided in the inlet to developer housing 51. Motor 69 drives roll 68. When fresh toner is required, as determined by the signal from photocell 65, controller 18 actuates motor 69 to turn roll 68 for a timed interval. The rotating roll 68, which is comprised of a relatively porous sponge-like material, carries toner particles thereon into developer housing 51 where it is discharged. Pre-transfer corotron 70 and lamp 71 are provided downstream of magnetic brush rolls 50 to regulate developed image charges before transfer.

A magnetic pick-off roll 72 is rotatably supported opposite belt 20 downstream of pre-transfer lamp 71, roll 72 serving to scavenge leftover carrier from belt 20 preparatory to transfer of the developed image to the copy sheet 3. Motor 73 turns roll 72 in the same direction and at substantially the same speed as belt 20 to prevent scoring or scratching of belt 20. One type of magnetic pick-off roll is shown in U.S. Pat. No. 3,834,804, issued Oct. 10, 1974 to Bhagat et al.

Figure 12:
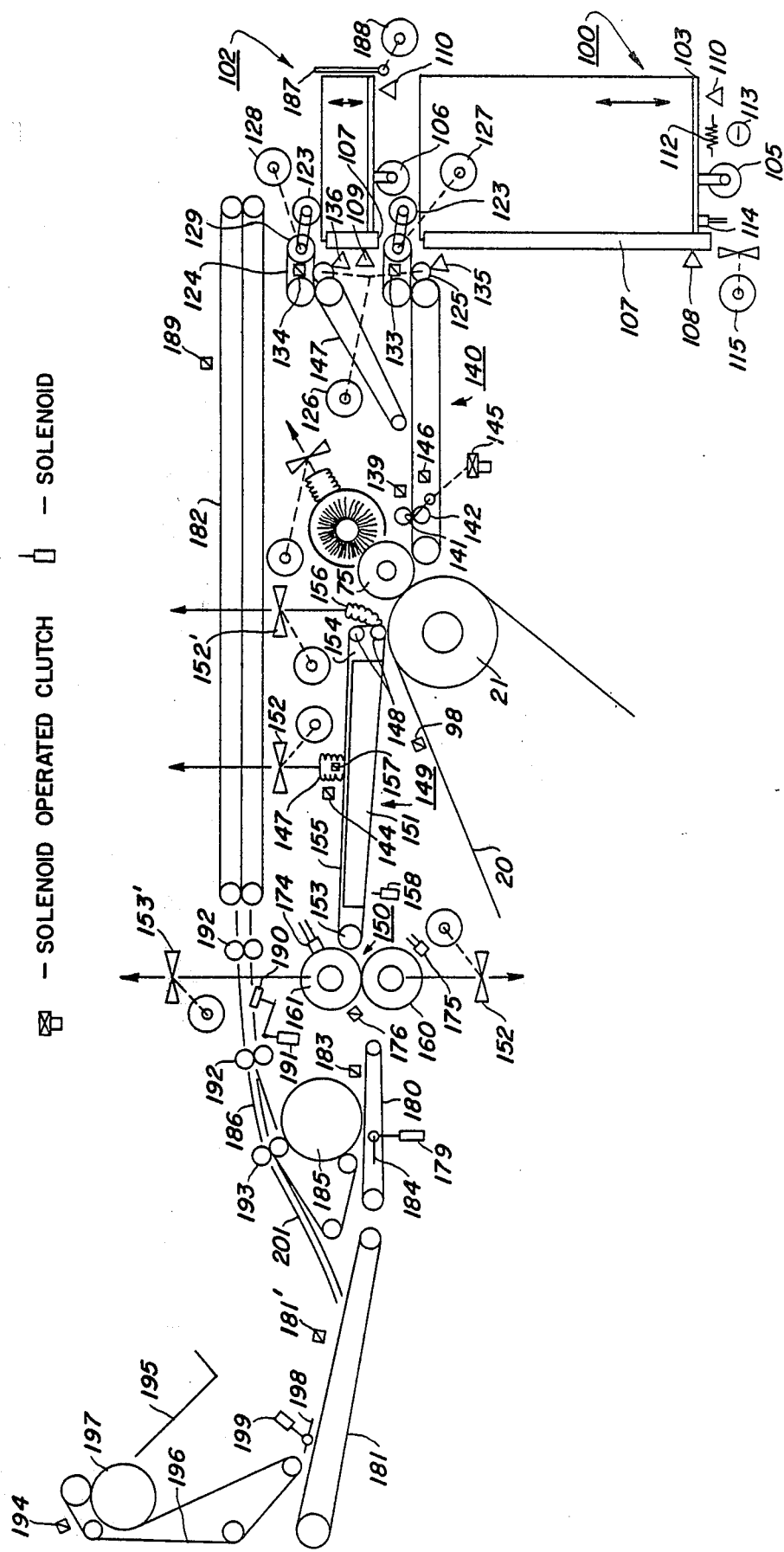
FIG. 12 is a schematic view showing the paper path and sensors of the apparatus shown in FIG. 1.

Referring to FIGS. 4, 9 and 12, to transfer developed images from belt 20 to the copy sheets 3, a transfer roll 75 is provided. Transfer roll 75, which forms part of the copy sheet feed path, is rotatably supported within a transfer roll housing 76 opposite belt support roll 21. Housing 76 is pivotally mounted for swinging movement about axis 76′ to permit the transfer roll assembly to be moved into and out of operative relationship with belt 20. A transfer roll cleaning brush 77 is rotatably journalled in transfer roll housing 76 with the brush periphery in contact with transfer roll 75. Transfer roll 75 is driven through contact with belt 20 while cleaning brush 77 is coupled to main drive motor 34. To remove toner, housing 76 is connected through conduit 78 with vacuum pump 81. To facilitate and control transfer of the developed images from belt 20 to the copy sheets 3, a suitable electrical bias is applied to transfer roll 75.

To permit transfer roll 75 to be moved into and out of operative relationship with belt 20, cam 79 is provided in driving contact with transfer roll housing 76. Cam 79 is driven from motor 34 through an electromagnetically operated one revolution clutch 80. Spring means (not shown) serves to maintain housing 76 in driving engagement with cam 79.

To facilitate separation of the copy sheets 3 from belt 20 following transfer of developed images, a detack corotron 82 is provided. Corotron 82 generates a charge designed to neutralize or reduce the charges tending to retain the copy sheet on belt 20. Corotron 82 is supported on transfer roll housing 76 opposite belt 20 and downstream of transfer roll 75.

Referring to FIGS. 1a, 2 and 10, to prepare belt 20 for cleaning, residual charges on belt 20 are removed by discharge lamp 84 and preclean corotron 94. A cleaning brush 85, rotatably supported within an evacuated semicircular shaped brush housing 86 at cleaning station 29, serves to remove residual developer from belt 20. Motor 95 drives brush 85, brush 85 turning in a direction opposite that of belt 20.

Vacuum conduit 87 couples brush housing 86 through a centrifugal type separator 88 with the suction side of vacuum pump 93. A final filter 89 on the outlet of pump 93 traps particles that pass through separator 88. The heavier toner particles separated by separator 88 drop into and are collected in one or more collecting bottles 90. Pressure sensor 91 monitors the condition of final filter 89 while a sensor 92 monitors the amount of toner particles in collecting bottles 90.

To obviate the danger of copy sheets remaining on belt 20 and becoming entangled with the belt cleaning mechanism, a deflector 96 is provided upstream of cleaning brush 85. Deflector 96, which is pivotally supported on the brush housing 86, is operated by solenoid 97. In the normal or off position, deflector 96 is spaced from belt 20 (the solid line position shown in the drawings). Energization of solenoid 97 pivots deflector 96 downwardly to bring the deflector leading edge into close proximity to belt 20.

Sensors 98, 99 are provided on each side of deflector 96 for sensing the presence of copy material on belt 20. A signal output from upstream sensor 98 triggers solenoid 97 to pivot deflector 96 into position to intercept the copy sheet on belt 20. The signal from sensor 98 also initiates a system shutdown cycle (mis-strip jam) wherein the various operating components are, within a prescribed interval, brought to a stop. The interval permits any copy sheet present in fuser 150 to be removed, sheet trap solenoid 158 (FIG. 12) having been actuated to prevent the next copy sheet from entering fuser 150 and becoming trapped therein. The signal from sensor 99, indicating failure of deflector 96 to intercept or remove the copy sheet from belt 20, triggers an immediate or hard stop (sheet on selenium jam) of the processor. In such instances the power to drive motor 34 is interrupted to bring belt 20 and the other components driven therefrom to an immediate stop.

Referring particularly to FIGS. 1a, 3, and 12, copy sheets 3 comprise precut paper sheets supplied from either main or auxiliary paper trays 100, 102. Each paper tray has a platform or base 103 for supporting in stack-like fashion a quantity of sheets. The tray platforms 103 are supported for vertical up and down movement with motors 105, 106 being provided to raise and lower the platform. Side guide pairs 107, in each tray 100, 102 delimit the tray side boundaries, the guide pairs being adjustable toward and away from one another in accommodation of different size sheets. Sensors 108, 109 respond to the position of each side guide pair 107, the output of sensors 108, 109 serving to regulate operation of edge fadeout lamps 45 and fuser cooling valve 171 (FIG. 3). Lower limit switches 110 on each tray prevent overtravel of the tray platform in a downward direction.

A heater 112 is provided below the platform 103 of main tray 100 to warm the tray area and enhance feeding of sheets therefrom. Humidstat 113 and thermostat 114 control operation of heater 112 in response to the temperature/humidity conditions of main tray 100. Fan 115 is provided to circulate air within tray 100.

To advance the sheets 3 from either main or auxiliary tray 100, 102, main and auxiliary sheet feeders 120, 121 are provided. Feeders 120, 121 each include a nudger roll 123 to engage and advance the topmost sheet in the paper tray forward into the nip formed by a feed belt 124 and retard roll 125. Retard rolls 125, which are driven at an extremely low speed by motor 126, cooperate with feed belts 124 to restrict feeding of sheets from trays 100, 102 to one sheet at a time.

Feed belts 124 are driven by main and auxiliary sheet feed motors 127, 128 respectively. Nudger rolls 123 are supported for pivotal movement about the axis of feed belt drive shaft 129 with drive to the nudger rolls taken from drive shaft 129. Stack height sensors 133, 134 are provided for the main and auxiliary trays, the pivoting nudger rolls 123 serving to operate sensors 133, 134 in response to the sheet stack height. Main and auxiliary tray misfeed sensors 135, 136 are provided at the tray outlets.

Main transport 140 extends from main paper tray 100 to a point slightly upstream of the nip formed by photoconductive belt 20 and transfer roll 75. Transport 140 is driven from main motor 34. To register sheets 3 with the images developed on belt 20, sheet register fingers 141 are provided, fingers 141 being arranged to move into and out of the path of the sheets on transport 140 once each revolution (see also FIG. 4). Registration fingers 141 are driven from main motor 34 through electromagnetic clutch 145 (seen in FIG. 4). A timing or reset switch 146 is set once on each revolution of sheet register fingers 141. Sensor 139 monitors transport 140 for jams. Further amplification of sheet register system may be found in U.S. Pat. No. 3,781,004, issued Dec. 25, 1973 to Buddendeck et al.

Pinch roll pair 142 is interspaced between transport belts that comprise main transport 140 on the downstream side of register fingers 141. Pinch roll pair 142 are driven from main motor 34.

Auxiliary transport 147 extends from auxiliary tray 102 to main transport 140 at a point upstream of sheet register fingers 141. Transport 147 is driven from motor 34.

To maintain the sheets in driving contact with the belts of transports 140, 147, suitable guides or retainers (not shown) may be provided along the belt runs.

The image bearing sheets leaving the nip formed by photoconductive belt 20 and transfer roll 75 are picked off by belts 155 of the leading edge of vacuum transport 149. Belts 155, which are perforated for the admission of vacuum therethrough, ride on forward roller pair 148 and rear roll 153. A pair of internal vacuum plenums 151, 154 are provided, the leading plenum 154 cooperating with belts 155 to pick up the sheets leaving the belt/transfer roll nip. Transport 149 conveys the image bearing sheets to fuser 150. Vacuum conduits 147, 156 communicate plenums 151, 154 with vacuum pumps 152, 152'. A pressure sensor 157 monitors operation of vacuum pump 152. Sensor 144 monitors transport 149 for jams.

To prevent the sheet on transport 149 from being carried into fuser 150 in the event of a jam or malfunction, a trap solenoid 158 is provided below transport 149. Energization of solenoid 158 raises the armature thereof into contact with the lower face of plenum 154 to intercept and stop the sheet moving therepast.

Referring particularly to FIGS. 3, 4, 11 and 12, fuser 150 comprises a lower heated fusing roll 160 and upper pressure roll 161. Rolls 160, 161 are supported for rotation in fuser housing 162. The core of fusing roll 160 is hollow for receipt of heating rod 163 therewithin.

Housing 162 includes a sump 164 for holding a quantity of liquid release agent, herein termed oil. Dispensing belt 165, moves through sump 164 to pick up the oil, belt 165 being driven by motor 166. A blanket-like wick 167 carries the oil from belt 165 to the surface of fusing roll 160.

Pressure roll 161 is supported within an upper pivotal section 168 of housing 162. This enables pressure roll 161 to be moved into and out of operative contact fusing roll 160. Cam shaft 169 in fuser housing 162 serves to move housing section 168 and pressure roll 161 into operative relationship with fusing roll 160 against a suitable bias (not shown). Cam shaft 169 is coupled to main motor 34 through an electromagnetically operated one revolution clutch 159.

Fuser housing section 168 is evacuated. For this purpose, a conduit 170 couples housing section 168 with vacuum pump 153. The ends of housing section 168 are separated into vacuum compartments opposite the ends of pressure roll 161 thereunder to cool the roll ends where smaller size copy sheets 3 are being processed.

Vacuum valve 171 (FIG. 3) in conduit 172 regulates communication of the vacuum compartments with vacuum pump 153' in response to the size sheets as sensed by side guide sensors 108, 109 in paper trays 100, 102.

Fuser roll 160 is driven from main motor 34. Pressure roll 161 is drivingly coupled to fuser roll 160 for rotation therewith.

Thermostat 174 (FIG. 12) in fuser housing 162 controls operation of heating rod 163 in response to temperature. Temperature sensor 175 protects against fuser over-temperature. To protect against trapping of a sheet in fuser 150 in the event of a jam, sensor 176 is provided.

Following fuser 150, the sheet is carried by post fuser transport 180 to either discharge transport 181 or, where duplex or two sided copies are desired, to return transport 182. Sheet sensor 183 monitors passage of the sheets from fuser 150. Transports 180, 181 are driven from main motor 34. Sensor 181' monitors transport 181 for jams. Suitable retaining means may be provided to retain the sheets on transports 180, 181.

A deflector 184, when extended, directs sheets on transport 180 onto conveyor roll 185 and into chute 186 leading to return transport 182. Solenoid 179, when energized raises deflector 184 into the sheet path. Return transport 182 carries the sheets back to auxiliary tray 102. Sensor 189 monitors transport 182 for jams. Paper stops 187 of tray 102 is supported for oscillating movement. Motor 188 drives stops 187 back and forth tap sheets returned to auxiliary tray 102 into alignment for refeeding.

To invert duplex copy sheets following fusing of the second or duplex image, a displaceable sheet stop 190 is provided adjacent the discharge end of chute 186. Stop 190 is pivotally supported for swinging movement into and out of chute 186. Solenoid 191 is provided to move stop 190 selectively into or out of chute 186. The sheet trapped in chute 186 by stop 190 is removed by pinch roll pairs 192, 193 and fed out through chute 201 pairs 192, 193 serve to draw the sheet trapped in chute 186 by stop 190 and carry the onto discharge transport 181. Further description of the inverter mechanism may be found in U.S. Pat. No. 3,856,295, issued Dec. 24, 1974, to John H. Looney.

Output tray 195 receives unsorted copies. Transport 196 a portion of which is wrapped around a turn around roll 197, serves to carry the finished copies to tray 195. Sensor 194 monitors transport 196 for jams. To route copies into output tray 195, a deflector 198 is provided. Deflector solenoid 199, when energized, turns deflector 198 to intercept sheets on conveyor 181 and route the sheets onto conveyor 196.

When output tray 195 is not used, the sheets are carried by conveyor 181 to sorter 14.

SORTER

Figure 13:
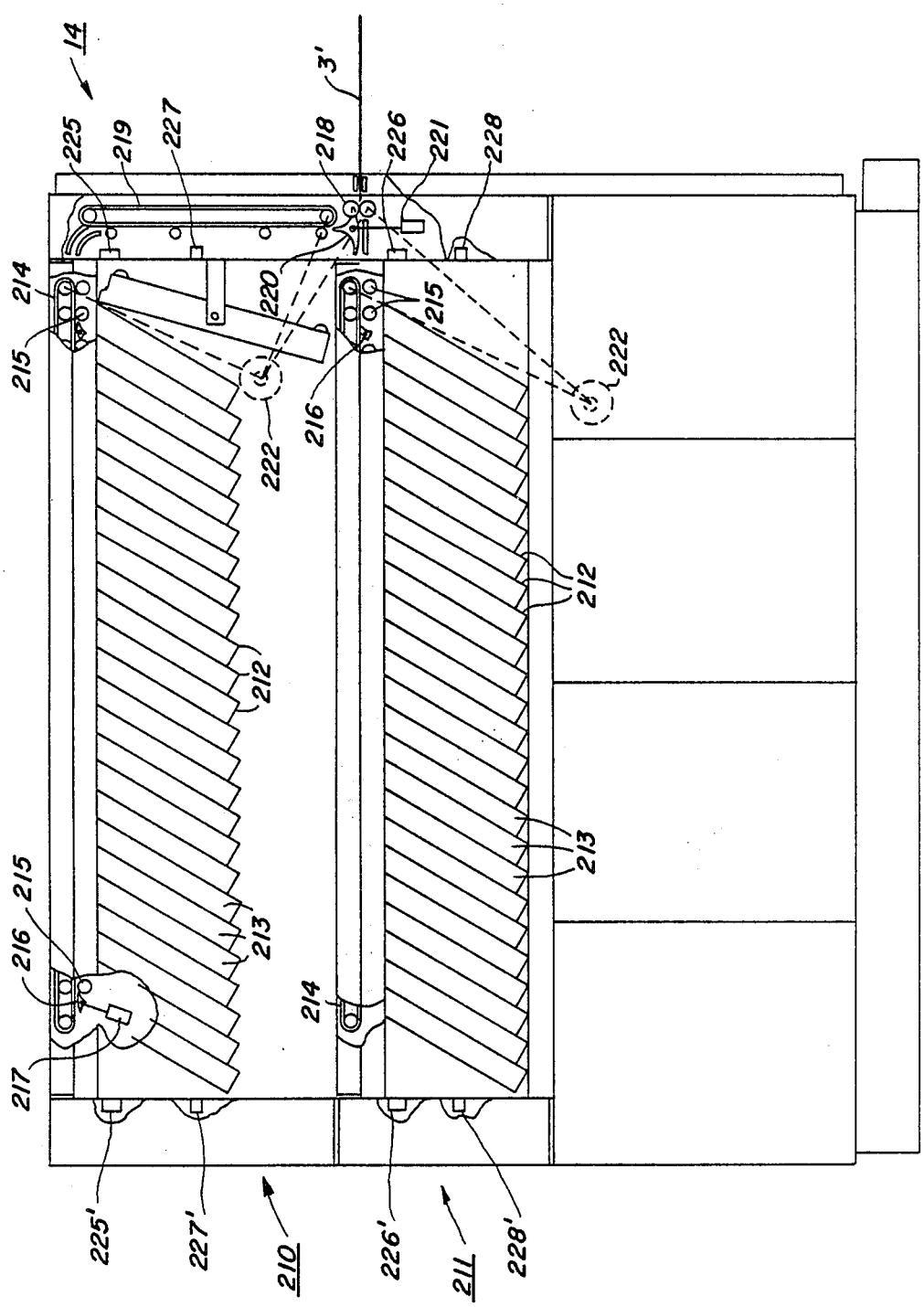
FIG. 13 is an enlarged view showing details of the copy sorter for the apparatus shown in FIG. 1.

Referring particularly to FIG. 13, sorter 14 comprises upper and lower bin arrays 210, 211. Each bin array 210, 211 consists of series of spaced downwardly inclined trays 212, forming a series of individual bins 213 for receipt of finished copies 3'. Conveyors 214 along the top of each bin array, cooperate with idler rolls 215 adjacent the inlet to each bin to transport the copies into juxtaposition with the bins. Individual defelctors 216 at each bin cooperate, when depressed, with the adjoining idler roll 215 to turn the copies into the bin associated therewith. An operating solenoid 217 is provided for each deflector.

A driven roll pair 218 is provided at the inlet to sorter 14. A generally vertical conveyor 219 serves to bring copies 3' to the upper bin array 210. Entrance deflector 220 routes the copies selectively to either the upper or lower bin array 210, 211 respectively. Solenoid 221 operates deflector 220.

Motor 222 is provided to drive the conveyors 214 and 219 of upper bin array 210 and conveyor 214 of lower bin array 211. Roll pair 218 is drivingly coupled to motor 222.

To detect entry of copies 3' in the individual bins 213, a photoelectric type sensor 225, 226 is provided at one end of each bin array 210, 211 respectively. Sensor lamps 225', 226' are disposed adjacent the other end of the bin array. To detect the presence of copies in the bins 213, a second set of photoelectric type sensors 227, 228 is provided for each bin array, on a level with a tray cutout (not shown). Sensor lamps 227', 228' are disposed opposite sensors 227, 228.

DOCUMENT HANDLER

Figure 14:
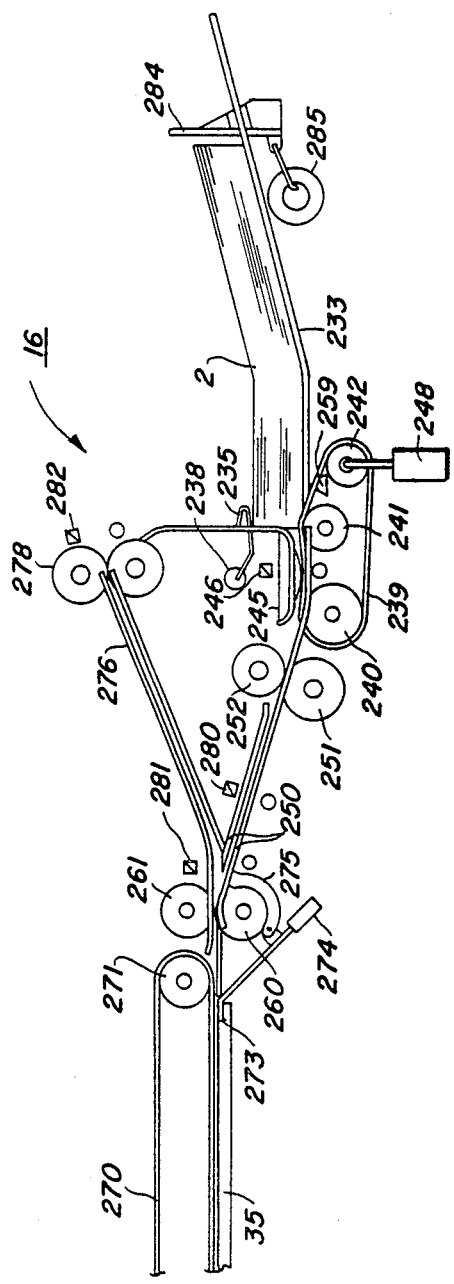
FIG. 14 is a schematic view showing details of the document handler for the apparatus shown in FIG. 1.
Figure 15:
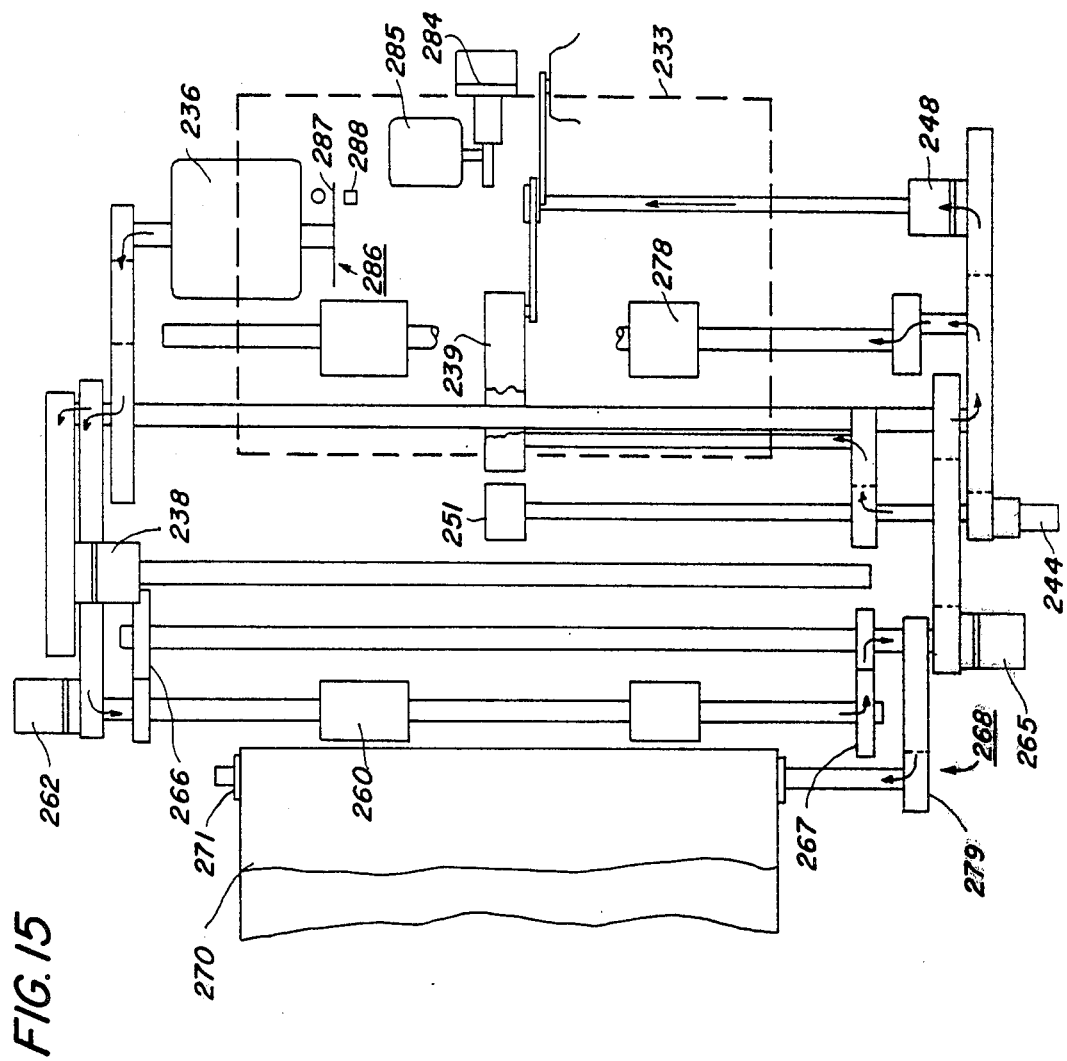
FIG. 15 is a view showing details of the drive mechanism for the document handler shown in FIG. 14.

Referring particularly to FIGS. 14 and 15, document handler 16 includes a tray 233 into which originals or documents 2 to be copied are placed by the operator following which a cover (not shown) is closed. A movable bail or separator 235, driven in an oscillatory path from motor 236 through a solenoid operated one revolution clutch 238, is provided to maintain document separation.

A document feed belt 239 is supported on drive and idler rolls 240, 241 and kicker roll 242 under tray 233, tray 233 being suitably apertured to permit the belt surface to project therewithin. Feedbelt 239 is driven by motor 236 through electromagnetic clutch 244. Guide 245, disposed near the discharge end of feed belt 239, cooperates with belt 239 to form a nip between which the documents pass.

A photoelectric type sensor 246 is disposed adjacent the discharge end of belt 239. Sensor 246 responds on failure of a document to feed within a predetermined interval to actuate solenoid 248 to raise kicker roll 242 and increases the surface area of feed belt 239 in contact with the documents. Another sensor 259 located underneath tray 233 provides an output signal when the last document 2 of each set has left the tray 233.

Document guides 250 route the document fed from tray 233 via roll pair 251, 252 to platen 35. Roll 251 is drivingly coupled to motor 236 through electromagnetic clutch 244. Contact of roll 251 with roll 252 turns roll 252.

Roll pair 260, 261 at the entrance to platen 35 advance the document onto platen 35, roll 260 being driven through electromagnetic clutch 262 in the forward direction. Contact of roll 260 with roll 261 turns roll 261 in the document feeding direction. Roll 260 is selectively coupled through gearset 268 with motor 236 through electromagnetic clutch 265 so that on engagement of clutch 265 and disengagement of clutch 262, roll 260 and roll 261 therewith turn in the reverse direction to carry the document back to tray 233 via return chute 276. One way clutches 266, 267 permit free wheeling of the roll drive shafts.

The document leaving roll pair 260, 261 is carried by platen feed belt 270 onto platen 35, belt 270 being comprised of a suitable flexible material having an exterior surface of xerographic white. Belt 270 is carried about drive and idler rolls 271, 272. Roll 271 is drivingly coupled to motor 236 for rotation in either a forward or reverse direction through clutches 262, 265. Engagement of clutch 262 operates through belt and pulley drive 279 to drive belt in the forward direction, engagement of clutch 265 operates through drive 279 to drive belt 270 in the reverse direction.

To locate the document in predetermined position on platen 35, a register 273 is provided at the platen inlet for engagement with the document trailing edge. For this purpose, control of platen belt 270 is such that following transporting of the document onto platen 35 and beyond register 273, belt 270 is reversed to carry the document backwards against register 273.

To remove the document from platen 35 following copying, register 273 is retracted to an inoperative position. Solenoid 274 is provided for moving register 273.

A document deflector 275, is provided to route the document leaving platen 35 into return chute 276, deflector 275 being raised by solenoid 274 when withdrawing register 273. For this purpose, platen belt 270 and pinch roll pair 260, 261 are reversed through engagement of clutch 265. Discharge roll pair 278, driven by motor 236, carry the returning document into tray 233.

To monitor movement of the documents in document handler 16 and detect jams and other malfunctions, photoelectric type sensors 246 and 280, 281 and 282 are disposed along the document routes.

To align documents 2 returned to tray 233, a document patter 284 is provided adjacent one end of tray 233. Patter 284 is oscillated by motor 285.

TIMING

To provide the requisite operational synchronization between host machine 10 and controller 18 as will appear, processor or machine clock 202 is provided. Referring particularly to FIG. 1a, clock 202 comprises a toothed disc 203 drivingly supported on the output shaft of main drive motor 34. A photoelectric type signal generator 204 is disposed astride the path followed by the toothed rim of disc 203, generator 204 producing, whenever drive motor 34 is energized, a pulse like signal output at a frequency correlated with the speed of motor 34.

As described, a second machine clock, termed a pitch reset clock 138 herein, and comprising timing switch 146 is provided. Switch 146 cooperates with sheet register fingers 141 to generate an output pulse once each revolution of fingers 141. As will appear, the pulse like output of the pitch reset clock is used to reset or resynchronize controller 18 with host machine 10.

Figure 17:
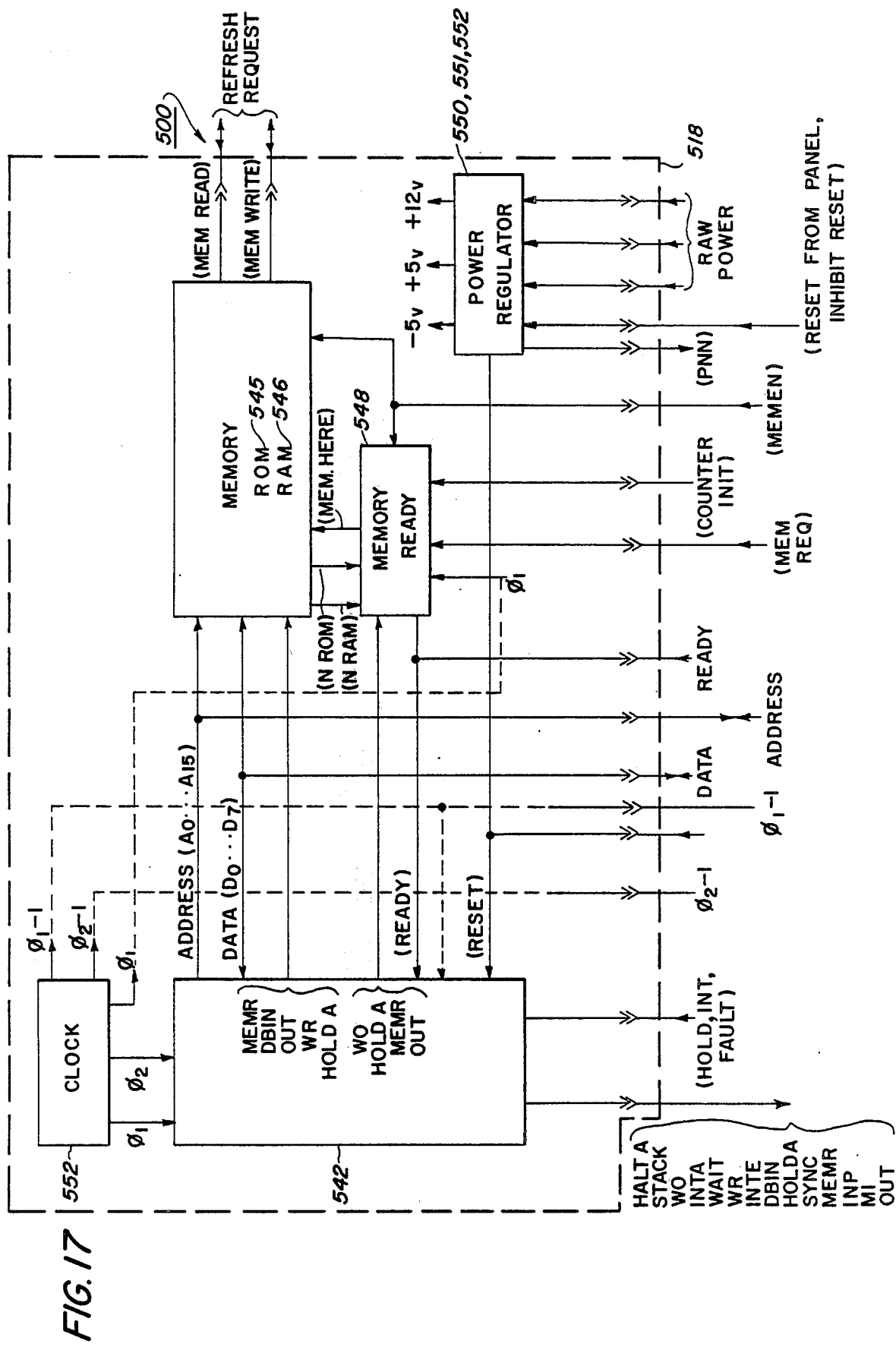
FIG. 17 is a block diagram of the controller CPU.

Referring to FIG. 15, a document handler clock 286 consisting of apertured disc 287 on the output shaft of document handler drive motor 236 and cooperating photoelectric type signal generator 288 is provided. As in the case of machine clock 202, document handler clock 286 produces an output pulse train from which components of the document handler may be synchronized. A real time clock such as clock 552 of FIG. 17, is utilized to control internal operations of the controller 18 as is known in the art. The real time clock is also utilized to time the operation of some of the machine components as will be described.

CONTROLLER

Figure 16:
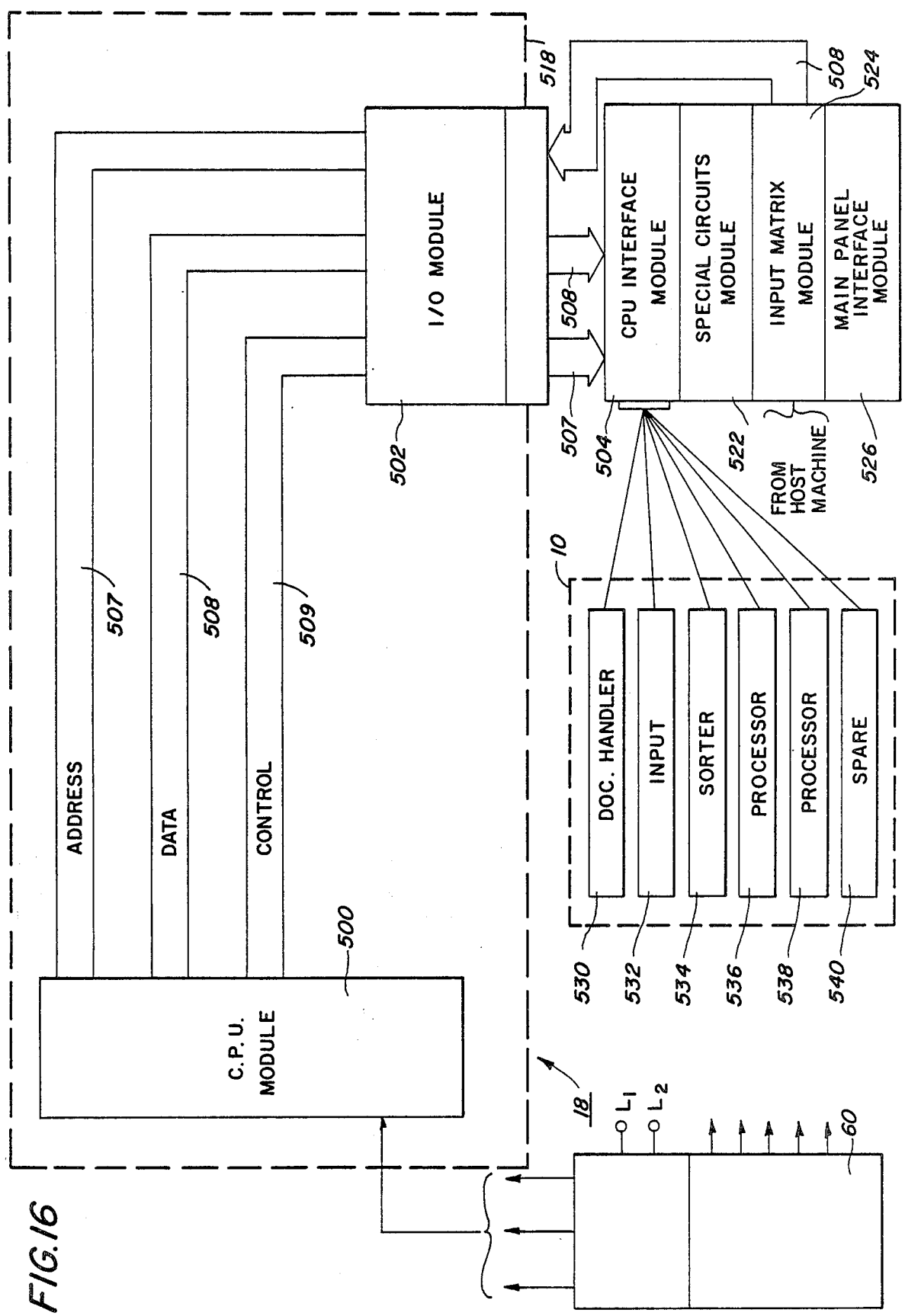
FIG. 16 is a block diagram of the controller for the apparatus shown in FIG. 1.

Referring to FIG. 16, controller 18 includes a Central Processor Unit (CPU) Module 500, Input/Output (I/O) Module 502, and Interface 504. Address, Data and Control Buses 507, 508, 509 respectively operatively couple CPU Module 500 and I/O Module 502. CPU Module 500 I/O Module 502 are disposed within a shield 518 to prevent noise interference.

Interface 504 couples I/O Module 502 with special circuits module 522, input matrix module 524, and main panel interface module 526. Module 504 also couples I/O Module 502 to the operating sections of the machine, namely, document handler section 530, input section 532, sorter section 534 and processor sections 536, 538. A spare section 540, which may be used for monitoring operation of the host machine, or which may be later utilized to control other devices, is provided.

Figure 18A:
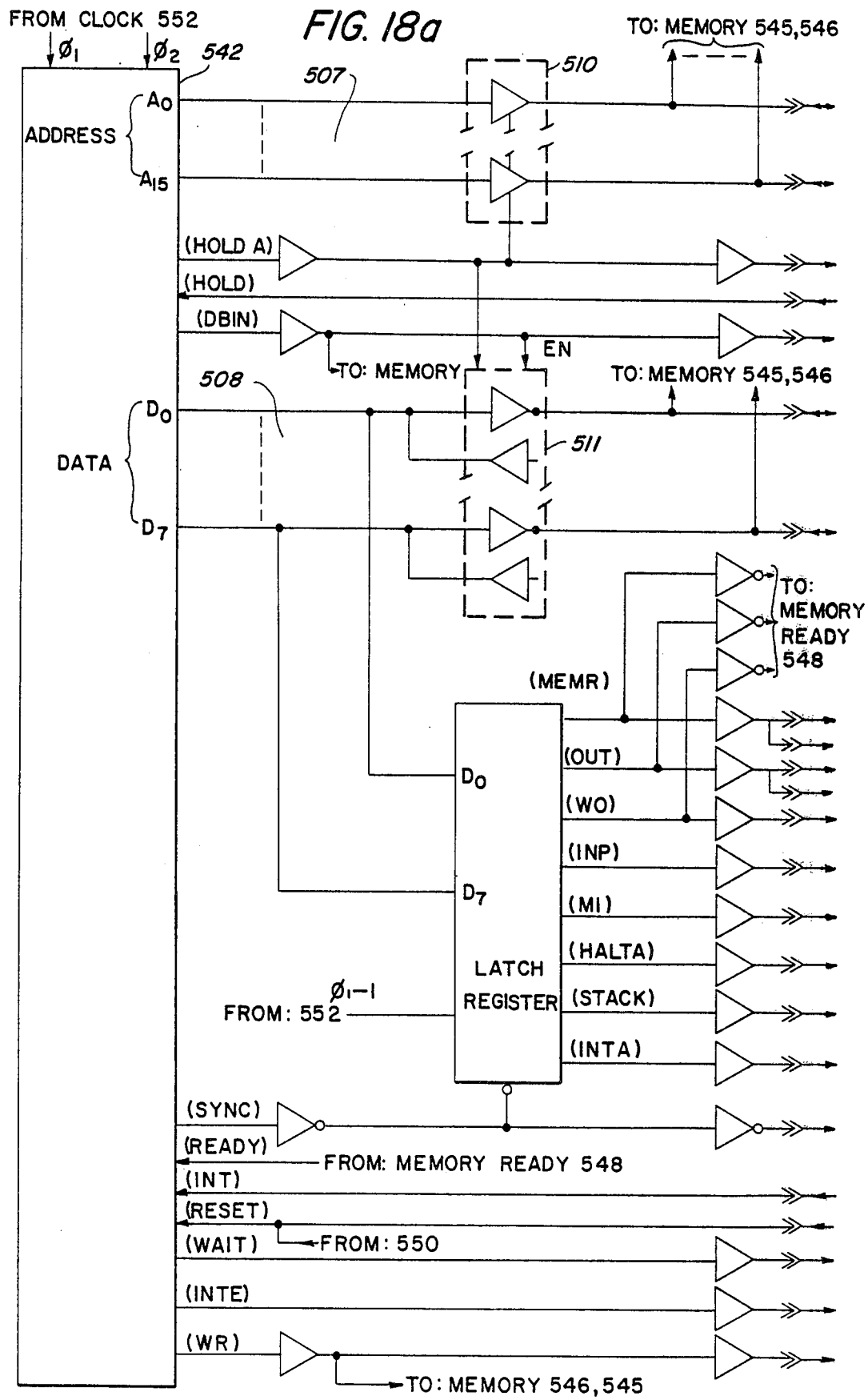
FIG. 18a is a block diagram showing the CPU microprocessor input/output connections.

Referring to FIGS. 17, 18a, CPU module 500 comprises a processor 542 such as an Intel 8080 microprocessor manufactured by Intel Corporation, Santa Clara, California, 16K Read Only Memory (herein ROM) and 2K Random Access Memory (herein RAM) sections 545, 546, Memory Ready section 548, power regulator section 550, and onboard clock 552. Bipolar tri-state buffers 510, 511 in Address and Data buses 507, 508 disable the bus on a Direct Memory access (DMA) signal (HOLDA) as will appear. While the capacity of memory sections 545, 546 are indicated throughout as being 16K and 2K respectively, other memory sizes may be readily contemplated.

Figure 19A:
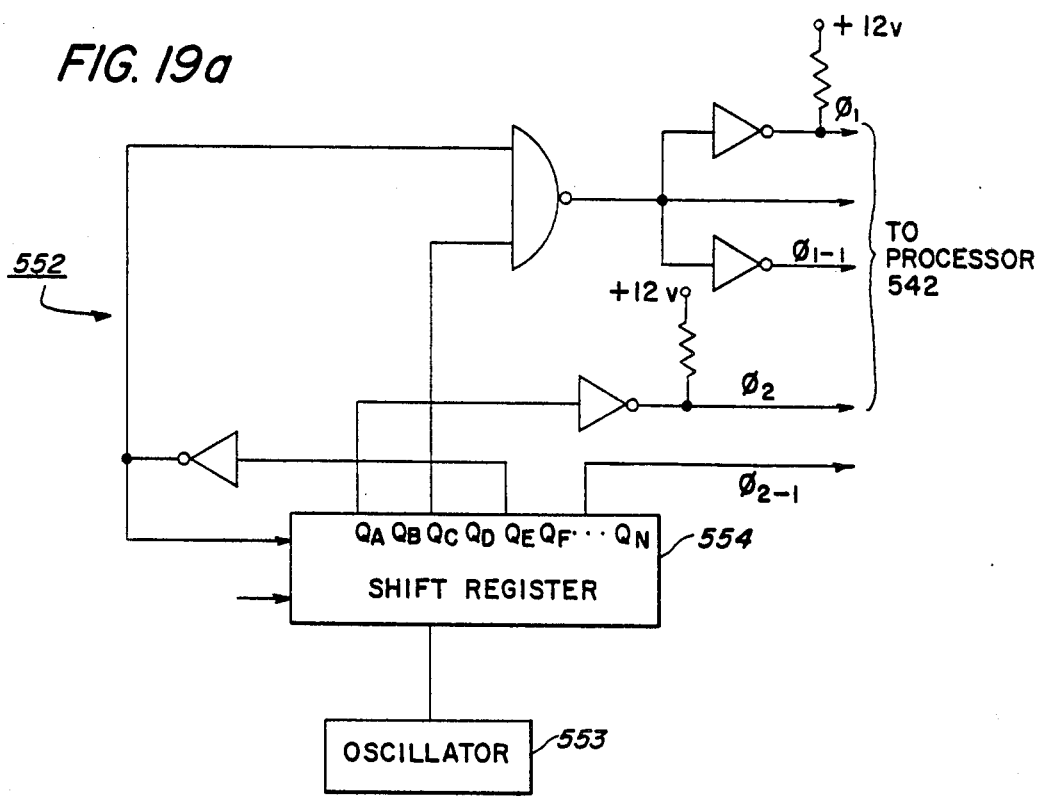
FIG. 19a is a logic schematic of the CPU clock.
Figure 19B:
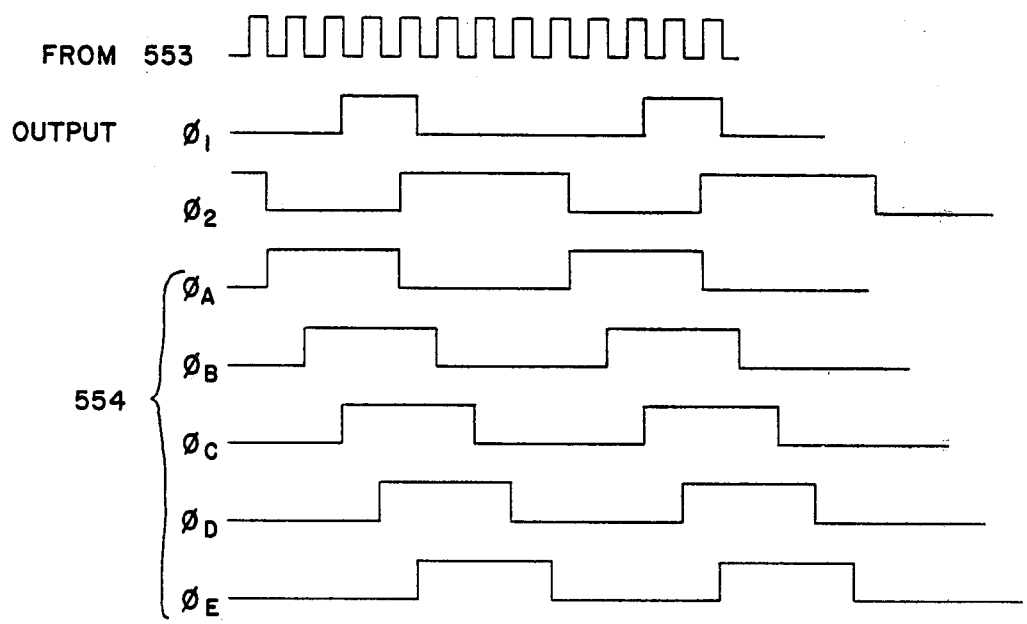

Referring particularly to FIGS. 19 (a,b), clock 552 comprises a suitable clock oscillator 553 feeding a multibite (Qa-Qn) shift register 554. Register 554 includes an internal feedback path from one bit to the serial input of register 554. Output signal waveforms $\phi_1, \phi_2, \phi_{1-1}$ and $\phi_{2-1}$ are produced for use by the system.

Referring to FIG. 20, the memory bytes in ROM section 545 are implemented by address signals (Ao–A 15) from processor 542, selection being effected by 3 to 8 decode chip 560 controlling chip select 1 (CS-1) and a 1 bit selection (A 13) controlling chip select 2 (CS-2). The most significant address bits (A 14, A 15) select the first 16K of the total 64 bytes of the addressing space. The memory bytes in RAM section 546 are implemented by Address signals (Ao–A 15) through selector circuit 561. Address bit A 10 serves to select the memory bank while the remaining five most significant bits (A 11–A 15) select the last 2 K bytes out of the 64K bytes of addressing space. RAM memory section 546 includes a 40 bit output buffer (DATA OUT) the output of which is tied together with the output from ROM memory section 545 and goes to tri-state buffer 562 to drive Data bus 508. Buffer 562 is enabled when either memory section 545 or 546 is being addressed and either a (MEM READ) or DMA (HOLD A) memory request exists. An enabling signal (MEMEN) is provided from the machine control or service panel (not shown) which is used to permit disabling of buffer 562 during servicing of CPU Module 500. Write control comes from either processor 542 (MEM WRITE) or from DMA (HOLD A) control. Tri-state buffers 563 permit Refresh Control 605 of I/O Module 502 (FIG. 23b) to access MEM READ and MEM WRITE control channels directly on a DMA signal (HOLD A) from processor 542 as will appear.

Figure 21:
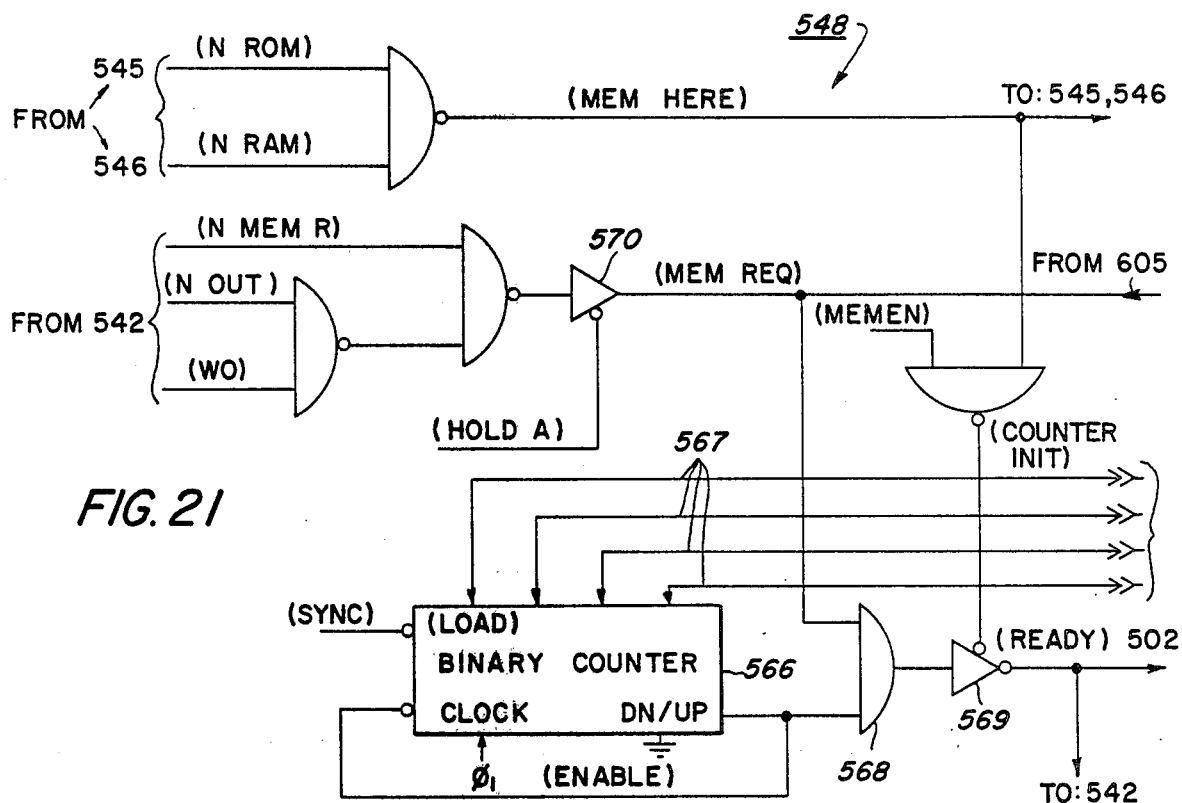
FIG. 21 is a logic schematic of the CPU memory ready.

Referring to FIG. 21, memory ready section 548 provides a READY signal to processor 542. A binary counter 566, which is initialized by a SYNC signal ($\phi$,) to a prewired count as determined by input circuitry 567, counts up at a predetermined rate. At the maximum count, the output at gate 568 comes true stopping the counter 566. If the cycle is a memory request (MEM REQ) and the memory locaton is on board as determined by the signal (MEM HERE) to tri-state buffer 569, a READY signal is sent to processor 542. Tri-state buffer 570 in MEM REQ line permits Refresh Control 605 of I/O Module 502 to access the MEM REQ channel directly on a DMA signal (HOLD A) from processor 542 as will appear.

Figure 22A:
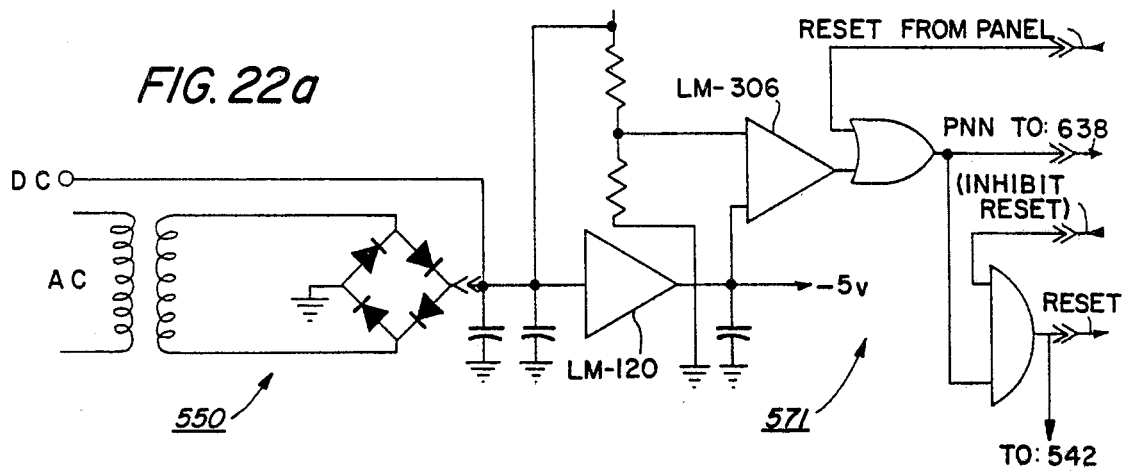
FIGS. 22a, 22b, 22c are logic schematics of the CPU power supply stages.
Figure 22B:
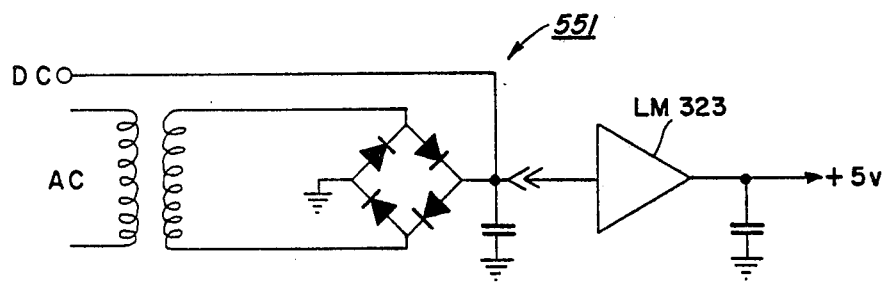
Figure 22C:
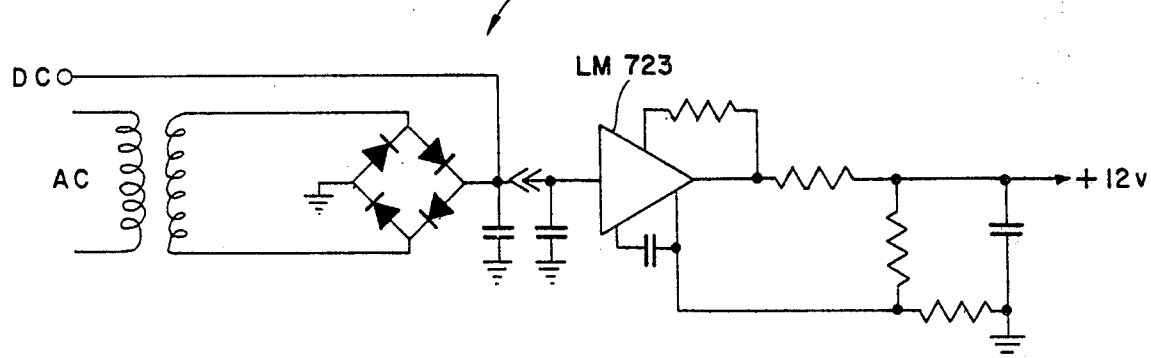

Referring to FIGS. 22 (a,b,c) and 23b, power regulators 550, 551, 552 provide the various voltage levels, i.e. +5 v, +12 v, and −5 v D. C. required by the module 500. Each of the three on board regulators 550, 551, 552 employ filtered D.C. inputs. Power Not Normal (PNN) detection circuitry 571 is provided to reset processor 542 during the power up time. Reset control from the machine service panel (not shown) is also provided via PNN. An enabling signal (INHIBIT RESET) from Memory Control 638 allows completion of a write cycle in Non Volatile (N.V.) Memory 610 of I/O Module 502.

Figure 18B:
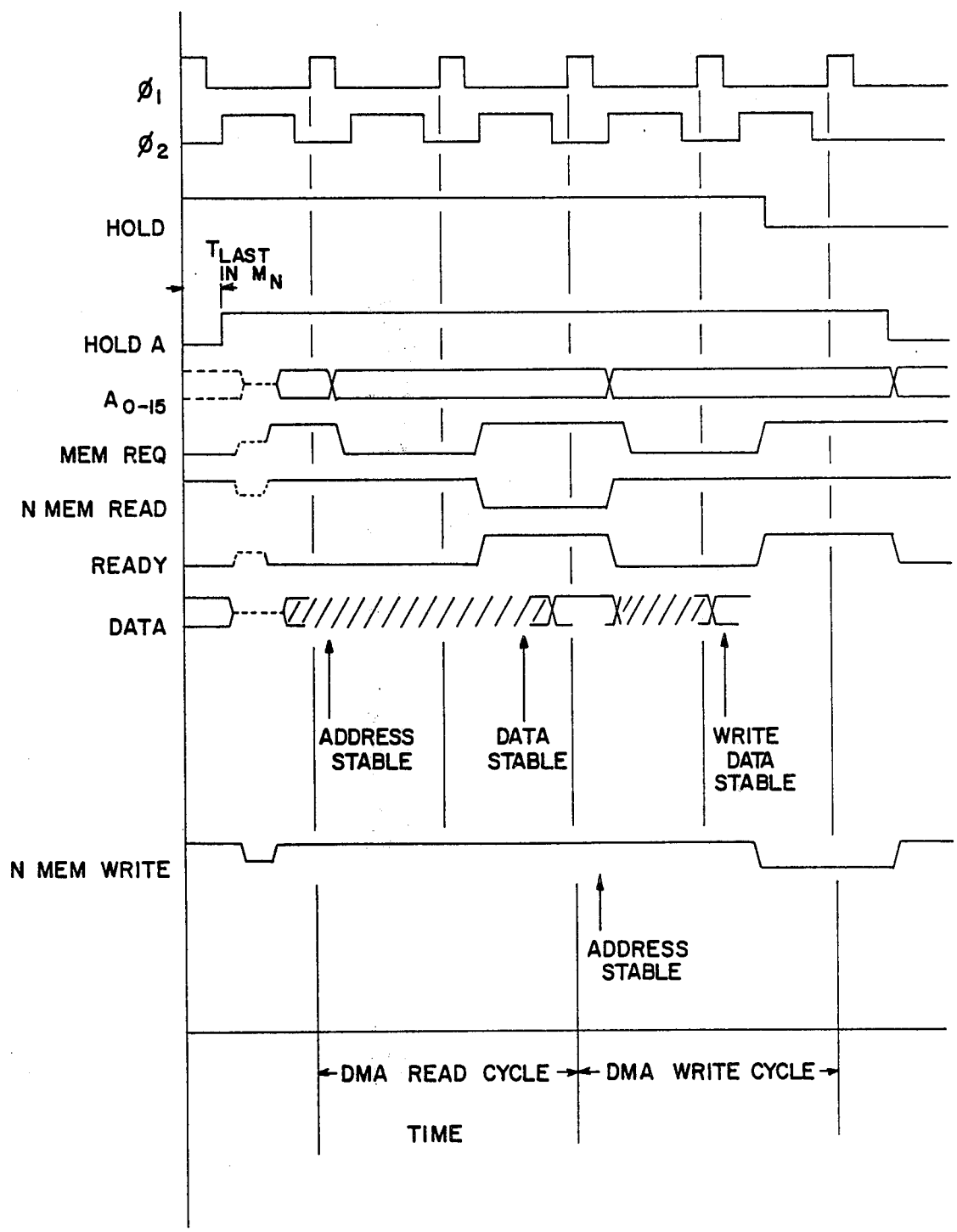
FIG. 18b is a timing chart of Direct Memory access (DMA) Read and Write cycles.

Referring to FIGS. 18a, 20, 21, and the DMA timing chart (FIG. 18b) data transfer from RAM section 546 to host machine 10 is effected through Direct Memory Access (DMA), as will appear. To initiate DMA, a signal (HOLD) is generated by Refresh Control 605 (FIG. 23b). On acceptance, processor 542 generates a signal HOLD ACKNOWLEDGE (HOLD A) which works through tri-state buffers 510, 511 and through buffers 563 and 570 to release Address bus 507, Data bus 508 and MEM READ, MEM WRITE, and MEM REQ channels (FIGS. 20, 21) to Refresh Control 605 of I/O Module 502.

Referring to FIGS. 23 (a, b), I/O Module 502 interfaces with CPU module 500 through bi-directional Address, and Data buses 507, 508, respectively, and Control bus 509. I/O Module 502 appears to CPU module 500 as a memory portion. Data transfers between CPU and I/O modules 500, 502, and commands to I/O module 502 except for output refresh are controlled by memory reference instructions executed by CPU module 500. Output refresh which is initiated by one of several uniquely decoded memory reference commands, enables Direct Memory access (DMA) by I/O module 502 of RAM section 546.

I/O module 502 includes Matrix Input select 604 (through which inputs from the host machine 10, are received), Refresh Control 605, Nonvolatile (NV) memory 610, Interrupt Control 612 (FIG. 23a), Watch dog Timer and failure Flag 614 and clock 570.

A Function Decode Section 601 receives and interprets commands from CPU section 500 by decoding information on address bus 507 along with control signals from processor 542 on control bus 509. On command, decode section 601 generates control signals to perform the function indicated. These functions include (a) controlling tri-state buffers 620 to establish the direction of data flow in Data bus 508; (b) strobing data from Data bus 508 into buffer latches 622; (c) controlling multiplexer 624 to put data from Interrupt Control 612, Real Time clock register 621, Matrix Input Select 604 or N.V. memory 610 onto data bus 508; (d) actuating refresh control 605 to initiate a DMA operation; (e) actuating buffers 634 to enable address bits Ao-A 7 to be sent to the host machine 10 for input matrix read operations; (f) commanding operation of Matrix Input Select 604; (g) initiating read or write operation of N.V. memory 610 through Memory Control 638; (h) loading Real Time clock register 621 (FIG. 23a) from data bus 508; and (i) resetting the Watch Dog timer or and setting the Fault Failure flag 614. In addition, section 601 includes logic to control and synchronize the READY control line to CPU module 500, the READY line being used to advise module 500 when data placed on the Data bus by I/O module 502 is valid.

Watch dog timer and failure flag 614, which serves to detect certain hardwired and software malfunctions, comprises a free running counter which under normal circumstances is periodically reset by an output refresh command (REFRESH) from Function Decode Section 601. If an output refresh command is not received within a preset time interval, (i.e. 25 m sec) a fault flip flop is set and a signal (FAULT) sent to the host machine 10. The signal (FAULT) also raises the HOLD line (via Refresh Control 605) to disable CPU Module 500. Clearing of the fault flip flop may be by cycling power or generating a signal (RESET). A selector (not shown) may be provided to disable (DISABLE) the watch dog timer when desired. The fault flip flop may also be set by a command from the CPU Module to indicate that the operating program detected a fault.

Matrix Input select 604 which controls receipt of data from host machine 10 has a capacity to read up to 32 groups of 8 discrete inputs from host machine 10. Lines $A_3$ through $A_7$ of Address bus 507 are routed to host machine 10 via optical isolator 569 and CPU Interface Module 504 to select the desired group of 8 inputs. The selected inputs from machine 10 are received by matrix via Input Matrix Module 524 (FIG. 28) and are placed by matrix 604 onto data bus 508 and sent to CPU Module 500 via multiplexer 624. Bit selection is effected by lines $A_0$ through $A_2$ of Address bus 507.

Output refresh control 605, when initiated, transfers either 16 or 32 sequential words from the memory output buffer (DATA OUT) of RAM memory section 546 to host machine 10 at the predetermined clock rate in line 574. Direct Memory access (DMA) is used to facilitate transfer of the data at a relatively high rate. On a Refresh signal from Function Decode Section 601, Refresh Control 605 generates a HOLD signal to processor 542. On acknowledgement (HOLD A) processor 542 enters a hold condition. In this mode, CPU Module 500 releases address and data buses 507, 508 (through actuation of tri-state buffers 510, 511 as described) to the high impedance state giving I/O module 502 control thereover. I/O module 502 then sequentially accesses the 32 memory words from output buffer (DATA OUT) of RAM section 546 (REFRESH ADDRESS) and transfers the contents to the host machine 10 via data bus 508 and optical isolator 569. CPU Module 500 is dormant during this period.

On capture of the address and data buses 507, 508, a control signal (LOAD) from Refresh Control 605 together with a clock signal (CLOCK) are utilized to generate eight 32 bit serial words which are transmitted serially via CPU Interface Module 504 to the host machine remote locations where serial to parallel transformation is performed. Alternatively, the data may be stored in addressable latches and distributed in parallel directly to the required destinations.

Figure 24:
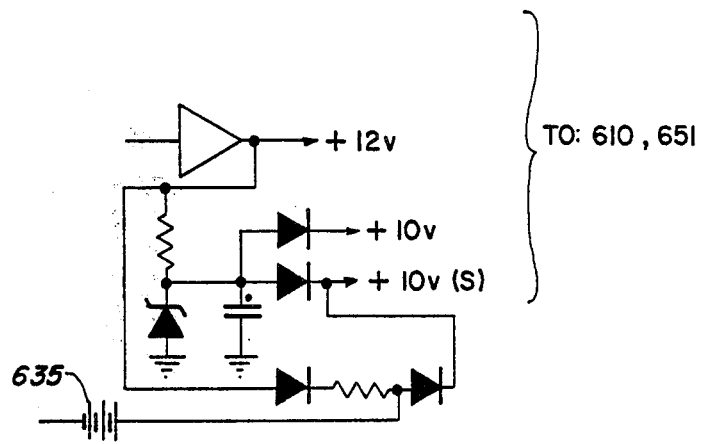
FIG. 24 is a logic schematic of the nonvolatile memory power supply.

N.V. memory 610 comprises a predetermined number of bits of non-volatile memory stored in I/O module 502 under Memory Control 638. N.V. memory 610 appears to CPU module 500 as part of the CPU module memory complement and therefore may be accessed by the standard CPU memory reference instruction set. Referring particularly to FIG. 24, to sustain the contents of N.V. memory 610 should system power be interrupted, one or more rechargeable batteries 635 are provided exterior to I/O module 502. CMOS protective circuitry 636 couples batteries 635 to memory 610 to preserve memory 610 on a failure of the system power. A logic signal (INHIBIT RESET) prevents the CPU Module 500 from being reset during the N.V. memory write cycle interval so that any write operation in progress will be completed before the system is shut down.

For tasks that require frequent servicing, high speed response to external events, or synchronization with the operation of host machine 10, a multiple interrupt system is provided. These comprise machine based interrupts, herein referred to as Pitch Reset interrupt and the Machine interrupt, as well as a third clock driven interrupt, the Real Time interrupt.

Figure 23A:
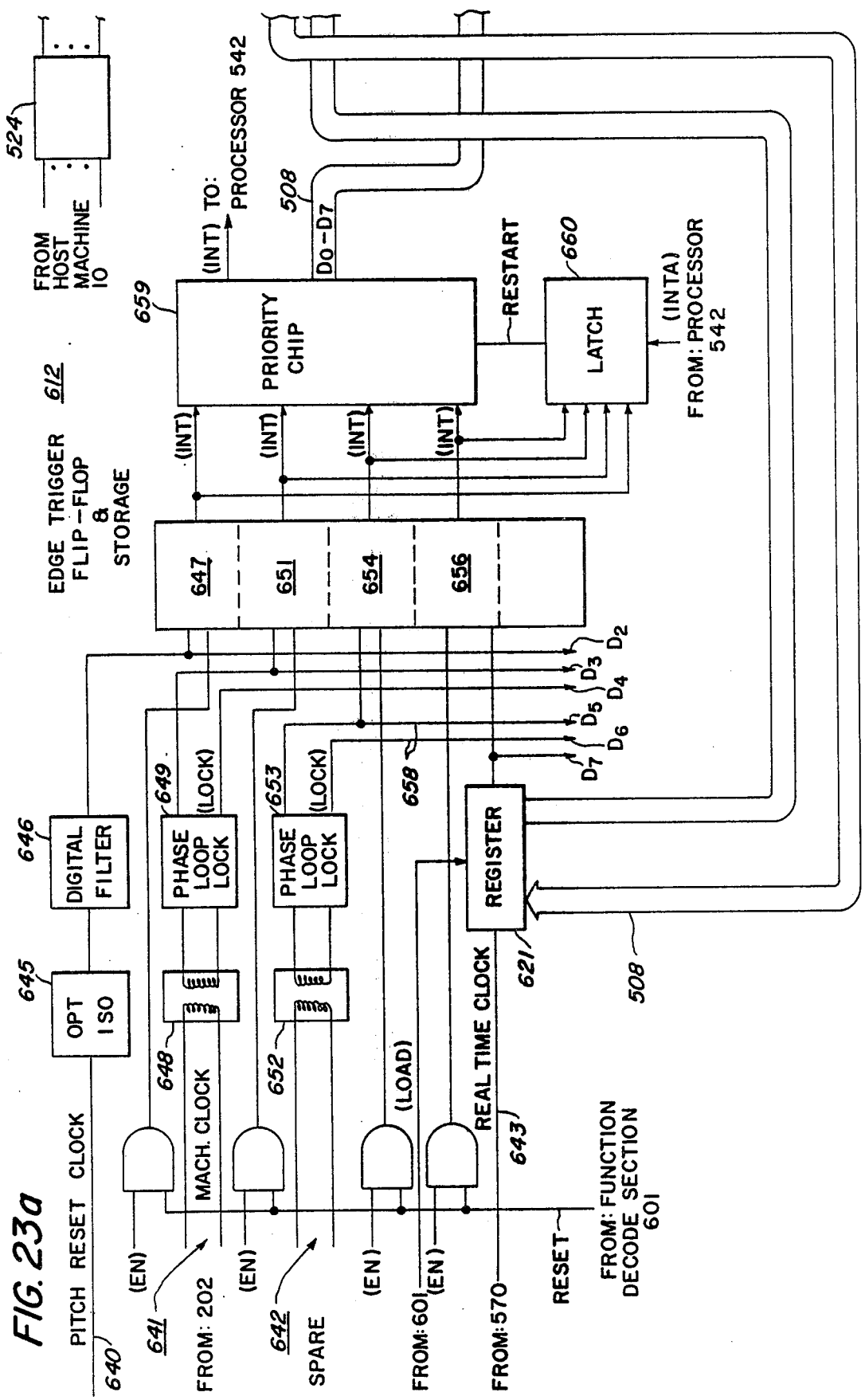

Referring particularly to FIG. 23(a) the highest priority interrupt signal, Pitch reset signal 640, is generated by the signal output of pitch reset clock 138. The clock singal is fed via optical isolator 645 and digital filter 646 to edge trigger flip flop 647.

The second highest priority interrupt signal, machine clock signal 641, is sent directly from machine clock 202 through isolation transformer 648 to a phase locked loop 649. Loop 649, which serves as bandpath filter and signal conditioner, sends a square wave signal to edge trigger flip flop 651. The second signal output (LOCK) serves to indicate whether loop 649 is locked onto a valid signal input or not.

The lowest priority interrupt signal, Real Time Clock signal 643, is generated by register 621. Register 621 which is loaded and stored by memory reference instructions from CPU module 500 is decremented by a clock signal in line 643 which may be drived from I/O Module clock 570, which is driven, in turn, by clock 552. On the register count reaching zero, register 621 sends an interrupt signal to edge trigger flip flop 656. A spare interrupt 642 is also provided.

Setting of one or more of the edge trigger flip flops 647, 651, 654, 656 by the interrupt signals 640, 641, 642, 643 generates a signal (INT) via priority chip 659 to processor 542 of CPU Module 500 (FIG. 18a). On acknowledgement, processor 542, issues a signal (INTA) transferring the status of the edge trigger flip flops 647, 651, 654, 656 to a four bit latch 660 to generate an interrupt instruction code (RESTART) onto the data bus 508.

Each interrupt is assigned a unique RESTART instruction code. Should an interrupt of higher priority be triggered, a new interrupt singal (INT) and RESTART instruction code are generated resulting in a nesting of interrupt software routines whenever the interrupt recognition circuitry is enabled within the CPU 500.

Priority chip 659 serves to establish a handling priority in the event of simultaneous interrupt signals in accordance with the priority schedule described.

Once triggered, the edge trigger flip flop 647, 651, 654 or 656 must be reset in order to capture the next occurrence of the interrupt associated therewith. Each interrupt subroutine serves, in addition to performing the functions programmed, to reset the flip flops (through the writing of a coded byte in a uniquely selected address) and to re-enable the interrupt (through execution of a re-enabling instruction). Until reenabled, initiation of a second interrupt is precluded while the first interrupt is in progress.

Lines 658 permit interrupt status to be interrogated by CPU module 500 on a memory reference instruction.

I/O Module 502 includes a suitable pulse generator of clock 570 for generating the various timing signals required by module 502. Clock 570 is driven by the pulselike output $\phi_{1-1}$, $\phi_{2-1}$ of processor clock 552 (FIG. 19a). As described, clock 570 provides a reference clock pulse (in line 574) for synchronizing the output refresh data and is the source of clock pulses (in line 643) for driving Real Time register 621.

Figure 25:
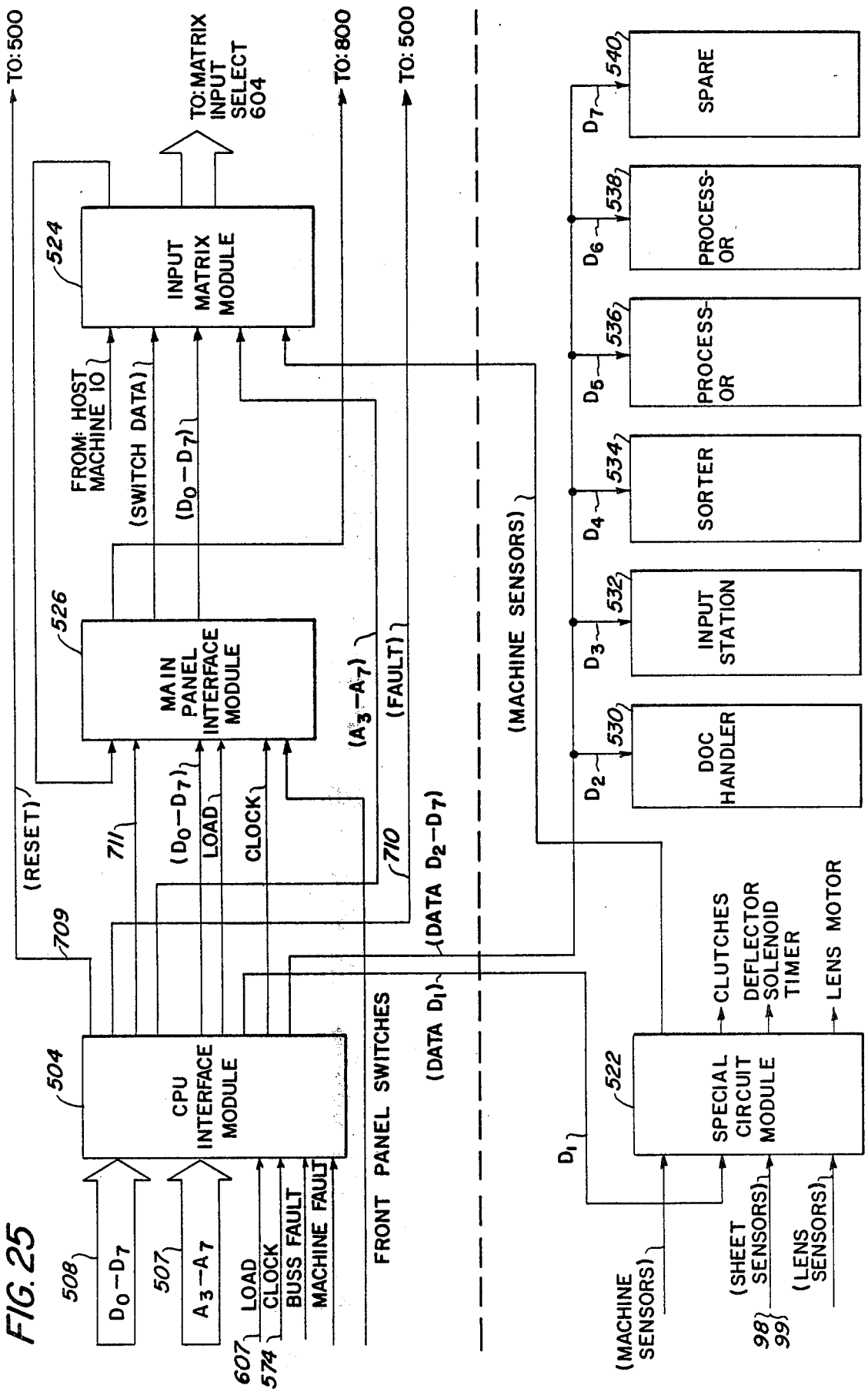
FIG. 25 is a block diagram of the apparatus interface and remote output connections.
Figure 26:
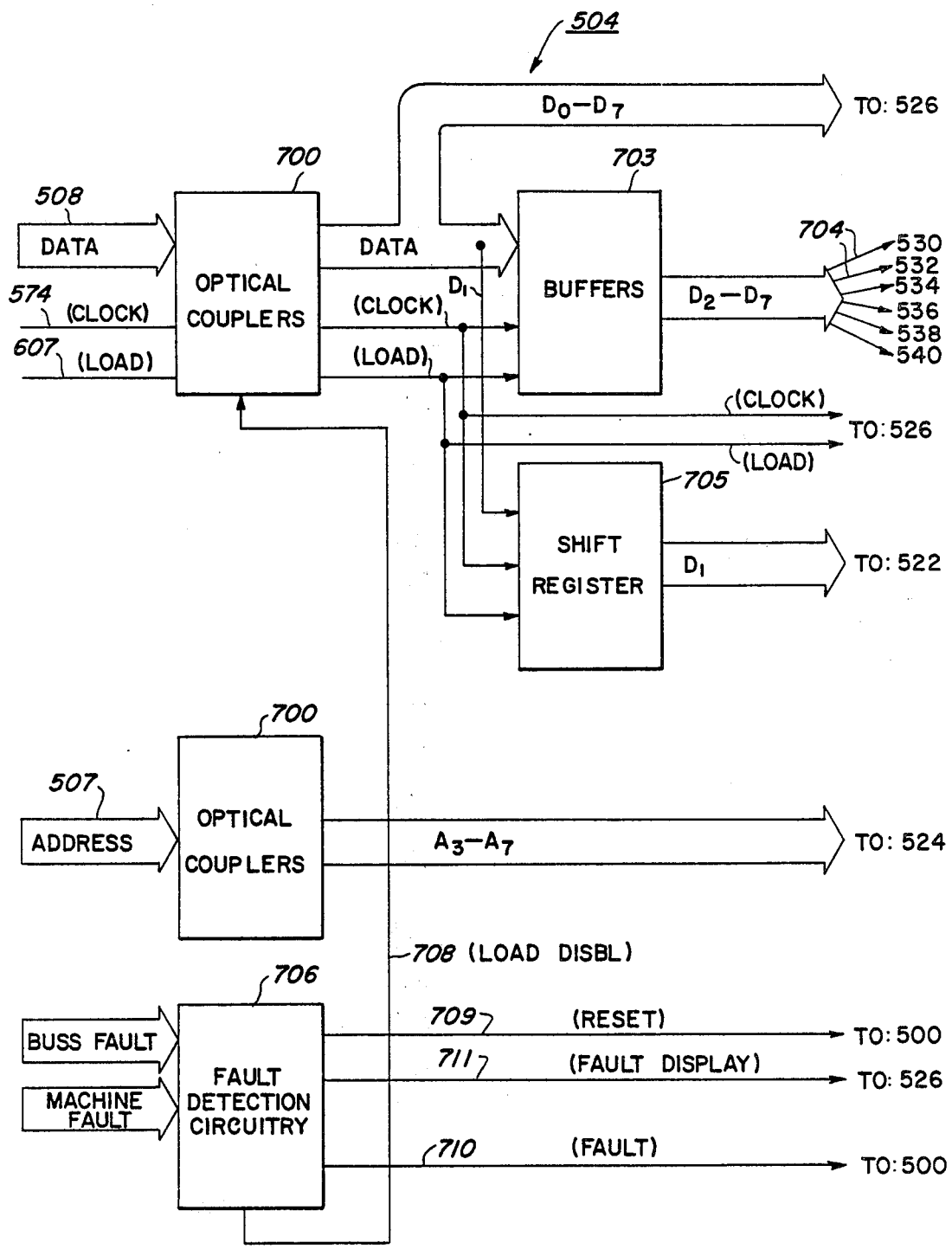
FIG. 26 is a block diagram of the CPU interface module.

CPU interface module 504 interfaces I/O module 502 with the host machine 10 and transmits operating data stored in RAM section 546 to the machine. Referring particularly to FIGS. 25 and 26, data and address information are inputted to module 504 through suitable means such as optical type couplers 700 which convert the information to single ended logic levels. Data in bus 508 on a signal from Refresh Control 605 in line 607 (LOAD), is clocked in module 546 at the reference clock rate in line 574 parallel by bit, serial by byte for a preset byte length, with each data bit of each successive byte being clocked into a separate data channel D0–D7. As best seen in FIG. 25, each data channel D0–D7 has an assigned output function with data channel D0 being used for operating the front panel lamps 830 in the digital display, (see FIG. 32), data channel D1 for special circuits module 522, and remaining data channels D2–D7 allocated to the host machine operating sections 530, 532, 534, 536, 538 and 540. Portions of data channels D1–D7 have bits reserved for front panel lamps and digital display.

Since the bit capacity of the data channels D2–D7 is limited, a bit buffer 703 (FIG. 26) is preferably provided to catch any bit overflow in data channels D2–D7.

Inasmuch as the machine output sections 530, 532, 534, 536, 538 and 540 are electrically a long distance away, i.e. remote, from CPU interface module 504, and the environment is electrically "noisy", the data stream in channels D2–D7 is transmitted to remote sections 530, 532, 534, 536, 538 and 540 via a shielded twisted pair 704. By this arrangement, induced noise appears as a differential input to both lines and is rejected. The associated clock signal for the data is also transmitted over line 704 with the line shielded carrying the return signal currents for both data and clock signals.

Data in channel $D_1$ destined for special circuits module 522 is inputted to shift register type storage circuitry 705 for transmittal to module 522. Display data $D_0$–$D_7$ is also inputted to main panel interface module 526. Address information in bus 507 is converted to single ended output by couplers 700 and transmitted to Input Matrix Module 524 to address host machine inputs.

CPU interface module 504 includes fault detector circuitry 706 for monitoring both faults occurring in host machine 10 and faults or failures along the buses, the latter normally comprising a low voltage level or failure in one of the system power lines. Machine faults may comprise a fault in CPU module 500, a belt mistrack signal from sensor 27 (see FIG. 2), opening one of the machine doors or covers as responded to by conventional cover interlock sensors (910), a fuser over temperature as detected by sensor 175, etc. In the event of a bus fault, a reset signal (RESET) is generated automatically in line 709 to CPU module 500 (see FIGS. 17 and 18a) until the fault is removed. In the event of a machine fault, a signal is generated in line 710 to actuate a suitable relay (not shown) controlling power to all or a portion of host machine 10. A load disabling signal (LOAD DISBL) is inputted to DATA receiving optical couplers 700 via line 708 in the event of a fault in CPU module 500 to terminate input of data to host machine 10. Other fault conditions are monitored by the software background program. In the event of a fault, a signal is generated in line 711 to the digital display on control console 800 (via main panel interface module 526) signifiying a fault.

Figure 27:
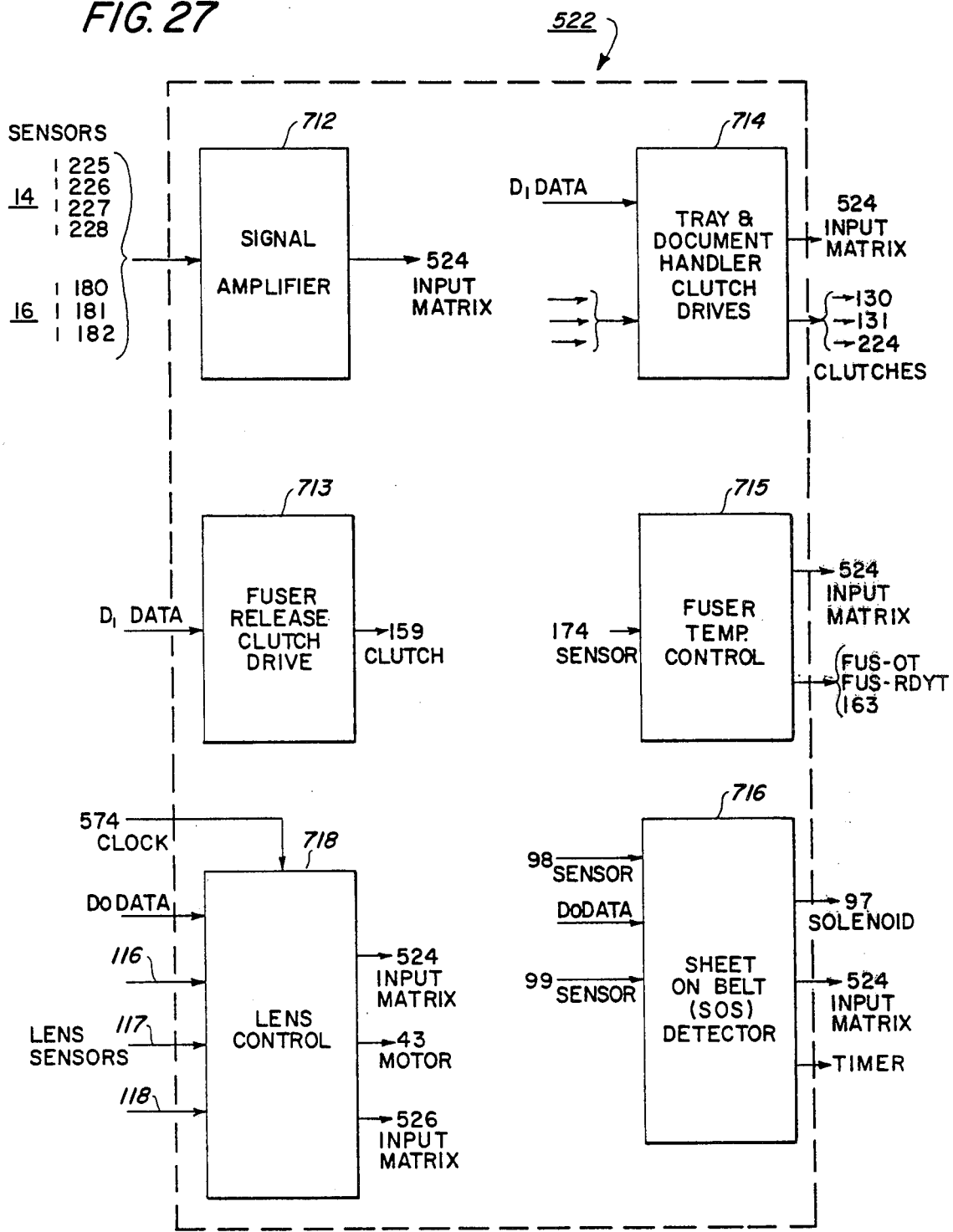
FIG. 27 is a block diagram of the apparatus special circuits module.

Referring particularly to FIGS. 25 and 27, special circuits module 522 comprises a collection of relatively independent circuits for either monitoring operation of and/or driving various elements of host machine 10. Module 522 incorporates suitable circuitry 712 for amplifying the output of sensors 225, 226, 227, 228 and 280, 281, 282 of sorter 14 and document handler 16 respectively; circuitry 713 for operating fuser release clutch 159; and circuitry 714 for operating main and auxiliary paper tray feed roll clutches 130, 131 and document handler feed clutch 244.

Additionally, fuser detection circuitry 715 monitors temperature conditions of fuser 150 as responded to by sensor 174. On overheating of fuser 150, a signal (FUSOT) is generated to turn heater 163 off, actuate clutch 159 to separate fusing and pressure rolls 160, 161; trigger trap solenoid 158 to prevent entrance of the next copy sheet into fuser 150, and initiate a shutdown of host machine 10. Circuitry 715 also cycles fuser heater 163 to maintain fuser 150 at proper operating temperatures and signals (FUS-RDYT) host machine 10 when fuser 150 is ready for operation.

Circuitry 716 provides closed loop control over sensor 98 which responds to the presence of a copy sheet 3 on belt 20. On a signal from sensor 98, solenoid 97 is triggered to bring deflector 96 into intercepting position adjacent belt 20. At the same time, a backup timer (not shown) is actuated. If the sheet is lifted from the belt 20 by deflector 96 within the time alloted, a signal from sensor 99 disables the timer and a misstrip type jam condition of host machine 10 is declared and the machine is stopped. If the signal from sensor 99 is not received within the allotted time, a sheet on selenium (SOS) type jam is declared and a immediate machine stop is effected.

Circuitry 718 controls the position (and hence the image reduction effected) by the various optical elements that comprise main lens 41 in response to the reduction mode selected by the operator and the signal inputs from lens position responsive sensors 116, 117, 118. The signal output of circuitry 718 serves to operate lens drive motor 43 as required to place the optical elements of lens 41 in proper position to effect the image reduction programmed by the operator.

Figure 28:
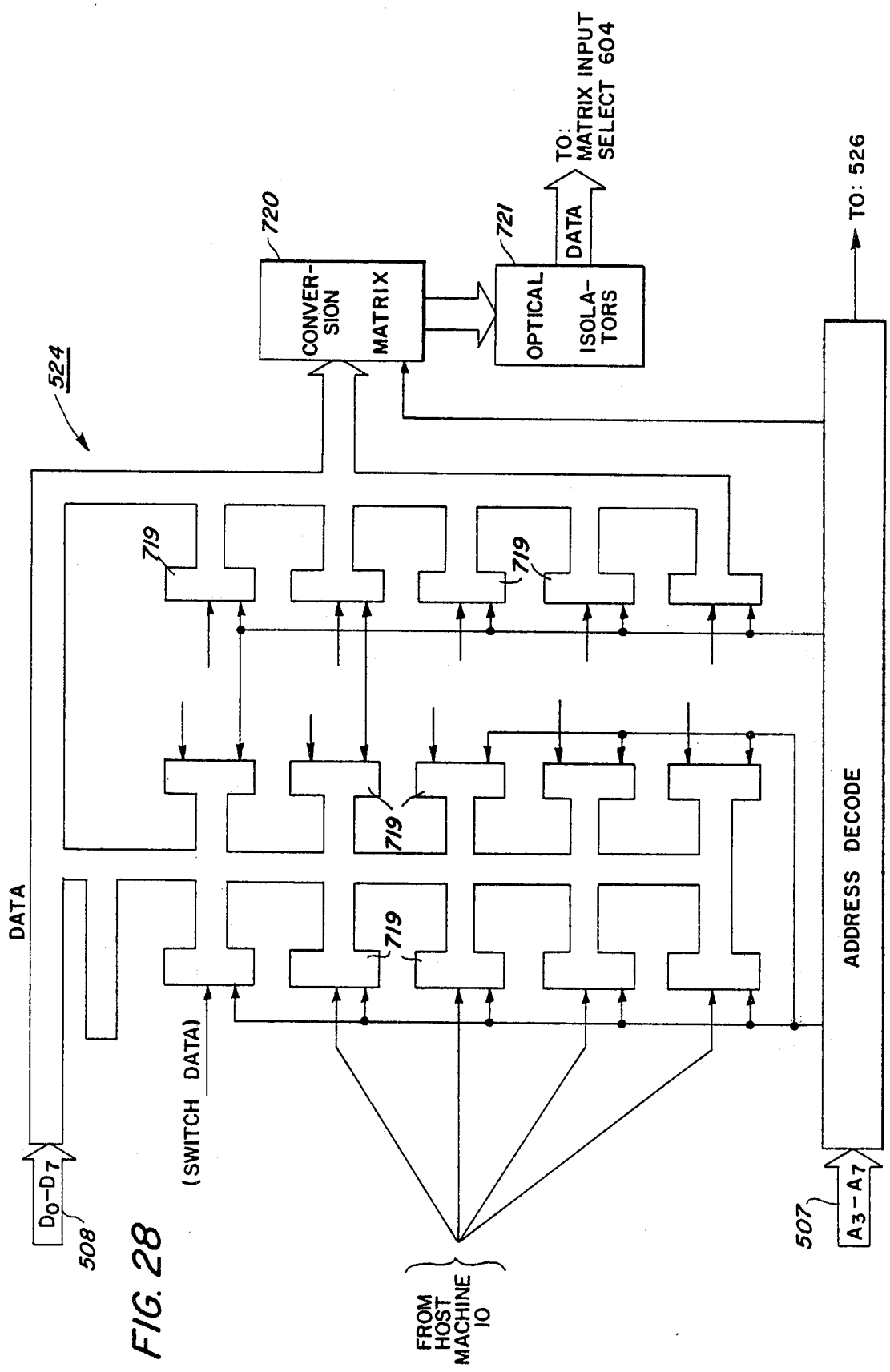
FIG. 28 is a block diagram of the main panel interface module.

Referring to FIG. 28, input matrix module 524 provides analog gates 719 for receiving data from the various host machine sensors and inputs (i.e. sheet sensors 135, 136; pressure sensor 157; etc), and data (SWITCH DATA) from the various switches on Console 800 (FRONT PANEL SWITCHES—FIG. 25) module 524 serving to convert the signal input to a byte oriented output for transmittal to I/O module 502 under control of Input Matrix Select 604 (FIG. 23b). The byte output to module 524 is selected by address information inputted on bus 507 and decoded on module 524. Conversion matrix 720, which may comprise a diode array, converts the input logic signals of "0" to logic "1" true. Data from input matrix module 524 is transmitted via optical isolators 721 to Input Matrix Select 604 of I/O module 502 (FIG. 23b). From there, the data is transmitted through Multiplexer 624 and buffers 620 to CPU Module 500.

Figure 29:
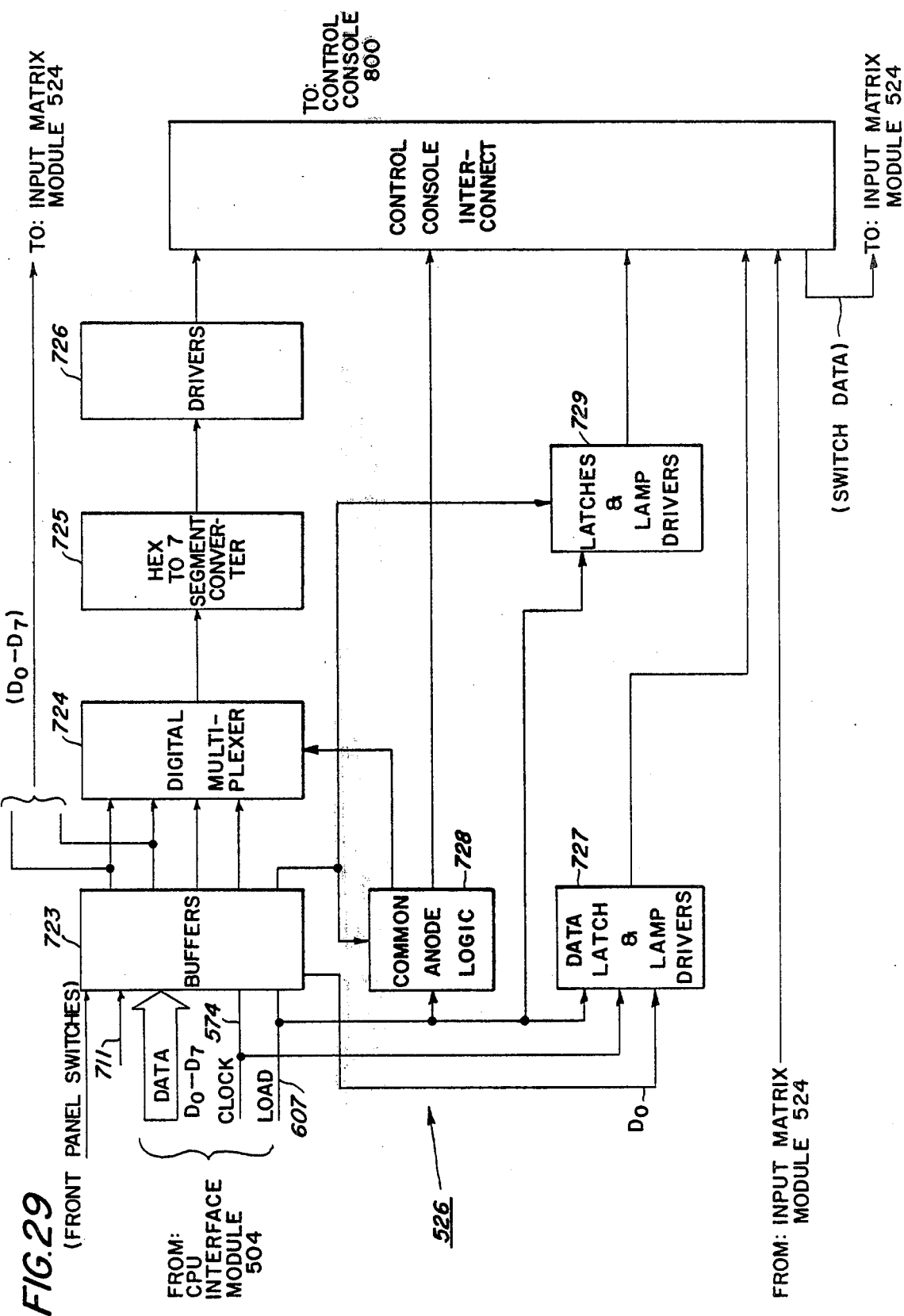
FIG. 29 is a block diagram of the input matrix module.

Referring particularly to FIG. 29, main panel interface module 526 serves as interface between CPU interface module 504 and operator control console 800 for display purposes and as interface between input matrix module 524 and the console switches. As described, data channels DO-D7 have data bits in each channel associated with the control console digital display or lamps. This data is clocked into buffer circuitry 723 and from there, for digital display, data in channels D1-D7 is inputted to multiplexer 724. Multiplexer 724 selectively multiplexes the data to HEX to 7 segment converter 725. Software controlled output drivers 726 are provided for each digit which enable the proper display digit in response to the data output of converter 725. This also provides blanking control for leading zero suppression or inter digit suppression.

Buffer circuitry 723 also enables through anode logic 728 the common digit anode drive. The signal (LOAD) to latch and lamp driver control circuit 729 regulates the length of the display cycle.

For console lamps 830, data in channel D0 is clocked to shift register 727 whose output is connected by drivers to the console lamps. Access by input matrix module 524 to the console switches and keyboard (FRONT PANEL SWITCHES) is through main panel interface module 526.

The machine output sections 530, 532, 534, 536, 538, 540 are interfaced with I/O module 502 by CPU interface module 504. At each interrupt/refresh cycle, data is outputted to sections 530, 532, 534, 536, 538, 540 at the clock signal rate in line 574 over data channels D2, D3, D4, D5, D6, D7 respectively.

Figure 30:
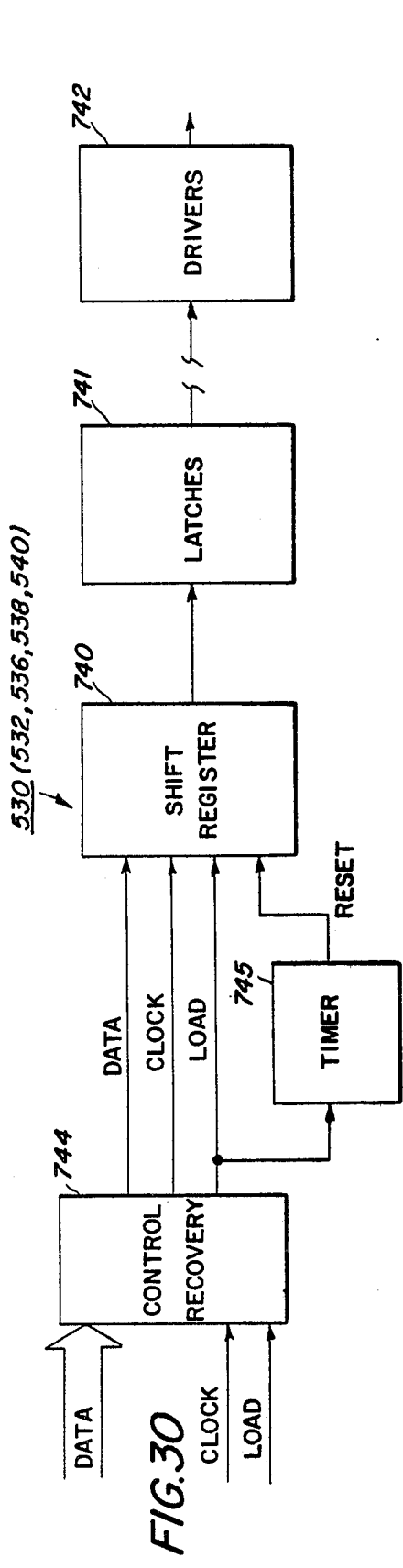
FIG. 30 is a block diagram of a typical remote.

Referring to FIG. 30, wherein a typical output section i.e. document handler section 530 is shown, data inputted to section 530 is stored in shift register/latch circuit combination 740, 741 pending output to the individual drivers 742 associated with each machine component. Preferably d.c. isolation between the output sections is maintained by the use of transformer couple differential outputs and inputs for both data and clock signals and a shielded twisted conductor pair. Due to transformer coupling, the data must be restored to a d.c. waveform. For this purpose, control recovery circuitry 744, which may comprise an inverting/non-inverting digital comparator pair and output latch is provided.

The LOAD signal serves to lockout input of data to latches 741 while new data is being clocked into shift register 740. Removal of the LOAD signal enables commutation of the fresh data to latches 741. The LOAD signal also serves to start timer 745 which imposes a maximum time limit within which a refresh period (initiated by Refresh Control 605) must occur. If refresh does not occur within the prescribed time limit, timer 745 generates a signal (RESET) which sets shift register 740 to zero.

With the exception of sorter section 534 discussed below, output sections 532, 536, 538 and 540 are substantially identical to document handler section 530.

Figure 31:
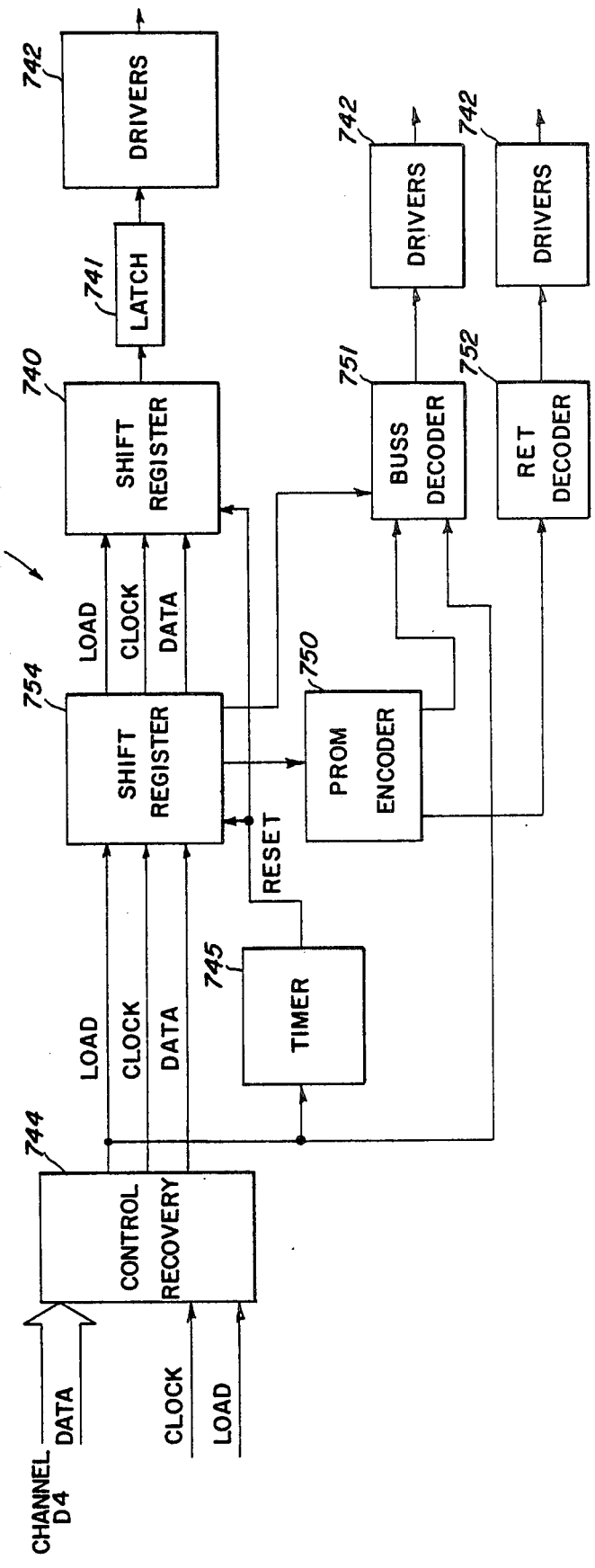
FIG. 31 is a block diagram of the sorter remote.

Referring to FIG. 31 wherein like numbers refer to like parts, to provide capacity for driving the sorter deflector solenoids 217, a decode matrix arrangement consisting of a Prom encoder 750 controlling buss decoder (BUSS DECODER) 751 and return decoder, 752 (RET DECODER) is provided. The output of decoders 751, 752 drive the sorter solenoids 217 of upper and lower bin arrays 210, 211 respectively. Data is inputted to encoder 750 by means of shift register 754.

Figure 32:
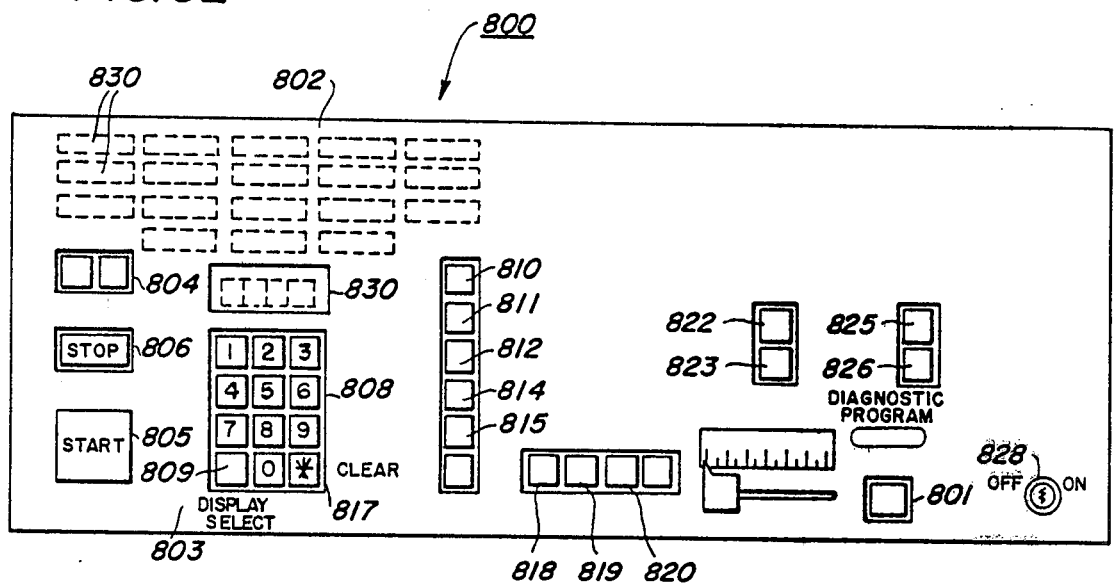
FIG. 32 is a view of the control console for inputting copy run instructions to the apparatus shown in FIG. 1.

Referring now to FIG. 32, control console 800 serves to enable the operator to program or condition host machine 10 to perform the copy run or runs desired. At the same time, various indicators on console 800 reflect the operational status of machine 10. Console 800 includes a bezel housing 802 suitably supported on host machine 10 at a convenient point with decorative front or face panel 803 on which the various machine programming buttons and indicators appear. Programming buttons include power on/off buttons 804, start print (PRINT) buttons 805, stop print (STOP) button 806 and keyboard copy quantity selector 808. A series of feature select buttons consisting of auxiliary paper tray button 810, two sided copy button 811, copy lighter button 814, and copy darker button 815, are provided.

Additionally, image size selector buttons 818, 819, 820; multiple or single document select buttons 822, 823 for operation of document handler 16; and sorter sets or stacks buttons 825, 826 are provided. An on/off service selector 828 is also provided for activation during machine servicing. Other buttons and selection devices are also provided as will be later described.

Indicators comprise program display lamps 830 and displays such as READY, WAIT, SIDE 1, SIDE 2, ADD PAPER, CHECK STATUS PANEL, PRESS FAULT CODE, QUANTITY COMPLETED, CHECK DOORS, UNLOAD AUX TRAY, CHECK DOCUMENT PATH, CHECK PAPER PATH, JOB INCOMPLETE and UNLOAD SORTER. Other display information may be envisioned.

MACHINE OPERATION

As will appear, host machine 10 is conveniently divided into a number of operational states. The copy control program is divided into background routines and foreground routines with operational control normally residing in the background routine or routines appropriate to the particular machine state then in effect. The output buffer 546' of RAM memory section (DATA OUT) is used to transfer/refresh control data to the various remote locations in host machine 10, control data from both background and foreground routines being inputted to RAM memory section 546 for subsequent transmittal to host machine 10. Transmittal/refresh of control data presently in output buffer (DATA OUT) of section 546 is effected through Direct Memory access (DMA) under the aegis of a Machine Clock interrupt routine.

Foreground routine control data which includes a Run Event Table built in response to the particular copy run or runs programmed, is transferred to output buffer (DATA OUT) of RAM section 546 by means of a multiple prioritized interrupt system wherein the background routine in process is temporarily interrupted while fresh foreground routine control data is inputted to the RAM output buffer following which the interrupted background routine is resumed.

The copy control program for host machine 10 is divided into a collection of foreground tasks, some of which are driven by the several interrupt routines, and others by the background or non-interrupt routines. Foreground tasks are tasks that generally require frequent servicing, high speed response, or synchronization with the host machine 10. Background routines are related to the state of host machine 10, different background routines being performed with different machine states. The copy control program includes a single background software routine (STCK) composed of specific subroutines associated with the principal operating states of host machine 10 is provided. A byte called STATE contains a number indicative of the current operating state of host machine 10. The machine STATES are as follows:

| STATE NO. | MACHINE STATE | CONTROL SUBR. |
|---|---|---|
| 0 | Software Initialize | INIT |
| 1 | System Not Ready | NRDY |
| 2 | System Ready | RDY |
| 3 | Print | PRINT |
| 4 | System Running, Not Print | RUNNPRT |
| 5 | Service | TECHREP |

Figure 33:
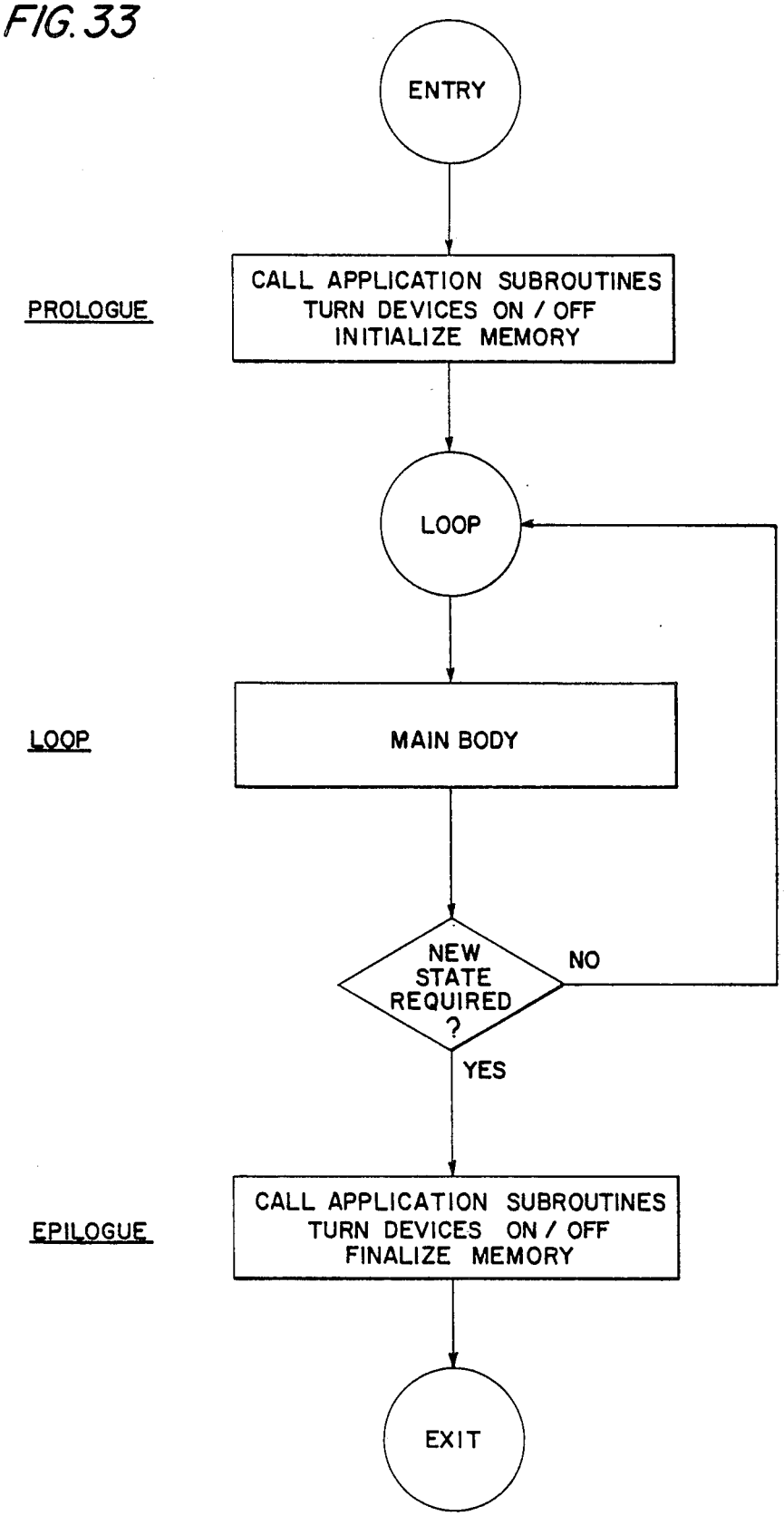
FIG. 33 is a flow chart illustrating a typical machine state.

Referring to FIG. 33, each STATE is normally divided into PROLOGUE, LOOP and EPILOGUE sections. As will be evident from the exemplary background program STCK reproduced in TABLE I, entry into a given STATE (PROLOGUE) normally causes a group of operations to be performed, these consisting of operations that are performed once only at the entry into the STATE. For complex operations, a CALL is made to an applications subroutine therefor. Relatively simpler operations (i.e. turning devices on or off, clearing memory, presetting memory, etc.) are done directly.

Once the STATE PROLOGUE is completed, the main body (LOOP) is entered. The routine remains in this LOOP until a change of STATE request is received and honored. On a change of STATE request, the STATE EPILOGUE is entered wherein a group of operations are performed, following which the STATE moves into the PROLOGUE of the next STATE to be entered.

Figure 34:
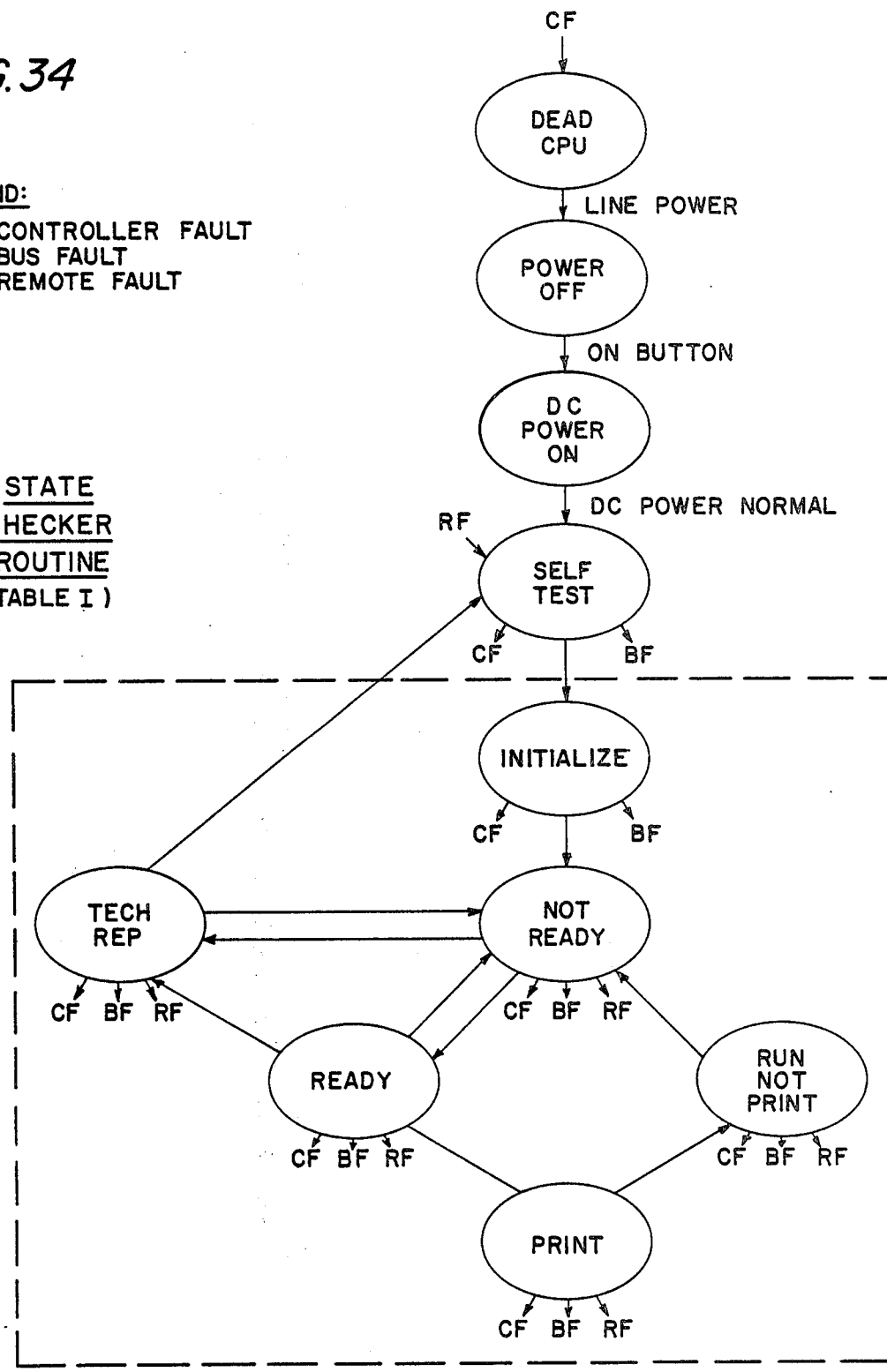
FIG. 34 is a flow chart of the machine state routine.

Referring to FIG. 34 and the routines reproduced in TABLE I. On actuation of the machine POWER-ON button 804 (FIG. 32), the software Initialize STATE (INIT) is entered. In this STATE, the controller is initialized and a software controlled self test subroutine is entered. If the self test of the controller is successfully passed, the System Not Ready STATE (NRDY) is entered. If not, a fault condition is signaled.

In the System Not Ready STATE (NRDY), background subroutines are entered. These include setting of Ready flags, control registers, timers, and the like; turning on power supplies, the fuser, etc. initializing the Fault Handler, checking for paper jams (left over from a previous run), door and cover interlocks, fuser temperatures, etc. During this period, the WAIT lamp on console 800 is lit and operation of host machine 10 precluded.

When all ready conditions have been checked and found acceptable, the controller moves to the System Ready State (RDY). The READY lamp on console 800 is lit and final ready checks made. Host Machine 10 is now ready for operation upon completion of the conditioning of the machine for the desired copy run, loading of one or more originals 2 into document handler 16 (if selected by the operator), and actuation of START PRINT button 805. As will appear hereinafter, the next state is PRINT wherein the particular copy run selected is carried out.

While the machine is completing a copy run, the controller normally enters the Run Not Print State (RUNNPRT) where the controller calculates the number of copies delivered, resets various flags, stores certain machine event information in the memory, as well as generally conditioning the machine for another copy run, if desired. The controller then returns to the System Not Ready State (NRDY) to recheck for ready conditions prepatory for another copy run, with the same state sequence being repeated until the machine is turned off by actuation of POWER OFF button 804 or a malfunction inspired shutdown is triggered. Hence, the copy control program comprises the routines in states 0–4. In contrast, the last state (TECH REP - 5) is a machine servicing state wherein different operating programs can be accessed as will later be described.

Referring particularly to FIG. 32 and Tables II, III, IV, V, VI and VII, the machine operator uses control console 800 to condition the machine for the copy run desired. Conditioning may be done during either the System Not Ready (NRDY) or System Ready (RDY) states, although the machine will not operate during the System Not Ready state should START PRINT button 805 be pushed. The copy run conditioning includes selecting (using keyboard 808) the number of copies to be made, and such other ancillary features as may be desired, i.e. use of auxiliary paper tray 102, (push button 810), image size selection (push buttons 818, 819, 820), document handler/sorter selection (push buttons 822, 823, 825, 826), copy density (push buttons 814, 815), duplex or two sided copy button 811, etc. On completion of the copy run START PRINT button 805 is actuated to start the copy run selected (presuming the READY lamp is on and an original or originals 2 have been placed in tray 233 of document handler 16 if the document handler has been selected).

After the operator selects the various features, controller 18 enters a Digit Input routine in which the conditioning information is transferred to RAM section 546. The copy run conditioning data passes via Main Panel Interface Module 526 to Input Matrix Module 524 and from there is addressed through Matrix Input Select 604, Multiplexer 624, and Buffers 620 of I/O Module 502 to RAM section 546 of CPU Module 500.

On entering PRINT STATE, a Run Event Table (FIG. 35) comprised of foreground tasks is built for operating in cooperation with the background tasks the various components of host machine 10 in an integrated manner to produce the copies desired. The run Event Table is formed by controller 18 through merger of a Fixed Pitch Event Table (TABLE II) (stored in ROM 545 and Non Volatile Memory 610) and a Variable Pitch Event Table (TABLE III) in a fashion appropriate to the parameters of the job selected.

The Fixed Pitch Event Table (TABLE II) is comprised of machine events whose operational timing is fixed during each pitch cycle such as the timing of bias to transfer roll 75, (TRN 2 CURR), actuating toner concentration sensor 65 (ADC ACT), loading roll 161 of fuser 150 (FUS*LOAD), and so forth, irrespective of the particular copy run selected. The Variable Pitch Table (TABLE III) is comprised of machine events whose operational timing varies with the individual copy run, i.e. timing of pitch fadeout lamp 44 (FO*ONBSE) and timing of flash illumination lamps 37 (FLSH BSE). The variable Pitch Table is built by the Pitch Table Builder (TABLE IV) from the copy run conditioning information coupled with event address information from ROM section 545, sorted by absolute clock count (via the routine shown in TABLE V), and stored in RAM section 546 (via the routine shown in TABLE VI). The Fixed Pitch Event Table and Variable Pitch Table are merged with the relative clock count differences between Pitch events calculated to form a Run Event Table (TABLE VII).

Figure 35:
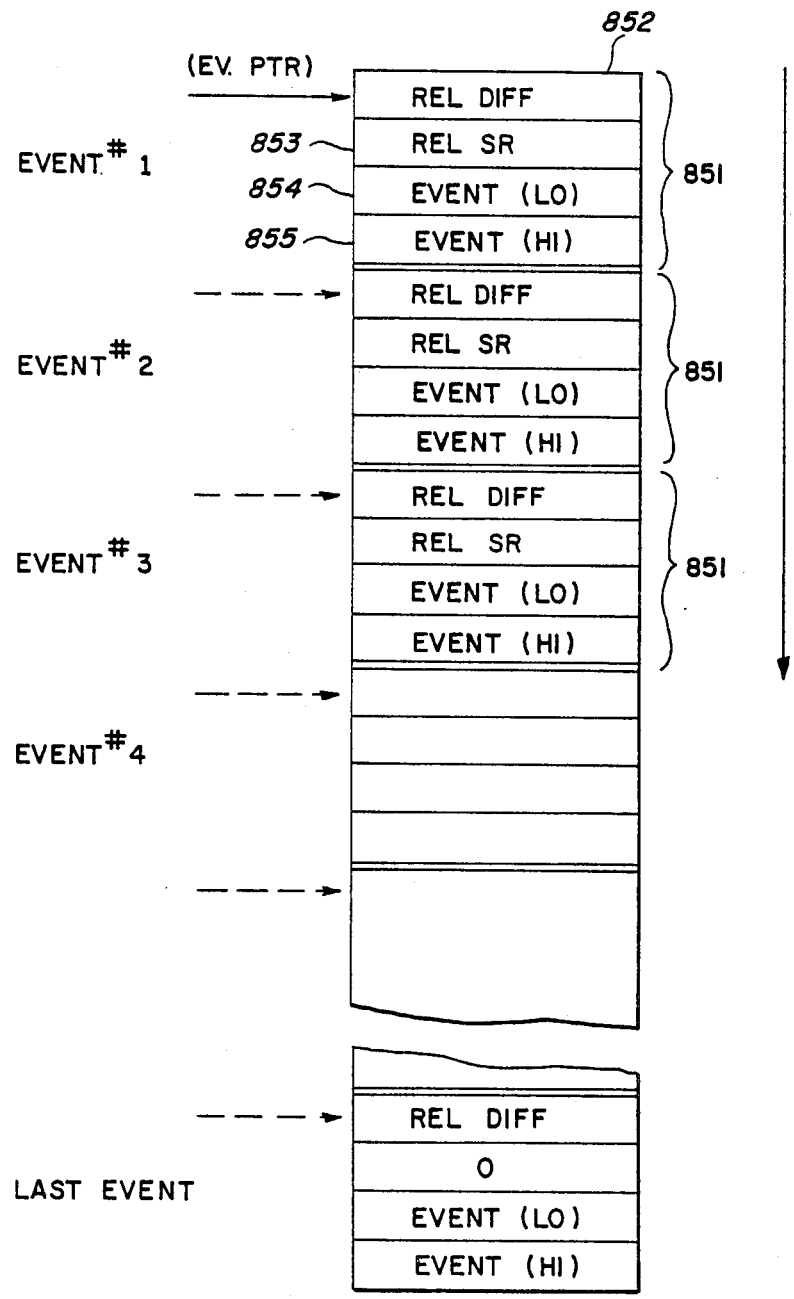
FIG. 35 is a view showing the event table layout.
Figure 36:
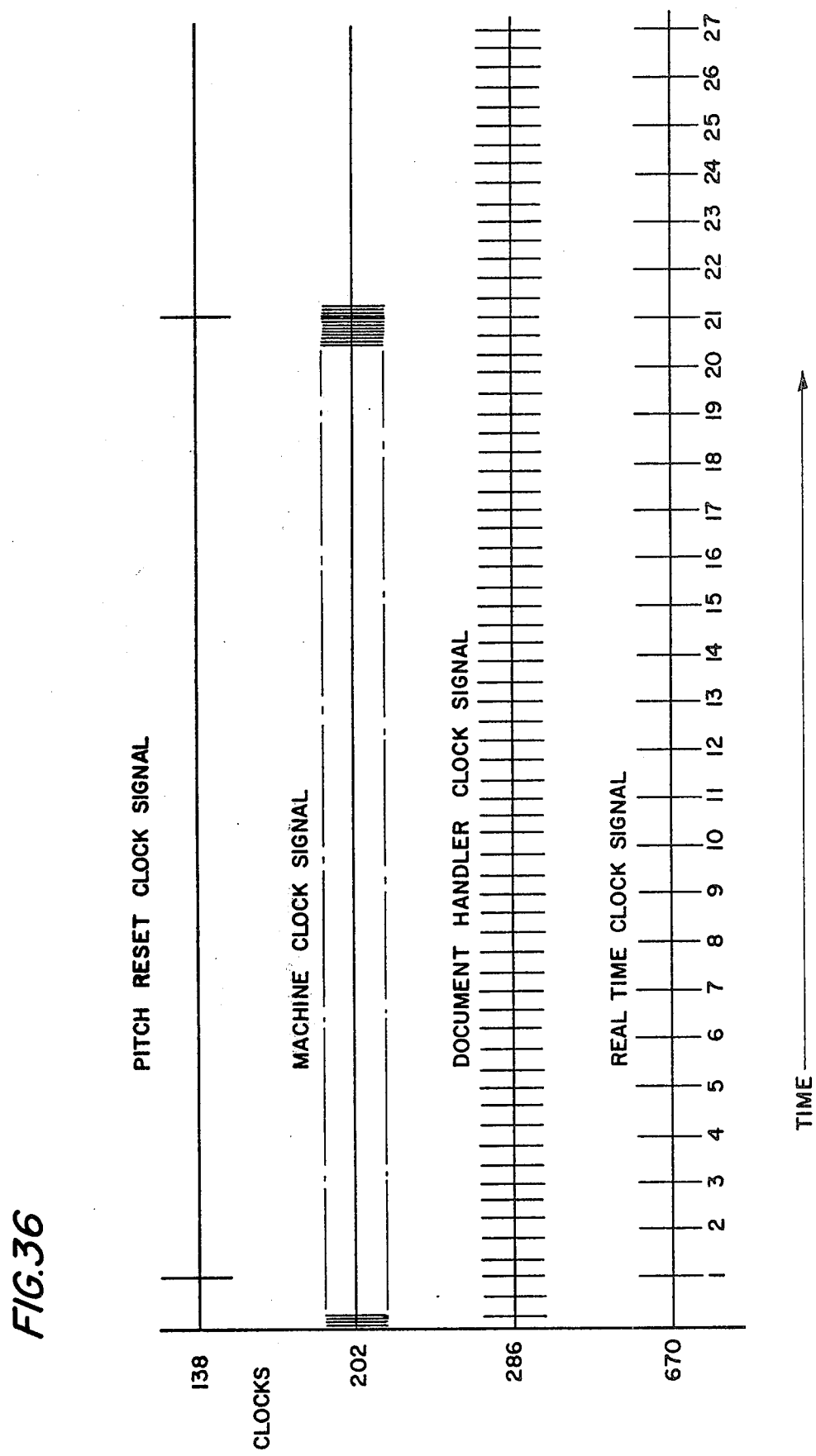
FIG. 36 is a chart illustrating the relative timing sequences of the clock interrupt pulses.

Referring particularly to FIG. 35, the Run Event Table consists of successive groups of individual events 851. Each event 851 is comprised of four data blocks, data block 852 containing the number of clock pulses (from machine clock 202) to the next scheduled pitch event (REL DIFF), data block 853 containing the shift register position associated with the event (REL SR), and data blocks 854, 855 (EVENT LO) (EVENT HI) containing the address of the event subroutine.

In machine states other than PRINT, data blocks 852, 853 (REL DIFF) (REL SR) are set to zero. Data blocks 854, 855 hold the address information for the Non-Print state event.

Control Data in the Run Event Table represents a portion of the foreground tasks and is transferred to the output buffer 546' of RAM memory section 546 by the Pitch Reset and Machine Clock interrupt routines. Other control data, representing foreground tasks not in the Run Event Table is transferred to RAM output buffer 546' by the Real Time Clock interrupt routine. Transfer of the remainder of the control data to output buffer 546' is by means of background (non-interrupt) routines.

Transfer of control data from output buffer 546' of RAM memory section 546 to the various locations in host machine 10 is through output Refresh via Direct Memory access (DMA) in response to machine clock interrupt signals as will appear. The interrupt routines are initiated by the respective interrupt signals.

Referring particularly to FIGS. 23 and 35–37 and TABLES VII, VIII the interrupt having the highest priority, the Pitch Reset interrupt (signal 640), is operable only during the PRINT state, and occurs once each revolution of sheet register fingers 141 as responded to by sensor 146 of pitch reset clock 138. At each pitch reset interrupt signal, after a determination of priority by Priority Chip 659 in the event of multiple interrupt signals, and interrupt signal (INT) is generated. The acknowledgement signal (INTA) from processor 542 initiates the pitch reset interrupt routine.

On entering the pitch reset routine, the interrupt is re-enabled and the contents of the program working registers stored. A check is made to determine if building of the Run Event Table is finished. Also checks are made to insure that a new shift register schedules have been built and at least 910 clock counts since the last pitch reset have elapsed. If not, an immediate machine shutdown is initiated.

Presuming that the above checks are satisfactory, the shift register pointer (SR PTR), which is the byte variable containing the address of a pre-selected shift register position (SR O), is decremented by one and adjusted for overflow and the shift register contents are updated with a byte variable (SR+VALUV) containing the new shift register value to be shifted in following the next pitch reset interrupt. The event pointer (EV*PTR), a two byte variable containing the full address of the next scheduled event, is reset to Event #1. The count in the C register equals the time to the first event.

Machine Cycle Down, Normal Down, and Side One Delay checks are made, and if negative, the count on a cycle up counter (CYC UP CT) is checked. If the count is less than a predetermined control count (i.e. 5), the counter (CYC UP CT) is incremented by one. When the count on the cycle up counter equals the control count, an Image Made Flag is set.

If a Normal Down, Cycle Down, or Side One Delay has been initiated, the cycle up counter (CYC UP CT) is reset to a preset starting count (i.e. 2). The pitch reset interrupt routine is exited with restoration of the working registers and resetting of pitch reset flip flop 647.

The Machine Clock Interrupt routine, which is second in priority, is operative in all operational states of host machine 10. Although nominally driven by machine clock 202, which is operative only during Print state when processor main drive motor 34 is energized, machine clock pulses are also provided by phase locked loop 649 when motor 34 is stopped.

Referring particularly to FIG. 38 and TABLE IX, entry to the Machine Clock interrupt routine there shown is by a signal (INTA) from processor 542 following a machine clock interrupt signal 642 as described earlier. On entry, the event control register (C REG) is obtained and the working register contents stored. The C REG is decremented by one, the register having been previously set to a count corresponding to the next event in the Event Run Table.

The control register (C REG) is checked for zero. If the count is not zero and is an odd number, an output refresh cycle is initiated to effect transfer/refresh of data in RAM output buffer 546' to host machine 10. If the number is even, or following an output refresh, the interrupt system is re-enabled, the machine clock interrupt flip flop 651 is reset and the working registers are restored. Return is then made to the interrupted routine.

If the control register (C REG) count is zero, the Event Pointer (EV*PTR), which identifies the clock count (in data block 852) for the next scheduled event (REL DIFF), is loaded and the control register (C REG) reset to a new count equal to the time to the next event. The Event Pointer (EV*PTR) is incremented to the relative shift register address for the event (REL SR, data block 853), and the shift register address information is set in appropriate shift registers (B, D, E, A registers).

The event Pointer (EV*PTR) is incremented successively to the event subroutine address information (EVENT LO) (EVENT HI) in the Event Run Table, and the address information therefrom loaded into a register pair (D & E registers). The Event Pointer (EV PTR) is incremented to the first data block (REL DIFF) of the next succeeding event in the Run Event Table, saved, and the register pair (H & L registers) that comprise the Event Pointer are loaded with the event subroutine address from the register pair (D & E registers) holding the information. The register pair (D & E registers) are set to the return address for the Event Subroutine. Using the address information, the Event Subroutine is called and the subroutine data transferred to RAM output buffer 546' for transfer to the host machine on the next Output Refresh.

Following this, the Machine Clock interrupt routine is exited as described earlier.

The Output Refresh cycle alluded to earlier functions, when entered, to transfer/refresh data from the output buffer of 546' RAM section 546 to host machine 10. Direct Memory Access (DMA) is used to insure a high data transfer rate.

On a refresh, Refresh Control 605 (see FIG. 23) raises the HOLD line to processor 542, which on completion of the operation then in progress, acknowledges by a HOLD A signal. With processor 542 in a hold mode and Address and Data buses 507, 508 released to I/O Module 502 (through operation of tri-state buffers 510, 511, 563, 570), the I/O module then sequentially accesses the output buffer 546' of RAM section 546 and transfers the contents thereof to host machine 10. Data previously transferred is refreshed.

The Real Time Interrupt, which carries the lowest priority, is active in all machine states. Primarily, the interrupt acts as an interval timer by decrementing a series of timers which in turn serve to control initiation of specialized subroutines used for control and error checking purposes.

Figure 39B:
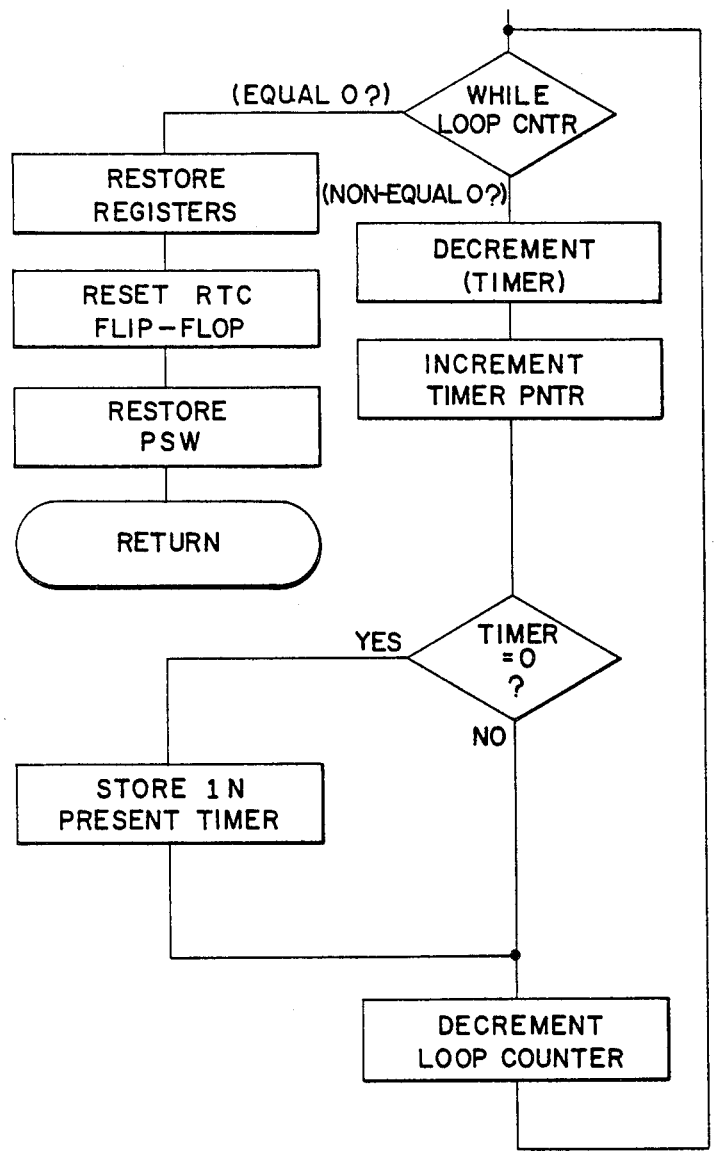
Figure 40A:
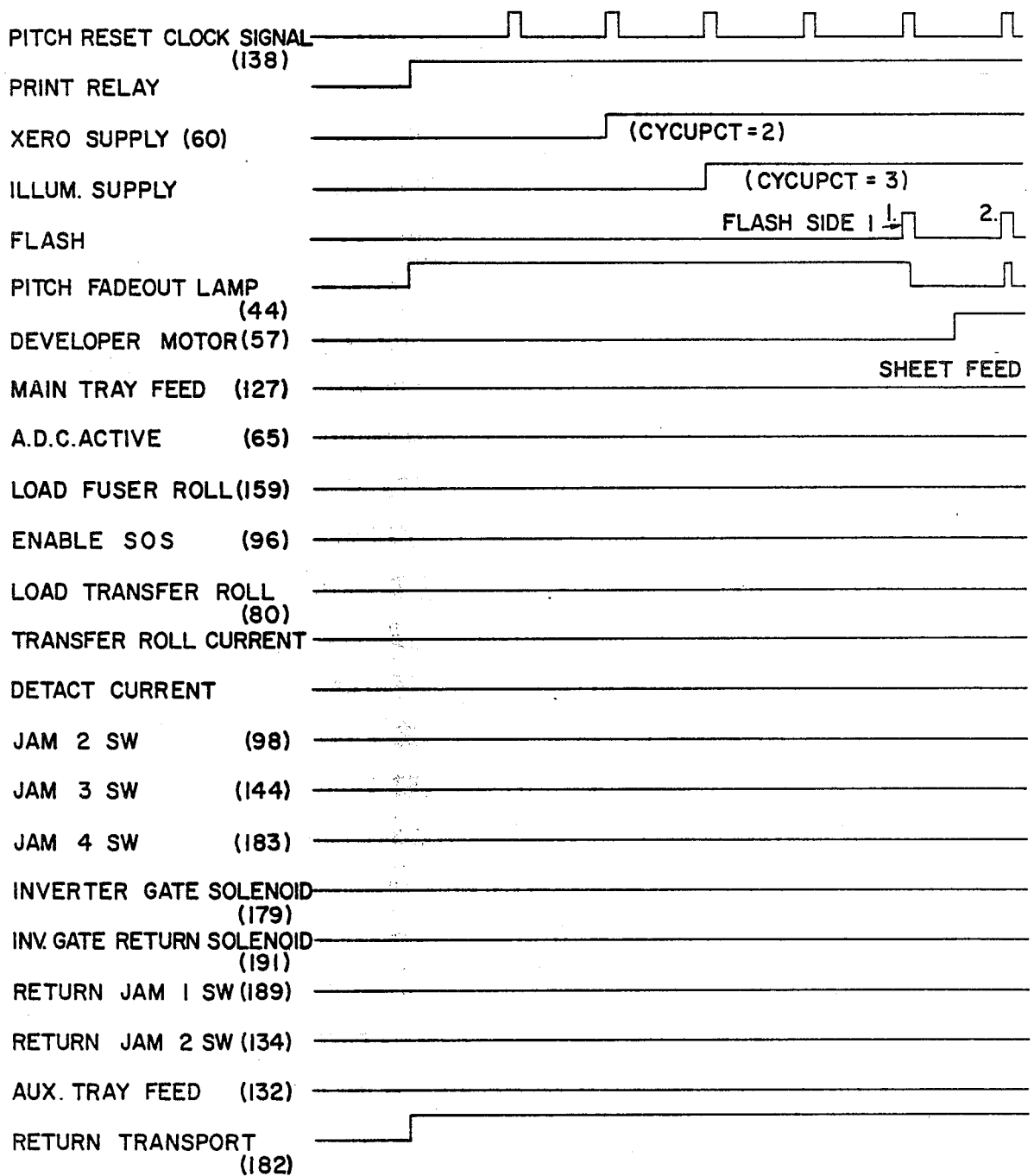
Figure 40C:
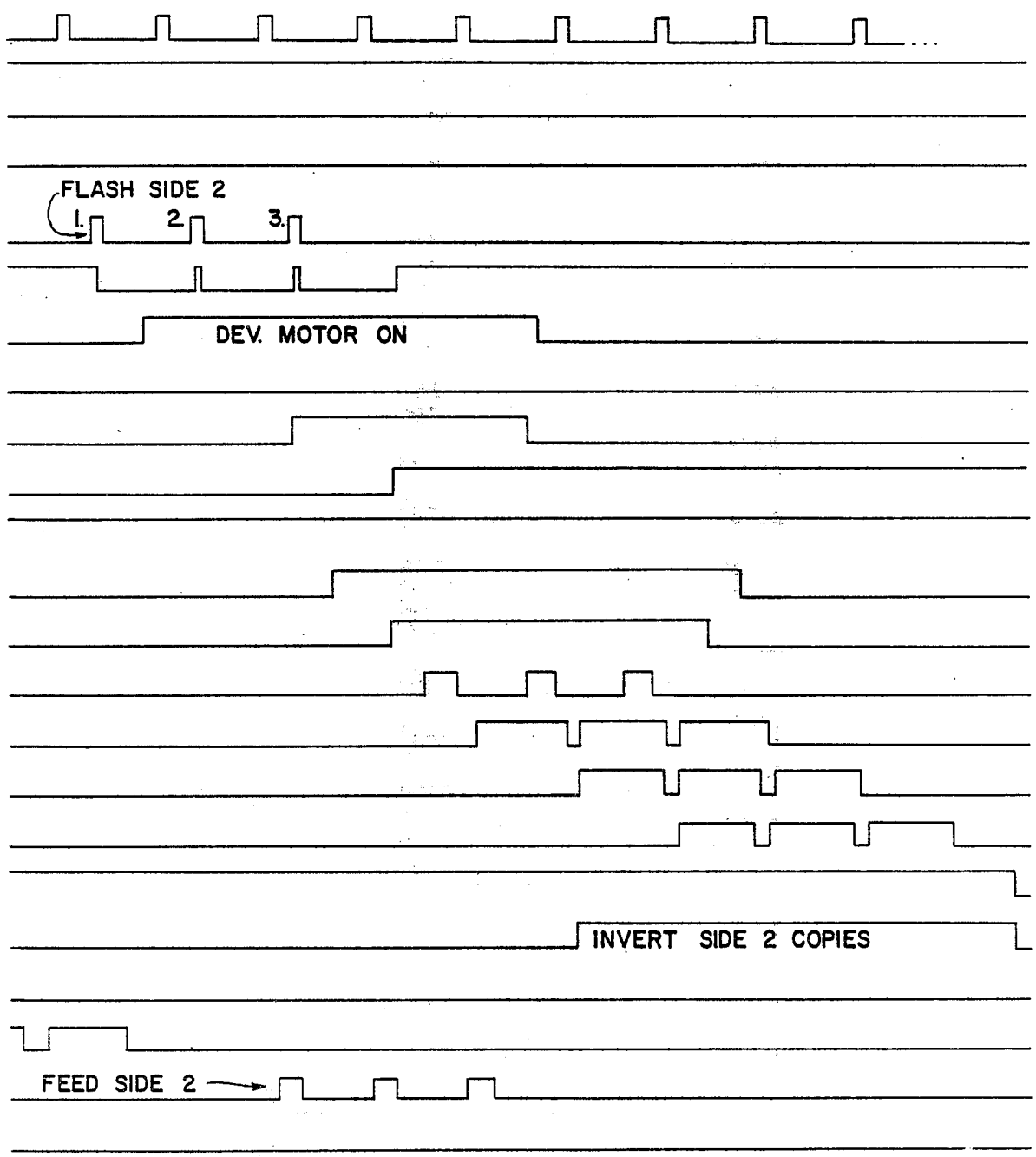

Referring particularly to FIG. 39 and TABLE X, the Real Time interrupt routine is entered in the same manner as the interrupt routines previously described, entry being in response to a specific RESTART instruction code assigned to the Real Time interrupt. On entry, the interrupt is re-enabled and the register contents stored. The timer pointer (PNTR) for the first class of timers (i.e. 10 msec TIMERS) is loaded, and a loop counter identifying the number of timers of this class (i.e. 10 msec TIMERS) preset. A control register (E REG) is loaded and a timer decrementing loop is entered for the first timer. The loop decrements the particular timer, increments the timer pointer (PNTR) to the location of the next timer in this class, checks the timer count, and decrements the loop counter. The decrementing loop routine is repeated for each timer in the class (i.e. 10 msec TIMERS) following which a control counter (CNTR) for the second group of timers (i.e. 100 msec TIMERS) is decremented by one and the count checked.

The control counter (CNTR) is initially set to a count equal to the number of times of the first timer interval is divisible into the second timer interval. For example, if the first class of timers are 10 msec timers and the second timer class are 100 msec timers, the control counter (CNTR) is set at 10 initially and decremented on each Real Time interrupt by one down to zero.

If the count on the control counter (CNTR) is not zero, the registers are restored, Real Time interrupt flip flop 856 reset, and the routine exited. If the count on the control counter is zero, the counter is reloaded to the original maximum count (i.e. 10) and a loop is entered decrementing individually the second group of timers (i.e. 100 msec TIMERS). On completion, the routine is exited as described previously. Other TIMERS can be envisioned which are implemented in the same manner.

In the following TABLES:

"@"- is used to indicate flags, counters and subroutine names.

"#"- is used to indicate input signals.

"$"- is used to indicate output signals.

":"- is used to indicate macro instructions, system subroutines, system flags, and data, etc.

For further explanation of the mnemonics and particular instructions utilized by the following routines, the reader is directed to Intel Corporation's Programming Manual for the 8080 Microcomputer Sytem.

TABLE I

```
99                          *NAR
100                          *
101                          *     INITIALIZE   STATE
102                          *
103                          *     INIT: SUBROUTINE
104                          *
105                          *     INITIALIZE STATE- EXECUTED AFTER EACH START OR RESTART.  SETS
106                          *     ALL POINTERS, FLAGS, AND DATA TO INITIAL VALUES REQUIRED TO
107                          *     START EXECUTION OF ANY CONTROL ALGORITHMS.  ALWAYS EXITS TO
108                          *     'NOT READY' STATE.
110                          *     EPILOG
112   05 00000   3E0A    A   INIT:  MVI    A,10
113   05 00002   3252FD  N          STA    DIVD:10                   INITIALIZE TO 10
114   05 00005   32B5FC  N          STA    SLOWTOGL                  INITIALIZE TO 10
115   05 00008   211907  N          LXI    H,EV@STBYI                H&L= ADDR OF STBY EVENT TABLE
116   05 0000B   2264FD  N          SHLD   EV@PTR:                   SAVE FOR MACH CLK ROUTINE
117   05 0000E   21FFFF  A          LXI    H,X'FFFF'                 INIT INSTRUMENTATION REMOTE
118   05 00011   2272FB  N          SHLD   INS@PTRR                  ADDR PNTR TO END OF RAM
119   05 00014   21FFFF  N          LXI    H,ADH@RAMT+1              SET PNTR TO RAM CNTRL TABLE
120   05 00017   2278FB  N          SHLD   TAB@STRT                  SAVE PNTR
121   05 0001A   3E7F    A          MVI    A,X'7F'                   INIT TO UN-BYPASS
122   05 0001C   328DFC  N          STA    JAM@BYPS                               ALL JAM SWS
123                          *
124                          *     TIMER INITIALIZATION
125                          *     MUST BE DONE BEFORE ANY TIMERS CAN BE USED
126                          *
127   05 0001F   211FF9  A          LXI    H,AVAIL!**8+X'1F'         SET H&L TO END OF AVAIL! TABLE
128   05 00022   36FF    A          MVI    H,X'FF'                   STORE X'FF' IN LAST TABLE ADDR
129   05 00024   3E1F    A          MVI    A,31                      SET A-REG TO VALUE TO BE STORED
130                                 REPEAT
131   05 00026   2D      A                 DCR    L                  STEP TO NEXT TABLE LOCATION
132   05 00027   77      A                 MOV    M,A                STORE INITIALIZATION VALUE
133   05 00028   3D      A                 DCR    A                  STEP TO NEXT VALUE
134   05 00029   C22600  N          UNTIL:  CC,Z,S                   IS INITIALIZATION COMPLETE
135   05 0002C   2120FE  A          LXI    H,ADR(DATA,TIME:OUT)      TO INITIALIZE TIME:OUT TABLE
136   05 0002F   225FFD  N          SHLD   INPTR:                    SET IN/OUT POINTERS TO
137   05 00032   2261FD  N          SHLD   OUTPTR:                   BEGINNING OF TIME:OUT TABLE
138                          *
139                          *     INITIALIZE SPOOL
140                          *     POINTERS
141                          *
142   05 00035   2140FE  A          LXI    H,ADR(DATA,SPL:TBL)       SET PNTRS
143   05 00038   226AFD  N          SHLD   SPL:IN                              TO START
144   05 0003B   226CFD  N          SHLD   SPL:OUT                                     OF TABLE
145                          *
146                          *     CHECK IF PAPER WAS PRESENT WHEN POWER WENT DOWN
147                          *
148   05 0003E   3AC9E2  A          RNVNIB  NV@JAM@N                 A = JAM INFO FROM POWER DOWN
149   05 00041   0F      A          RRC                              SET CARRY TO FOR JAM INFO
150   05 00042   D25A00  N          IFI    CC,C,S                    WAS THERE PAPER IN FOR AREA
151   05 00045   47      A                 MOV    B,A                YES, SAVE JAM INFO
152   05 00046   213CFD  A                 SFBIT,P FDR@AJAM,FDR@MJAM SET FEEDER JAMS
      05 00049   3E0C    A
      05 0004B   B6      A
      05 0004C   77      A
153   05 0004D   2121F9  A                 SFBIT,P BN@X@2,ON@X@3     SIGNAL TRANSPT CL'RANCE REQ'D
      05 00050   3E03    A
      05 00052   B6      A
      05 00053   77      A
154   05 00054   3E80    A                 SFLG   CLP@REQD           TELL FLT HNDLR CLEARANCE REQD
      05 00056   3267F4  A
155   05 00059   78      A                 MOV    A,B                RESTORE THE A-REG
156                                 ENDIF
157   05 0005A   0F      A          RRC                              SET CARRY TO IMED@DN:
158   05 0005B   D27100  N          IFI    CC,C,S                    WAS THERE AN IMED@DN:
159                          *
160                                        MVI    L,MSK(FBIT,L@PR@FLT,JAM2@FLT,JAM3@FLT,JAM4@FLT,)
161   05 0005E   2EFF    A                        JAM5@FLT,JAM6@FLT,RET1@FLT,RET2@FLT)
162                          *                                       SETS ALL JAM FBITS IN REG-L
163   05 00060   2603    A                 MVI    H,MSK(FBIT,S@S@JAM,MISSTRIP)
164                          *                                       SETS ADDITIONAL FBITS IN H
165   05 00062   223BFD  A                 SHLD   ADR(FBYT,PAP:1)    MOVE FBITS INTO FBYTES
166   05 00065   3E80    A                 SFLG   CLR@REQD           TELL FLT HNDLR CLEARANCE REQD
      05 00067   3267F4  A
167   05 0006A   2120F9  A                 SFBIT,P TS@FUS,TS@X@2     TURN ON UNDEDICATED MAP LAMPS
      05 0006D   3E21    A
      05 0006F   B6      A
      05 00070   77      A
168                                 ENDIF
169                                 IFI    XBYT,A,AND,!              IS EITHER SRT JAM FLAG SET
170   05 00071   E60C    A                 MSK(NVBIT,NV@L@W@J,NV@UP@J),NZ : IN NVNIB
      05 00073   CA8A00  N
171                                        IFI    XBYT,A,EQ,!        YES, ARE BOTH SET
172   05 00076   FE0C    A                        MSK(NVBIT,NV@L@W@J,NV@UP@J)
      05 00078   C28300  N
173   05 0007B   3E80    A                        SFLG   TW@@ACT     TELL SRT THAT THERE WAS A JAM
      05 0007D   3261F4  A
174   05 00080   C38700  N                 ELSE:
175   05 00083   0F      A                        RRC                GET NV@L@W@J TO SIGN BIT &
176                                                ID:READ  NV@L@W@J
177   05 00084   3237F4  A                        M@DFLG   L@W@M@D   TELL SRT IF UP OR L@W JAM
178                                        ENDIF
179   05 00087   CD0000  N                 CALL   JAM@SET            LET SRT SET JAM FLAGS & LAMPS
180                                 ENDIF
181   05 0008A   3E80    A          SFLG   SRT@RDY                   SIGNAL SRT NOT IN USE (READY)
      05 0008C   328CF7  A
```

```
182  05 0008F  3287F7   A            MODFLG   PROG@RDY                        SET PROG ROUTINE READY
183  05 00092  326BF4   A            MODFLG   2SD@ENAB                        ALLOW SELECTION OF DUPLEX MODE
184  05 00095  3EF2     A            MVI      A,X'F2'                         RE-ENABLE
185  05 00097  3200E6   A            STA      RSINTFF1                                 INTERRUPT
186  05 0009A  FB       A            EI                                                       SYSTEM
187  05 0009B  CD0000   N            SOBIT,S  NPFO$ON,24V$SPL                 PFO OFF (INVT'D) & 24V ON
     05 0009E  02       A
     05 0009F  E480     A
     05 000A1  EE80     A
188  05 000A3  CD0000   N            STIMR    FLT@DLY,25000,FLT@CHK           START LENS FAULT TIMER
     05 000A6  12       A
     05 000A7  FA       A
     05 000A8  0000     N
189  05 000AA  CD0000   N            CALL     DBC@CLR                         INITIALIZE DBC#NUM TO 1     (1)
190  05 000AD  327AFC   N            STA      CF@DIGIT                        ENABLE '0' IN QTY FLASHED   (2)
191  05 000B0  3E08     A            MVI      A,MSK(F8IT,POP@RS)              TELL FLT ASSUME
192  05 000B2  3286FC   N            STA      XP@PREV                                    BRUSH HOUSE OPN
193  05 000B5  3E02     A            MVI      A,INRDY                         INIT STCK
194  05 000B7  3254FD   N            STA      1STATE1                                 SYNCRONIZED BACKGROUND
195  05 000BA  3253FD   N            STA      STATE1                                         CONTROL LOOP
196  05 000BD  CD3702   N            CALL     NRDY:PRL                        INIT CONTROL TO NOT-READY STATE
198
199                                  ****************************************************************
200                                  *                                                              *
201                                  *   S Y C R O N I Z E D   B A C K G R O U N D   C O N T R O L   L O O P S   *
202                                  *                                                              *
                                     ****************************************************************
204                                  *   PRIORTIES:
205                                  *            FIRST    10MS TIME OUT REQUESTS
206                                  *            SECOND   10MS CALLS
207                                  *            THIRD    SPOOLED CALLS
208                                  *            FOURTH   20MS CALLS
209                                  *            FIFTH    100MS CALLS
210                                  *            SIXTH    100MS TIME OUT REQUESTS
212  05 000C0  2151FD   A            LXI      H,ADR(DATA,SB:RQST)             SET MEM PNTR TO SB BYTE
213                                  REPEAT                                   LOOP-3 FROM HLT ON ALL INTER'S
214                                    REPEAT                                 LOOP-2 BACK AFTER EACH 100MS
215                                      REPEAT                               LOOP-1 BACK AFTER EACH 20MS
216  05 000C3  7E       A              MOV      A,M                           A= SYNC BKGND REQUESTS FROM RTC
217                                    ID:READ  SB:RQST
218  05 000C4  07       A              RLC                                    TEST FOR 10MS
219  05 000C5  D2F700   N              IF:      CC,C,S                                  SB REQUEST
220
221                                  *                                        TIMER SERVICE REQUESTS
222                                  *                                        'CALLS TIMED OUT TIMER SUBRS
223                                  *                                        USING WRAP ARROUND TABLE AND
224                                  *                                        IN/OUT PNTRS - RTCI SETS
225                                  *                                        INPTR: & ENTERS CALL ADDR
226                                  *
227  05 000C8  3A5FFD   N              WHILE:   XBYT,INPTR:,NE,OUTPTR: ARE PNTRS AT SAME TABL
     05 000CB  2161FD   N
     05 000CE  BE       A
     05 000CF  CAE500   N
228  05 000D2  6E       A                MOV    L,M               SET L-REG TO ADDR(L) IN TABLE
229  05 000D3  26FE     A                MVI    H,HADR(DATA,TIME:OUT) MEM PNTR NOW SET TO
230  05 000D5  5E       A                MOV    E,M                     MOVE CALL ADDR(L) TO E
231  05 000D6  23       A                INX    H                       STEP TO NEXT TABLE BYTE
232  05 000D7  56       A                MOV    D,M                     MOVE CALL ADDR(H) TO D
233  05 000D8  23       A                INX    H                       STEP TO NEXT TABLE BYTE
234  05 000D9  7D       A                MOV    A,L                     PREPARE TO UPDATE PNTR
235                                      ID:READ  TIME:OUT              DYNAMIC TABLE CONTAINING ADDRS
236                                      MODBYT   A,AND,)               ADJUST FOR END OF TABLE
                                                  TIME:MSK
237  05 000DA  E62F     A                STA      ADR(DATA,OUTPTR:) PNTR TO ADDR OF LAST SE
238  05 000DC  3261FD   A                CALL     DE:IND                 DO TIMEOUT CALL
239  05 000DF  CD0000   N            ENDWHILE                            YES, ALL TIME OUTS SERVICED
240  05 000E2  C3C800   N                                                END TIMER SECTION
241
242  05 000E5  2A55FD   N              LHLD   10:CALLS              GET PROPER 10MS CALL TABLE
243  05 000E8  CDC000   N              CALL   HL:IND                DO 10MS CALLS
244  05 000EB  2151FD   A              LXI    H,ADR(DATA,SB:RQST) SET MEM PNTR TO SB BYTE
245  05 000EE  F3       A              DI
246  05 000EF  7E       A              MODBYT M,AND, 10:RQST REMOVE 10MS REQUEST
     05 000F0  E67F     A
     05 000F2  77       A
247
                                      ID:ALTR  SB:RQST
248  05 000F3  FB       A              EI                              (WATCH OUT FOR UNPRINTABLE NOT)
249  05 000F4  C31501   N            ELSE:                             DO ANY SPOOLED ROUTINES
250  05 000F7  3A6AFD   N              IF:    XBYT,SPL:IN,NE,SPL:OUT
     05 000FA  216CFD   N
     05 000FD  BE       A
     05 000FE  CA1101   N
251  05 00101  6E       A                MOV    L,M
252  05 00102  26FE     A                MVI    H,HADR(DATA,SPL:TBL)
253  05 00104  5E       A                MOV    E,M
254  05 00105  23       A                INX    H
255  05 00106  56       A                MOV    D,M
256  05 00107  23       A                INX    H
257  05 00108  7D       A                MOV    A,L
258  05 00109  E64F     A                MODBYT A,AND,SPL:MSK
259  05 0010B  326CFD   A                STA    ADR(DATA,SPL:OUT)
260  05 0010E  CD0000   N                CALL   DE:IND
261                                    ENDIF
262  05 00111  2151FD   A              LXI    H,ADR(DATA,SB:RQST)
263  05 00114  7E       A              MOV    A,M
264                                  ENDIF
265                                  ID:READ  SB:RQST
266  05 00115  07       A              RLC
267  05 00116  07       A              RLC                             TEST FOR 20MS
268  05 00117  D24201   N              IF:    CC,C,S                           SB REQUEST
269  05 0011A  2A59FD   N              LHLD   20PNTR              SET MEM PTR TO CALL IN 20MS TAB
```

| | | | | | | | |
|---|---|---|---|---|---|---|---|
|270|05 00110|5E|A|MOV|E,M|MOVE CALL ADDR(L) TO E| |
|271|05 0011E|23|A|INX|H|STEP MEM PTR TO ADDR(H)| |
|272|05 0011F|7E|A|IF:|XBYT,M,EQ,X'FF'|IS POINTER AT END OF TABLE| |
| |05 00120|FEFF|A| | | | |
| |05 00122|C23701|N| | | | |
|273|05 00125|2A57FD|N|LHLD|20:PNTR|YES, SET MOVING POINTER| |
|274|05 00128|2259FD|N|SHLD|20PNTR|BACK TO BEGINNING OF TABLE| |
|275|05 0012B|2151FD|A|LXI|H,ADR(DATA,SB:RQST)|SET MEM PNTR TO| |
|276|05 0012E|F3|A|DI| | | |
|277|05 0012F|7E|A|MODBYT|M,AND, 20:RQST REMOVE 20MS REQUEST| | |
| |05 00130|E6BF|A| | | | |
| |05 00132|77|A| | | | |
|278| | | |ID:ALTR|SB:RQST| | |
|279|05 00133|FB|A|EI| | | |
|280|05 00134|C34201|N|ELSE:| | | |
|281|05 00137|56|A|MOV|D,M|NO, MOVE CALL ADDR(H) TO D| |
|282|05 00138|23|A|INX|H|STEP TO NEXT CALL IN TABLE| |
|283|05 00139|2259FD|N|SHLD|20PNTR|SAVE FOR NEXT LOOP-1| |
|284|05 0013C|CD0000|N|CALL|DE:IND| | |
|285|05 0013F|2151FD|A|LXI|H,ADR(DATA,SB:RQST) SET MEM PNTR TO SB BY| | |
|286| | | |FNDIF| | | |
|287| | | |ENDIF| | | |
|288|05 00142|7E|A|UNTIL:|XBYT,M,AND,20:RQST,Z MORE 20MS CALLS TO DO  (LOOP-1)| | |
| |05 00143|E640|A| | | | |
| |05 00145|C2C300|N| | | | |
|289| | | |ID:READ|SB:RQST| | |
|290|05 00148|7E|A|IF:|XBYT,M,AND,100:RQST,NZ TEST FOR 100MS SB REQUEST| | |
| |05 00149|E620|A| | | | |
| |05 0014B|CA9E01|N| | | | |
|291| | | |ID:READ|SB:RQST| | |
|292|05 0014E|2A5DFD|N|LHLD|100PNTR|SET MEM PNTR TO CALL IN 100 TAB| |
|293|05 00151|5E|A|MOV|E,M|MOVE CALL ADDR(L) TO E| |
|294|05 00152|23|A|INX|H|STEP MEM PNTR TO ADDR(H)| |
|295|05 00153|7E|A|IF:|XBYT,M,EQ,X'FF'|IS PNTR AT END OF TABLE| |
| |05 00154|FEFF|A| | | | |
| |05 00156|C29301|N| | | | |
|296|05 00159|2A5BFD|N|LHLD|100:PNTR|YES, SET MOVING PNTR BACK| |
|297|05 0015C|225DFD|N|SHLD|100PNTR|TO BEGINNING OF TABLE| |
|298| | | | | | | |
|299| | | | | |100MS TIMER SERVICE| |
|300| | | | | |·DECREMENTS TIMERS AND CALLS| |
|301| | | | | |SUBROUTINE REQUESTED WHEN| |
|302| | | | | |TIMER TIMES OUT| |
|303| | | | | |USES 3 TABLES ON 3 CONSECUTIVE| |
|304| | | | | |RAM PAGES -100:CNT W/TIMER| |
|305| | | | | |-100:LS W/ADDR(L)| |
|306| | | | | |-100:LS W/ADDR(H)| |
|307| | | | | |ADDR IS FOR REQSTED SUBR| |
|308| | | | | | | |
|309|05 0015F|2130FA|N|LXI|H,100:CNT|STARTING ADDR OF 100MS TIMERS| |
|310|05 00162|1614|A|MVI|D,100:TMAX|D-REG SET TO QTY OF 100MS THRS| |
|312| | | | | |CONDITIONAL HOLD OF 100MS THRS| |
|314|05 00164|3A45FD|A|IF:|FBIT,STDBOPNO,T IS STAND-BY RELAY OPEN| | |
| |05 00167|E640|A| | | | |
| |05 00169|CA6E01|N| | | | |
|315| | | | | | | |
|316|05 0016C|1611|A|MVI|D,100:TMAX: YES, HOLD SPECIFIED NUMBER| | |
| | | | | |-HOLDTMRS|OF TIMERS| |
|317| | | |FNDIF| | | |
|318| | | | | | | |
|319| | | |REPEAT| |LOOP TO DECR & SERVICE TIMEOUTS| |
|320|05 0016E|7E|A|IF:|VBYT,M,NZ IS TIMER ACTIVE| | |
| |05 0016F|A7|A| | | | |
| |05 00170|CA8201|N| | | | |
|321|05 00173|35|A|DCR|M|DECR TIMER| |
|322|05 00174|C28201|N|IF:|CC,Z,S HAS TIMER TIMED OUT| | |
|323|05 00177|D5|A|PUSH|D|SAVE # TIMERS TO SERVICE| |
|324|05 00178|E5|A|PUSH|H|SAVE ANDR OF CURRENT TIMER| |
|325|05 00179|24|A|INR|H|STEP TO NEXT RAM PAGE| |
|326|05 0017A|5E|A|MOV|E,M|MOVE CALL ADDR(L) TO E| |
|327|05 0017B|24|A|INR|H|STFP TO NEXT RAM PAGE| |
|328|05 0017C|56|A|MOV|D,M|MOVE CALL ADDR(H) TO D| |
|329|05 0017D|CD0000|N|CALL|DE:IND| | |
|330|05 00180|E1|A|POP|H|RECALL ADDR OF CURRENT THR| |
|331|05 00181|D1|A|POP|D|RECALL NUMBER OF TIMERS| |
|332| | | | | |YET TO BE SERVICED| |
|333| | | |ENDIF| | | |
|334| | | |ENDIF| | | |
|335|05 00182|23|A|INX|H|STEP TO NEXT TIMER ADDR| |
|336|05 00183|15|A|DCR|D|DECR NUMBER OF 100MS TIMERS| |
|337|05 00184|C26E01|N|UNTIL:|CC,Z,S|HAVE ALL TIMFRS BEEN SERVICED| |
|338| | | | | |END 100MS TIMER SECTION| |
|339|05 00187|2151FD|A|LXI|H,ADR(DATA,SB:RGST) SET MEM PNTR TO SB BYTE| | |
|340|05 0018A|F3|A|DI| | | |
|341|05 0018B|7E|A|MODBYT|M,AND, 100:RQST REMOVE 100MS REQUEST| | |
| |05 0018C|E6DF|A| | | | |
| |05 0018E|77|A| | | | |
|342| | | | | | | |
|343|05 0018F|FB|A|ID:ALTR|SB:RQST| | |
|344|05 00190|C39E01|N|EI| | | |
|345|05 00193|56|A|ELSE:| | | |
|346|05 00194|23|A|MOV|D,M|NO, MOVE CALL ADDR(H) TO D| |
|347|05 00195|225DFD|N|INX|H|STEP PNTR TO NEXT CALL| |
|348|05 00198|CD0000|N|SHLD|100PNTR|SAVE FOR NEXT LOOP-2| |
|349|05 0019B|2151FD|A|CALL|DE:IND| | |
|350| | | |LXI|H,ADR(DATA,SB:RQST) SET MEM PNTR TO SB BYTE| | |
|351| | | |ENDIF| | | |
|352|05 0019E|7E|A|ENDIF| | | |
| |05 0019F|A7|A|UNTIL:|VBYT,M,Z|MORE SB CALLS TO DO  (LOOP-2)| |
| |05 001A0|C2C300|N| | | | |

```
353                                    ID:READ    SB:POST
354   05 001A3  76      A              HLT                           COOL IT UNTIL INTERRUPT RESTART
355   05 001A4  CAC300  N              UNTIL:    CC,Z,C              WAS INTERRUPT RTC (LOOP=3)
356   05 001A7  F3      A              DI                            ONLY KIDDING BEFORE, BUT THIS
357   05 001A8  76      A              HLT                           TIME REALLY STOP (ABORT)
359                                *
360                                *   SUBR TO SET CALL TABLE POINTERS
361                                *   CALLED BY EACH STATE PROLOG
362                                *
363                                *   POSITION SB:TABLE POINTER
364                                *
365   05 001A9  3A53FD  N   SB:PNTRS LDA    STATE:                   WHAT STATE IS WANTED
366   05 001AC  110600  A            LXI    D,X'06'                  LOAD D&E WITH SKIP NUMBER
367   05 001AF  21D501  N            LXI    H,SB:TABLE-X'06'         H&L=6'<' TABLE ADDR
368                                  REPEAT
369   05 001B2  19      A              DAD    D                      SKIP THREE WORDS
370   05 001B3  3D      A              DCR    A                      DECR STATE LOOP COUNTER
371   05 001B4  F2B201  N            UNTIL:   CC,S,S                 IS POINTER AT CORRECT STATE
372                                *
373                                *   TRANSFER ADDRS TO VARIABLE SB POINTERS
374                                *
375   05 001B7  1155FD  N            LXI    D,10:CALLS               SET D&E TO FIRST OF SB PNTRS
376   05 001BA  0602    A            MVI    B,2                      LOAD 10:CALLS
377   05 001BC  CDCE01  N            CALL   MV:WORDS                   & 20:PNTR
378   05 001BF  2B      A            DCX    H                        ADJUST 'FROM' PNTR
379   05 001C0  2B      A            DCX    H                                          BACK 1 WORD
380   05 001C1  0602    A            MVI    B,2                      LOAD 20PNTR
381   05 001C3  CDCE01  N            CALL   MV:WORDS                   & 100:PNTR
382   05 001C6  2B      A            DCX    H                        ADJUST 'FROM' PNTR
383   05 001C7  2B      A            DCX    H                                          BACK 1 WORD
384   05 001C8  CDCC01  N            CALL   MV:WORD                  LOAD 100PNTR
385                                  ID:ALTR  10:CALLS,20:PNTR,20PNTR,;  DATA WORDS MODIFIED
386                                           100:PNTR,100PNTR         BY THIS SUBR
387   05 001CB  C9      A            RET
388                                *NAR
389                                *
390                                *   MV:WORD/MV:WORDS SUBROUTINES
391                                *
392                                *   SUBR TO TRANSFER WORDS (2BYTES) FROM MEMORY POINTED TO BY <H&L>
393                                *   TO MEMORY POINTED TO BY <D&E>, CALL MV:WORD FOR 1 TRANSFER,
394                                *   AND CALL MV:WORDS (WITH B-REG # WORDS TO TRANSFER) FOR
395                                *   MULTIPLE TRANSFERS. USES ALL BUT C-REG.
396                                *
397   05 001CC  0601    A   MV:WORD  MVI    B,1                      B= # WORDS TO BE MOVED
398                            MV:WORDS REPEAT
399   05 001CE  7E      A              MOV    A,M                    A= 1ST 'FROM' BYTE
400   05 001CF  12      A              STAX   D                      STORE IN 1ST 'TO' LOCATION
401   05 001D0  23      A              INX    H                      ADVANCE 'FROM'
402   05 001D1  13      A              INX    D                                      AND 'TO' PNTRS
403   05 001D2  7E      A              MOV    A,M                    A= 2ND 'FROM' BYTE
404   05 001D3  12      A              STAX   D                      STORE IN 2ND 'TO' LOCATION
405   05 001D4  23      A              INX    H                      ADVANCE 'FROM'
406   05 001D5  13      A              INX    D                                      AND 'TO' PNTRS
407   05 001D6  05      A              DCR    B                      DECRM # OF WORDS CNTR
408   05 001D7  C2CE01  N            UNTIL:   CC,Z,S                 LOOP UNTIL ALL WORDS TRANSFERRD
409   05 001DA  C9      A            RET
410                                *
411                                *   TABLE OF SB CALL POINTERS
412                                *   FOR EACH STATE
413                                *
414   05 001DB  0906    N   SB:TABLE DW     COMP10
415   05 001DD  0A06    N            DW     COMP20
416   05 001DF  1206    N            DW     COMP100
417   05 001E1  B105    N            DW     TREP10
418   05 001E3  B505    N            DW     TREP20
419   05 001E5  C305    N            DW     TREP100
420   05 001E7  4202    N            DW     NRDY10
421   05 001E9  4602    N            DW     NRDY20
422   05 001EB  52C2    N            DW     NRDY100
423   05 001ED  AF02    N            DW     RDY10
424   05 001EF  B302    N            DW     RDY20
425   05 001F1  BF02    N            DW     RDY100
426   05 001F3  A803    N            DW     PRNT10
427   05 001F5  B203    N            DW     PRNT20
428   05 001F7  C803    N            DW     PRNT100
429   05 001F9  1905    N            DW     RUNN10
430   05 001FB  1D05    N            DW     RUNN20
431   05 001FD  2F05    N            DW     RUNN100

433                                *
434                                *   SUBR TO DO EPILOGS & PROLOGS LAST CALL IN EVERY 100MS TABLE
435                                *
436   05 001FF  2153FD  A   STAT:CHG LXI    H,ADR(DATA,STATE:)       A= PRESENT STATE # IF UNCHANGED
437   05 00202  7E      A            MOV    A,M                        OR NEXT STATE IF CHANGED
438   05 00203  23      A            INX    H                        H&L= ADDR 'FORMER STATE' GLOBAL
439   05 00204  BE      A            IF:    XBYT,A,NE,M              HAS THERE BEEN A STATE CHANGE
      05 00205  CA3602  N
440                                  ID:READ   STATE:,:STATE:
441   05 00208  46      A            MOV    B,M                      YES, B= FORMER STATE
442   05 00209  77      A            MOV    M,A                      UPDATE 'FORMER' TO 'PRESENT'
443                                  ID:ALTR  :STATE:
444   05 0020A  78      A            CASE:    VBYT,B                 DO EPILOG FOR FORMER STATE
      05 0020B  111F02  N
      05 0020E  FE06    A
      05 00210  CD0000  N
445   05 00213  1806    N                      C,0       COMP:EPL    COMPONENT CONTROL STATE
446   05 00215  DB05    N                      C,1       TREP:EPL    TECH REP STATE
447   05 00217  7A02    N                      C,2       NRDY:EPL    NOT-READY STATE
448   05 00219  E302    N                      C,3       RDY:EPL     READY STATE
449   05 0021B  E603    N                      C,4       PRNT:EPL    PRINT STATE
450   05 0021D  4105    N                      C,5       RUNN:EPL    SYSTEM RUNNING, NOT PRINT STATE
```

| Line | Addr1 | Addr2 | Code | Flag | Label | Opcode | Operand | Comment |
|---|---|---|---|---|---|---|---|---|
| 451 | | | | | | ENDCASE | | |
| 452 | 05 | 0021F | 3A53FD | N | | CASE: | VBYT,STATE: | DO PROLOG FOR PRESENT STATE |
| | 05 | 00222 | 113602 | N | | | | |
| | 05 | 00225 | FE06 | A | | | | |
| | 05 | 00227 | CD0000 | N | | | | |
| 453 | 05 | 0022A | FF05 | N | | C,0 | COMP:PRL | COMPONENT CONTROL STATE |
| 454 | 05 | 0022C | A505 | N | | C,1 | TREP:PRL | TECH REP STATE |
| 455 | 05 | 0022E | 3702 | N | | C,2 | NRDY:PRL | NOT-READY STATE |
| 456 | 05 | 00230 | A602 | N | | C,3 | RDY:PRL | READY STATE |
| 457 | 05 | 00232 | 1603 | N | | C,4 | PRNT:PRL | PRINT STATE |
| 458 | 05 | 00234 | 0B05 | N | | C,5 | RUNN:PRL | SYSTEM RUNNING, NOT PRINT STATE |
| 459 | | | | | | ENDCASE | | |
| 460 | | | | | | ENDIF | | |
| 461 | 05 | 00236 | C9 | A | | RET | | RETURN TO 100 MSEC SYNC BKGND |
| 463 | | | | | *NAR | | | |
| 464 | | | | | • | | | |
| 465 | | | | | • | N O T   R E A D Y   S T A T E | | |
| 466 | | | | | • | | | |
| 467 | | | | | • | NOT READY STATE- EXECUTES AFTER INITIALIZE UNTIL ALL READY CONDITIONS | | |
| 468 | | | | | • | ARE MET. THIS STATE CAN ALSO BE ENTERED FROM 'RUN NOT PRINT','READY' | | |
| 469 | | | | | • | AND 'TECH REP'. CONTROL EXITS TO EITHER 'READY' OR 'TECH REP' STATES. | | |
| 471 | | | | | • | PROLOG | | |
| 473 | 05 | 00237 | CDA901 | N | NRDY:PRL | CALL | SB:PNTRS | SYNC BKG PNTRS TO NEW STATE |
| 474 | 05 | 0023A | CD0000 | N | | STIMR | INST@TMR,1000,NEXT@FLT | UPDATES INST FLT CODE IN STBY |
| | 05 | 0023D | 49 | A | | | | |
| | 05 | 0023E | 64 | A | | | | |
| | 05 | 0023F | 0000 | N | | | | |
| 475 | 05 | 00241 | C9 | A | | RET | | |
| 477 | | | | | • | CALLS FOR NOT READY 10 MS SYN BACKGROUND | | |
| 479 | 05 | 00242 | CD0000 | N | NRDY10 | CALL | ADH@CTRL | |
| 480 | 05 | 00245 | C9 | A | | RET | | |
| 482 | | | | | • | CALLS FOR NOT READY 20 MS SYN BACKGROUND | | |
| 484 | 05 | 00246 | 0000 | N | NRDY20 | DW | NRDY@SWS | |
| 485 | 05 | 00248 | 0000 | N | | DW | MN@ELVPS | |
| 486 | 05 | 0024A | 0000 | N | | DW | DSPL@CTL | |
| 487 | 05 | 0024C | 0000 | N | | DW | LMP@CTRL | |
| 488 | 05 | 0024E | 0000 | N | | DW | INSTRU | |
| 489 | 05 | 00250 | FFFF | A | | DW | X'FFFF' | END OF TABLE |
| 491 | | | | | • | CALLS FOR NOT READY 100 MS SYN BACKGROUND | | |
| 493 | 05 | 00252 | 0000 | N | NRDY100 | DW | NRILK@CK | |
| 494 | 05 | 00254 | 0000 | N | | DW | RED@BGND | |
| 495 | 05 | 00256 | 0000 | N | | DW | OVL@DUMP | |
| 496 | 05 | 00258 | 0000 | N | | DW | RECAPFR | |
| 497 | 05 | 0025A | 0000 | N | | DW | BIN@CHK | 1 |
| 498 | 05 | 0025C | 0000 | N | | DW | MINIPHS1 | 2 |
| 499 | 05 | 0025E | 0000 | N | | DW | BIL@JMP@ | |
| 500 | 05 | 00260 | 0000 | N | | DW | FUS@ROUT | |
| 501 | 05 | 00262 | 0000 | N | | DW | FLT@100 | 1 |
| 502 | 05 | 00264 | 0000 | N | | DW | FLT@CTRL | 2 |
| 503 | 05 | 00266 | 0000 | N | | DW | FLT@CLRN | 3 |
| 504 | 05 | 00268 | 0000 | N | | DW | PROG2SJM | |
| 505 | 05 | 0026A | 0000 | N | | DW | 2SD@STPY | |
| 506 | 05 | 0026C | 0000 | N | | DW | XHM@STPY | |
| 507 | 05 | 0026E | 0000 | N | | DW | JAM@RST | |
| 508 | 05 | 00270 | 0000 | N | | DW | KEY@CNTR | |
| 509 | 05 | 00272 | 0000 | N | | DW | TST@LP4 | |
| 510 | 05 | 00274 | 84C2 | N | | DW | NRDY:CHG | TEST IF OK TO |
| 511 | 05 | 00276 | FF01 | N | | DW | STAT:CHG | LEAVE NOT READY |
| 512 | 05 | 00278 | FFFF | A | | DW | X'FFFF' | END OF TABLE |
| 514 | | | | | • | EPILOG | | |
| 516 | 05 | 0027A | CDC000 | N | NRDY:EPL | COBIT,S | WAIT@ | INSURE WAIT OFF AT NRDY EXIT |
| | 05 | 0027D | E9FE | A | | | | |
| 517 | 05 | 0027F | AF | A | | CFLG | STRT:POT | DIS-ABLE TRANSFER TO 'PRINT' |
| | 05 | 00280 | 325BF4 | A | | | | |
| 518 | 05 | 00283 | C9 | A | | RET | | |
| 520 | | | | | • | | | |
| 521 | | | | | • | SUBR FOR 'NOT-READY' 100MS SYNC BKGND | | |
| 522 | | | | | • | TESTS FOR CHANGE TO 'READY' OR 'TREP REP' | | |
| 523 | | | | | • | | | |
| 524 | 05 | 00284 | CDDF05 | N | NRDY:CHG | CALL | TREP:CHG | TEST FOR STATE CHANGE TO :TREP |
| 525 | 05 | 00287 | 7E | A | | IF: | XBYT,M,NE,:TREP | DID IT CHANGE TO :TREP STATE |
| | 05 | 00288 | FE01 | A | | | | |
| | 05 | 0028A | CA9302 | N | | | | |
| 526 | | | | | | ID:READ STATE: | | |
| 527 | 05 | 0028D | CD9402 | N | | CALL | RDYTEST: | TEST ALL 'READY' FLAGS |
| 528 | 05 | 00290 | CD0B03 | N | | CALL | NRDY:IRDY | MOVE TO EITHER :NRDY OR :RDY |
| 529 | | | | | | ENDIF | | |
| 530 | 05 | 00293 | C9 | A | | RET | | |
| 532 | | | | | • | | | |
| 533 | | | | | • | SUBR TO TEST ALL 'READY' FLAGS IN A LOOP | | |
| 534 | | | | | • | | | |
| 535 | 05 | 00294 | 2184F7 | A | RDYTEST: | LXI | H,RDYFLGS: | H&L= START ADDR OF READY FLAGS |
| 536 | 05 | 00297 | 0609 | A | | MVI | B,RDYFNUM: | B= # OF READY FLAGS TO CHK |
| 537 | | | | | | REPEAT | | |
| 538 | 05 | 00299 | 7E | A | | MOV | A,M | A= <PRESENT READY FLAG> |
| 539 | 05 | 0029A | 07 | A | | RLC | | SET C IF FLAG SET (READY) |
| 540 | 05 | 0029B | DAA002 | N | | IF: | CC,C,C | IS PRESENT FLAG INDICATING RDY |
| 541 | 05 | 0029E | 0601 | A | | MVI | B,1 | NO, DON'T TEST ANY FURTHER |
| 542 | | | | | | ENDIF | | |

```
543   05 002A0   23         A              INX      H                        MOVE TO NEXT FLAG LOCATION
544   05 002A1   05         A              DCR      B                        DECRM LOOP CNTR (# READY FLAGS)
545   05 002A2   C29902     N              UNTIL:   CC,Z,S                   LOOP UNTIL ALL FLAGS CHKED
546                                         ID:READ  LENS@RDY,EL'V@RDY,FUS@RDY,;   FLAGS READ
547                                                  PR0G@RDY,ILCK@RDY,XHM@RDY,;
548                                                  FLT@RDY,ADH@NM@V,SRT@RDY
549   05 002A5   C9         A              RET                               RETURN

551                                    *NAR
552                                    *
553                                    *        R E A D Y    S T A T E
554                                    *
555                                    *   READY STATE- EXECUTES WHEN MACHINE IS READY TO GO INTO PRINT STATE.
556                                    *   CONTROL CAN GO BACK TO 'NOT READY' OR GO TO 'TECH REP' IF REQUIRED.

558                                    *   PROLOG 560   05 002A6   C00000     N   RDY:PRL  S@BIT,S   READY$
      05 002A9   E701       A
561   05 002AB   CDA901     N            CALL      SB:PNTRS                  SYNC BKG PNTRS TO NEW STATE
562   05 002AE   C9         A            RET

564                                    *   CALLS FOR READY 10MS SYN BACKGROUND 566   05 002AF   CD0000     N   RDY10    CALL      ADH@CTRL
567   05 002B2   C9         A            RET

569                                    *   CALLS FOR READY 20MS SYN BACKGROUND 571   05 002B3   0000       N   RDY20    DW        RDY@SWS
572   05 002B5   0000       N            DW        MN@ELVRS
573   05 002B7   0000       N            DW        DSPL@CTL
574   05 002B9   0000       N            DW        LMP@CTRL
575   05 002BB   0000       N            DW        INSTRU
576   05 002BD   FFFF       A            DW        X'FFFF'                   END OF TABLE

578                                    *   CALLS FOR READY 100MS SYN BACKGROUND 580   05 002BF   0000       N   RDY100   DW        BIN@CHK                   1
581   05 002C1   0000       N            DW        MINIPHS1                  2
582   05 002C3   0000       N            DW        BIL@JMP@
583   05 002C5   0000       N            DW        NVL@DUMP
584   05 002C7   0000       N            DW        RECAPEP
585   05 002C9   0000       N            DW        FUS@ROUT
586   05 002CB   0000       N            DW        FLT@100                   1
587   05 002CD   0000       N            DW        FLT@CTRL                  2
588   05 002CF   0000       N            DW        NRILK@CK
589   05 002D1   0000       N            DW        RED@BG\D
590   05 002D3   0000       N            DW        2SD@STPY
591   05 002D5   00C0       N            DW        XMM@STPY
592   05 002D7   0000       N            DW        JAM@RST
593   05 002D9   0000       N            DW        KEY@CNTR
594   05 002DB   00C0       N            DW        TST@LP4
595   05 002DD   E9C2       N            DW        RDY:CHG                   TEST IF OK TO
596   05 002DF   FFC1       N            DW        STAT:CHG                                LEAVE READY
597   05 002E1   FFFF       A            DW        X'FFFF'                   END OF TABLE

599                                    *   EPILOG 601   05 002E3   C0C000     N   RDY:EPL  C@BIT,S   READY$
      05 002E6   E7FE       A
602   05 002E8   C9         A            RET

604                                    *   CHANGE OF STATE ROUTINES

606                                    *
607                                    *   SUBR FOR 'READY' 100MS SYNC BKGND
608                                    *   TESTS FOR CHANGE TO 'NOT-READY' OR 'TECH REP'
609                                    *
610   05 002E9   CDDF05     N   RDY:CHG  CALL      TREP:CHG                  TEST FOR STATE CHANGE TO :TREP
611   05 002EC   7E         A            IF:       XBYT,M,NE,:TREP           DID IT CHANGE TO :TREP STATE
      05 002ED   FE01       A
      05 002EF   CA0A03     N
612                                        ID:READ  STATE:
613   05 002F2   CD9402     N              CALL     RDYTEST:                 TEST ALL 'READY' FLAGS
614   05 002F5   CD0B03     N              CALL     NRDY:RDY                 MOVE TO EITHER :NRDY OR :RDY
615   05 002F8   3A5BF4     A              IF:      FLG,STRT:PRT,T           IS START PRINT REQUESTED
      05 002FB   07         A
      05 002FC   D20A03     N
616   05 002FF   2153FD     A              LXI      H,ADR(DATA,STATE:)       SET MEM PNTR
617   05 00302   7E         A              IF:      XBYT,M,EQ,:RDY           OK TO GO TO PRINT
      05 00303   FE03       A
      05 00305   C20A03     N
618                                          ID:READ  STATE:
619   05 00308   3604       A                MVI      M,:PRNT                CHG TO PRT STATE
620                                          ID:ALTR  STATE:
621                                        ENDIF
622                                      ENDIF
623                                    ENDIF
624   05 0030A   C9         A            RET

626                                    *
627                                    *   SUBR TO USE INFO FROM 'RDYTEST' AND EXECUTE THE PROPER CHANGE OF STATE
628                                    *
629   05 0030B   2153FD     A   NRDY:RDY LXI       H,ADR(DATA,STATE:)       SET MEM PNTR
630   05 0030E   3603       A            MVI       M,:RDY                   ASSUME GOING TO 'READY' STATE
631                                      ID:ALTR   STATE:
632   05 00310   DA1503     N            IF:       CC,C,C                   ARE ALL 'READY' FLAGS SET
633   05 00313   3602       A              MVI       M,:NRDY                NO, MOVE TO 'NOT-READY' STATE
634                                      ID:ALTR   STATE:
635                                      ENDIF
636   05 00315   C9         A            RET
```

```
638                                  *NAR
639                                  *
640                                  *        PRINT   STATE
641                                  *
642                                  *        PRINT STATE= EXECUTES WHILE MACHINE IS PRODUCING COPIES.
643                                  *        ENTERED FROM 'READY' AND EXITS TO 'RUN NOT PRINT'.

645                                  *        PROLOG 647     05 00316   2160FE   N   PRNT:PRL CLR:MEM  16,SHIFTREG              CLEAR SHIFT REGISTER
        05 00319   0610     A
        05 0031B   CD0000   N
648     05 0031E   3E60     A            MVI      A,LADR(DATA,SHIFTREG)    FORCE SHIFT REG TO START AT
649     05 00320   3263FD   A            STA      ADR(DATA,SROPTR1)         BEGINNING OF SHIFTREG TABLE
650                                      CLR:MEM  SD1@DLY-TIME@DN1+1,,     CLEAR THE FOLLOWING FLAGS
651     05 00323   21A7F4   A                     ADR(FLG,TIME@DN1)
        05 00326   0609     A
        05 00328   CD0000   N
652                                      ID:CLR   TIME@DN1,IMED@DN1,,
653                                               CYCL@DN1,NORM@DN1,QWIK1OUT,,
654                                               IMG@ADF1,SD1@TIM@,SD1@DLY
655     05 0032B   3E80     A            SFLG     910@D@NE                 ALLOW FIRST PITCH RESET
        05 0032D   326FF4   A
656     05 00330   AF       A            XRA      A
657     05 00331   3266FD   N            STA      CYCUPCT1                 INIT CYCLE-UP CNTR TO 0
658     05 00334   3269FD   N            STA      SR@VALU1                 INIT 'NEW SR VALUE' TO 0
659     05 00337   325DFA   N            STA      PLL@INF@                 INIT PLL SHUTDOWN CONTROL TO 0
660     05 0033A   3268FD   N            STA      SMPL@CT1                 INIT SAMPLE COPY CNTR TO 0
661     05 0033D   3E03     A            MVI      A,3
662     05 0033F   3267FD   N            STA      NOIMGCT1                 INIT 'NO IMAGE CNTR' TO 3
663     05 00342   CD0000   N            CALL     SRSK                     SHIFT REG SCHEDULER (INIT SR#0)
664     05 00345   CD0000   N            CALL     TIM@M@D                  CALC SHIFTED IMAGE VALUES    (1)
665     05 00348   CD0000   N            STIMR    935!TMR,810,RETURN!      SET 'OVER-RUN EVENT' TIMER   (2)
        05 0034B   22       A
        05 0034C   51       A
        05 0034D   0000     N
666     05 0034F   CD0000   N            CALL     TBLD@PPT                 BUILD NEW PITCH TABLE        (3)
667     05 00352   CD0000   N            S@BIT,S  PRNT$RLY,PR$C@@L         PRINT RELAY & COOLING FAN ON
        05 00355   02       A
        05 00356   EA08     A
        05 00358   F608     A
668     05 0035A   AF       A            CTIMR    PR@C@@L                  CLEAR COOLING FAN TIMER
        05 0035B   3232FA   N
669     05 0035E   CD0000   N            C@BIT,S  NPF@$@N                  TURN OFF PF@ (INVERTED DRIVER)
        05 00361   E47F     A
670     05 00363   3AE0F4   A            IF!      FLG,ADH@SELC,T
        05 00366   07       A
        05 00367   D27003   N
671     05 0036A   CD0000   N            CALL     ADH@M@TN
672     05 0036D   C37503   N            ELSE:
673     05 00370   3E80     A            SFLG     ADH@WTEN
        05 00372   32CCF4   A
674                                      ENDIF
675     05 00375   CD0000   N            CALL     TRN@B@D
676     05 00378   CD0000   N            CALL     PAP@SIZE                 CHK PAPER WIDTH FOR FUSER    (1)
677     05 0037B   CD0000   N            CALL     EDGE@F@                  CHK WHICH EDGE FADE OUT      (2)
678     05 0037E   CD0000   N            CALL     PAP@PPL3
679     05 00381   CD0000   N            CALL     PR@G@UP                  PROG INITIALIZATION SUBR
680     05 00384   CD0000   N            CALL     PR@G@UF1
681     05 00387   CDC000   N            CALL     FDR@PRT                  CHECK FEEDER SELECTION
682     05 0038A   CD0000   N            CALL     BLG@BKPT                 READ BILLING BREAK-POINTS
683     05 0038D   CD0000   N            CALL     DO@ELV                   CAUSE ELV TO EXECUTE
684     05 00390   3A54F4   A            IF!      FLG,SRT@SEL,T            IS SORTER BEING USED
        05 00393   07       A
        05 00394   D29F03   N
685     05 00397   CD0000   N            CALL     SRT@INIT                 INITIALIZE SORTER JAM DETECT
686                                      MVI      A,MSK(NV@BIT,NV@FJAM,,   SETS ALL 4 JAM CONDITIONS
687     05 0039A   3E0F     A                     NV@IMED,NV@L@W@J,NV@UP@J)
688     05 0039C   C3A403   N            ELSE:
689     05 0039F   3AC9E2   A            RNVNIB   NV@JAM@N                 READ SAVED PREVIOUS SRT JAMS
690                                      M@DBYT   A,@R,MSK(NVBIT,,         & SET IMED DN K FOR JAM
691     05 003A2   F603     A                     NV@FJAM,NV@IMED)
692                                      ENDIF
693     05 003A4   32C9E2   A            WNVNIB   NV@JAM@N                 STORE IN CASE OF PWR DN
694                                      ID:ALTR  NV@FJAM,NV@IMED,NV@L@W@J,, SEE ABOVE IF!/FLG@!
695                                               NV@UP@J
696     05 003A7   CDA901   N            CALL     SB:PNTPS                 SYNC BKG PNTRS TO NEW STATE
697     05 003AA   C9       A            RET

699                                  *        CALLS FOR PRINT 10 MS SYN BACKGROUND 701     05 003AB   CD0000   N   PRNT10   CALL     ADH@CTPL
702     05 003AE   CDC004   N            CALL     PRT!!MD
703     05 003B1   C9       A            RET

705                                  *        CALLS FOR PRINT 20 MS SYN BACKGROUND 707     05 003B2   0000     N   PRNT20   DW       PRT@SWS
708     05 003B4   0000     N            DW       T@N@DIS
709     05 003B6   0000     N            DW       PAP@TGL3
710     05 003B8   0000     N            DW       LMP@CTPL
711     05 003BA   0000     N            DW       FDR@BKFD
712     05 003BC   0000     N            DW       S@RTER@
713     05 003BE   0000     N            DW       FLV@PRNT
714     05 003C0   0000     N            DW       S@S@JHDT
715     05 003C2   0000     N            DW       DSPL@CTL
716     05 003C4   0000     N            DW       INSTRU
717     05 003C6   FFFF     A            DW       X'FFFF'                  END OF TABLE
```

```
719                                  *      CALLS FOR PRINT 100 MS SYN BACKGROUND 721   05 003C8    0000     N   PRNT100   DW      RILK&CK
722   05 003CA    0000     N             DW      2SD@RUN
723   05 003CC    0000     N             DW      LITE@0FF
724   05 003CE    0000     N             DW      XMM@PRNT
725   05 003D0    0000     N             DW      FUS@RDUT
726   05 003D2    0000     N             DW      READY@CK
727   05 003D4    0000     N             DW      JAM@RST
728   05 003D6    0000     N             DW      MINIPHS@
729   05 003D8    4F06     N             DW      SMPL@CPY
730   05 003DA    0000     N             DW      RXCYCLDN                        STUB IN US IMG
731   05 003DC    0000     N             DW      KEY@CNTR
732   05 003DE    0000     N             DW      TST@LP4
733   05 003E0    2C04     N             DW      PRT!CHG                         TEST IF OK TO
734   05 003E2    FF01     N             DW      STAT!CHG                                        LEAVE PRINT
735   05 003E4    FFFF     A             DW      X'FFFF'                         END OF TABLE
737                                  *      EPILOG 739   05 003E6    CD0000   N   PRNT!EPL  CALL    AX@EPTY                         (1)
740   05 003E9    CD0000   N             CALL    FDM@EPL3                        (2)
741   05 003EC    CD0000   N             CALL    FDA@EPL3                        (3)
742   05 003EF    CD0000   N             CALL    TPN@EPL3
743   05 003F2    CD0000   N             CALL    DVL@NRDY
744                                      COBIT,S FUS$CAPL,FUS$L@AD,ILLH$SPL,;
745   05 003F5    CD0000   N                     FF@$11,EF@$12$5,SMPL$CPY,READY$
      05 003F8    07       A
      05 003F9    E6F7     A
      05 003FB    EDFD     A
      05 003FD    F2F7     A
      05 003FF    ECF7     A
      05 00401    EBF7     A
      05 00403    E2FE     A
      05 00405    E7FE     A
746   05 00407    CD0000   N             SOBIT,S NPF@$@N                         TURN OFF PF@ (INVERTED DRIVER)
      05 0040A    E480     A
747   05 0040C    AF       A             CFLG    ELV@AUT@                        DISABLE AUTO-TRAY SWITCHING
      05 0040D    3222F4   A
748   05 00410    CD0000   N             CALL    PAP@EPL3
749   05 00413    CD1704   N             CALL    ABORT
750   05 00416    C9       A             RET

752                                  *
753                                  *      SUBROUTINE
754                                  *

756   05 00417    F3       A   ABORT     DI                                      TURN OFF INTERRUPT SYSTEM
757   05 00418    AF       A             CFLG    TBLD@FIN                        SIGNAL NEW PITCH TABLE REQ'D
      05 00419    325DF4   A
758   05 0041C    211907   N             LXI     H,EV@STBY!                      ADDR OF STBY EVENT TABLE
759   05 0041F    2264FD   N             SHLD    EV@PTR!                         SAVE FOR MACH CLK ROUTINE
760   05 00422    CD0000   N             COBIT,S BTR$L@AD,PRNT$RLY               UN-LOAD BTR & DROP PRINT RELAY
      05 00425    02       A
      05 00426    E17F     A
      05 00428    EAF7     A
761   05 0042A    FB       A             EI
762   05 0042B    C9       A             RET
764   05 0042C    3A66FD   N   PRT!CHG   IF!     XBYT,CYCUPCT!,EQ,2              CHECK FOR PROL@G 2 OR CYCLE OUT
      05 0042F    FEC2     A
      05 00431    C23C04   N
765   05 00434    3E8C     A             SFLG    PRT$PR@2                        YES, SET 'PRINT PROLOG 2' FLAG
      05 00436    3271F4   A
766   05 00439    C37004   N             ORIF!   XBYT,A,EQ,3                     NO, IS CYCLE UP CNTR=3
      05 0043C    FEC3     A
      05 0043E    C27004   N
767   05 00441    3A71F4   A             ANDIF!  FLG,PRT$PR@2,T                  YES, AND IS PROLOG 2 FLAG SET
      05 00444    07       A
      05 00445    D27004   N
768   05 00448    AF       A             CFLG    PRT@PR@2                        YES, DO PROLOG 2 AND CLR FLAG
      05 00449    3271F4   A
769                                  *
770                                  *       PRINT STATE BACKGROUND- PROLOG 2
771                                  *
772   05 0044C    CD0000   N             CALL    PAP@PRL2                        RETN XPORT OFF IF NOT SIDE 1
773   05 0044F    CD0000   N             CALL    PRG@UP2
774   05 00452    3AADF4   A             IF!     FLG,IMGMADE!,T                  HAS 1ST IMAGE BEEN MADE
      05 00455    07       A
      05 00456    D25C04   N
775   05 00459    CD0000   N                CALL    PROG@UP                      YES, CALL PROG INITIALIZATION
776                                      ENDIF
777   05 0045C    3A57FA   N             IF!     VBYT,MINIBYTE,NZ                IS MINI-PHYSICAL ACTIVE
      05 0045F    A7       A
      05 00460    CA7004   N
778   05 00463    AF       A                CFLG    DSPL@1ST                     YES, ENABLE DISPLAY UPDATE.
      05 00464    329AF4   A
779   05 00467    3C       A                INR     A                            DISPLAY QUANTITY
780   05 00468    3250FA   N                STA     DSPL@ST1                     COMPLETE
781   05 0046B    3EC6     A                MVI     A,6                          SET DOCUMENT TOTAL TO
782   05 0046D    326FFA   N                STA     D@C@T@TL                     6 FOR ADH DOCUMENT CHECK
783                                      ENDIF
784                                   ENDIF

786                                  *     END PROLOG2

788                                  *
789                                  *     BUILD FLAG BYTE
790                                  *
791   05 00470    0608     A             MVI     B,8                             NUMBER OF FLAGS REQ'D
792   05 00472    AF       A             XRA     A                               CLEAR A-REG
793   05 00473    57       A             MOV     D,A                             CLEAR D-REG
```

```
794    05 00474   21A9F4   A           LXI     H,ADR(FLG,IMED8DNI)         STARTING ADDR OF PRTICHG FLAGS
795                                    REPEAT
796    05 00477   7E       A              MOV     A,M                      LOAD A W/CONTENTS OF FLAG ADDR
797    05 00478   07       A              RLC                              ROTATE FLAG(D7) INTO CARRY
798    05 00479   7A       A              MOV     A,D                      LOAD A W/FLAGS BILT INTO BYTE
799    05 0047A   17       A              RAL                              PUT FLAG IN D0 & SHIFT LEFT
800    05 0047B   57       A              MOV     D,A                      SAVE RESULT IN D-REG
801    05 0047C   23       A              INX     H                        STEP TO NEXT FLAG
802    05 0047D   05       A              DCR     B                        DECR NUMBER OF FLAGS REQ'D
803    05 0047E   C27704   N           UNTIL:  CC,Z,S                      LOOP UNTIL ALL FLAGS IN BYTE
804                                    ID:READ IMED8DNI,CYCL8DNI,NORM8DNI,; FLAGS READ
805                                            QWIKI8UT,IMGMADEI,SD18TIMO,;
806                                            SD18DLY,ADH8SELC
807                                    .
808                                    .   TEST FOR STATE CHANGE TO IRUNN
809                                    .
810    05 00481   3A67FD   N              LDA     NOIMGCT!                 MOV CURRENT NO IMAGE COUNTER
811    05 00484   5F       A              MOV     E,A                      TO THE E-REG
812    05 00485   060E     A              MVI     B,14                     LOOP CNTR FOR STATE CHG TESTS
813    05 00487   21E104   N              LXI     H,CYCI8UT                TABLE ADDR OF PRTICHG TESTS
814                                    REPEAT
815    05 0048A   7A       A              MOV     A,D                      MOV FLAG BYTE TO THE A-REG
816    05 0048B   A6       A              MODBYT  A,AND,M                  MASK FOR DESIRED FLAGS
817    05 0048C   23       A              INX     H                        STEP TO STATUS TEST
818    05 0048D   AE       A              MODBYT  A,XOR,M                  TEST FLAG STATUS
819    05 0048E   C29F04   N              IF:     CC,Z,S                   DID TEST PASS
820    05 00491   23       A                 INX     H                     YES, STEP TO NOIMGCT! TEST
821    05 00492   7B       A                 IF:     XBYT,E,GE,M           IS NOIMGCT! AT CORRECT VALUE
       05 00493   BE       A
       05 00494   DA9E04   N
822    05 00497   3E05     A                    MVI     A,IRUNN            YES, CHANGE STATE
823    05 00499   3253FD   N                    STA     STATE!             TO RUN NOT PRINT
824    05 0049C   0601     A                    MVI     B,1                FORCE END OF TESTS (EARLY OUT)
825                                          ENDIF
826    05 0049E   2B       A                 DCX     H                     ADJ PNTR BACK TO NO IMG TEST
827                                       ENDIF
828    05 0049F   23       A              INX     H                        STEP OVER NO IMG TEST
829    05 004A0   23       A              INX     H                        STEP TO MASK FOR NEXT TEST
830    05 004A1   05       A              DCR     B                        DECR LOOP COUNTER
831    05 004A2   C2A404   N           UNTIL:  CC,Z,S                      ALL TESTS COMPLETE OR STATE CHG
832                                    .
833    05 004A5   7A       A           MOV     A,D                         MOV FLAG BYTE TO A-REG
834    05 004A6   E662     A           MODBYT  A,AND,D61D5ID1              MASK AND TEST FOR FLAGS TRUE
835                                    ID:READ NORM8DNI,CYCL8DNI,SD18DLY   FROM ABOVE BYTE BUILD
836    05 004A8   CAFF04   N           IF:     CC,Z,C                      ARE ANY FLAGS TRUE
837    05 004AB   2166FD   A              LXI     H,ADR(DATA,CYCUPCT!)     PREPARE TO TEST OR MODIFY
838    05 004AE   7E       A              IF:     XBYT,M,GF,3              HAS PROG PUSHED IT TO 0
       05 004AF   FE03     A
       05 004B1   DAB604   N
839                                    ID:READ CYCUPCT!
840    05 004B4   3602     A              MVI     M,2                      NO, FORCE CYCLE-UP MODE AGAIN
841                                    ID:ALTR CYCUPCT!
842                                       ENDIF
843    05 004B6   CD0000   N              COBIT,S ILLM8SPL                 ILLM SPL 8FF DURING DEAD CYCLE
       05 004B9   F2F7     A
844    05 004BB   AF       A              CFLG    SMPL8FLG                 CANCEL SAMPLE COPY SEQUENCE
       05 004BC   324CF4   A
845                                    ENDIF
846    05 004BF   C9       A           RET

848                                 PRT!IMD IF:    FLGS,IMED8DNI,AND,;     IS IMEDIATE DOWN REQUESTED
849    05 004C0   3AA9F4   A                       TBLD8FIN,T              AND HAS PROB BEEN DETECTED
       05 004C3   2150F4   A
       05 004C6   A6       A
       05 004C7   F2D004   N
850    05 004CA   CD1704   N           CALL    AB8RT
851    05 004CD   C3E004   N           ORIF:   FLG,TIMF8DNI,T              IF TIMED OWN REQ'D DROP OUT
       05 004D0   3AA7F4   A
       05 004D3   07       A
       05 004D4   D2E004   N
852    05 004D7   21E1FF   A           COBIT   BTP8LOAD                    BIAS TRANS ROLL (ASAP)
       05 004DA   3E7F     A
       05 004DC   F3       A
       05 004DD   46       A
       05 004DE   77       A
       05 004DF   F8       A
853                                    ENDIF
854    05 004E0   C9       A           RET
```

```
                                                                           D7 6 5 4 3 2 1 0 (X=DON'T CARE)

.TABLE OF FLAG STATUS TESTS          I C N Q I S S A     N C
                                        AND NO IMAGE COUNTER VALUES         M Y 8 W M D D D     8 8
                                        USED TO DETERMINE IF STATE          E C R I G 1 1 H         U      T N
                                        SHOULD CHANGE FROM PRINT TO         D L M K M 8 8 8         I N    E U
                                        RUN NOT PRINT                       8 8 8 I A T D S         M T    S M
                                                                            D D D 8 D I L E         A E    T B
                                                                            N N N U E M Y L         8 R    E
                                                                            ! ! ! T 8     C         E      R 868    05 004E1   48   A   CYC!8UT  DB    D61D3                             X 1 X X 0 X X X    00     1
869    05 004E2   40   A            DB    D6
870    05 004E3   00   A            DB    0
871    05 004E4   5C   A            DB    D61D41D31D2                       X 1 X 0 1 1 X X    16     2
872    05 004E5   4C   A            DB    D61D31D2
873    05 004E6   10   A            DB    16
874    05 004E7   5C   A            DB    D61D41D31D2                       X 1 X 0 1 0 X X    11     3
875    05 004E8   48   A            DB    D61D3
876    05 004E9   0B   A            DB    11
```

```
877   05 004EA   68        A              DB      D6!D5!D3              X 0 1 X 0 X X X    00    4
878   05 004EB   20        A              DB      D5
879   05 004EC   00        A              DB      0
880   05 004ED   75        A              DB      D6!D5!D4!D2!D0       , X 0 0 0 X 1 X 0   36    5
881   05 004EE   04        A              DB      D2
882   05 004EF   24        A              DB      36
883   05 004F0   75        A              DB      D6!D5!D4!D2!D0        X 0 0 0 X 1 X 1    20    6
884   05 004F1   05        A              DB      D2!D0
885   05 004F2   14        A              DB      20
886   05 004F3   70        A              DB      D6!D5!D4!D3!D2!D0     X 0 1 0 1 1 X 0    36    7
887   05 004F4   2C        A              DB      D5!D3!D2
888   05 004F5   24        A              DB      36
889   05 004F6   7D        A              DB      D6!D5!D4!D3!D2!D0     X 0 1 0 1 1 X 1    20    8
890   05 004F7   2D        A              DB      D5!D3!D2!D0
891   05 004F8   14        A              DB      20
892   05 004F9   75        A              DB      D6!D5!D4!D2!D0        X 0 0 0 X 0 X 0    21    9
893   05 004FA   00        A              DB      0
894   05 004FB   15        A              DB      21
895   05 004FC   7D        A              DB      D6!D5!D4!D3!D2!D0     X 0 1 0 1 0 X 0    21    10
896   05 004FD   28        A              DB      D5!D3
897   05 004FE   15        A              DB      21
898   05 004FF   75        A              DB      D6!D5!D4!D2!D0        X 0 0 0 X 0 X 1    13    11
899   05 00500   01        A              DB      D0
900   05 00501   0D        A              DB      13
901   05 00502   7D        A              DB      D6!D5!D4!D3!D2!D0     X 0 1 0 1 0 X 1    13    12
902   05 00503   29        A              DB      D5!D3!D0
903   05 00504   0D        A              DB      13
904   05 00505   10        A              DB      D4                    X X X 1 X X X X    11    13
905   05 00506   10        A              DB      D4
906   05 00507   0B        A              DB      11
907   05 00508   80        A              DB      D7                    1 X X X X X X X    00    14
908   05 00509   80        A              DB      D7
909   05 0050A   00        A              DB      0
912                                       *NAR
913                                       *
914                                       *       R U N   N O T   P R I N T   S T A T E
915                                       *
916                                       *       RUN NOT PRINT- EXECUTES WHILE MACHINE IS COMPLETING A COPY RUN.
917                                       *       ENTERED FROM 'PRINT' AND EXITS TO 'NOT READY'.
919                                       *       PROLOG
921   05 0050B   CD0000    N  RUN:PRL     CALL    DO@ELV                CAUSE ELV TO EXECUTE
922   05 0050E   CD0000    N              STIMR   RUNN:TMR,2500,RUNN@CHG STAY IN RUNN 2.5 SEC
      05 00511   2F        A
      05 00512   FA        A
      05 00513   7505      N
923   05 00515   CDA901    N              CALL    SB:PNTRS              SYNC BKG PNTRS TO NEW STATE
924   05 00518   C9        A              RET
926                                       *       CALLS FOR RUN NOT PRINT 10 MS SYN BACKGROUND
928   05 00519   CD0000    N  RUNN10      CALL    ADH@CTRL
929   05 0051C   C9        A              RET
931                                       *       CALLS FOR RUN NOT PRINT 20 MS SYN BACKGROUND
933   05 0051D   0000      N  RUNN20      DW      RUNN@SWS
934   05 0051F   0000      N              DW      SORTERS
935   05 00521   0000      N              DW      S@S@JMOT
936   05 00523   0000      N              DW      FLV@PRNT
937   05 00525   0000      N              DW      LMP@CTRL
938   05 00527   0000      N              DW      PAP@TGL4
939   05 00529   0000      N              DW      DSPL@CTL
940   05 0052B   0000      N              DW      INSTRU
941   05 0052D   FFFF      A              DW      X'FFFF'               END OF TABLE
943                                       *       CALLS FOR RUN NOT PRINT 100 MS SYN BACKGROUND
945   05 0052F   0000      N  RUNN100     DW      JAM@RST
946   05 00531   0000      N              DW      RIL@CK
947   05 00533   0000      N              DW      FUS@RDUT
948   05 00535   0000      N              DW      PSD@RUN
949   05 00537   0000      N              DW      XMM@PRNT
950   05 00539   0000      N              DW      LITE@OFF
951   05 0053B   0000      N              DW      TST@LP4
952   05 0053D   FF01      N              DW      STAT:CHG              TEST IF OK TO LEAVE RUN NOT PRT
953   05 0053F   FFFF      A              DW      X'FFFF'               END OF TABLE
955   05 00541   CD0000    N  RUNN:EPL    CALL    DEL@CK                CALC COPIES DELIVERED
956   05 00544   CD0000    N              CALL    PAP@EPL4              'RUNNPRT' PAPER PATH MOP UP SUB
957   05 00547   CD0000    N              CALL    MOT@OFF               TURN OFF SORTER MOTORS
958   05 0054A   CD0000    N              CALL    DO@ELV                CAUSE ELV TO EXECUTE
959   05 0054D   AF        A              CFLG    AXFD@FLT              RESET FOR USE DURING NEXT RUN
      05 0054E   323FF4    A
960   05 00551   2123FC    A              CFBIT,P TF@XMM@               STOP BLINKING OF XMM 'OTHER'
      05 00554   3EFE      A
      05 00556   A6        A
      05 00557   77        A
961   05 00558   CD0000    N              COBIT,S S@S*SMPL
      05 0055B   ECFD      A
962   05 0055D   CD7805    N              CALL    NV@JAM
963   05 00560   CD0000    N              CALL    RCP@STRE              STORE RECAP DATA IN RAM
964   05 00563   CD0000    N              CALL    ADH@M@TF
965   05 00566   3E08      A              MVI     A,8
966   05 00568   3285FA    A              STA     COOLCNT               SET COUNTER FOR 7 TIMEOUTS
967   05 0056B   CD0000    N              CALL    PR@FAN
968   05 0056E   CD0000    N              CALL    FLT@EPL5              (1)
969   05 00571   CD0000    N              CALL    HIST@FLE              (2) LOG HISTORY DATA FOR RUN
970   05 00574   C9        A              RET                           (3)
```

```
972    05 00575  2153FD  N  RUNN0CHG LXI      H,STATE1              SET H&L TO ADDR OF STATE1
973    05 00578  3602    A           MVI      M,1NRDY               CHANGE STATE1 TO NOT READY
974                                   ID:ALTR  STATE1
975    05 0057A  C9      A           RET
977    05 0057B  3A66F4  A  NV0JAM   RFLG     UP0JAM                LOAD A WITH SRT UPPER JAM FLAG
       05 0057E  07      A                                          & SAVE IT IN THE CARRY BIT
978                                *                                LOAD A WITH SRT LOWER JAM FLAG
979    05 0057F  3A36F4  A           LDAFLG   LOW0JAM               & MOVE CARRY &
980    05 00582  17      A           RAL                            LOWJAM INTO THEIR POSITIONS
981    05 00583  17      A           RAL
982    05 00584  07      A           RLC
983    05 00585  07      A           RLC
984                                  MODBYT   A,AND,MSK(NVBIT,;     MASK FOR DESIRED BITS
985    05 00586  E60C    A                    NV0LOW0J,NV0UP0J)
986    05 00588  47      A           MOV      B,A                   & SAVE IT IN THE B-REG
987    05 00589  3AA9F4  A           IF:      FLG,IMED0DN1,T        WAS THERE AN IMED ON CONDITION
       05 0058C  07      A
       05 0058D  D29605  N
988    05 00590  78      A                    MOV      A,B          YES,RESTORE A-REG
989                                           MODBYT   A,OR,MSK(NVBIT,NV0FJAM,;  & SET NV JAM BITS
990    05 00591  F603    A                             NV0IMED)
991    05 00593  C3A105  N           ELSE:
992    05 00596  3A3CFD  A                    IF:      FBITS,FOR0AJAM,OR,FOR0MJAM,T  IS EITHER JAM CONDITION TRUE
       05 00599  E60C    A
       05 0059B  CA9F05  N
993    05 0059E  37      A                             STC          YES,SET CARRY
994                                           ENDIF
995    05 0059F  17      A                    RAL                   ROTATE INTO D0
996    05 005A0  B0      A                    MODBYT   A,OR,B       'OR' IN SRT JAM BITS
997                                  ENDIF
998    05 005A1  32C9E2  A           WNVNIB   NV0JAM0N
999                                  ID:ALTR  NV0FJAM,NV0IMED,NV0LOW0J,NV0UP0J
1000   05 005A4  C9      A           RET                            RETURN TO STATE CHECKER
1002                              *NAR
1003                              *
1004                              *      T E C H    R E P    S T A T E
1005                              *
1006                              *      THE TECH REP STATE IS ENTERED WHEN THE SERVICE KEY IS ON IN
1007                              *      'NOT READY' & 'READY' STATES. THIS ALLOWS THE TECH REP TO PERFORM SUCH
1008                              *      TASKS AS ACCESS NON-VOLATILE MEMORY & COMPONENT CONTROL.
1010                              *
1011                              *      PROLOG
1012                              *
1013   05 005A5  CD0000  N  TREP:PRL COBIT,S  WAIT$                 INSURE WAIT OFF AT TREP ENTRANC
       05 005A8  E9FE    A
1014   05 005AA  CD0000  N           CALL     DGN0PRL               DIAGNOSTIC PROLOG
1015   05 005AD  CDA901  N           CALL     SB:PNTRS              SYNC BKG PNTRS TO NEW STATE
1016   05 005B0  C9      A           RET

1019                              *      CALLS FOR TECH REP 10MS SYN BACKGROUND 1021   05 005B1  CD0000  N  TREP10   CALL     ADH0CTRL
1022   05 005B4  C9      A           RET

1024                              *      CALLS FOR TECH REP 20MS SYN BACKGROUND 1026   05 005B5  0000    N  TREP20   DW       TREP0SWS
1027   05 005B7  0000    N           DW       MN0ELVRS
1028   05 005B9  0000    N           DW       LMP0CTRL
1029   05 005BB  0000    N           DW       DSPL0CTL
1030   05 005BD  0000    N           DW       DGN0BKG
1031   05 005BF  0000    N           DW       INSTRU
1032   05 005C1  FFFF    A           DW       X'FFFF'               END OF TABLE

1034                              *      CALLS FOR TECH REP 100MS SYN BACKGROUND 1036   05 005C3  0000    N  TREP100  DW       NRILK0CK
1037   05 005C5  0000    N           DW       ?SD0STPY
1038   05 005C7  0000    N           DW       XMM0STPY
1039   05 005C9  0000    N           DW       RED0BGND
1040   05 005CB  0000    N           DW       BIN0CHK
1041   05 005CD  0000    N           DW       JAM0RST
1042   05 005CF  0000    N           DW       DVL0DUMP
1043   05 005D1  0000    N           DW       FUS0ROUT
1044   05 005D3  0000    N           DW       TST0LP4
1045   05 005D5  DF05    N           DW       TREP:CHG              TEST IF OK TO
1046   05 005D7  FF01    N           DW       STAT:CHG                          LEAVE TREP REP
1047   05 005D9  FFFF    A           DW       X'FFFF'               END OF TABLE
1049                              *
1050                              *      EPILOG (TECH REP STATE)
1051                              *
1052   05 005DB  CD0000  N  TREP:EPL CALL     DGN0EPL               DIAGNOSTIC EPILOG
1053   05 005DE  C9      A           RET

1055                              *      CHANGE OF STATE CHECK 1057   05 005DF  2153FD  A  TREP:CHG LXI      H,ADR(DATA,STATE1)    PREPARE FOR POSSIBLE STATE CHG
1058   05 005E2  7E      A           IF:      XBYT,M,NE,1COMP       DO NOT CHG STATE IF IN COMP
       05 005E3  FE00    A
       05 005E5  CAFE05  N
1059   05 005E8  3A49F4  A                    IF:      FLG,SER0ACT,T   IF SERVICE KEY IS ON AND IF
       05 005EB  07      A
       05 005EC  D2FC05  N
1060   05 005EF  3A20FC  A                             ANDIF:  FBIT,DGN0PRT0,F  IN DIAG PRINT PROGRAM
       05 005F2  E602    A
       05 005F4  C2FC05  N
1061   05 005F7  3601    A                             MVI      M,1TREP        CHG TO TREP STATE
1062   05 005F9  C3FE05  N                    ELSE:                            IF KEY IS TURNED OFF
1063   05 005FC  3602    A                             MVI      M,1NRDY        CHG TO NOT READY STATE
```

```
1064                        ENDIF
1065                          IDIALTR  STATE1
1066                        ENDIF
1067  05 005FE   C9     A   RET
```

TABLE II

```
 96                          *  FIXED PITCH EVENT TABLE
 97                          *
 98                          *  EVENTS MUST BE IN SEQUENTIAL ORDER STARTING
 99                          *  WITH THE EVENT CLOSES TO PITCH RESET FIRST
100                          *
101                          *  THERE CAN BE NO MORE THAN 256 COUNTS BETWEEN EVENTS
102                          *
103                          *  FORMAT OF EVENTS FOR EVENT TABLE
104                          *
105                          *  EVENT     X,Y,Z
106                          *  WHERE:
107                          *  X = ABSOLUTE COUNTS FROM RESET
108                          *  Y = SHIFT REGISTER NEEDED IN EVENT
109                          *  Z = EVENT NAME
110                          *
111                          *
112                          *  PITCH EVENTS
113                          *
114                             TABLE
115  05 0001E   0200   A        EVENT     2,3,TRN2CURR
     05 00020   03     A
     05 00021   0000   N
116  05 00023   0300   A        EVENT     3,2,ADC@ACT
     05 00025   02     A
     05 00026   0000   N
117  05 00028   0400   A        EVENT     4,3,FDR5AFLT
     05 0002A   03     A
     05 0002B   0000   N
118  05 0002D   0700   A        EVENT     7,0,SPLYS@RN
     05 0002F   00     A
     05 00030   0000   N
119  05 00032   0800   A        EVENT     8,2,FDR1AXFD
     05 00034   02     A
     05 00035   0000   N
120  05 00037   0A00   A        EVENT     10,3,FUS@LOAD
     05 00039   03     A
     05 0003A   0000   N
121  05 0003C   3000   A        EVENT     48,8,DECG@INV          DECISION GATE FOR INVTD COPIES
     05 0003E   08     A
     05 0003F   0000   N
122  05 00041   3600   A        EVENT     54,5,FUS@NTLD          FUSER LOADED TEST
     05 00043   05     A
     05 00044   0000   N
123  05 00046   5500   A        EVENT     85,3,FDR6MFLT
     05 00048   03     A
     05 00049   0000   N
124  05 0004B   5900   A        EVENT     89,2,FDR2MNFD
     05 0004D   02     A
     05 0004E   0000   N
125  05 00050   5D00   A        EVENT     93,8,JAM6@N@N          PAPER PATH JAM SW PITCH EVENT
     05 00052   08     A
     05 00053   0000   N
126  05 00055   7600   A        EVENT     118,9,JAM5@INV         PAPER PATH JAM SW PITCH EVENT
     05 00057   09     A
     05 00058   0000   N
127  05 0005A   7800   A        EVENT     120,0,FSH@@FF
     05 0005C   00     A
     05 0005D   0000   N
128  05 0005F   8700   A        EVENT     135,0,PR@G@HST         PROG HISTORY FILE UPDATE
     05 00061   00     A
     05 00062   0000   N
129  05 00064   8F00   A        EVENT     143,6,JAM4@CHK         PAPER PATH JAM SW PITCH EVENT
     05 00066   06     A
     05 00067   0000   N
130  05 00069   AA00   A        EVENT     170,10,RET2@CHK        PAPER PATH JAM SW PITCH EVENT
     05 0006B   0A     A
     05 0006C   0000   N
131  05 0006E   CF00   A        EVENT     207,3,S@S@CLN
     05 00070   03     A
     05 00071   0000   N
132  05 00073   D100   A        EVENT     209,2,TRN5CURR
     05 00075   02     A
     05 00076   0000   N
133  05 00078   E300   A        EVENT     227,5,JAM3@CHK         PAPER PATH JAM SW PITCH EVENT
     05 0007A   05     A
     05 0007B   0000   N
134  05 0007D   0901   A        EVENT     265,2,FDR3AEDG         ENABLE AUX FDR WT SENSOR
     05 0007F   02     A
     05 00080   0000   N
135  05 00082   0D01   A        EVENT     267,4,JAM2@CHK         PAPER PATH JAM SW PITCH EVENT
     05 00084   04     A
     05 00085   0000   N
136  05 00087   0E01   A        EVENT     270,8,RET1@CHK         PAPER PATH JAM SW PITCH EVENT
     05 00089   08     A
     05 0008A   0000   N
137  05 0008C   6901   A        EVENT     361,3,TRN3DTCK
     05 0008E   03     A
     05 0008F   0000   N
138  05 00091   6C01   A        EVENT     364,2,FDR4MEDG         ENABLE MAIN WT SENSOR
     05 00093   02     A
     05 00094   0000   N
```

```
139   05 00096   B901    A            EVENT    441,9,JAM6@INV       PAPER PATH JAM SW PITCH EVENT
      05 00098   09      A
      05 00099   0000    N
140   05 0009B   C201    A            EVENT    450,4,FUS@UNLD
      05 0009D   04      A
      05 0009E   0000    N
141   05 000A0   C301    A            EVENT    451,2,TRN1ROLL
      05 000A2   02      A
      05 000A3   0000    N
142   05 000A5   F401    A            EVENT    500,0,DPM@SMPL
      05 000A7   00      A
      05 000A8   0000    N
143   05 000AA   0E02    A            EVENT    526,3,TRN4DTCK
      05 000AC   03      A
      05 000AD   0000    N
144   05 000AF   1802    A            EVENT    539,0,DVLV@0FF       TURN OFF VAR DFNS DEVELOPERS
      05 000B1   00      A
      05 000B2   0000    N
145   05 000B4   5802    A            EVENT    600,0,PIL@PLOP       TEST FOR PLATEN OPEN     (BLG)
      05 000B6   00      A
      05 000B7   0000    N
146   05 000B9   7602    A            EVENT    630,5,INVTRCTL       INVTR GATE & RFTURN CONTROL
      05 000BB   05      A
      05 000BC   0000    N
147   05 000BE   8A02    A            EVENT    650,6,DECG@NON       DECISION GATE FOR NON-INVTD
      05 000C0   06      A
      05 000C1   0000    N
148   05 000C3   9A02    A            EVENT    666,0,JAM@DLY
      05 000C5   00      A
      05 000C6   0000    N
149   05 000C8   BC02    A            EVENT    700,7,JAM5@NON       PAPER PATH JAM SW PITCH EVENT
      05 000CA   07      A
      05 000CB   0000    N
150   05 000CD   2003    A            EVENT    800,0,PROGMODE
      05 000CF   00      A
      05 000D0   0000    N
151   05 000D2   2203    A            EVENT    802,0,FSH@ENB
      05 000D4   00      A
      05 000D5   0000    N
152   05 000D7   5003    A            EVENT    848,0,DVB@VAR        TURN ON VARIABLE-BIAS DEVELOPER
      05 000D9   00      A
      05 000DA   0000    N
153   05 000DC   5203    A            EVENT    850,4,SRSK@EV        INIT SRSK & SRT MOTOR
      05 000DE   04      A
      05 000DF   0000    N
154   05 000E1   5403    A            EVENT    852,0,PECOFFEV       TURN OFF POST EXP. COROTRON
      05 000E3   00      A
      05 000E4   0000    N
155   05 000E6   8C03    A            EVENT    908,0,PECONEV        TURN ON POST EXP COROTRON
      05 000E8   00      A
      05 000E9   0000    N
156   05 000EB   8EC3    A            EVENT    910,0,910@EV
      05 000ED   00      A
      05 000EE   0000    N
157   05 000F0   90C3    A            EVENT    912,0,DGN@HCNT
      05 000F2   00      A
      05 000F3   0000    N
158   05 000F5   A703    A            EVENT    935,0,OVER@RUN
      05 000F7   00      A
      05 000F8   0000    N
159                                   ENDTABLE
```

TABLE III

```
71                                    *
72                                    *         VARIABLE PITCH EVENT TABLE
73                                    *
74    00000001              FLSH@BSE   EQU      1
75    00000019              F@@@NBSE   EQU      25
76    00000064              F@@0FFBS   EQU      100
77    05 00000   0100    A  ROM@FSH    DW       FLSH@BSE
78    05 00002   00      A             DB       0
79    05 00003   0000    N             DW       FSH@ON
80    05 00005   6400    A  ROM@0FF    DW       F@@0FFBS
81    05 00007   00      A             DB       0
82    05 00008   0000    N             DW       F@@OFF
83    05 0000A   1900    A  ROM@@N     DW       F@@0NBSE
84    05 0000C   00      A             DB       0
85    05 0000D   0000    N             DW       F@@@N
86    05 0000F   0100    A  ROM@FSHS   DW       FLSH@BSE
87    05 00011   00      A             DB       0
88    05 00012   0000    N             DW       FSH@ON@S
89    05 00014   6400    A  ROM@0FFS   DW       F@@0FFBS
90    05 00016   00      A             DB       0
91    05 00017   0000    N             DW       F@@0FF@S
92    05 00019   1900    A  ROM@@NS    DW       F@@0NBSE
93    05 0001B   00      A             DB       0
94    05 0001C   0000    N             DW       F@@0N@S
95                                    *
```

TABLE IV

```
161   00000396              BASE@CNT   SET      918         #CLK CNTS/PITCH
162   0000038E              SAFE@CNT   SET      910         MIN # CLK CNTS/PITCH
163                                    *
164                                    *         PITCH TABLE BUILDER
165                                    *
```

4,186,299

```
166                              *        BUILD VARIABLE PITCH EVENT TABLE INTO RAM
167                              *        FROM ROM DATA + REDUCTION ADJUST & F0 TRIM
168                              *
169    05 000FA   2A0000    N    TBLD@PRT LHLD    ROM@FSH              H&L= BASE CNT OF FLASH
170    05 000FD   EB        A             XCHG                          D&E= BASE CNT OF FLASH
171    05 000FE   2A9AFC    N             LHLD    1FLSH@ON              H&L= RED ADJ
172    05 00101   19        A             DAD     D                     H&L= BASE + ADJ
173    05 00102   2244FC    N             SHLD    RAM@FSH               RAM@FSH = BASE + ADJ
174                              *
175    05 00105   2A0500    N             LHLD    ROM@OFF               H&L= BASE CNT OF F0 OFF
176    05 00108   EB        A             XCHG                          D&E= BASE CNT OF F0 OFF
177    05 00109   2A9CFC    N             LHLD    1F0@OFF               H&L= RED ADJ + TRIM ADJ
178    05 0010C   19        A             DAD     D                     H&L= BASE + ADJ
179    05 0010D   2249FC    N             SHLD    RAM@OFF               RAM@OFF = BASE + ADJ
180                              *
181    05 00110   2A0A00    N             LHLD    ROM@ON                H&L= BASE CNT OF F0 ON
182    05 00113   EB        A             XCHG                          D&E= BASE CNT OF F0 ON
183    05 00114   2A9EFC    N             LHLD    1F0@ON                H&L= RED ADJ + TRIM ADJ
184    05 00117   19        A             DAD     D                     H&L= BASE + ADJ
185    05 00118   CDEA02    N             CALL    ON@MOD                CALL MOD ROUTINE TO MOD IF<0
186    05 0011B   224EFC    N             SHLD    RAM@ON                RAM@ON = RESULTS OF ABOVE
187                              *
188    05 0011E   3A31F4    A             IF:     FLG,IMG@SFT,T         IS THERE IMAGE SHIFT
       05 00121   07        A
       05 00122   D25601    N
189    05 00125   3E06      A                     MVI     A,6           YES,# OF VAR EVENTS TO USE = 6
190    05 00127   47        A                     MOV     B,A           SET UP B-REG FOR LOOP CONTROL
191    05 00128   3262FA    N                     STA     TBLD@NUM      STORE # OF VAR EVENTS
192    05 0012B   3D        A                     DCR     A             SET UP # OF TIMES TO GO
193    05 0012C   3263FA    N                     STA     TBLD@TMP      THRU SORT
194                              *
195    05 0012F   2A0F00    N                     LHLD    ROM@FSHS      UPDATE ROM@FSHS TO
196    05 00132   EB        A                     XCHG                  INCLUDE RED MODE ADJ + SHIFT
197    05 00133   2AA0FC    N                     LHLD    2FLSH@ON      ADJ AND SAVE FOR THE
198    05 00136   19        A                     DAD     D             IMAGE SHIFT
199    05 00137   2253FC    N                     SHLD    RAM@FSHS      FLASH EVENT
200                              *
201    05 0013A   2A1400    N                     LHLD    ROM@OFFS      UPDATE ROM@OFFS TO INCLUDE
202    05 0013D   EB        A                     XCHG                  RED MODE ADJ + TRIM ADJ +
203    05 0013E   2AA2FC    N                     LHLD    2F0@OFF       SHIFT ADJ AND SAVE
204    05 00141   19        A                     DAD     D             FOR THE IMAGE SHIFT
205    05 00142   2258FC    N                     SHLD    RAM@OFFS      FADE OUT EVENT
206                              *
207    05 00145   2A1900    N                     LHLD    ROM@ONS       UPDATE ROM@ONS TO INCLUDE
208    05 00148   EB        A                     XCHG                  RED MODE ADJ + TRIM ADJ +
209    05 00149   2AA4FC    N                     LHLD    2F0@ON        SHIFT ADJ
210    05 0014C   19        A                     DAD     D
211    05 0014D   CDEA02    N                     CALL    ON@MOD        CALL MOD ROUTINE TO MOD IF <0
212    05 00150   225DFC    N                     SHLD    RAM@ONS       SAVE THE RESULTS
213                              *
214    05 00153   C36001    N             ELSE:
215    05 00156   3E03      A                     MVI     A,3           IF IMAGE SHIFT NOT SET
216    05 00158   47        A                     MOV     B,A           #OF VAR EVENTS TO USE = 3
217    05 00159   3262FA    N                     STA     TBLD@NUM      SET UP B-REG FOR LOOP CONTROL
218    05 0015C   3D        A                     DCR     A             STORE # OF VAR EVENTS & SETUP
219    05 0015D   3263FA    N                     STA     TBLD@TMP      #OF TIMES TO GO THRU SORT
220                                       ENDIF
221                              *
440                              *
441                              *        SUBROUTINE TO DETERMINE IF MODIFIED F0 ON EVENT
442                              *        CLK COUNT IF CLK COUNT RESULTS ARE NEGATIVE OR 0
443                              *
444    05 002EA   7C        A    ON@MOD   MOV     A,H                   A= MS PART OF ABS CLK COUNT
445    05 002EB   07        A             RLC                           CARRY= SIGN OF ABS CLK COUNT
446    05 002EC   D20203    N             IF:     CC,C,S                IS THE ABS CLK CNT NEG
447    05 002EF   119603    A                     LXI     D,BASE@CNT    YES,ADD # CLK COUNTS PER PITCH
448    05 002F2   19        A                     DAD     D             TO NEG #
449    05 002F3   118E03    A                     IF:     XWRD,H,GE,SAFE@CNT   IS RESULTS GE SAFE # CLK/PITCH
       05 002F6   C00000    N
       05 002F9   DAFF02    N
450    05 002FC   210100    A                     LXI     H,1           YES,MOVE TO TURN ON LATER
451                                       ENDIF
452    05 002FF   C30E03    N             ORIF:   XWRD,H,EQ,0           IF RESULTS = 0, MOVE LATER IN
       05 00302   110000    A
       05 00305   CD0000    N
       05 00308   C20E03    N
453    05 0030B   210100    A                     LXI     H,1           PITCH BECUASE EVENT MUST BE > 0
454                                       ENDIF
455    05 0030E   C9        A             RET
456                                       END
```

CONTROL SECTION SUMMARY: 01 00000   PT 0    02 00000   PT 0    03 00000   PT 0    04 0FFD8   PT 2
                         05 0030F   PT 1

* NO UNDEFINED SYMBOLS
* ERROR SEVERITY LEVEL: 0
* NO ERROR LINES

TABLE V

```
252                              *
253                              *
254                              *        SORTS VARIABLE RAM EVENT TABLE BY
255                              *        ABS CLK COUNT & LOWEST ENDS IN EV@RAM
256                              *
257                              *        SORTS ONLY 1ST 3 IF NO IMAGE SHIFT, OTHERWISE SORTS ALL 6
258    05 0017E   2144FC    N             LXI     H,EV@RAM              H&L= ADDR OF TOP OF VAR RAM TBL
259    05 00181   3A63FA    N             WHILE:  XBYT,TBLD@TMP,NE,0    TIMES TO GO THRU OUTER LOOP
       05 00184   FE00      A
       05 00186   CAFD01    N
260    05 00189   3253FA    N                     STA     IN@LP@CT      INTER LOOP CNT=OUTER LOOP CNT
261    05 0018C   3E80      A                     SFLG    TBLD@1ST      SET 1ST FLAG FOR THIS POSITION
       05 0018E   3265FF4   A
```

```
262  05 00191  2252FB  N         SHLD      FIXØADDR              ADDR OF POSITION TO FULL
263  05 00194  B7      A         ØRA       A                     CLEAR Z CONDITION BIT
264  05 00195  CAEF01  N         WHILE:    CC,Z,C
265  05 00198  5E      A               MØV       E,M             E= LS PART OF ABS CLK COUNT
266  05 00199  23      A               INX       H
267  05 0019A  56      A               MØV       D,M             D= MS PART OF ABS CLK COUNT
268  05 0019B  D5      A               PUSH      D               STORE ABS CLK CNT OF FILL POS
269. 05 0019C  3A5EF4  A               IF:       FLG,TBLDØ1ST,T  IS IT 1ST TIME FOR THIS POS
     05 0019F  07      A
     05 001A0  D2AE01  N
270  05 001A3  AF      A                   CFLG      TBLDØ1ST        YES, CLEAR ITS FLAG
     05 001A4  325EF4  A
271  05 001A7  23      A                   INX       H               AND INCREMENT
272  05 001A8  23      A                   INX       H               POINTER TO LS PART OF
273  05 001A9  23      A                   INX       H               ABS CLK COUNT OF NEXT
274  05 001AA  23      A                   INX       H               EVENT
275  05 001AB  C38601  N               ELSE:
276  05 001AE  2A5CFB  N                   LHLD      VARØADDR        H&L= ADDR
277  05 001B1  23      A                   INX       H               OF LS PART OF
278  05 001B2  23      A                   INX       H               ABS CLK COUNT TO
279  05 001B3  23      A                   INX       H               COMPARE TO FILL
280  05 001B4  23      A                   INX       H               POSITION
281  05 001B5  23      A                   INX       H
282                                    ENDIF
283  05 001B6  225CFB  N               SHLD      VARØADDR            STORE POINTER TO COMPARE EVENT
284  05 001B9  5E      A               MØV       E,M                 E= LS PART OF COMPARE ABS CLK
285  05 001BA  23      A               INX       H
286  05 001BB  56      A               MØV       D,M                 D= MS PART OF COMPARE ABS CLK
287  05 001BC  E1      A               PØP       H                   H&L= ABS CLK COUNT OF FILL POS
288  05 001BD  EB      A               IF:       XWRD,D,LT,H         IS CLK OF COMPARE < FILL
     05 001BE  CD0000  N
     05 001C1  D2E501  N
289  05 001C4  2A5CFB  N                   LHLD      VARØADDR        YES, SWITCH THE 2 EVENTS
290  05 001C7  EB      A                   XCHG                      D&E= ADDR LOWER CLK VALUE
291  05 001C8  2A52FB  A                   LHLD      FIXØADDR        H&L= ADDR LARGER CLK VALUE
292  05 001CB  3EFB    A                   MVI       A,=5            INITIALIZE LOOP COUNTER TO 5
293  05 001CD  3265FA  N                   STA       TSWØNUM         WHICH = # OF ITEMS TO MOVE
294  05 001D0  B7      A                   ØRA       A               CLEAR Z CONDITION BIT
295  05 001D1  CAE501  N                   WHILE:    CC,Z,C
296  05 001D4  1A      A                       LDAX      D           A= CONTAINS OF COMPARE EVENT
297  05 001D5  46      A                       MØV       B,M         B= CONTAINS OF FILL EVENT
298  05 001D6  77      A                       MØV       M,A         UPDATE FILL POS
299  05 001D7  78      A                       MØV       A,B         UPDATE COMPARE POS
300  05 001D8  12      A                       STAX      D           WITH NEW VALUE
301  05 001D9  13      A                       INX       D           MOVE POINTERS TO
302  05 001DA  23      A                       INX       H           NEXT ITEM
303  05 001DB  3A65FA  N                       LDA       TSWØNUM     INC MOVE
304  05 001DE  3C      A                       INR       A           LOOP CONTROL
305  05 001DF  3265FA  N                       STA       TSWØNUM     COUNTER
306  05 001E2  C3D101  N                   ENDWHILE
307                                    ENDIF
308  05 001E5  2153FA  N               DECBYT    INØLPØCT           DECRM INNER LOOP CNTR
     05 001E8  35      A
309  05 001E9  2A52FB  N               LHLD      FIXØADDR            H&L= ADDR OF FILL POSITION
310  05 001EC  C39501  N         ENDWHILE
311  05 001EF  110500  A         LXI       D,5                      MOVE H&L TO LOOK AT NEXT EVENT
312  05 001F2  19      A         DAD       D                        POSITION TO FILL
313  05 001F3  3A63FA  N         LDA       TBLDØTMP                 DECREMENT # OF EVENTS
314  05 001F6  3D      A         DCR       A                        TO SORT
315  05 001F7  3263FA  N         STA       TBLDØTMP
316  05 001FA  C38101  N         ENDWHILE
```

TABLE VI

```
223                                  *     MOVE THE SR# & EVENT ADDR FROM ROM TABLE
224                                  *     TO RAM TABLE. MOVES ONLY THE FIRST 3 IF
225                                  *     NO IMAGE SHIFT, OTHERWISE MOVES ALL 6
226                                  *
227                                  *
228  05 00160  1144FC  N         LXI       D,RAMØFSH                 D&E = ADDR OF RAM TABLE
229  05 00163  210000  N         LXI       H,RØMØFSH                 H&L = ADDR OF ROM TABLE
230  05 00166  B0      A         ØRA       B                         CLEAR Z CONDITION BIT
231  05 00167  CA7E01  N         WHILE:    CC,Z,C
232  05 0016A  23      A             INX       H                     INCREMENT H&L AND D&E
233  05 0016B  23      A             INX       H                     POINTERS OVER THE
234  05 0016C  13      A             INX       D                     ABS CLK COUNT
235  05 0016D  13      A             INX       D
236  05 0016E  7E      A             MØV       A,M                   LOAD A WITH SR#
237  05 0016F  12      A             STAX      D                     STORE SR# IN RAM TABLE
238  05 00170  23      A             INX       H                     MOVE POINTERS TO LS
239  05 00171  13      A             INX       D                     ADDR OF EVENT
240  05 00172  7E      A             MØV       A,M                   LOAD A WITH LS ADDR OF EVENT
241  05 00173  12      A             STAX      D                     & STORE IT IN RAM TABLE
242  05 00174  23      A             INX       H                     MOVE POINTERS TO MS
243  05 00175  13      A             INX       D                     ADDR OF EVENT
244  05 00176  7E      A             MØV       A,M                   MOVE MS ADDR OF EVENT
245  05 00177  12      A             STAX      D                     TO RAM
246  05 00178  23      A             INX       H                     MOVES POINTERS TO
247  05 00179  13      A             INX       D                     LS PART OF ABS CLK COUNT
248  05 0017A  05      A             DCR       B                     DECREMENT LOOP COUNTER
249  05 0017B  C36701  N         ENDWHILE
250
```

TABLE VII

MERGE VARIABLE PITCH EVENT TABLE & FIXED EVENT
TABLE CALCULATING THE REL DIFFERENCE WITH THE
RESULTS GOING INTO THE RUN EVENT TABLE

| Line | Addr1 | Addr2 | Code | Flag | Label | Op | Operand | Comment |
|---|---|---|---|---|---|---|---|---|
| 318 | | | | | | | | |
| 319 | | | | | | | | MERGE VARIABLE PITCH EVENT TABLE & FIXED EVENT |
| 320 | | | | | | | | TABLE CALCULATING THE REL DIFFERENCE WITH THE |
| 321 | | | | | | | | RESULTS GOING INTO THE RUN EVENT TABLE |
| 322 | | | | | | | | |
| 323 | 05 | 001FD | 2A44FC | N | | LHLD | EV@RAM | INITIALIZE VAR@CLK TO ABS CLK |
| 324 | 05 | 00200 | 225EFB | N | | SHLD | VAR@CLK | COUNT OF 1ST VAR PITCH EVENT |
| 325 | 05 | 00203 | 2144FC | N | | LXI | H,EV@RAM | INITIALIZE VAR@ADDR TO ADDR OF |
| 326 | 05 | 00206 | 225CFB | N | | SHLD | VAR@ADDR | 1ST VAR PITCH EVENT |
| 327 | 05 | 00209 | 211E00 | N | | LXI | H,EV@ROM | INITIALIZE FIX@ADDR TO ADDR OF |
| 328 | 05 | 0020C | 2252FB | N | | SHLD | FIX@ADDR | 1ST FIXED PITCH EVENT |
| 329 | 05 | 0020F | 3E80 | A | | SFLG | TBLD@1ST | NOTES 1ST EVENT TO RUN TABLE |
| | 05 | 00211 | 325EF4 | A | | | | |
| 330 | 05 | 00214 | 3E2C | A | | MVI | A,TABLENUM | INITIALIZE TSW@NUM TO # OF |
| 331 | 05 | 00216 | 3265FA | N | | STA | TSW@NUM | EVENTS IN FIXED PITCH TABLE |
| 332 | 05 | 00219 | 2A1E00 | N | | LHLD | FV@ROM | INITIALIZE O&E WITH ABS CLOCK |
| 333 | 05 | 0021C | EB | A | | XCHG | | COUNT OF 1ST FIXED EVENT |
| 334 | 05 | 0021D | AF | A | | CFLG | VAR@DONE | FLAG DENOTES VAR EVENTS |
| | 05 | 0021E | 3259F4 | A | | | | |
| 335 | 05 | 00221 | 3A59F4 | A | WHILE: | FLG,VAR@DONE,F | | WHILE THERE ARE MORE VAR EVENTS |
| | 05 | 00224 | 07 | A | | | | |
| | 05 | 00225 | DA6F02 | N | | | | |
| 336 | 05 | 00228 | 2A5EFB | N | | IF: | XWRD,VAR@CLK,LE,D | IS VAR CLK CNT <= FIXED CLK CNT |
| | 05 | 0022B | CD0000 | N | | | | |
| | 05 | 0022E | DA3402 | N | | | | |
| | 05 | 00231 | C25902 | N | | | | |
| 337 | 05 | 00234 | 2A5CFB | N | | LHLD | VAR@ADDR | YES, H&L = VAR EVENT ADDR |
| 338 | 05 | 00237 | CD9302 | N | | CALL | TBLD@UPD | PLACE VAR EVENT AT END RUN TBL |
| 339 | 05 | 0023A | 3A62FA | N | | LDA | TBLD@NUM | DECREMENT # OF |
| 340 | 05 | 0023D | 3D | A | | DCR | A | VARIABLE EVENTS LEFT |
| 341 | 05 | 0023E | 3262FA | N | | STA | TBLD@NUM | TO MERGE |
| 342 | 05 | 00241 | C24C02 | N | | IF: | CC,Z,S | DID TBLD@NUM GO TO 0 |
| 343 | 05 | 00244 | 3E80 | A | | SFLG | VAR@DONE | YES,DENOTE NO MORE VAR EVENTS |
| | 05 | 00246 | 3259F4 | A | | | | |
| 344 | 05 | 00249 | C35602 | N | | ELSE: | | |
| 345 | 05 | 0024C | 225CFB | N | | SHLD | VAR@ADDR | STORE ADDR OF NEXT VAR EVENT |
| 346 | 05 | 0024F | 5E | A | | MOV | E,M | UPDATE VAR@CLK TO |
| 347 | 05 | 00250 | 23 | A | | INX | H | VALUE OF ABS CLK COUNT |
| 348 | 05 | 00251 | 56 | A | | MOV | D,M | OF PRESENT VARIABLE |
| 349 | 05 | 00252 | EB | A | | XCHG | | EVENT |
| 350 | 05 | 00253 | 225EFB | N | | SHLD | VAR@CLK | |
| 351 | | | | | | ENDIF | | |
| 352 | 05 | 00256 | C36602 | N | | ELSE: | | IF FIXED TABLE CLK COUNT IS |
| 353 | 05 | 00259 | 2A52FB | N | | LHLD | FIX@ADDR | LESS THEN VAR TABLE UPDATE THE |
| 354 | 05 | 0025C | CD9302 | N | | CALL | TBLD@UPD | RUN TABLE WITH THAT EVENT |
| 355 | 05 | 0025F | 2252FB | N | | SHLD | FIX@ADDR | UPDATE TO NEXT FIXED EVENT |
| 356 | 05 | 00262 | 2165FA | N | | LXI | H,TSW@NUM | DECREMENT # OF FIXED EVENTS |
| 357 | 05 | 00265 | 35 | A | | DCR | M | LEFT |
| 358 | | | | | | ENDIF | | |
| 359 | 05 | 00266 | 2A52FB | N | | LHLD | FIX@ADDR | |
| 360 | 05 | 00269 | 5E | A | | MOV | E,M | UPDATE D&L TO = |
| 361 | 05 | 0026A | 23 | A | | INX | H | ABS CLK CNT VALUE |
| 362 | 05 | 0026B | 56 | A | | MOV | D,M | OF PRESENT FIXED TABLE |
| 363 | 05 | 0026C | C32102 | N | | ENDWHILE | | |
| 364 | 05 | 0026F | 3EFF | A | | MVI | A,X'FF' | CLEAR Z CONDITION |
| 365 | 05 | 00271 | B7 | A | | ORA | A | BIT FOR LOOP |
| 366 | 05 | 00272 | 2A52FB | N | | LHLD | FIX@ADDR | NO MORE VAR EVENTS, USE FIXED |
| 367 | 05 | 00275 | CA8402 | N | | WHILE: | CC,Z,C | DONE WITH FIXED TABLE |
| 368 | 05 | 00278 | CD9302 | N | | CALL | TBLD@UPD | NO,UPDATE RUN TABLE |
| 369 | 05 | 0027B | EB | A | | XCHG | | SAVE H&L IN D&E |
| 370 | 05 | 0027C | 2165FA | N | | LXI | H,TSW@NUM | DECREMENT # OF FIXED |
| 371 | 05 | 0027F | 35 | A | | DCR | M | EVENTS LEFT |
| 372 | 05 | 00280 | EB | A | | XCHG | | RESTORE H&L |
| 373 | 05 | 00281 | C37502 | N | | ENDWHILE | | |
| 374 | 05 | 00284 | 2A58FB | N | | LHLD | P@TBL@A | H&L=ADDR OF LAST MS ADDR IN RUN |
| 375 | 05 | 00287 | 2B | A | | DCX | H | MOVE H&L POINTER BACK TO POINT |
| 376 | 05 | 00288 | 2B | A | | DCX | H | AT THE BEGINNING OF THE LAST |
| 377 | 05 | 00289 | 2B | A | | DCX | H | EVENT (OVER@RUN) & STORE IT |
| 378 | 05 | 0028A | 2264FD | N | | SHLD | EV@PTR: | FOR MACH CLK INTERRUPT HANDLER |
| 379 | 05 | 0028D | 3E80 | A | | SFLG | TBLD@FIN | DENOTES PITCH TABLE IS COMPLETE |
| | 05 | 0028F | 325DF4 | A | | | | |
| 380 | 05 | 00292 | C9 | A | | RET | | |
| 382 | | | | | | | | |
| 383 | | | | | | | | SUBROUTINE TO CALCULATE REL DIFFERENCE BETWEEN |
| 384 | | | | | | | | 2 EVENTS & MOVE REST OF TABLE TO RUN TABLE |
| 385 | | | | | | | | |
| 386 | 05 | 00293 | 3A5EF4 | A | TBLD@UPD | IF: | FLG,TBLD@1ST,T | THIS IS THE FIRST EVENT |
| | 05 | 00296 | 07 | A | | | | |
| | 05 | 00297 | D2AF02 | N | | | | |
| 387 | 05 | 0029A | AF | A | | CFLG | TBLD@1ST | YES, CLR FLAG TO KEEP OUT |
| | 05 | 0029B | 325EF4 | A | | | | |
| 388 | 05 | 0029E | 7E | A | | MOV | A,M | A= LS OF 1ST EVENT ABS CLK CNT |
| 389 | 05 | 0029F | 3251FA | N | | STA | EV@1@TIM | USED AT PITCH PESET |
| 390 | 05 | 002A2 | 5F | A | | MOV | E,A | E=LS OF 1ST EVENT ABS CLK CNT |
| 391 | 05 | 002A3 | 23 | A | | INX | H | H&L=ADDR OF MS ABS CLK CNT |
| 392 | 05 | 002A4 | 56 | A | | MOV | D,M | D=MS OF 1ST EVENT ABS CLK CNT |
| 393 | 05 | 002A5 | EB | A | | XCHG | | D&E= ADDR OF MS ABS CLK CNT |
| 394 | 05 | 002A6 | 2256FB | N | | SHLD | LCLK@CNT | STORE ABS CLK OF 1ST EVENT |
| 395 | 05 | 002A9 | 21E8FE | N | | LXI | H,EV@BASE: | H&L = ADDR OF RUN TABLE |
| 396 | 05 | 002AC | C3D802 | N | | ELSE: | | |
| 397 | 05 | 002AF | 5E | A | | MOV | E,M | E=LS CLK CNT OF NEW EVENT |
| 398 | 05 | 002B0 | 23 | A | | INX | H | H&L= ADDR OF MS ABS CLK CNT |
| 399 | 05 | 002B1 | 56 | A | | MOV | D,M | D=MS CLK CNT OF NEW EVENT |
| 400 | 05 | 002B2 | E5 | A | | PUSH | H | SAVE ADDR OF MS ABS CLK CNT |
| 401 | 05 | 002B3 | 2A56FB | N | | IF: | XWRD,LCLK@CNT,GE,D | IS LAST CLK CNT GE NEW CLK CNT |
| | 05 | 002B6 | CD0000 | N | | | | |
| | 05 | 002B9 | DAC502 | N | | | | |
| 402 | 05 | 002BC | 23 | A | | INX | H | H&L= LAST CLK CNT + 1 |
| 403 | 05 | 002BD | 2256FB | N | | SHLD | LCLK@CNT | STORE IT FOR NEXT TIME |
| 404 | 05 | 002C0 | 3E01 | A | | MVI | A,1 | PUT THIS EVENT AT THE NEXT CLK |

```
405   05 002C2   C3CC02    N           ELSE:
406   05 002C5   45        A              MOV      B,L                  B=LS CLK CNT OF LAST EVENT
407   05 002C6   EB        A              XCHG                          H&L=ABS CLK CNT OF NEW EVENT
408   05 002C7   2256FB    N              SHLD     LCLK@CNT             STORE IT FOR THE NEXT TIME
409   05 002CA   7D        A              MOV      A,L                  A=LS CLK CNT OF NEW EVENT
410   05 002CB   90        A              SUB      B                    FIND DIFF (ONLY NEED LS IF CLK
411                                    ENDIF                            CNTS BETWEEN EVENTS <256)
412   05 002CC   D1        A              POP      D                    D&E=ADDR OF MS OF CLK OF NEW EV
413   05 002CD   2A58FB    N              LHLD     P@TBL@A              H&L= ADDR OF END OF LAST RUN EV
414   05 002D0   2B        A              DCX      H                    MOVE H&L POINTER
415   05 002D1   2B        A              DCX      H                    TO REL DIFF OF LAST
416   05 002D2   2B        A              DCX      H                    EVENT IN RUN TABLE
417   05 002D3   77        A              MOV      M,A                  MOVE REL DIFF TO RUN TABLE
418   05 002D4   23        A              INX      H                    INCREMENT RUN TABLE
419   05 002D5   23        A              INX      H                    POINTER OVER LAST
420   05 002D6   23        A              INX      H                    EVENT
421   05 002D7   23        A              INX      H
422                                    ENDIF
423   05 002D8   23        A              INX      H                    H&L= ADDR OF SR# IN RUN TABLE
424   05 002D9   13        A              INX      D                    D&E= ADDR OF SR#
425   05 002DA   1A        A              LDAX     D                    MOVE SR# FROM TABLE TO
426   05 002DB   77        A              MOV      M,A                  RUN TABLE
427   05 002DC   23        A              INX      H                    MOVE POINTERS TO LS 8 BITS
428   05 002DD   13        A              INX      D                    OF EVENT ADDR
429   05 002DE   1A        A              LDAX     D                    MOVE LS 8 BITS OF ADDR
430   05 002DF   77        A              MOV      M,A
431   05 002E0   23        A              INX      H                    MOVES POINTER TO MS 8 BITS
432   05 002E1   13        A              INX      D                    OF EVENT ADDR
433   05 002E2   1A        A              LDAX     D                    MOVES MS 8 BITS OF ADDR
434   05 002E3   77        A              MOV      M,A
435   05 002E4   2258FB    N              SHLD     P@TBL@A              STORE ADDR OF RUN TABLE
436   05 002E7   13        A              INX      D                    POINTER TO LS 8 BITS OF CLK CNT
437   05 002E8   EB        A              XCHG                          H&L= ADDR OF LS 8 BITS OF CLK
438   05 002E9   C9        A              RET
440                                 *
441                                 *     SUBROUTINE TO DETERMINE IF MODIFIED FO ON EVENT
442                                 *     CLK COUNT IF CLK COUNT RESULTS ARE NEGATIVE OR 0
443                                 *
444   05 002EA   7C        A       ON@MOD MOV     A,H                   A= MS PART OF ABS CLK COUNT
445   05 002EB   07        A              RLC                           CARRY= SIGN OF ABS CLK COUNT
446   05 002EC   D20203    N              IF:     CC,C,S                IS THE ABS CLK CNT NEG
447   05 002EF   119603    A                 LXI     D,BASE@CNT         YES,ADD # CLK COUNTS PER PITCH
448   05 002F2   19        A                 DAD     D                  TO NEG #
449   05 002F3   118E03    A                 IF:     XWRD,H,GE,SAFE@CNT IS RESULTS GE SAFE # CLK/PITCH
      05 002F6   CD0000    N
      05 002F9   DAFF02    N
450   05 002FC   210100    A                    LXI   H,1               YES,MOVE TO TURN ON LATER
451                                          ENDIF
452   05 002FF   C30E03    N                 ORIF:   XWRD,H,EQ,0        IF RESULTS = 0, MOVE LATER IN
      05 00302   110000    N
      05 00305   CD0000    N
      05 00308   C20E03    N
453   05 0030B   210100    A                    LXI   H,1               PITCH BECUASE EVENT MUST BE > 0
454                                          ENDIF
455   05 0030E   C9        A              RET
456                                    END

CONTROL SECTION SUMMARY: 01 00000   PT 0    02 00000   PT 0    03 00000   PT 0    04 OFF08   PT 2
                         05 0030F   PT 1
* NO UNDEFINED SYMBOLS
*   ERROR SEVERITY LEVEL: 0
* NO ERROR LINES
```

TABLE VIII

```
219
220                                 *  PITCH RESET INTERRUPT HANDLER
221                                 *
223   06 000F9   FB        A       RSET:  EI                            RE-ENABLE INTERRUPTS
224   06 000FA   F5        A              PUSH    PSW                   SAVE A-REG & CONDITION BITS
225   06 000FB   3A5DF4    A              IF:     FLG,TBLD@FIN,T        IS PITCH TABLE BUILD FINISHED
      06 000FE   07        A
      06 000FF   D26201    N
226   06 00102   E5        A              PUSH    H                    SAVE H&L
227                                       IF:     FLGS,SR@DONE,,       YES, IS THERE A NEW SR VALUE
228   06 00103   3A4DF4    A                      AND,910@DONE,T       YES, DID 910 EVENT GET DONE
      06 00106   216FF4    A
      06 00109   A6        A
      06 0010A   F25501    N
229   06 0010D   AF        A                 CFLG    910@DONE          YES, RESET & MACH CLK TIMING OK
      06 0010E   326FF4    A
230   06 00111   324DF4    A                 MODFLG  SR@DONE           CLR FLAG UNTIL NEXT SR EVENT
231   06 00114   2163FD    A                 LXI     H,ADR(DATA,SR@PTR:) LOAD RELATIVE
232   06 00117   7E        A                 MOV     A,M                         PNTR TO SR #0
233   06 00118   C60F      A                 MODBYT  A,ADD,15          MOVE PNTR BACK
234   06 0011A   E66F      A                 MODBYT  A,AND,SR@ADJ:              BY 1 (CIRCULAR)
235   06 0011C   77        A                 MOV     M,A               SAVE NEW REL SR PNTR IN SR@PTR:
236   06 0011D   26FE      A                 MVI     H,HADR(DATA,SHIFTREG) H&L= ABS ADDR
237   06 0011F   6F        A                 MOV     L,A                         OF SR #0
238   06 00120   3A69FD    A                 LDA     ADR(DATA,SR@VALU:) A= NEW SR VALUE FROM SRSK
239   06 00123   77        A                 MOV     M,A               UPDATE CONTENTS OF SR#0
240   06 00124   3A51FA    A                 LDA     ADR(DATA,EV@1@TIM) INIT MCLK:CNT
241   06 00127   326EFD    A                 STA     ADR(DATA,MCLK:CNT)
242   06 0012A   21E8FE    A                 LXI     H,ADR(DATA,EV@BASE:) INIT EV@PTR:
243   06 0012D   2264FD    A                 SHLD    ADR(DATA,EV@PTR:)           TO 1ST EVENT ADDR
244                                          IF:     FLGS,NORM@DN:,,   IS NORMAL SHUTDOWN REQUESTED
245                                                  AND,CYCL@DN:,,    NO, IS CYCLE=DOWN REQUESTED
246   06 00130   3AABF4    A                         AND,SD1@DLY,F     NO, IS PROC DEAD CYCLING
      06 00133   21AAF4    A
      06 00136   B6        A
      06 00137   21AFF4    A
      06 0013A   B6        A
```

| 247 | 06 0013E | 2166FD | A | | LXI | H,ADR(DATA,CYCUPCT1) | NO, LOAD CYCLE-UP CNTR |
| --- | --- | --- | --- | --- | --- | --- | --- |
| 248 | 06 00141 | 7E | A | | IF: | XBYT,M,NE,5 | IS PROC IN CYCLE-UP MODE |
| | 06 00142 | FE05 | A | | | | |
| | 06 00144 | CA5201 | N | | | | |
| 249 | 06 00147 | FE04 | A | | IF: | XBYT,A,EQ,4 | YES, IS IT RDY TO MAKE 1ST IMG |
| | 06 00149 | C25101 | N | | | | |
| 250 | 06 0014C | 3E80 | A | | SFLG | IMGMADE: | YES, SIGNAL 1ST IMAGE MADE |
| | 06 0014E | 32ADF4 | A | | | | |
| 251 | | | | | ENDIF | | |
| 252 | 06 00151 | 34 | A | | INR | M | INCRM CYCLE-UP CNTR (UNTIL= 5) |
| 253 | | | | | ENDIF | | |
| 254 | | | | | ENDIF | | |
| 255 | 06 00152 | C36101 | N | | ELSE: | | NEW SR VALUE NOT AVAILABLE |
| 256 | 06 00155 | 3E80 | A | | SFLG | IMEDODN: | REQUEST AN IMED SHUTDOWN |
| | 06 00157 | 32A9F4 | A | | | | |
| 257 | 06 0015A | 2132FD | A | | SFBIT,P | EOPROFLT | SIGNAL EARLY PITCH RESET FAULT |
| | 06 0015D | 3E40 | A | | | | |
| | 06 0015F | B6 | A | | | | |
| | 06 00160 | 77 | A | | | | |
| 258 | | | | | ENDIF | | |
| 259 | 06 00161 | E1 | A | | POP | H | RESTORE H&L |
| 260 | | | | | ENDIF | | |
| 261 | 06 00162 | 3EFE | A | | MVI | A,RSETFF: | RESET PITCH RESET |
| 262 | 06 00164 | 3200E6 | A | | STA | ADR(EQU,RSINTFF:) | INT FLIP-FLOP |
| 263 | 06 00167 | F1 | A | | POP | PSW | RESTORE A-REG & CONDITION BITS |
| 264 | 06 00168 | C9 | A | | RET | | RETURN TO INTERRUPTED ROUTINE |

TABLE IX

| 57 | | | | | | | |
| --- | --- | --- | --- | --- | --- | --- | --- |
| 58 | | | | * MACHINE CLOCK INTERRUPT HANDLER | | | |
| 59 | | | | * | | | |
| 61 | 06 0002B | | | | ORIGIN | X'38' | INTERRUPT TRAP CELL LOCATION |
| 64 | 06 00038 | F5 | A | MCLK: | PUSH | PSW | SAVE A-REG & CONDITION CODES |
| 65 | 06 00039 | 3A6EFD | A | | LDA | ADR(DATA,MCLK:CNT) | IS THERE |
| 66 | 06 0003C | 3D | A | | DCR | A | A PITCH |
| 67 | 06 0003D | C26600 | N | | IF: | CC,Z,S | EVENT TO DO |
| 68 | 06 00040 | E5 | A | | PUSH | H | YES, SAVE |
| 69 | 06 00041 | D5 | A | | PUSH | D | ALL REMAINING |
| 70 | 06 00042 | C5 | A | | PUSH | B | REGS |
| 71 | 06 00043 | 2A64FD | A | | LHLD | ADR(DATA,EVOPTR:) | H&L= 1ST LOC OF NEXT PE TO DO |
| 72 | 06 00046 | 7E | A | | MOV | A,M | SAVE RELATIVE DIFFERENTIAL TO |
| 73 | 06 00047 | 326EFD | A | | STA | ADR(DATA,MCLK:CNT) | NEXT EVENT (# CLOCK COUNTS) |
| 74 | 06 0004A | 23 | A | | INX | H | MOVE PNTR TO RFL SR IN TABLE |
| 75 | 06 0004B | 3A63FD | A | | LDA | ADR(DATA,SROPTR:) | LOAD REL POSITION OF SR #0 |
| 76 | 06 0004E | 86 | A | | MODBYT | A,ADD,M | C= LS PORTION OF ADDR OF THE |
| 77 | 06 0004F | E66F | A | | MODBYT | A,AND,SROADJ: | REQUESTED SHIFT REGISTER |
| 78 | 06 00051 | 4F | A | | MOV | C,A | POSITION (FOR USE WITHIN PE) |
| 79 | 06 00052 | 06FE | A | | MVI | B,HADR(SHIFTREG) | B&C= ADDR REQUESTED SR POSITION |
| 80 | 06 00054 | 0A | A | | LDAX | B | A= <REQUESTED SR POSITION> |
| 81 | 06 00055 | 23 | A | | INX | H | E= LS PORTION OF ADDR OF THE |
| 82 | 06 00056 | 5E | A | | MOV | E,M | REQUESTED PITCH EVENT |
| 83 | 06 00057 | 23 | A | | INX | H | D= MS PORTION OF ADDR OF THE |
| 84 | 06 00058 | 56 | A | | MOV | D,M | REQUESTED PITCH EVENT |
| 85 | 06 00059 | 23 | A | | INX | H | SAVE PNTR TO |
| 86 | 06 0005A | 2264FD | A | | SHLD | ADR(DATA,EVOPTR:) | NEXT PITCH EVENT |
| 87 | 06 0005D | CD0000 | N | | CALL | DE:IND | VECTOR TO REQUESTED PITCH EVENT |
| 88 | 06 00060 | C1 | A | | POP | B | RESTORE |
| 89 | 06 00061 | D1 | A | | POP | D | SAVED |
| 90 | 06 00062 | E1 | A | | POP | H | REGISTERS |
| 91 | 06 00063 | C37000 | N | | ELSE: | | |
| 92 | 06 00066 | 326EFD | A | | STA | ADR(DATA,MCLK:CNT) | NO PE; SAVE DECRM'D 'MCLK:CNT' |
| 93 | 06 00069 | 0F | A | | RRC | | IS IT TIME FOR |
| 94 | 06 0006A | D27000 | N | | IF: | CC,C,S | A REFRESH |
| 95 | 06 0006D | 3202E6 | A | | REFRESH . | | YES, REFRESH RFMOTES (1 MSEC) |
| 96 | | | | | ENDIF | | |
| 97 | | | | | ENDIF | | |
| 98 | 06 00070 | FB | A | | EI | | RE-ENABLE INTERRUPT SYSTEM |
| 99 | 06 00071 | 3EFD | A | | MVI | A,MCLKFF: | RESET MCLK |
| 100 | 06 00073 | 3200E6 | A | | STA | ADR(EQU,RSINTFF:) | INTERRUPT FLIP-FLOP |
| 101 | 06 00076 | F1 | A | | POP | PSW | RESTORE A-REG & CONDITION CODES |
| 102 | 06 00077 | C9 | A | | RET | | RETURN TO INTERRUPTED ROUTINE |

TABLE X

| 139 | | | | | | | |
| --- | --- | --- | --- | --- | --- | --- | --- |
| 140 | | | | * REAL TIME CLOCK INTERRUPT HANDLER | | | |
| 141 | | | | * | | | |
| 143 | 06 00081 | FB | A | RTC: | EI | | RE-ENABLE INTERRUPTS |
| 144 | 06 00082 | F5 | A | | PUSH | PSW | SAVE A-REG & CONDITION BITS |
| 145 | 06 00083 | 3EF7 | A | | MVI | A,RTCFF: | RESET RTC |
| 146 | 06 00085 | 3200E6 | A | | STA | ADR(EQU,RSINTFF:) | INTERRUPT FLIP-FLOP |
| 147 | 06 00088 | D5 | A | | PUSH | D | SAVE D&E REGS |
| 148 | 06 00089 | E5 | A | | PUSH | H | SAVE H&L REGS |
| 149 | 06 0008A | C5 | A | | PUSH | B | SAVE 'B' REGISTER |
| 150 | | | | | | | |
| 151 | 06 0008B | 2150FD | N | | DECBYT | GLBITIMR | DECREMENT THE CLOCK CELL |
| | 06 0008E | 35 | A | | | | |
| 152 | 06 0008F | 7E | A | | MOV | A,M | A = <GLBITIMR> ( 0 TO 255 ) |
| 153 | 06 00090 | 23 | A | | INX | H | MEM. PTR. TO SR:RQST BYTE |
| 154 | 06 00091 | E601 | A | | IF: | XBYT,A,AND,X'01',NZ | IS IT 20 MSEC TIME YET |
| | 06 00093 | CA9D00 | N | | | | |
| 155 | 06 00096 | 7E | A | | MODBYT | H,OR,10:RQST:20:RQST | YES = BOTH 10 AND 20 BKGD |
| | 06 00097 | F6C0 | A | | | | |
| | 06 00099 | 77 | A | | | | |

```
156   06 0009A   C3A100   N          ELSE:
157   06 0009D   7E       A              MODBYT    M,OR,10:RQST              NO - 10 BKGD ONLY
      06 0009E   F680     A
      06 000A0   77       A
158                                  ENDIF
159   06 000A1   23       A          INX       H                             MEM. PTR. TO DIVD:10 CNTR
160   06 000A2   35       A          DCR       M                             DECREMENT 10 TO 0 COUNTER
161   06 000A3   C2AD00   N          IF:       CC,Z,S                        HAS 100 MSEC PASSED
162   06 000A6   360A     A              MVI       M,10                      YES - RESET THE 10 TO 0 COUNTER
163   06 000A8   2B       A              DCX       H                         MEM. PTR. BACK TO SB:RQST
164   06 000A9   7E       A              MODBYT    M,OR,100:RQST             ADD 100 BKGD TO REQUEST BYTE
      06 000AA   F620     A
      06 000AC   77       A
165                                  ENDIF
166                                  REPEAT                                  NOW CHECK FOR TIME OUTS
167   06 000AD   2150FD   N              LXI       H,GLB:TIMR                LOAD 'B' WITH QUANTITY TO LOOK
168   06 000B0   46       A              MOV       B,M                       FOR (CLOCK CELL VALUE)
169   06 000B1   16FB     A              MVI       D,COUNT:                  SET 'D' FOR TABLE TO SEARCH
170   06 000B3   CD0000   N              CALL      FIND:LOC                  GO LOOK IN ACTIVE LIST
171   06 000B6   CAF000   N              IF:       CC,Z,C                    HAS A MATCH BEEN FOUND
172   06 000B9   E5       A                  PUSH      H                     YES - SAVE LOCATION ON STACK
173   06 000BA   26FC     A                  MVI       H,ID:                 SEGWAY MEM PTR TO ID: TABLE
174   06 000BC   5E       A                  MOV       E,M                   NOW ASSEMBLE
175   06 000BD   1600     A                  MVI       D,0                   ADDRESS OF TIMER
176   06 000BF   21C8F4   A                  LXI       H,TMR:FLGS            FLAG INTO THE
177   06 000C2   19       A                  DAD       D                     MEMORY POINTER
178   06 000C3   0600     A                  MVI       B,0                   GET SET TO CLEAR THE FLAG
179   06 000C5   F3       A                  DI                              NO INTERRUPTIONS NOW, PLEASE
180   06 000C6   7E       A                  MOV       A,M                   GET FLAG
181   06 000C7   07       A                  RLC                             INTO THE CARRY BIT
182   06 000C8   D2EC00   N                  IF:       CC,C,S                IS FLAG SET
183   06 000CB   70       A                      MOV       M,B               YES - RESET AND NOW
184   06 000CC   FB       A                      EI                          EVERYBODY CAN INTERRUPT AGAIN
185   06 000CD   E1       A                      POP       H                 LOCATION FROM STACK TO MEM PTR
186   06 000CE   26FD     A                      MVI       H,LS:ADDR         SEGWAY MEM PTR TO LS: TABLE
187   06 000D0   5E       A                      MOV       E,M               GET LS TIME-OUT ADDRESS
188   06 000D1   24       A                      INR       H                 SEGWAY MEM PTR TO MS: TABLE
189   06 000D2   56       A                      MOV       D,M               GET MS TIME-OUT ADDRESS
190   06 000D3   45       A                      MOV       B,L               LOCATION TO 'B' TEMPORARILY
191   06 000D4   2A5FFD   N                      LHLD      INPTR:            STUFF TIME-OUT ADDRESS INTO
192   06 000D7   73       A                      MOV       M,E               INTO TABLE OF TIME-OUT
193   06 000D8   23       A                      INX       H                 ADDRESSES THAT IS CHECKED
194   06 000D9   72       A                      MOV       M,D               FOR ENTRIES EVERY 10 MSECONDS
195   06 000DA   23       A                      INX       H                 BY THE STATE CHECKER
196   06 000DB   7D       A                      MODBYT    L,AND,TIME:MSK    FORCE A CIRCULAR TABLE
      06 000DC   E62F     A
      06 000DE   6F       A
197   06 000DF   225FFD   N                      SHLD      INPTR:            SAVE NEW ADDRESS LOCATION
198   06 000E2   58       A                      MOV       E,B               LOCATION BACK TO 'E'
199   06 000E3   CD0000   N                      CALL      DEACTIV:          TAKE OUT OF ACTIVE TIMER LIST
200   06 000E6   CD0000   N                      CALL      PUT:              AND MAKE LOCATION AVAILABLE
201   06 000E9   C3EE00   N                  ELSE:                           * * * FLAG IS NOT SET SO
202   06 000EC   FB       A                      EI                              LET INTERRUPTIONS OCCUR
203   06 000ED   E1       A                      POP       H                     MAKE THE STACK RIGHT AND
204                                          ENDIF                               FORCE NON-ZERO CONDITION TO
205   06 000EE   F601     A                      MODBYT    A,OR,1                STAY IN UNTIL LOOP
206                                      ENDIF                                 * * NO MATCH - RTC COMPLETE
207   06 000F0   C2AD00   N              UNTIL:    CC,Z,S                    WILL FALL THROUGH THIS CRACK
208
209   06 000F3   E1       A              POP       H                         RESTORE THE
210   06 000F4   44       A              MOV       B,H                       'B' REGISTER
211   06 000F5   E1       A              POP       H                         RESTORE H&L REGS
212   06 000F6   D1       A              POP       D                         RESTORE D&E REGS
213   06 000F7   F1       A              POP       PSW                       RESTORE A-REG & CONDITION CODES
214   06 000F8   C9       A              RET                                 RETURN TO 'FLOAT' BACKGROUND
215
```

TABLE XI

```
151
152                 *******************************************************************
153                 * COMMON SWITCH SCAN SUBR-  ENTER WITH SWITCH BYTE IN A-REG (FROM BIT OR BYTE
154                 *     FILTERING SUBROUTINES), ADDR OF PRIOR SWITCH CONDITION BYTE IN MEMORY (H&L
155                 *     REGS), AND E-REG SET TO SWITCH BYTE (AND 'CASE:' GROUP) NUMBER (5 TO 0).
                    *******************************************************************
157   05 0007D   47       A   SWS&SCAN  MOV       B,A                        B= LATEST 'READ' DATA
158   05 0007E   7E       A             MOV       A,M                        A= PRIOR 'READ' DATA
159   05 0007F   70       A             MOV       M,B                        UPDATE 'PRIOR' TO 'LATEST'
160   05 00080   A8       A             MODBYT    A,XOR,B                    A= 1 WHERE SWS JUST CHANGED
161   05 00081   A0       A             IF:       XBYT,A,AND,B,NZ            WERE ANY SWS JUST PUSHED
      05 00082   CA5501   N
162   05 00085   26FF     A                 MVI       H,X'FF'                YES, INIT BIT POSITION CNTR
163                                      REPEAT                              LOOP 'UNTIL' NO BITS= 1 IN BYTE
164   05 00087   24       A                 INR       H                      H= POSITION OF SW (D0 TO D7)
165   05 00088   17       A                 RAL                              PUT SW INFO INTO 'C' BIT
166   05 00089   D25101   N                 IF:       CC,C,S                 HAS THIS SW JUST BEEN PUSHED
167   05 0008C   F5       A                     PUSH      PSW                YES, SAVE
168   05 0008D   D5       A                     PUSH      D                          REGS OVER
169   05 0008E   E5       A                     PUSH      H                                  'CASE:'
170   05 0008F   7B       A                     MOV       A,E                RELOAD 'BYTE #' CNTR
171   05 00090   E61F     A                     ANI       X'1F'              ELLIM.PASS.OF POSITIVE #
172   05 00092   07       A                     RLC                          MULTIPLE
173   05 00093   07       A                     RLC                                  A-REG
174   05 00094   07       A                     RLC                                        BY 8
175   05 00095   84       A                     CASE:     XBYT,A,ADD,H       USE BYTE # & BIT # AS A PNTR
      05 00096   114E01   N
      05 00099   FE58     A
      05 0009B   CD0000   N
```

```
177
178              ************************************************************
                 * ACTIVE SWITCHES FOR STAND-BY (NOT READY & READY STATES) *
179              ************************************************************
180    05 0009E   0000   N              C,00     DIGIT@IN      DIGIT 1
181    05 000A0   0000   N              C,01     DIGIT@IN      DIGIT 2
182    05 000A2   0000   N              C,02     DIGIT@IN      DIGIT 3
183    05 000A4   0000   N              C,03     DIGIT@IN      DIGIT 4
184    05 000A6   0000   N              C,04     DIGIT@IN      DIGIT 5
185    05 000A8   0000   N              C,05     DIGIT@IN      DIGIT 6
186    05 000AA   0000   N              C,06     DIGIT@IN      DIGIT 7
187    05 000AC   0000   N              C,07     DIGIT@IN      DIGIT 8
188             *
189    05 000AE   0000   N              C,08     DIGIT@IN      DIGIT 9
190    05 000B0   0000   N              C,09     KYBD@O        DIGIT 0
191    05 000B2   0000   N              C,10     RECALL@
192    05 000B4   0000   N              C,11     @CLEAR        CLEAR
193    05 000B6   0000   N              C,12     IMAG@SFT      IMAGE SHIFT
194    05 000B8   9301   N              C,13     SPARE
195    05 000BA   0000   N              C,14     STRT@PRT      START PRINT
196    05 000BC   0000   N              C,15     STOP@PRT      STOP PRINT
197             *
198    05 000BE   0000   N              C,16     VAR@DENS      VARIABLE DENSITY
199    05 000C0   0000   N              C,17     AX@TRAY       AUX TRAY
200    05 000C2   9301   N              C,18     SPARE
201    05 000C4   9301   N              C,19     SPARE
202    05 000C6   9301   N              C,20     SPARE
203    05 000C8   0000   N              C,21     PEC@ON        PASTE UP SUPPRESSION
204    05 000CA   0000   N              C,22     2SD@CPY       2 SIDED COPY
205    05 000CC   9301   N              C,23     SPARE
206             *
207    05 000CE   9401   N              C,24     RX
208    05 000D0   9401   N              C,25     RX
209    05 000D2   9401   N              C,26     RX
210    05 000D4   9401   N              C,27     RX
211    05 000D6   0000   N              C,28     98@REDN       98% REDUCTION
212    05 000D8   0000   N              C,29     74@REDN       74% REDUCTION
213    05 000DA   0000   N              C,30     65@REDN       65% REDUCTION
214    05 000DC   0000   N              C,31     RX@ZOOM       RANK ZOOM LENS
215             *
216    05 000DE   0000   N              C,32     ADH@JREC      ADH JOB RECOVERY
217    05 000E0   0000   N              C,33     ADH@MULT      ADH MULTIPLE FEED
218    05 000E2   0000   N              C,34     ADH@SGNL      ADH SINGLE FEED
219    05 000E4   9401   N              C,35     RX
220    05 000E6   0000   N              C,36     SRT@JBS       SORTER JOB SUPPLEMENT
221    05 000E8   0000   N              C,37     SRT@SETS      SORTER SETS
222    05 000EA   0000   N              C,38     SRT@STKS      SORTER STACKS
223    05 000EC   9301   N              C,39     SPARE
224             *
225    05 000EE   9301   N              C,40     SPARE
226    05 000F0   9301   N              C,41     SPARE
227    05 000F2   9301   N              C,42     SPARE
228    05 000F4   9301   N              C,43     SPARE
229    05 000F6   0000   N              C,44     SERVICE       TECH REP KEY SWITCH
230    05 000F8   0000   N              C,45     FAULT@CD      DISPLAY FAULT CODE
231    05 000FA   0000   N              C,46     LVDGNPRG      LEAVE DIAGNOSTIC PROGRAM
232    05 000FC   9301   N              C,47     SPARE
234              **********************************
235              * ACTIVE SWITCHES FOR PRINT STATE *
236              **********************************
237    05 000FE   0000   N              C,48     RECALL@       RECALL QUANTITY
238    05 00100   0000   N              C,49     ADH@PMUL      ADH MULTIPLE FEED
239    05 00102   0000   N              C,50     ADH@PSIN      ADH SINGLE FEED
240    05 00104   9301   N              C,51     SPARE
241    05 00106   0000   N              C,52     SMPL@CPY      SAMPLE COPY (START PRINT)
242    05 00108   0000   N              C,53     PRT@STOP      STOP PRINT
243    05 0010A   0000   N              C,54     CNTR@RST      DIAGNOSTIC COUNTER RESET
244    05 0010C   0000   N              C,55     AX@PRNT       AUX TRAY
245              ***************************************************************
246              * ACTIVE SWITCHES FOR TECH REP (NOT READY, READY STATES)       *
247              ***************************************************************
248    05 0010E   0000   N              C,56     DIGIT@TR      DIGIT 1
249    05 00110   0000   N              C,57     DIGIT@TR      DIGIT 2
250    05 00112   0000   N              C,58     DIGIT@TR      DIGIT 3
251    05 00114   0000   N              C,59     DIGIT@TR      DIGIT 4
252    05 00116   0000   N              C,60     DIGIT@TR      DIGIT 5
253    05 00118   0000   N              C,61     DIGIT@TR      DIGIT 6
254    05 0011A   0000   N              C,62     DIGIT@TR      DIGIT 7
255    05 0011C   0000   N              C,63     DIGIT@TR      DIGIT 8
256             *
257    05 0011E   0000   N              C,64     DIGIT@TR      DIGIT 9
258    05 00120   0000   N              C,65     KYBD@OTR      DIGIT 0
259    05 00122   0000   N              C,66     @RECALL@
260    05 00124   0000   N              C,67     @CLEAR@
261    05 00126   0000   N              C,68     SERVICE       TECH REP KEY SWITCH
262    05 00128   0000   N              C,69     DIAG@PRG      DIAGNOSTIC PROGRAM
263    05 0012A   0000   N              C,70     STRT@DG       START PRINT
264    05 0012C   0000   N              C,71     STOP@DG       STOP PRINT
265              ***************************************************************
266              * ACTIVE SWITCHES FOR MINI PHYSICAL (NOT READY & READY STATE)  *
267              ***************************************************************
268    05 0012E   0000   N              C,72     MINI@MIS      MISFEED CLEAR
269    05 00130   0000   N              C,73     RECALL@       RECALL QUANTITY
270    05 00132   9301   N              C,74     SPARE
271    05 00134   0000   N              C,75     FAULT@CD      DISPLAY FAULT CODE
272    05 00136   0000   N              C,76     LVDGNPRG      LEAVE DIAGNOSTIC PROGRAM
273    05 00138   0000   N              C,77     MINI@PRT      MINI PHYSICAL AT PRINT
274    05 0013A   0000   N              C,78     STOP@PRT      STOP PRINT
275    05 0013C   0000   N              C,79     ADH@JREC      ADH JOB RECOVERY
276              ********************************************************************
277              * ACTIVE SWITCHES FOR MINI PHYSICAL (PRINT STATE & RUNNOT PRINT STATE) *
278              ********************************************************************
```

```
279  05 0013E  9301    N                         C,80      SPARE
280  05 00140  9301    N                         C,81      SPARE
281  05 00142  0000    N                         C,82      RECALL@         RECALL QUANTITY
282  05 00144  9301    N                         C,83      SPARE
283  05 00146  9301    N                         C,84      SPARE
284  05 00148  9301    N                         C,85      SPARE
285  05 0014A  9301    N                         C,86      SPARE
286  05 0014C  0000    N                         C,87      PRT@STOP        STOP PRINT
287                                           ENDCASE
288  05 0014E  E1      A                       POP        H               RESTORE
289  05 0014F  D1      A                       POP        D                       SAVED
290  05 00150  F1      A                       POP        PSW                          REGS
291                                         ENDIF
292  05 00151  B7      A                    UNTIL:  XBYT,A,BR,A,Z          END WHEN NO BITS IN THIS BYTE
     05 00152  C28700  N
293                                      ENDIF
294  05 00155  C9      A                   RET                            RETURN TO STDBY OR PRINT BK(IND
```

TABLE XII

```
328                                * ROUTINE CALLED BY SWITCH SCAN WHEN DIAGNOSTIC PROGRAM BUTTON IS PUSHED
329                                * IN NON TECH REP STATES
330
331
332  05 001F4  3A4EFA  N  LVDGNPRG  IF:   VBYT,DGN@NUM,NZ          IS THERE AN ACTIVE DGN PROGRAM
     05 001F7  A7      A
     05 001F8  CA0102  N
333  05 001FB  CD2703  N              CALL   DGN@ABT              ABORT OPERATING DGN PRG
334  05 001FE  C30602  N            ELSE:
335  05 00201  3E80    A              SFLG   SER@ACT              SIGNAL STCK TO GO TO TECH-REP
     05 00203  3249F4  A
336                                  ENDIF
337  05 00206  C9      A            RET
338                                *
339                                * ROUTINE CALLED WHEN SERVICE KEY IS TURNED 'ON'
340                                *
341  05 00207  CD0000  N  SERVICE   STIMR  KEY@REL,250,KEY@OFF     LOOK FOR KEY RELEASE
     05 0020A  45      A
     05 0020B  19      A
     05 0020C  2A02    N
342  05 0020E  3A1BF4  A            IF:    FLG,DGN@ERR,T           IS THERE ERROR PENDING
     05 00211  07      A
     05 00212  D22902  N
343  05 00215  3A4EFA  N            ANDIF: VBYT,DGN@NUM,Z          WAS IT A PROGRAM # ENTRY ERROR
     05 00218  A7      A
     05 00219  C22902  N
344  05 0021C  3A4FFA  N              LDA    DG@SAV               PUT DISPLAY BACK
345  05 0021F  326DFC  N              STA    DG@DIGIT
346  05 00222  AF      A              CFLG   DGN@ERR              CANCEL ERROR
     05 00223  321BF4  A
347  05 00226  CD4101  N              CALL   DIAG@PRG             GIVE NUMBER RETRY FOR VALID
348                                                                ENTRY
349                                  ENDIF
350  05 00229  C9      A            RET
351                                *
352                                * ROUTINE CALLED TO LOOK FOR KEY TURN OFF
353                                *
354  05 0022A  2E2B    A  KEY@OFF   IF:    IBIT,SERVICE#,T
     05 0022C  CD0000  N
     05 0022F  D23C02  N
355  05 00232  CD0000  N              STIMR  KEY@REL,250,KEY@OFF  KEY STILL ON
     05 00235  45      A
     05 00236  19      A
     05 00237  2A02    N
356  05 00239  C35E02  N              ORIF:  VBYT,DGN@NUM,NZ       IS DGN PROGRAM ACTIVE
     05 0023C  3A4EFA  N
     05 0023F  A7      A
     05 00240  CA5E02  N
357  05 00243  CD7103  N              CALL   NVTB@CK              CLEAR IF NOT DISCLOSED
358  05 00246  CA5E02  N              IF:    CC,Z,C               IS IT A RUNNING STATE
359  05 00249  3A53FD  N                IF:  XBYT,STATE:,LT,IPRNT
     05 0024C  FE04    A
     05 0024E  D25702  N
360  05 00251  CD2703  N                CALL  DGN@ABT             YES ABORT DIAGNOSTIC PROGRAM
361  05 00254  C35E02  N              ELSE:
362  05 00257  CD0000  N                STIMR KEY@REL,250,KEY@OFF KEEP LOOKING AT KEY RELEASE
     05 0025A  45      A
     05 0025C  2A02    N
363                                                                UNTIL MACHINE STOPS
364                                      ENDIF
365                                    ENDIF
366                                  ENDIF
367  05 0025E  C9      A            RET
368                                *
369                                * ROUTINE CALLED IN TECH-REP STATE PROLOGUE
370                                *
371  05 0025F  CDCB02  N  DGN@PRL   CALL   DSPL@DC                PUT DC-- IN DISPLAY
372  05 00262  3E80    A            SFLG   DSPL@DGN               USE DIAGNOSTIC DISPLAY
     05 00264  321FF4  A
373  05 00267  3A63FC  N            LDA    PREV@IN+1
374  05 0026A  F604    A            ORI    X'04'                  INHIBIT IMMEDIATE CALL TO
375  05 0026C  3263FC  N            STA    PREV@IN+1              DIAG@PRG
376  05 0026F  C9      A            RET
377
```

TABLE XIII

```
272      *
273      *
274      * ROUTINE CALLED BY SWITCH SCAN WHEN DIAGNOSTIC PROGRAM BUTTON IS PUSHED
275      * IN TECH REP STATE ONLY
276      *
277   05 00141  3A4EFA  N   DIAG@PRG  IF!       VBYT,DGN@NUM,NZ              IS DGN PROGRAM ACTIVE
      05 00144  A7      A
      05 00145  CA7A01  N
278   05 00148  3A53FD  N              IF!      XBYT,STATE1,EQ,ICOMP         IS IT COMP CTRL STATE
      05 0014B  FE00    A
      05 0014D  C25601  N
279   05 00150  CD0000  N                  CALL      COMP!CHG               TELL STATE CK TO GO TO TRP
280   05 00153  C37701  N              ELSE!
281   05 00156  CD0000  N                  CT!MR     DSPL@TIM               CLEAR DIAG PRG 20,21,22 TIMER
      05 00159  4A      A
282   05 0015A  AF      A                  XRA       A
283   05 0015B  326EFB  N                  STA       FALT@PTR               SET UP FOR RESTART OF PRG. 20
284   05 0015E  3A4EFA  N                  IF!       XBYT,DGN@NUM,NE,DGNPRG29  DIAG 29 NOT ACTIVE
      05 00161  FE10    A
      05 00163  CA7101  N
285   05 00166  3A4EFA  N                  ANDIF!    XBYT,DGN@NUM,NE,DGNPRG28  DIAG 28 NOT ACTIVE
      05 00169  FE0F    A
      05 0016B  CA7101  N
286   05 0016E  C37401  N                  ELSE!                           CLEAN UP OPERATING ADH DIAGNOST
287   05 00171  CD0000  N                      CALL      ADH29EPL           ABORT ADH SKEW TEST
288                                        ENDIF
289   05 00174  CDC802  N                  CALL      DSPL@DC                 PUT DC-- IN DISPLAY
290                                     ENDIF
291   05 00177  C3F301  N              ORIF!     FLG,DGN@ERR,T                IF ERROR IS PENDING
      05 0017A  3A1BF4  A
      05 0017D  07      A
      05 0017E  D28701  N
292   05 00181  CDC802  N                  CALL      DSPL@DC                 PUT DC-- IN DISPLAY
293   05 00184  C3F301  N              ORIF!     XWRD,DGN@DSPL,EQ,X'DC00'
      05 00187  11000C  N
      05 0018A  2A6BFC  N
      05 0018D  CD0000  N
      05 00190  C29A01  N
294   05 00193  AF      A                  CFLG      SER@ACT                 EXIT TECH REP STATE
      05 00194  3249F4  A
295   05 00197  C3F301  N              ELSE!
296   05 0019A  2600    A                  MVI       H,0
297   05 0019C  CD0000  N                  CALL      4BCD!B!N               CONVERT TO BINARY
298   05 0019F  7D      A                  IF!       XBYT,L,GE,LST@KEY+1
      05 001A0  FE25    A
      05 001A2  DAA801  N
299   05 001A5  C3C101  N                  ORIF!     XBYT,A,LT,1ST@NKEY
      05 001A8  FE0A    A
      05 001AA  D2B101  N
300   05 001AD  3F      A                  CMC
301   05 001AE  C3C101  N                  ORIF!     XBYT,A,GE,1ST@KEY
      05 001B1  FE14    A
      05 001B3  DABC01  N
302   05 001B6  D604    A                  SU!       1ST@KEY-LST@NKEY-1
303   05 001B8  3F      A                  CMC
304   05 001B9  C3C101  N                  ORIF!     XBYT,A,GE,LST@NKEY+1
      05 001BC  FE10    A
305                                        ENDIF
306   05 001C1  DACA01  N                  IF!       CC,C,C
307   05 001C4  CDAE02  N                      CALL      DSPL@ERR           BAD ENTRY BLINK DISPLAY
308   05 001C7  C3F301  N                  ELSE!
309   05 001CA  D609    A                      SU!       9
310   05 001CC  47      A                      MOV       B,A
311   05 001CD  CD7103  N                      CALL      NVTB@CK            IS THIS ENTRY DISCLOSED YET
312   05 001D0  CAE101  N                      IF!       CC,Z,C             CLEAR IF NOT DISCLOSED
313   05 001D3  2E2B    A                      ANDIF!    IBIT,SERVICE#,F
      05 001D5  CD0000  N
      05 001D8  DAE101  N
314   05 001DB  CDAE02  N                          CALL      DSPL@ERR       NO,SHOW ERROR
315   05 001DE  C3F301  N                      ELSE!
316   05 001E1  78      A                          MOV       A,B
317   05 001E2  324EFA  N                          STA       DGN@NUM        USE NEW PROGRAM NUMBER
318   05 001E5  CDEE02  N                          CALL      DSPL@CLR       BLANK THE DISPLAY
319   05 001E8  2121FC  A                          SFBIT,P   ON@DIAG
      05 001EB  3E02    A
      05 001ED  B6      A
      05 001EE  77      A
320   05 001EF  AF      A                          XRA       A
321   05 001F0  326EFB  N                          STA       FALT@PTR       CAUSES 'FC' TO BE DISP PRG 20
322                                     *                                  TO INDICATE PROGRAM ACTIVE
323                                            ENDIF
324                                        ENDIF
325                                     ENDIF
326   05 001F3  C9      A              RET
```

TABLE XIV

```
473
474                  *
475                  * ROUTINE TO DETERMINE IF DIAGNOSTIC PROGRAM HAS BEEN DISCLOSED BY
476                  * THE TECH-REP BY SEARCHING NV BYTE FOR ENABLE
                     *
477   05 00371  FE06    A   NVTB@CK   IF!    XBYT,A,LE,LST@NKEY-1ST@NKEY+1  IS IT DISCLOSURE RANGE
      05 00373  DA7903  N
      05 00376  C28503  N
478   05 00379  CD8603  N              CALL   NV@MASK                       BUILD MASK BASED ON A REG
479   05 0037C  E5      A              PUSH   H                             SAVE MASK
480   05 0037D  CD0000  N              RNVBYT TRP@DSCL                      GET DISCLOSED INFO
      05 00380  5F      A
```

```
      05 00381    E3       A
481   05 00382    E1       A          POP      H
482   05 00383    A4       A          MODBYT   A,AND,H              ; IS MASK BIT FOUND IN DISCLOSURE
483   05 00384    94       A          MODBYT   A,SUB,H              BYTE
484                                  ENDIF
485                              *
486                              *    ZERO CC IS CLEARED IF PROGRAM IS NOT DISCLOSED
487                              *
488   05 00385    C9       A          RET
```

TABLE XV

```
1236                             *
1237                             *    PROGRESSIVE DISCLOSURE DIAGNOSTIC PROGRAM USED BY THE TECH-REP
1238                             *    TO GIVE ADVANCED OPERATORS ADDITIONAL DIAGNOSTIC CAPABILITY
1239                             *
1240  05 00971   2A6BFC    N     VALID@33 LHLD    DGN@DSPL          WHAT IS IN DISPLAY
1241  05 00974   7C        A              IFI    VBYT,H,Z           IS DISPLAY GT 99
      05 00975   A7        A
      05 00976   C29A09    N
1242  05 00979   7D        A              ANDIF  XBYT,L,GE,1ST@NKEY+6
      05 0097A   FE10      A
      05 0097C   DA9A09    N
1243  05 0097F   FE16      A              ANDIF  XBYT,A,LT,LST@NKEY+7
      05 00981   D29A09    N
1244  05 00984   D60F      A              SUI    15                CONVERT TO BINARY AND SUB 9
1245  05 00986   47        A              MOV    B,A
1246  05 00987   CD8603    N              CALL   NV@MASK           BUILD MASK FOR ENABLING
1247  05 0098A   E5        A              PUSH   H                 OR DISABLING REQUESTED PRG
1248  05 0098B   CD0000    N              RNVBYT TRP@DSCL
      05 0098E   5F        A
      05 0098F   E3        A
1249  05 00990   E1        A              POP    H                 H HAS MASK
1250  05 00991   6F        A              MOV    L,A
1251  05 00992   AF        A              XRA    A
1252  05 00993   3D        A              DCR    A                 CLEAR ZERO CONDITION CODE
1253  05 00994   3234F4    A              MODFLG KYBD$INH          INHIBIT KEYBOARD ENTRY
1254  05 00997   C39E09    N           ELSE:
1255  05 0099A   CDAE02    N              CALL   DSPL@ERR          BAD NUMBER BLINK DISPLAY
1256  05 0099D   AF        A              XRA    A                 SET ZERO CONDITION CODE
1257                                  ENDIF
1258  05 0099E   C9        A           RET
1259                             *
1260                             *    PROGRESSIVE DISCLOSURE BACKGROUND PROGRAM
1261                             *
1262  05 0099F   3A2AF4    A     DGN@T@33 IFI    FLG,RCALL@DG,T     IS RECALL REQUESTED
      05 009A2   07        A
      05 009A3   D20109    N
1263  05 009A6   CD7109    N              CALL   VALID@33
1264  05 009A9   CACE09    N              IFI    CC,Z,C            CLEAR IF GOOD NUMBER
1265  05 009AC   2E0D      A                IFI    IBIT,RECALL#,T
      05 009AE   CD0000    N
      05 009B1   D2CB09    N
1266  05 009B4   78        A                MOV    A,B
1267  05 009B5   CD7103    N                CALL   NVT@DCK         CHECK IF IN TABLE
1268  05 009B8   C2C309    N                IFI    CC,Z,S          SET IF IN TABLE
1269  05 009BB   CD0000    N                  S@BIT,S  READY$      TURN ON READY LIGHT
      05 009BE   E701      A
1270  05 009C0   C3C809    N                ELSE:
1271  05 009C3   CD0000    N                  S@BIT,S  JOB$ICMP    TURN ON JOB INCOMPLETE
      05 009C6   F4C1      A
1272                                      ENDIF
1273  05 009C8   C3CE09    N              ELSE:
1274  05 009CB   CD6F00    N                CALL   NO@DGN          TURN OFF READY LIGHT CLR RECALL
1275                             *                                 FLAG
1276                                      ENDIF
1277                                  ENDIF
1278  05 009CE   C3ODOA    N           ORIF:   FLG,STRT@DGN,T       IS START PRINT PUSHED
      05 009D1   3A3EF4    A
      05 009D4   07        A
      05 009D5   D2F009    N
1279  05 009D8   CD7109    N              CALL   VALID@33
1280  05 009DB   CAED09    N              IFI    CC,Z,C            CLEAR IF GOOD NUMBER
1281  05 009DE   7D        A                MOV    A,L
1282  05 009DF   B4        A                ORA    H               PUT NEWLY DISCLOSED PROGRAM
1283  05 009E0   325EE3    A                WNVBYT TRP@DSCL         IN NV TABLE
      05 009E3   0F        A
      05 009E4   0F        A
      05 009E5   0F        A
      05 009E6   0F        A
      05 009E7   325FE3    A
1284  05 009EA   CDEE02    N                CALL   DSPL@CLR        BUTTON PUSHED CLEAR DISPLAY
1285                                      ENDIF
1286  05 009ED   C30D0A    N           ORIF:   FLG,STOP@DGN,T       IS STOP PRINT PUSHED
      05 009F0   3A33F4    A
      05 009F3   07        A
      05 009F4   D2D00A    N
1287  05 009F7   CD7109    N              CALL   VALID@33          CLEAR IF GOOD NUMBER
1288  05 009FA   CA0D0A    N              IFI    CC,Z,C
1289  05 009FD   7C        A                MOV    A,H             PUT MASK IN A
1290  05 009FE   2F        A                CMA                    BUILD CANCEL MASK
1291  05 009FF   A5        A                ANA    L               CANCEL PROGRAM FROM TABLE
1292  05 00A00   325EE3    A                WNVBYT TRP@DSCL
      05 00A03   0F        A
      05 00A04   0F        A
      05 00A05   0F        A
      05 00A06   0F        A
      05 00A07   325FE3    A
1293  05 00A0A   CDEE02    N                CALL   DSPL@CLR        BUTTON PUSHED CLEAR DISPLAY
1294                                      ENDIF
1295                                  ENDIF
1296  05 00A0D   CD9100    N           CALL   CLR@CK
1297  05 00A10   C9        A           RET
```

TABLE XVI

```
231
232              *****************************************************************
233              * TECH REP DIGIT INPUT ROUTINE IS CALLED BY SWITCH SCAN IN THE TECH REP STATE  *
234              * WHEN A NUMERIC KEY IS PUSHED ON THE PROGRAMMER KEYBOARD. THIS ROUTINE LOADS *
235              * A NUMBER INTO DGN@DSPL WORD                                                 *
236              *****************************************************************

237   05 000F1   OF       A    DIGIT@TR  RRC                           RECOVER NUMBER FROM SWITCH SCAN
238   05 000F2   D637     A              SUI       55
239   05 000F4   5F       A              MOV       E,A
240   05 000F5   1600     A              MVI       D,0
241   05 000F7   3A34F4   A              IF:       FLG,KYBD5INH,F      IS THE ENTRY INHIBITED
      05 000FA   07       A
      05 000FB   DA4001   N
242   05 000FE   2A6BFC   N                 LHLD   DGN@DSPL            GET PREVIOUS VALUE
243   05 00101   7C       A                 MOV    A,H
244   05 00102   29       A                 DAD    H
245   05 00103   29       A                 DAD    H
246   05 00104   29       A                 DAD    H
247   05 00105   29       A                 DAD    H                   MULTIPLY PREVIOUS VALUE BY 10
248   05 00106   19       A                 DAD    D                   MERGE NEW UNITS DIGIT
249   05 00107   FEDC     A                 IF:    XBYT,A,NE,X'DC'     IS IT DIAGNOSTIC PROGRAM ENTRY
      05 00109   CA2301   N
250   05 0010C   FEFC     A              ANDIF:    XBYT,A,NE,X'FC'     NO-IS IT PROG 20 OR 22 ENTRY
      05 0010E   CA2301   N
251   05 00111   CD0000   N                    CALL   DIG@FIX          NO-JUST PLAIN OLD ENTRY
252   05 00114   47       A                    MOV    B,A              SAVE DIGIT FIX RESULT
253   05 00115   FE0F     A                    IF:    XBYT,A,EQ,X'0F'  IS DISPLAY FULL
      05 00117   C21F01   N
254   05 0011A   3E80     A                       SFLG   KYBD5INH      INHIBIT FURTHER ENTRY
      05 0011C   3234F4   A
255                                          ENDIF
256   05 0011F   78       A                    MOV    A,B
257   05 00120   C33601   N              ELSE:
258   05 00123   67       A                    MOV    H,A              PUT BACK 'DC' OR 'FC'
259   05 00124   7D       A                    IF:    XBYT,L,GE,X'10'
      05 00125   FE10     A
      05 00127   DA3401   N
260   05 0012A   3E80     A                       SFLG   KYBD5INH      INHIBIT FURTHER ENTRY
      05 0012C   3234F4   A
261   05 0012F   3E0F     A                       MVI    A,X'0F'       ALL DIGITS ON
262   05 00131   C33601   N                    ELSE:
263   05 00134   3E0D     A                       MVI    A,X'0D'       TENS DIGIT BLANK
264                                          ENDIF
265                                       ENDIF
266   05 00136   226BFC   N                 SHLD   DGN@DSPL            UPDATE MEMORY
267   05 00139   326DFC   N                 STA    DG@DIGIT            UPDATE MEMORY
268   05 0013C   AF       A                 CFLG   DSPL@1ST            UPDATE DISPLAY
      05 0013D   329AF4   A
269                                       ENDIF
270   05 00140   C9       A              RET
```

TABLE XVII

```
502   05 002CF   3A34F4   A    DGN@T@13  IF:       FLG,KYBD5INH,F      1ST TIME FOR DIAG #13
      05 002D2   07       A
      05 002D3   DAE302   N
503   05 002D6   3E80     A                 SFLG   KYBD5INH            SET ONE TIME(INHIBIT KEYBOARD)
      05 002D8   3234F4   A
504   05 002DB   3E01     A                 MVI    A,1
505   05 002DD   3283FA   N                 STA    OUTPNTR             INITIALIZE PNTR TO LAST GAP TIM
506   05 002E0   C30B03   N              ORIF:     FLG,RCALL@DG,T      DISPLAY SELECT SWITCH PUSHED
      05 002E3   3A2AF4   A
      05 002E6   07       A
      05 002E7   D2F602   N
507   05 002EA   AF       A                 CFLG   RCALL@DG            ACKNOWLEDGE PUSH
      05 002EB   322AF4   A
508   05 002EE   3E09     A                 MVI    A,TABLNGTH          FETCH TABLE SIZE
509   05 002F0   CD1E03   N                 CALL   ADH@DINC            UPDATE DISPLAY
510   05 002F3   C30B03   N              ORIF:     FLG,STRT@DGN,T      START PRINT PUSHED
      05 002F6   3A3EF4   A
      05 002F9   07       A
      05 002FA   D20B03   N
511   05 002FD   AF       A                 CFLG   STRT@DGN            ACKNOWLEDGE PUSH
      05 002FE   323EF4   A
512   05 00301   3A83FA   N                 LDA    OUTPNTR             FETCH CURRENT GAP TIME IDENTIFI
513   05 00304   3D       A                 DCR    A                   MOV ID TO NEXT GAP TIME PAIR
514   05 00305   CA0B03   N                 IF:    CC,Z,C              NOT AT LAST GAP TIME
515   05 00308   CD1E03   N                    CALL   ADH@DINC         UPDATE DISPLAY
516                                          ENDIF
517                                       ENDIF
518   05 0030B   C9       A              RET
```

TABLE XVIII

```
521              *
522              *     THE FOLLOWING TABLE DEFINES THE DISPLAYED GAP TIMES
523              *            THE GAP TIME IS DEFINED AS:
524              *             (ARGUMENT(2),ARGUMENT(1))X10MS
525              *          *NOTE:CODE GENERATED IS NOT NECESSARILY IN
526              *                THE SAME ORDER AS THE ARGUMENTS*
527              *                (SEE ORDITBL PROC DEFINITION)
528              *

530                        ADH@ROMT,TAB@2 ORDITBL   ADH@CPDC,ADHRL3DC,;    1ST GAP TIME
```

| | | | | | | | |
|---|---|---|---|---|---|---|---|
|631| | | | |ADHRL3DC,ADH@L4DC,;| |2ND GAP TIME|
|532| | | | |ADH@L4DC,ADHRT3DC,;| |3RD GAP TIME|
|533| | | | |ADHRT3DC,ADH@T4DC,;| |4TH GAP TIME|
|534| | | | |ADH@SFDC,ADHFL3DC,;| |5TH GAP TIME|
|535| | | | |ADHFL3DC,ADH@T2DC,;| |6TH GAP TIME|
|536| | | | |ADH@T2DC,ADHFT3DC,;| |7TH GAP TIME|
|537| | | | |ADH@T1DC,ADH@L1DC,;| |8TH GAP TIME|
|538|05 0030C|CA|A| |ADH@SFDC,ADH@L2DC| |9TH GAP TIME|
| |05 0030D|C8|A| | | | |
| |05 0030E|C7|A| | | | |
| |05 0030F|C6|A| | | | |
| |05 00310|C5|A| | | | |
| |05 00311|C3|A| | | | |
| |05 00312|C2|A| | | | |
| |05 00313|C1|A| | | | |
| |05 00314|C0|A| | | | |
| |05 00315|C4|A| | | | |
| |05 00316|C9|A| | | | |
| |05 00317|C6|A| | | | |
| |05 00318|C5|A| | | | |
| |05 00319|C4|A| | | | |
| |05 0031A|C2|A| | | | |
| |05 0031B|C1|A| | | | |
| |05 0031C|C0|A| | | | |
| |05 0031D|BF|A| | | | |

TABLE XIX

| | | | | | | | |
|---|---|---|---|---|---|---|---|
|540|05 0031E|3283FA|N|ADH@DINC|STA|OUTPNTR|UPDATE IDENTIFIER|
|541|05 00321|CD0000|N| |STIMR|DSPL@TIM,510,ADH@DSPL|UPDATE DISPLAY IN .5SEC|
| |05 00324|4A|A| | | | |
| |05 00325|33|A| | | | |
| |05 00326|3103|N| | | | |
|542|05 00328|CD0000|N| |CALL|DSPL@CLR|BLANK THE DISPLAY|
|543|05 0032B|3E80|A| |SFLG|KYBD5INH|RE-INHIBIT KEYBOARD|
| |05 0032D|3234F4|A| | | | |
|544|05 00330|C9|A| |RET| | |
| | | | | | | | |
|546|05 00331|3A83FA|N|ADH@DSPL|LDA|OUTPNTR|FETCH IDENTIFIER|
|547|05 00334|2A78FB|N| |LHLD|TAB@STRT|SET PNTR TO START OF CONTROL TA|
|548| | | | | | |(MINUS ONE)|
|549|05 00337|1600|A| |MVI|D,0| |
|550|05 00339|5F|A| |MOV|E,A|SET PAIR TO ID OFFSET|
|551|05 0033A|19|A| |DAD|D|OFFSET PNTR TO CURRENT ID|
|552|05 0033B|46|A| |MOV|B,M|SAV PRIOR DIAG CNTR OFFSET|
|553|05 0033C|1E09|A| |MVI|E,TABLNGTH| |
|554|05 0033E|19|A| |DAD|D|MOV PNTR TO 2ND PART OF CNTRL|
|555|05 0033F|6E|A| |MOV|L,M|FETCH SUBSEQUENT DIAG CNTR OFFS|
|556|05 00340|26FC|A| |MVI|H,HBADDR|MOV PNTR TO SUBSEQUENT DIAG CNT|
|557|05 00342|7E|A| |MOV|A,M|FETCH SUBSEQUENT DC TIME|
|558|05 00343|68|A| |MOV|L,B|MOV PNTR TO PRIOR DIAG CNTR|
|559|05 00344|96|A| |SUB|M|CALCULATE GAP TIME|
|560|05 00345|CD0000|N| |CALL|BINR1BCD|CONVERT TO BCD|
|561|05 00348|29|A| |DAD|H| |
|562|05 00349|29|A| |DAD|H|ADD TRAILING ZERO(MULTIPLY BY T|
|563|05 0034A|29|A| |DAD|H| |
|564|05 0034B|29|A| |DAD|H| |
|565|05 0034C|CD0000|N| |CALL|DSPL@HL|PUT GAP TIME IN DISPLAY|
|566|05 0034F|216DFC|N| |LXI|H,DG@DIGIT|SET PNTR TO DIGIT DISPLAY ENABL|
|567|05 00352|3E01|A| |MVI|A,D0| |
|568|05 00354|B6|A| |ORA|M| |
|569|05 00355|77|A| |MOV|M,A|ENABLE ZERO GAP TIME|
|570|05 00356|C9|A| |RET| | |

TABLE XX

| | | | | | | | |
|---|---|---|---|---|---|---|---|
|423|05 001CE|3A3EF4|A|DGN@T@28 IF:|FLG,STRT@DGN,T| |START PRINT PUSHED|
| |05 001D1|07|A| | | | |
| |05 001D2|D21502|N| | | | |
|424|05 001D5|AF|A| |CFLG|STRT@DGN|ACKNOWLEDGE PUSH|
| |05 001D6|323EF4|A| | | | |
|425|05 001D9|3A05F4|A| |IF:|FLG,ADDR@ACT,T|ADH CLEARED|
| |05 001DC|07|A| | | | |
| |05 001DD|D21202|N| | | | |
|426|05 001E0|3A08F4|A| |ANDIF:|FLG,ADH@MSEL,T|RE-SELECTED|
| |05 001E3|07|A| | | | |
| |05 001E4|D21202|N| | | | |
|427|05 001E7|3A8BF7|A| |ANDIF:|FLG,ADH@NMOV,T|AND READY|
| |05 001EA|07|A| | | | |
| |05 001EB|D21202|N| | | | |
|428|05 001EE|AF|A| |CFLG|ADDR@ACT|RESET SEQUENCE|
| |05 001EF|3205F4|A| | | | |
|429|05 001F2|2F|A| |CMA| | |
|430|05 001F3|3234F4|A| |MODFLG|KYBD5INH|INHIBIT KEYBOARD|
|431|05 001F6|2A6BFC|N| |LHLD|DGN@DSPL|FETCH GAP TIME IDENTIFIER|
|432|05 001F9|7C|A| |IF:|VBYT,H,Z| |
| |05 001FA|A7|A| | | | |
| |05 001FB|C20F02|N| | | | |
|433|05 001FE|7D|A| |ANDIF:|XBYT,L,LT,TABLNGTH+1|IDENTIFIER IN RANGE|
| |05 001FF|FE0A|A| | | | |
| |05 00201|D20F02|N| | | | |
|434|05 00204|3283FA|N| |STA|OUTPNTR|SAV IDENTIFIER OFFSET|
|435|05 00207|3EFF|A| |MVI|A,X'FF'|FETCH 'SET' MASK|
|436|05 00209|CDR602|N| |CALL|CYCLSTRT|START ADH RECYCLING|
|437|05 0020C|C31202|N| |ELSE:| |IDENTIFIER OUT OF RANGE|
|438|05 0020F|CD0000|N| |CALL|DSPL@ERR| |
|439| | | | |ENDIF| | |

```
440                                       ENDIF
441  05 00212  C38502  N          ORIF:   FLG,STOPODGN,T            STOP PRINT PUSHED
     05 00215  3A33F4  A
     05 00218  07      A
     06 00219  C22D02  N
442  05 0021C  AF      A                  CFLG    STOPODGN          ACKNOWLEDGE PUSH
     05 0021D  3233F4  A
443  05 00220  2F      A                  CMA
444  05 00221  3205F4  A                  MODFLG  ADDRQACT          INDICATE ADH CLEARED
445  05 00224  CDCR00  N                  CALL    ADHOCLR           ABORT(CLEAR) ADH
446  05 00227  CD0000  N                  CALL    DSPLOCLR          CLEAR DISPLAY
447  05 0022A  C38502  N          ORIF:   FLG,CLRODGN,T             CLEAR SWITCH PUSHED
     05 0022D  3A16F4  A
     05 00230  07      A
     05 00231  D23E02  N
448  05 00234  AF      A                  CFLG    CLRODGN           ACKNOWLEDGE PUSH
     05 00235  3216F4  A
449  05 00238  CD9D00  N                  CALL    ADHOMULT          SELECT ADH
450  05 0023B  C38502  N          ORIF:   FLG,RCALLODG,T            DISPLAY SELECT PUSHED
     05 0023E  3A2AF4  A
     05 00241  07      A
     05 00242  D25902  N
451  05 00245  AF      A                  CFLG    RCALLODG          ACKNOWLEDGE PUSH
     05 00246  322AF4  A
452  05 00249  2F      A                  CMA
453  05 0024A  3234F4  A                  MODFLG  KYBD5INH          INHIBIT THE KEYBOARD
454  05 0024D  3A83FA  N                  LDA     OUTPNTR           FETCH LAST IDENTIFIER
455  05 00250  2600    A                  MVI     H,0
456  05 00252  6F      A                  MOV     L,A
457  05 00253  CD0000  N                  CALL    DSPLOHL           DISPLAY LAST IDENTIFIER
458  05 00256  C38502  N          ELSE:                             NO BUTTONS PUSHED
459  05 00259  CD9602  N                  CALL    LMPOUPDT          UPDATE JOB$ICMP & READY$ LAMPS
460  05 0025C  3A07F4  A                  IF:     FLG,ADHOJOBBR,T   ADH CYCLE STARTED
     05 0025F  07      A
     05 00260  D28502  N
461  05 00263  3A83FA  N                          LDA     OUTPNTR   FETCH CURRENT IDENTIFIER
462  05 00266  3D      A                          DCR     A
463  05 00267  FA8502  N                          IF:     CC,S,C    ID NOT ZERO
464  05 0026A  2A78FB  N                                  LHLD    TABOSTRT    FETCH START OF CONTROL TABLE
465  05 0026D  111200  A                                  LXI     D,TABLNGTH*2 SET OFFSET TO END OF CONTROL TA
466  05 00270  47      A                                  MOV     B,A         SAV ID OFFSET
467  05 00271  7B      A                                  MOV     A,E         MOV OFFSET TO SUBSEQUENT DIAGNO
468  05 00272  90      A                                  SUB     B           COUNTER OF CURRENT GAP TIME PAI
469  05 00273  5F      A                                  MOV     E,A
470  05 00274  19      A                                  DAD     D           MOV PNTR TO SUBSEQUENT CNTR IN
471  05 00275  6E      A                                  MOV     L,M         SET PNTR TO ACTUAL
472  05 00276  26FC    A                                  MVI     H,HOADDR    SUBSEQUENT COUNTER
473  05 00278  3A84FA  N                                  LDA     ADHODGNL    FETCH LAST VALUE OF COUNTER
474  05 0027B  BE      A                                  IF:     XBYT,A,NE,M HAS THERE BEEN A CHANGE
     05 0027C  CA8502  N
475  05 0027F  3284FA  N                                          STA     ADHODGNL  SAV NEW COUNTER VALUE
476  05 00282  CD3103  N                                          CALL    ADHODSPL  CALC & DISPLAY NEW GAP TIME
477                                                        ENDIF
478                                               ENDIF
479                                       ENDIF
480                               ENDIF
481  05 00285  C9      A          RET
```

TABLE XXI

```
385  05 0015F  3A3EF4  A   DGNOT029 IF:    FLG,STRTODIN,T            START PRINT PUSHED
     05 00162  07      A
     05 00163  D2A101  N
386  05 00166  AF      A                  CFLG    STRTODGN          ACKNOWLEDGE PUSH
     05 00167  323EF4  A
387  05 0016A  3A05F4  A                  IF:     FLG,ADDROACT,T    ADH READY TO START (SELECTED)
     05 0016D  07      A
     05 0016E  D29E01  N
388  05 00171  3A8BF7  A                  ANDIF:  FLG,ADHONMOV,T    AND NO JAM PENDING
     05 00174  07      A
     05 00175  D29E01  N
389  05 00178  AF      A                          CFLG    ADDROACT  CLEAR READY TILL NEXT SEQUENCE
     05 00179  3205F4  A
390  05 0017C  11B1F4  A                          LXIFLG  D,ADHO29O1 SET PNTR TO 1ST HLT FLAG
391  05 0017F  2A6BFC  N                          LHLD    DGNODSPL  FETCH STATION CODE
392  05 00182  2D      A                          DCR     L         JUSTIFY STATION CODE OFFSET
393  05 00183  7C      A                          MOV     A,H
394  05 00184  B7      A                          ORA     A         CHECK MSBYT OF STATION CODE
395  05 00185  C29B01  N                          IF:     CC,Z,S    MSBYT OF CODE ZERO
396  05 00188  70      A                          ANDIF:  XBYT,L,LT,MAXOCNT+1 LSBYT OF CODE IN RANGE(>0&<MAXC
     05 00189  FE05    A
     05 0018B  D29B01  N
397  05 0018E  19      A                                  DAD     D           SET PNTR TO PROPER FLAG
398  05 0018F  3EFF    A                                  MVI     A,X'FF'     FETCH 'SET' MASK
399  05 00191  77      A                                  MOV     M,A         SET HLT FLAG
400  05 00192  3234F4  A                                  MODFLG  KYBD5INH    INHIBIT KEYBOARD
401  05 00195  CD8602  N                                  CALL    CYCLSTRT    START ADH RECYCLING
402  05 00198  C39E01  N                          ELSE:                       STATION CODE OUT OF RANGE
403  05 0019B  CD0000  N                                  CALL    DSPLOERR    START BLINKING THE DISPLAY
404                                               ENDIF
405                                       ENDIF
406  05 0019E  C3C901  N          ORIF:   FLG,STOPODGN,T            STOP PRINT PUSHED
     05 001A1  3A33F4  A
     05 001A4  07      A
     05 001A5  D28901  N
407  05 001A8  AF      A                  CFLG    STOPODGN          ACKNOWLEDGE PUSH
     05 001A9  3233F4  A
408  05 001AC  2F      A                  CMA
409  05 001AD  3205F4  A                  MODFLG  ADDROACT          INDICATE ADH READY FOR CYCLE (S
```

```
410  05 001B0  CDCB00  N            CALL    ADH@CLR            CANCELL OLD CYCLE
411  05 001B3  CD4800  N            CALL    ADH@SGNL           RE-SELECT ADH
412  05 001B6  C3C901  N        ORIF: FLG,CLR@DGN,T            CLEAR SWITCH PUSHED
     05 001B9  3A16F4  A
     05 001BC  07      A
     05 001BD  D2C601  N
413  05 001C0  CD0000  N            CALL    DSPL@CLR           CLEAR THE DISPLAY
414  05 001C3  C3C901  N        ELSE:                          UPDATE FRONT PANEL LIGHTS
415  05 001C6  CD9602  N            CALL    LMP@UPDT           UPDATE JOB$ICMP & READY$ LAMPS
416                                ENDIF
417  05 001C9  C9      A            RET 419  05 001CA  CDCB00  N    ADH29EPL CALL   ADH@CLR            CLEAR ADH
420  05 001CD  C9      A            RET
```

TABLE XXII

```
854  05 00546  3A80F4   A   ADH@CTRL IF:  FLG,ADH@SELC,T              ADH SELECTED
     05 00549  07       A
     05 0054A  D2E805   N
855  05 0054D  CDA004   N            CALL    SEN@READ             CHECK ADH INPUT SENSORS
856  05 00550  CAE505   N            IF:     CC,Z,C               CHANGE STATE IF SENSOR CHANGE
857  05 00553  57       A                MOV    D,A               SAVE CHANGE MASK IN D REG
858  05 00554  A0       A                ANA    B                 FIND LEAD EDGES
859  05 00555  5F       A                MOV    E,A               SAVE LEAD EDGES IN E REG
860  05 00556  2F       A                CMA
861  05 00557  A2       A                ANA    D                 FIND TRAIL EDGES
862  05 00558  21B9FC   N                LXI    H,TEDGINH         SET PNTR TO TEDG INHIBIT MASK
863  05 0055B  A6       A                ANA    M                 MASK OUT INHIBITED SENSORS
864  05 0055C  CA9E05   N                IF:    CC,Z,C            ANY TRAIL EDGES THIS READ
865  05 0055F  57       A                   MOV    D,A            SAVE TRAIL EDGES IN D REG
866  05 00560  23       A                   INX    H              MOV PNTR TO TEDG BYPASS MASK
867  05 00561  A6       A                   ANA    M              MASK OUT INDETERMINENT TRAIL ED
868  05 00562  47       A                   MOV    B,A            SAVE VALID TRAIL EDGES
869  05 00563  23       A                   INX    H              MOV PNTR TO TRAIL EDGE EXPECTED
870  05 00564  7E       A                   MOV    A,M            FETCH EXPECTED TRAIL EDGES
871  05 00565  2F       A                   CMA
872  05 00566  A0       A                   ANA    B              COMPARE ACTUAL AND EXPECTED TRA
873  05 00567  C29605   N                   IF:    CC,Z,S         NO UNEXPECTED TRAIL EDGES
874  05 0056A  B2       A                      ORA    D           RESTORE TRAIL EDG BYE/SET CC FO
875  05 0056B  1600     A                      MVI    D,0         CLR CASE BRANCH TABLE POINTER
876                                            REPEAT
877  05 0056D  17       A                         RAL
878  05 0056E  D28E05   N                         IF:    CC,C,S
879  05 00571  D5       A                            PUSH   D
880  05 00572  F5       A                            PUSH   PSW
881  05 00573  7A       A                            CASE:  VBYT,D
     05 00574  118C05   N
     05 00577  FE08     A
     05 00579  CD0000   N
882  05 0057C  0108     N                               C,0     TEDGFDOF FEED-OFF TRAIL EDGE ROUT
883  05 0057E  C408     N                               C,1     TEDGWAIT WAIT TRAIL EDGE ROUTINE
884  05 00580  F308     N                               C,2     TEDGRET RETURN TRAIL EDGE ROUTINE
885  05 00582  EE05     N                               C,3     SPARE SPARE POSITION
886  05 00584  0208     N                               C,4     TEDGEXIT EXIT TRAIL EDGE ROUTINE
887  05 00586  3A09     N                               C,5     TEDGKICK KICK TRAIL EDGE ROUTINE
888  05 00588  EE05     N                               C,6     SPARE SPARE POSITION
889  05 0058A  5409     N                               C,7     TEDGIEMP INPUT EMPTY TRAIL EDGE R
890                                            ENDCASE
891  05 0058C  F1       A                            POP    PSW
892  05 0058D  D1       A                            POP    D
893                                         ENDIF
894  05 0058E  14       A                         INR    D            INCREMENT CASE TABLE POINTER
895  05 0058F  87       A                         ORA    A            CHECK FOR ADDITIONAL TRAIL EDGE
896  05 00590  C26D05   N                      UNTIL:  CC,Z,S         LOOP UNTIL NO MORE TRAIL EDGES
897  05 00593  C39E05   N                   ELSE:
898  05 00596  2134FD   A                      LXIFBYT  H,ADH11       SET PNTR TO PRIMARY FAULT BYTE
899  05 00599  B6       A                      ORA      M             SAVE INVALID TRAIL EDGES IN FAU
900  05 0059A  77       A                      MOV      M,A
901  05 0059B  CDA309   N                      CALL     ADH@ABRT      ABORT ADH
902                                         ENDIF
903                                      ENDIF
904  05 0059E  7B       A                MOV     A,E
905  05 0059F  21BCFC   N                LXI     H,LEDGINH            SET PNTR TO LEAD EDGE INHIBIT H
906  05 005A2  A6       A                ANA     M                    MASK OUT INHIBITED SENSORS
907  05 005A3  CAE505   N                IF:     CC,Z,C               LEAD EDGES THIS READ
908  05 005A6  5F       A                   MOV    E,A                SAVE VALID LEAD EDGES
909  05 005A7  23       A                   INX    H                  MOV PNTR TO LEAD EDGE BYPASS MA
910  05 005A8  A6       A                   ANA    M                  MASK OUT INDETERMINENT LEAD EDG
911  05 005A9  47       A                   MOV    B,A                SAVE VALID LEAD EDGES IN B-REG
912  05 005AA  23       A                   INX    H                  MOV PNTR TO LEAD EDGE EXPECTED
913  05 005AB  7E       A                   MOV    A,M                FETCH EXPECTED LEAD EDGES
914  05 005AC  2F       A                   CMA
915  05 005AD  A0       A                   ANA    B
916  05 005AE  CABC05   N                   IF:    CC,Z,C             COMPARE ACTUAL WITH EXPECTED LE
917  05 005B1  2134FD   A                      LXIFBYT  H,ADH11       SET PNTR TO PRIMARY FAULT BYTE
918  05 005B4  B6       A                      ORA      H             SAVE INVALID LEAD EDGES
919  05 005B5  77       A                      MOV      M,A
920  05 005B6  CDA309   N                      CALL     ADH@ABRT      ABORT ADH
921  05 005B9  C3E505   N                   ELSE:
922  05 005BC  B3       A                      ORA    E               FETCH LEAD EDGES (IF ANY)
923  05 005BD  1600     A                      MVI    D,0             SET POINTER TO ZERO
924                                            REPEAT
925  05 005BF  17       A                         RAL
926  05 005C0  D2E005   N                         IF:    CC,C,S
927  05 005C3  5F       A                            MOV    E,A       SAVE LEAD EDGE BYTE
```

```
928   05 005C4   D5       A                              PUSH      D
929   05 005C5   7A       A                              CASE:     VBYT,D
      05 005C6  11DE05    N
      05 005C9   FE08     A
      05 005CB  CD0000    N
930   05 005CE   0008     N                                  C,0   LEDGFDOF FEED-OFF LEAD EDGE ROUTI
931   05 005D0   5D07     N                                  C,1   LEDGWAIT WAIT LEAD EDGE ROUTINE
932   05 005D2   AF07     N                                  C,2   LEDGRET RETURN LEAD EDGE ROUTINE
933   05 005D4   EE05     N                                  C,3   SPARE SPARE POSITION
934   05 005D6   B206     N                                  C,4   LEDGEXIT EXIT LEAD EDGE ROUTINE
935   05 005D8   9207     N                                  C,5   LEDGKICK KICK LEAD EDGE ROUTINE
936   05 005DA   EE05     N                                  C,6   SPARE SPARE POSITION
937   05 005DC   CB07     N                                  C,7   LEDGIEMP INPUT EMPTY LEAD EDGE RO
938                                                      ENDCASE
939   05 005DE   D1       A                              POP       D
940   05 005DF   7B       A                              MOV       A,E   RESTORE LEAD EDGE BYTE
941                                                      ENDIF
942   05 005E0   14       A                              INR       D
943   05 005E1   B7       A                              ORA       A
944   05 005E2  C28F05    N                         UNTIL:   CC,Z,S     LOOP UNTIL NO MORE LEAD EDGES
945                                                ENDIF
946                                          ENDIF
947                                    ENDIF
948   05 005E5  C3ED05    N       ELSE:                                 ADH NOT SELECTED
949   05 005E8   3E80     A              SFLG      ADHONMOV             INDICATE NO ADH PROBLEMS
      05 005EA  3288F7    A
950                             ENDIF
951   05 005ED   C9       A       RET 953   05 005EE   C9       A  SPARE  RET                                 DUMMY ROUTINE FOR CASE TABLES
```

TABLE XXIII

```
1082                       *******************************************
1083                       *                                         *
1084                       *   LEDGEXIT:ROUTINE CALLED WHEN LEAD     *
1085                       *   EDGE IS DETECTED AT EXIT SENSOR       *
1086                       *   IF PAPER IS MOVING FORWARD THE        *
1087                       *   WAIT SENSOR IS ENABLED,THE FEED       *
1088                       *   COUNTER IS PULSED,AND THE MISFEED     *
1089                       *   AND TO LONG OVER EXIT TIMING SEQ      *
1090                       *   ARE STARTED. THE SLOW WAIT TO EXIT    *
1091                       *   TIMING SEQUENCE IS STOPPED.           *
1092                       *   IF MOVING REVERSE,ORIGINALS FLASH     *
1093                       *   ED IS UPDATED,SLOW-OFF FAULT SEQ      *
1094                       *   IS STOPPED,SLOW EXIT TO RETURN SEQ    *
1095                       *   IS STARTED AND THE PATTERS ARE        *
1096                       *   TURNED ON                             *
1097                       *                                         *
1098                       *******************************************

1100  05 00682  3A04F4   A  LEDGEXIT IF:    FLG,ADHOFORW,T          DOCUMENT MOVING FORWARD
      05 00685   07      A
      05 00686  D22007   N
1101  05 00689  3A81F4   A           IF:    FLG,ADHO2901,F          NO DIAGNOSTIC ABORT PENDING
      05 0068C   07      A
      05 0068D  DA1607   N
1102  05 006C0  21EEFF   A              SOBIT    ADH$WT             ENABLE WAIT SENSOR
      05 006C3   3E02    A
      05 006C5   F3      A
      05 006C6   B6      A
      05 006C7   77      A
      05 006C8   FB      A
1103  05 006C9  21E8FF   A              SOBIT    ADH$FDCT           START FEED COUNT PULSE
      05 006CC   3E04    A
      05 006CE   F3      A
      05 006CF   B6      A
      05 006D0   77      A
      05 006D1   FB      A
1104  05 006D2  2A60FB   N              LHLD     TLTOAOFD
1105  05 006D5  CD0000   N              CALL     BCD8INC            INCREMENT SOFTWARE FEED COUNTER
1106  05 006D8  2260FB   N              SHLD     TLTOAOFD
1107  05 006DB  CD0000   N              CTIMR    ADH$0              STOP SLOW WAIT TO EXIT
      05 006DE   00      A
1108  05 006DF  CD0000   N              CTIMR    ADH$6              STOP SLOW OUT FAULT TIMER
      05 006E2   06      A
1109  05 006E3  CD0000   N              STIMR    ADH$1,350,EXITOFLT START TO LONG OVER EXIT SEQ OF
      05 006E6   01      A
      05 006E7   23      A
      05 006E8   E109    N
1110  05 006EA  CD0000   N              STIMR    ADH$2,800,MISSFEED START MISFEED SEQUENCE OF 800MS
      05 006ED   02      A
      05 006EE   50      A
      05 006EF   2D0A    N
1111  05 006F1  CD0000   N              STIMR    ADH$3,200,MULTFEED ALLOW 200MS TO CLEAR WAIT SENSO
      05 006F4   03      A
      05 006F5   14      A
      05 006F6   850A    N
1112  05 006F8  3A50FD   N              DIAGOCT  ADHFL3DC           SAVE LEDG EXIT(FORWARD PATH) TI
      05 006FB  32C5FC   N
1113  05 006FE  218AFC   N              LXI      H,TEDGMASK         SET PNTR TO TRAIL EDGE MASK
1114  05 00701   3EFB    A              MVI      A,ADH$L3FM
1115  05 00703   A6      A              ANA      M                  BYPASS TRAIL EDGE AT KICK
1116  05 00704   77      A              MOV      M,A
1117  05 00705   23      A              INX      H                  MOV PNTR TO EXPECTED TRAIL EDGE
1118  05 00706   3640    A              MVI      M,ADH$L3F          EXPECTED TRAIL EDGE AT WAIT
1119  05 00708  21B9FC   N              LXI      H,TEDGINH
1120  05 0070B   3E44    A              MVI      A,WAIT&2:KICK$1
```

```
1121   05 0070D   86        A            ORA       M                    ENABLE TRAIL EDGES AT WAIT & KI
1122   05 C070E   77        A            MOV       M,A                  (CANCEL HOLE BYPASS)
1123   05 0070F   AF        A            XRA       A
1124   05 00710   328EFC    N            STA       LEDGEXPT             CANCEL EXPECTED LEAD EDGE AT EX
1125   05 00713   C31D07    N          ELSE!                            VALID HALT FLAG SET
1126   05 00716   AF        A            CFLG      ADH#2901             CLEAN UP HALT FLAG
       05 00717   3281F4    A
1127   05 0071A   CDA309    N            CALL      ADH#ABRT             STOP ORIGINAL
1128                                   ENDIF
1129                               *           DOCUEMENT MOVING ON REVERSE PATH
1130   05 0071D   C35C07    N          ORIF!     FLG,ADH#2905,F         NO ABORT PENDING FOR REVERSE
       05 00720   3A85F4    A
       05 00723   07        A
       05 00724   0A5507    N
1131   05 00727   21F7FF    A            SOBIT     ADH#PATT             START PATTERS
       05 0072A   3E08      A
       05 0072C   F3        A     *
       05 0072D   B6        A                                                  ,
       05 0072E   77        A
       05 0072F   F8        A
1132   05 00730   CD0000    N            CTIMR     ADH#4                STOP SLOW-OFF SEQUENCE
       05 00733   04        A
1133   05 00734   CD0000    N            STIMR     ADH#5,300,EXT#RET    START EXIT TO RETURN SEQ OF 300
       05 00737   05        A
       05 00738   1E        A
       05 00739   800A      N
1134   05 0073B   CD0000    N            STIMR     ADH#1,350,REXT#FLT   ALLOW 350MS TO CLEAR EXIT SENSO
       05 0073E   01        A
       C5 0073F   23        A
       C5 00740   DFCA      N
1135   05 00742   3A50FD    N            DIAG#CT   ADH#RL3DC            SAVE LEDG EXIT(REVERSE PATH) TI
       05 00745   32C0FC    N
1136   05 00748   3E20      A            MVI       A,ADH#L3R
1137   05 0074A   328EFC    N            STA       LEDGEXPT             EXPECT LEAD EDGE AT RETURN
1138   05 0074D   3E08      A            MVI       A,EXIT#3
1139   05 0074F   3288FC    N            STA       TEDGEXPT             EXPECT TRAIL EDGE AT EXIT
1140   05 00752   C35C07    N            ELSE!                          STOP DOCUEMENT ON REVERSE PATH
1141   05 00755   AF        A            CFLG      ADH#2905             CLEAN UP HALT FLAG
       05 00756   3285F4    A
1142   05 00759   CDA309    N            CALL      ADH#ABRT             HALT ADH
1143                                   ENDIF
1144   05 0075C   C9        A          RET
```

Figure 46A:
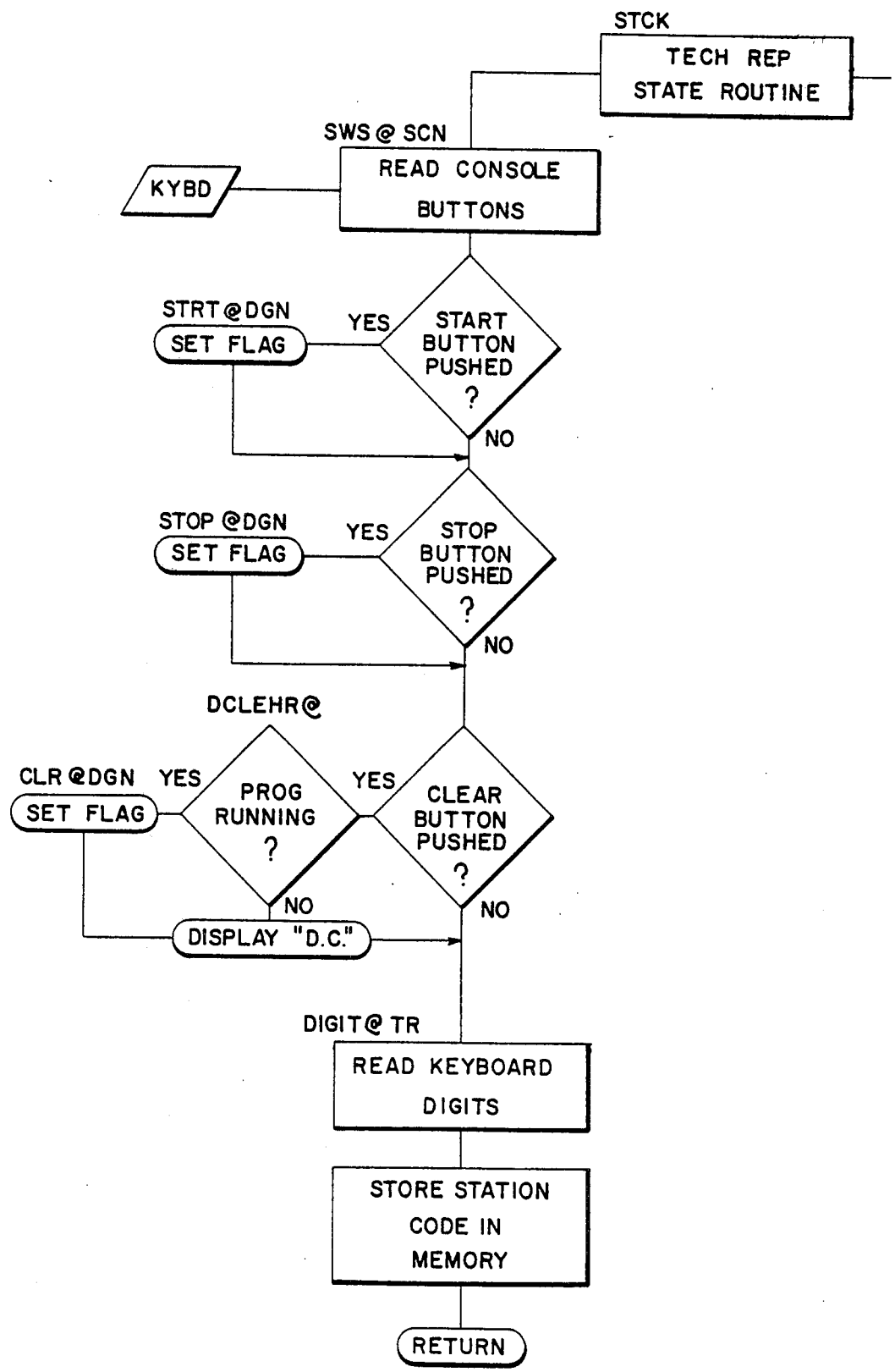
FIGS. 46a and b is a flow chart which illustrates the operation of a diagnostic program which automatically moves documents to preselected stations in the document handler to check for proper alignment.
Figure 46B:
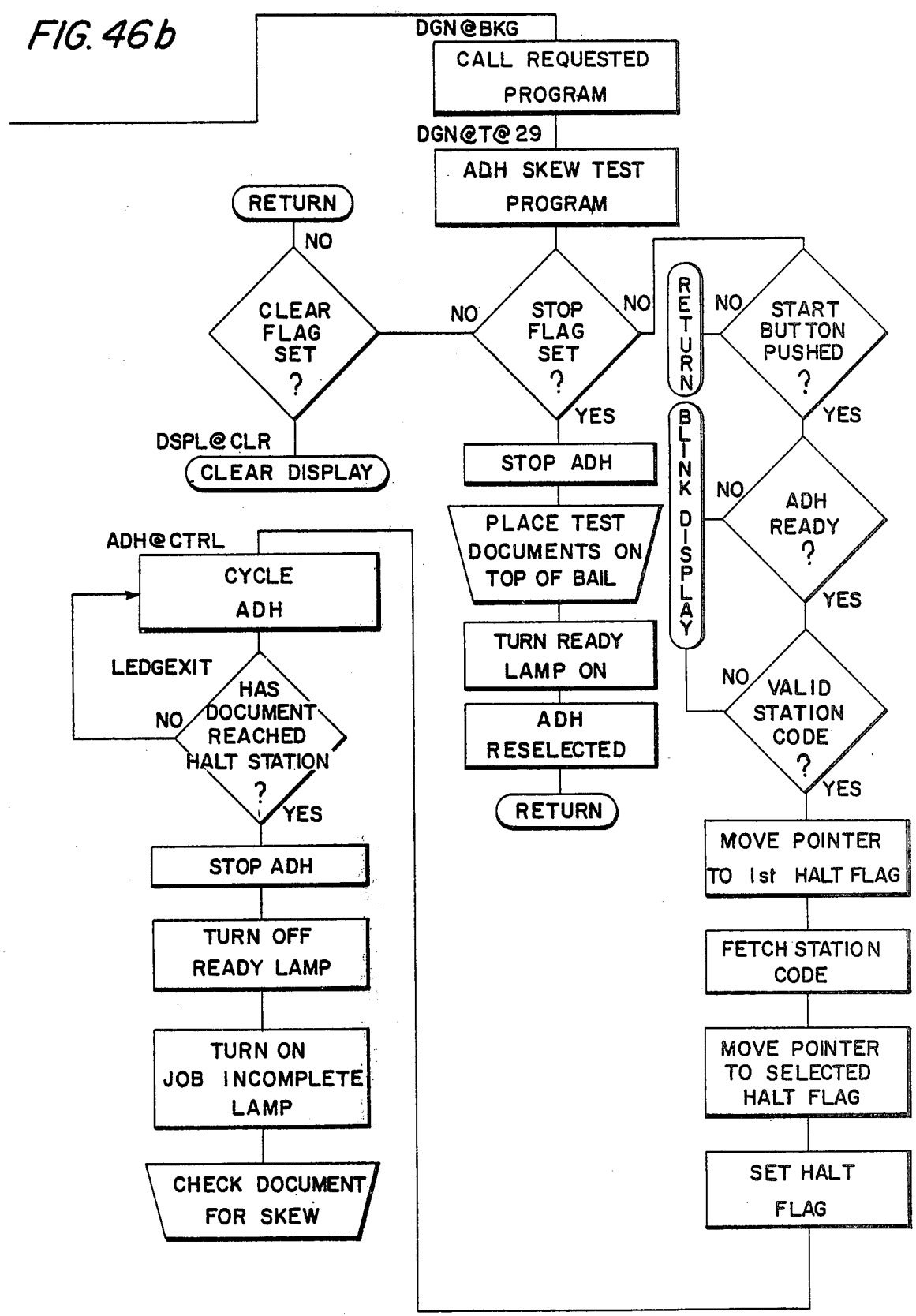

Referring particularly to the timing chart shown in FIG. 46(a, b, c.), an exemplary copy run wherein three copies of each of two simplex or one-sided originals in duplex mode is made. Referring to FIG. 32, the appropriate buttons of copy selector 808 are depressed for the number of copies desired, i.e. 3 and document handler button 822, sorter select button 825 and two sided (duplex) button 811 depressed. The originals, in this case, two simplex or one-sided orignals are loaded into tray 233 of document handler 16 (FIG. 14) and the Print button 805 depressed. One depression of button 805, the host machine 10 enters the PRINT state and the Run Event Table (FIG. 35) for the exemplary copy run selected is built by controller 18 and stored in RAM section 546. As described, the Run Event Table together with Background routines serve, via the multiple interrupt system and output refresh (through D.M.A.) to operate the various components of host machine 10 in integrated timed relationship to produce the copies programmed as more fully described in the aforementioned copending application Ser. No. 677,473.

During the run, the first original is advanced onto platen 35 by document handler 16 where, as seen in FIG. 46 (a, b, c), three exposures (FLASH SIDE 1, 2, 3) are made producing three latent electrostatic images on belt 20 in succession. As described earlier, the images are developed at developing station 28 and transferred to individual copy sheets fed forward (SHEET FEED 1, 2, 3) from main paper tray 100. The sheets bearing the images are carried from the transfer roll/belt nip by vacuum transport 155 to fuser 150 where the images are fixed. Following fusing, the copy sheets are routed by deflector 184 (referred to as an inverter gate in the tables) to return transport 182 (DIRECTS SIDE 1 COPIES TO RETURN TRANSPORT) and carried to auxiliary tray 102. The image bearing sheets entering tray 102 are aligned by edge pattern 187 in preparation for refeeding thereof.

Following delivery of the last copy sheet to auxiliary tray 102, the document handler 16 is activated to remove the first original from platen 35 and bring the second original into registered position on platen 35. The second original is exposed three times (FLASH SIDE 2), the resulting images being developed on belt 20 at developing station 28 and transferred to the opposite or second side of the previously processed copy sheets which are now advanced (FEED SIDE 2) in timed relationship from auxiliary tray 102. Following transfer, the side two images are fused by fuser 150 and routed, by gate 184 toward stop 190, the latter being raised for this purpose (INVERT SIDE 2 COPIES). Abutment of the leading edge of the copy sheet with stop 190 causes the sheet trailing edge to be guided into discharge chute 201, effectively inverting the sheet, now bearing images on both sides. The inverted sheet is fed onto transport 181 and into an output receptacle such as sorter 14 where, in this example, the sheets are placed in successive ones of the first three trays 212 of either the upper of lower arrays 210,211 respectively depending on the disposition of deflector 220.

DIAGNOSTICS

In addition to the copy control program described above, the reproduction machine of the present invention includes several diagnostic programs stored in ROM memory 545 to aid the user or service personnel to maintain the reliability of the machine. Some of the programs are more complex than others, with the most complex programs bearing significant meaning only to trained service personnel. Accordingly, the machine is conditioned to prohibit the casual user from accessing the most complex programs. However, some of the programs of lesser complexity can be useful to the trained user depending upon the extent of her familiarity with the machine. Accordingly, the machine of the present invention has the capability of permitting service personnel to progressively disclose more complex diagnostic programs to the user as her training correspondingly increases, while at the same time reserving the most complex programs for use only by the service personnel. Similarly, means are also provided to prevent access to prior disclosed programs, for example, in the event that a new operator is assigned to the machine.

Figure 41:
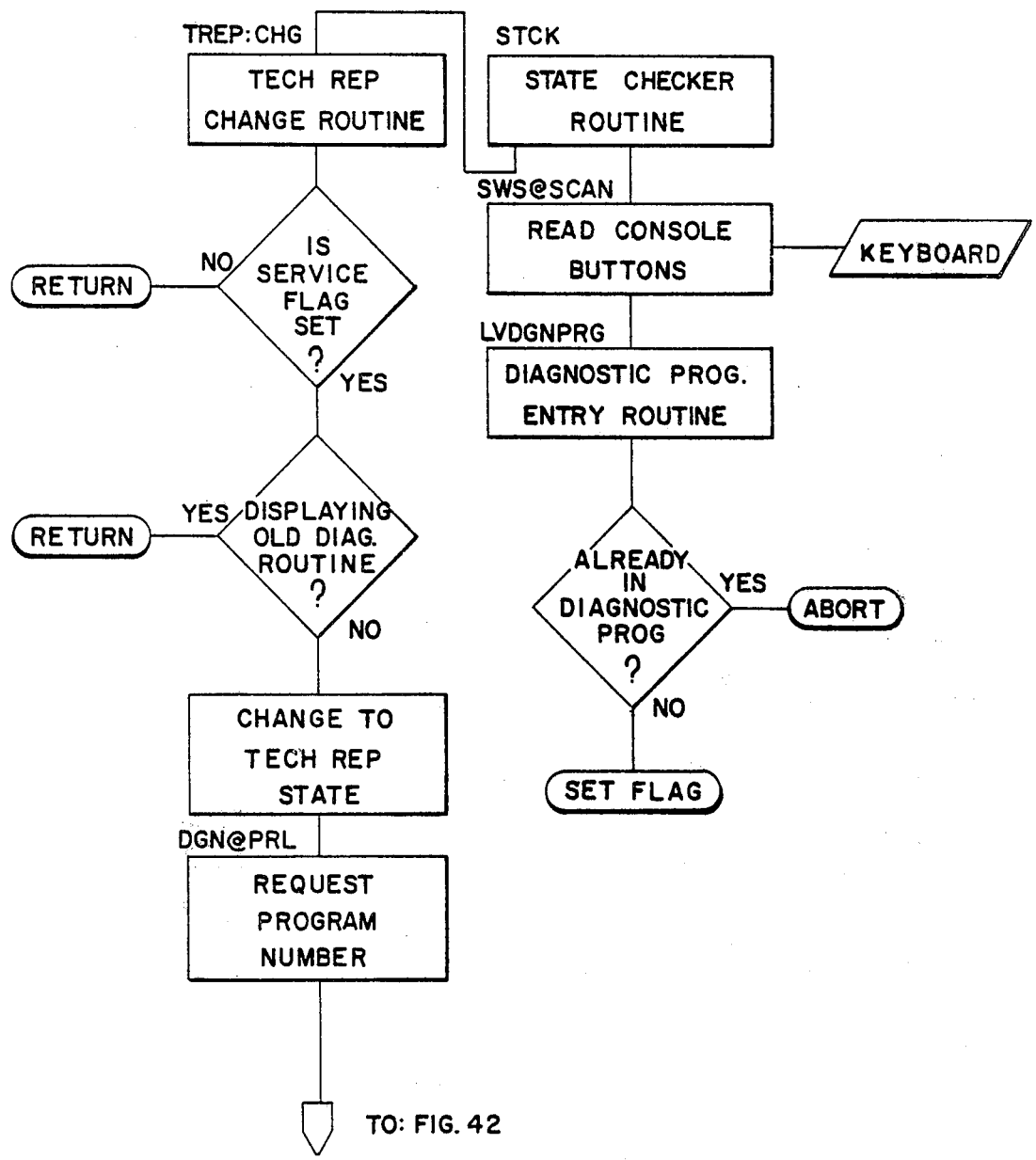
FIGS. 41, 42, and 43a and b are flow charts which illustrate the sequence of events for entering the machine into a diagnostic program, as well as determining whether the user has access to the particular program requested.
Figure 42:
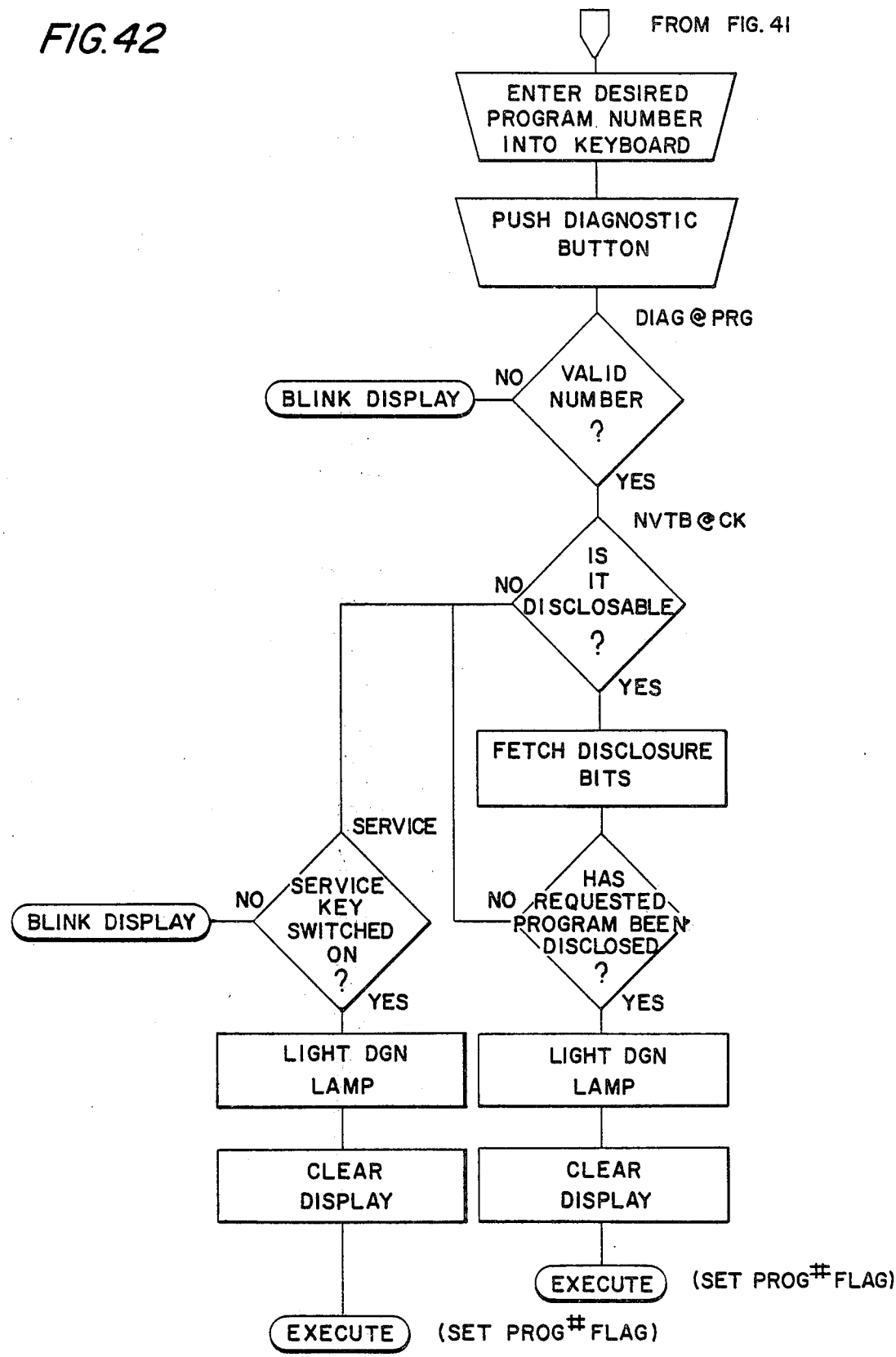

Referring now to FIGS. 41 and 42, along with the illustration of the operator console as shown in FIG. 32, a routine for selecting a desired diagnostic program will be explained. It will be remembered that the machine is normally being instructed by the copy control program comprising STATE routines numbers 0-4 shown in Table I. Each STATE routine periodically calls a Switch Scan routine (SWS@SCAN) reproduced in Table XI. To enter a diagnostic program, the operator presses diagnostic console button 801 which is read by the Switch Scan routine thereby causing it to call a Diagnostic Program Entry routine (LVDGNPRG of Table XII). This routine checks to see if there is an active diagnostic program in progress. If so, it causes the operating program to cease. Normally, there will not be another diagnostic program running. Consequently, a service flag (SER@ACT) will be set indicating that the user desires to enter a diagnostic program.

The copy control program periodically calls the Tech Rep Change (TREP:CHG) subroutine which monitors the computer memory to determine whether the service flag has been set. If it has been set and there is no diagnostic routine information being displayed, the controller 18 will change instruction from the copy control program to the Tech Rep STATE (also shown in Table I). This routine serves as an interface to provide access to different operating programs and will periodically call the Diagnostic Prologue (DGN@PRL) routine also shown in Table XII which puts a "dC" in the console display 830 thereby requesting that the operator enter the two digit access code corresponding to the diagnostic program desired. After doing so, the diagnostics button 801 is then again pushed which, in turn, is picked up by the diagnostic program routine (DIAG@PRG of Table XIII). This routine determines whether the numbers entered in the display 830 correspond to valid diagnostic program numbers. For example, if numbers 10-36 are valid diagnostic access codes and a number 52 was pushed, it would not be a valid number, with this program indicating such an error by blinking the display 830.

If it is a valid number, a Nonvolatile Memory Table Check routine (NVTB@CK) shown in Table XIV is called. This routine first checks to determine whether the requested program number is disclosable, i.e., whether this particular program can be accessed by an operator other than the service personnel. For example, assume that program numbers 10-15 can be, but need not be, disclosed to the user, with the remaining programs being reserved for the service personnel. Then, if the requested program number is within the 10-15 range this routine will check particular addresses in the nonvolatile memory 610 to determine whether the service personnel has stored the access code corresponding to the requested program in the memory, i.e. disclosed the program to the user. If it has been disclosed, the display 830 is cleared and the light on the console above the diagnostic button 801 is turned on indicating that the machine is now under the control of the diagnostic program desired.

On the other hand, if it was determined that the requested program was not disclosable to the user, the controller makes another check to determine whether the service key 828 has been switched on or off via the SWITCH SCAN routine and periodically called subroutines SERVICE and KEY@OFF of Table XII. Normally, only the service personnel possess this key. When the key is turned on, all of the diagnostic programs are accessible. However, if the requested program number has not been disclosed to the user nor has the service key been switched on, the display 830 will be caused to blink thereby indicating the error. Conversely, if the program is accessible, the program number flag is set signalling the controller to execute the requested program.

Figure 43A:
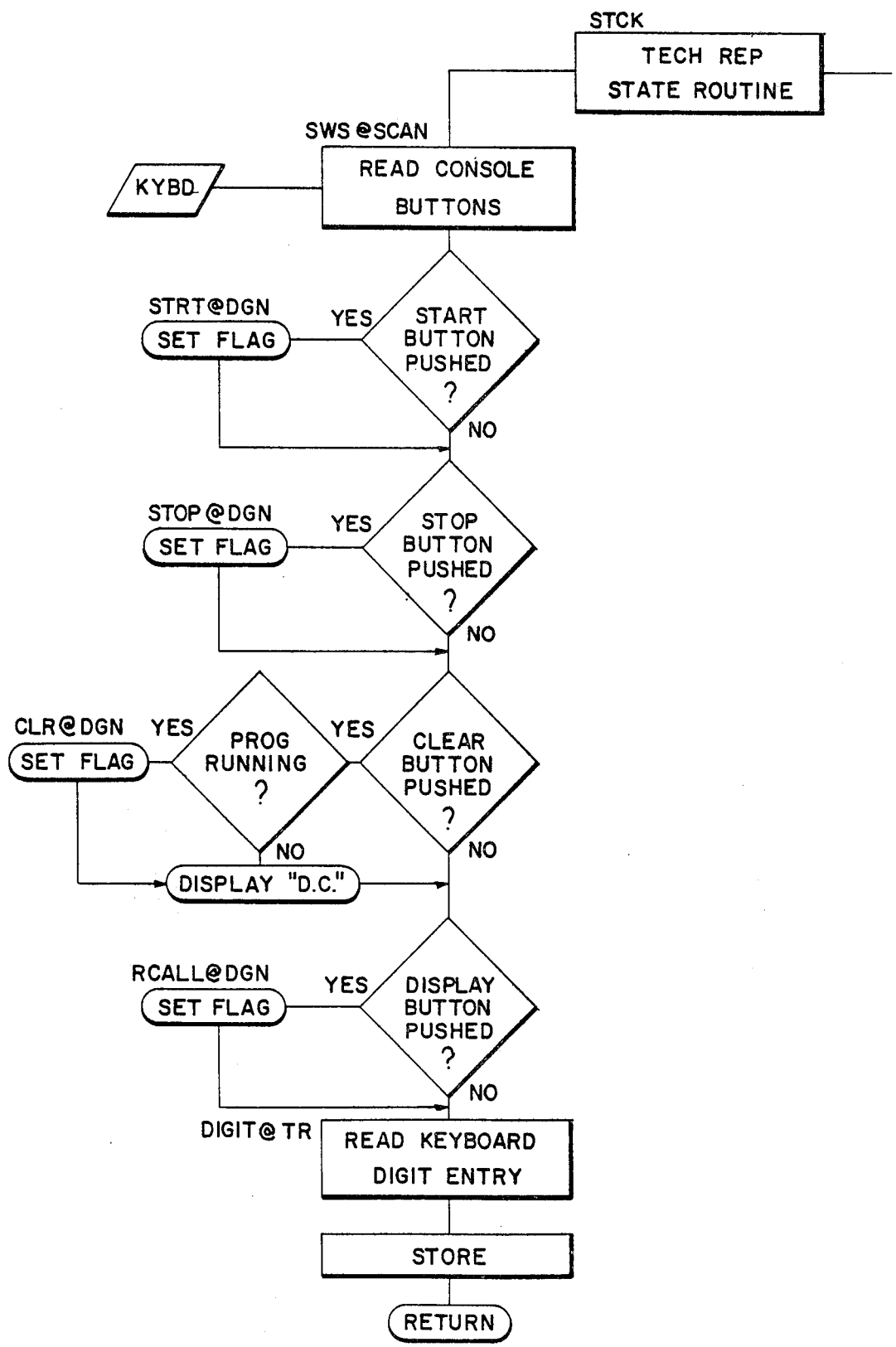
Figure 43B:
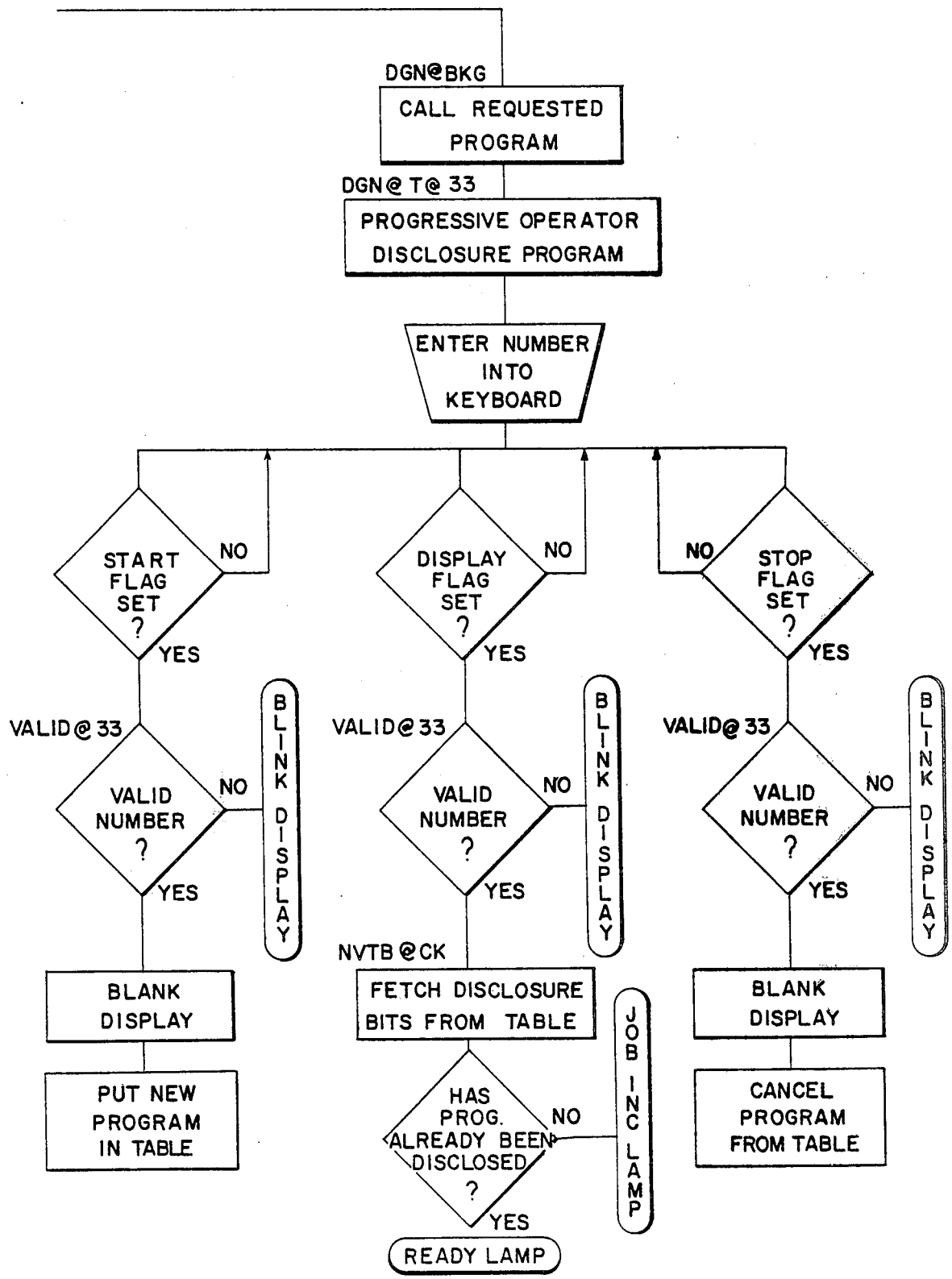

Referring to FIGS. 43a and b, in order to disclose more complex programs to the user as she becomes more familiar with the machine, the service personnel utilizes the Progressive Operator Disclosure Program (DGN@T@33) shown in Table XV. This program is not disclosable to the user and can be accessed only by the service personnel through the use of his service key. With the switch 828 turned on, the program is entered in the manner set forth above. To determine whether a particular program has already been disclosed, he enters the program number into keyboard 808 and pushes the Display button 809. The Switch Scan routine (SWS@SCAN) reads the various console buttons to determine whether they have been pushed, and, in this state, sets a flag, RCALL@DGN, indicating that the Display button 809 has been pushed. Similarly, another routine (DIGIT@TR of Table XVI) reads the numbers entered in the keyboard 808 and stores them in a register or memory location for further use.

The Disclosure program (DGN@T@33) cause the controller to read the Display flag and calls a subroutine (VALID@33) which, in turn, checks the entered number to determine whether it is within a predetermined range. If it is not a valid number, the display 830 will blink indicating that the number does not correspond to a designated program number. If this test is passed, the controller 18 interrogates the non-volatile memory 610 via routine NVTB@CK. As described above, this routine interrogates the memory to determine whether the access code for the requested routine has been stored in the memory thereby indicating that it has already been disclosed. As known in the art, the access code must be converted to binary electrical signals to be stored in the memory. If it has been disclosed, one of the console lamps 830 (READY) will be turned on. If it has not been disclosed, another lamp (JOB INCOMPLETE) is lit. Accordingly, the service personnel can determine whether a particular program has already been disclosed to the user.

If he wishes to disclose a new program, he merely enters its access code into keyboard 808 and presses Start button 805. If it is a valid number, it will be converted to a binary signal which is stored in memory 610 so that the user can now access the disclosed program. Conversely, if he wishes to cancel a program already disclosed, the stop button 806 is pushed instead. This removes the entered program number from memory 610 so that only the service personnel can access the diagnostic program. By storing the disclosed program access code information in the non-volatile memory 610, it is insured that the information will not be lost in the event of a power failure, etc.

Figure 44:
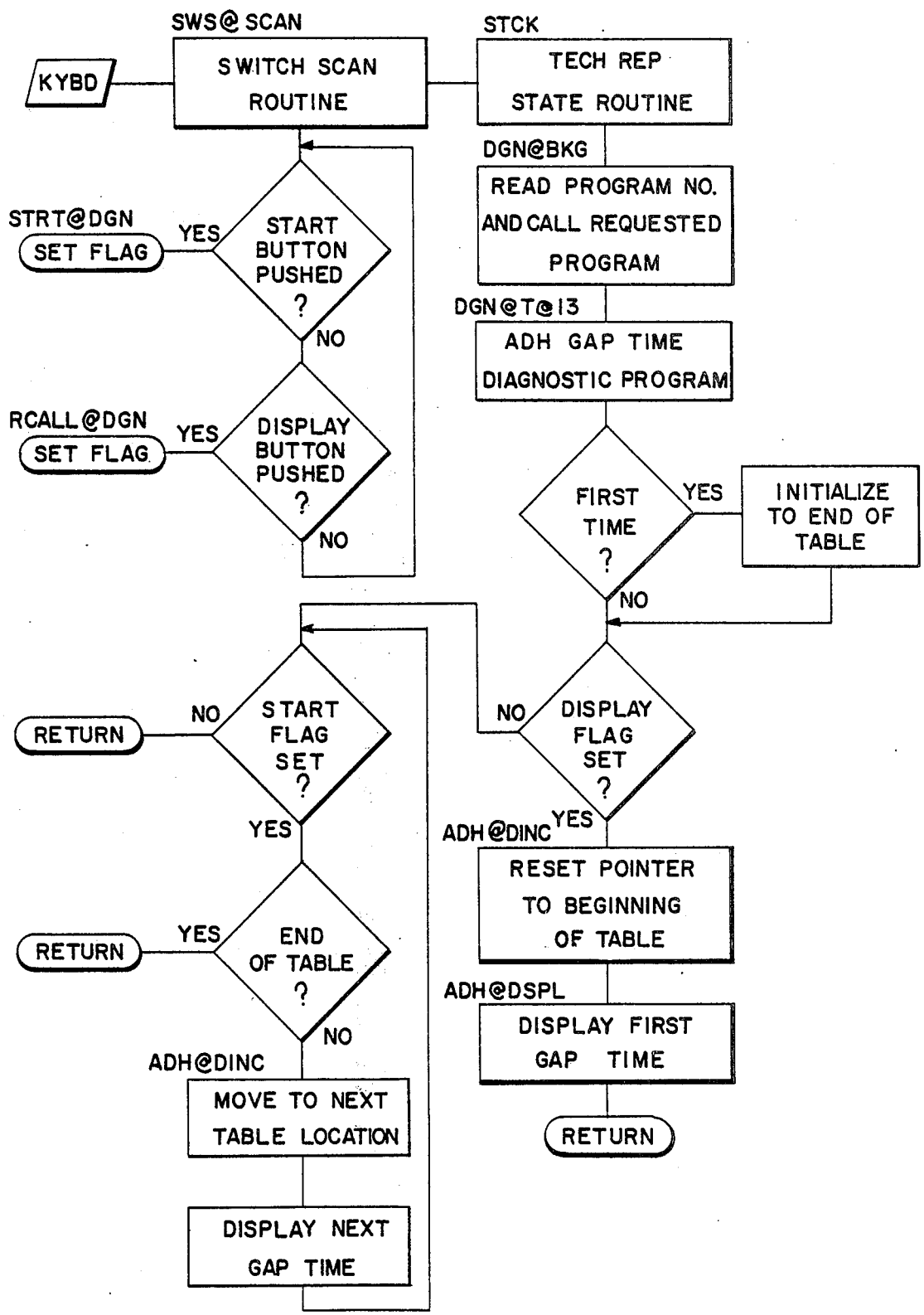
FIG. 44 is a flow chart which illustrates the operation of a diagnostic program for displaying document travel times in the document handler.

Referring now to FIGS. 44 and 14, a diagnostic program for the automatic document handler (ADH) 16 will be described. Document handler 16 includes four paper path sensors hereinafter referred to as the kick sensor 246, the wait sensor 280, the exit sensor 281, and the return sensor 282. As the original documents 2 cycle through the ADH as previously described, each sensor senses the leading and trailing edge of the document. For example, if the photocell sensor goes from light to dark, then it is sensing a leading edge. However, if the sensor goes from dark to light, it is sensing a trailing edge. Each of the sensors are coupled to a free running global counter or timer, referred to as a diagnostic counter, DIAG@CT, in the tables. The diagnostic counter can be any of a variety of known counting devices. In the preferred embodiment, it is a specified register which is periodically set and then decremented by the machine clock signal 202.

When each sensor senses a leading or trailing edge of the document 2, the controller reads the time of the diagnostic counter and stores it in a specified address in the RAM memory 546. These times are accessed by the ADH Gap Time Diagnostic program (DGN@T@13) shown in Table XVII. This routine reads the addresses of the stored times from the Gap Time Table shown in TABLE XVIII. The Gap Time Table defines a plurality of stations or gap times, i.e. the time it takes for a document to travel between various preselected sensors. For example, one gap time may be the time it takes the leading edge of the document to travel from the exit sensor 281 to the return sensor 282. In such case, when the exit sensor 281 senses a leading edge of a document, it will read the diagnostic counter and store that time in the table (see, e.g. Lead Edge Exit routine (LEDGEXIT) of Table XXIII). Similarly, when the return sensor 282 senses the document, it also will store that time in the table. Consequently, to read that gap time, a pointer, e.g. an index register, is set to the particular address of the Gap Time Table which, in turn, contains the addresses in RAM memory 546 of these two times. One time is then subtracted from the other to determine the particular gap time, i.e. the time of document travel between these sensors. It should be realized that a particular "gaps" defined in the Gap Time Table can be changed if desired.

Referring now especially to FIG. 44, the ADH Gap Time Diagnostic (DGN@T@13) program is entered in the usual manner as previously described to determine if this program has been disclosed to the user. If so, the program checks to determine whether this is the first time that this particular program has been requested. If it is the first time, the pointer is initialized by setting it to the end of the Gap Time Table. The routine then checks to see if the display flag (RCALL@DGN) has been set by the operator pushing the display select button 809 on console 800. If this button has been pushed, the switch scan routine will set a flag (FCALL@DGN) which is tested by the Diagnostic routine. If it has been yet, the pointer will be decremented by the ADH Display Decrementing routine (ADH@DINC) shown in Table XIX. This will cause display 230 to blank for approximately one-half second in order to permit the viewer to distinguish between the gap time about to be displayed and an old gap time that may be currently displayed. Then the gap time identified by the pointer (or identifier as sometimes referred to in the tables) is calculated and displayed in the display 230 via the ADH display routine (ADH@DSPL) which is also shown in Table XIX. Accordingly, the first gap time of the previous document run will appear in the display. The operator or service personnel can compare this gap time with standard times and make necessary adjustments to the machine, if required, thereby insuring proper synchronism with the machine processor.

In order to display the next gap time the operator pushes start button 805. This sets the start flag (STRT@DGN) which is picked up by the Diagnostic program. It will check if the pointer is set at the end of the table. If not, the pointer is moved to the next table location and the next gap time is calculated and displayed in the display 230 as previously described. In order to display the next gap time the start button 805 is again pushed and the next gap time is analogously displayed. This operation occurs until the pointer reaches the end of the table.

Figure 45A:
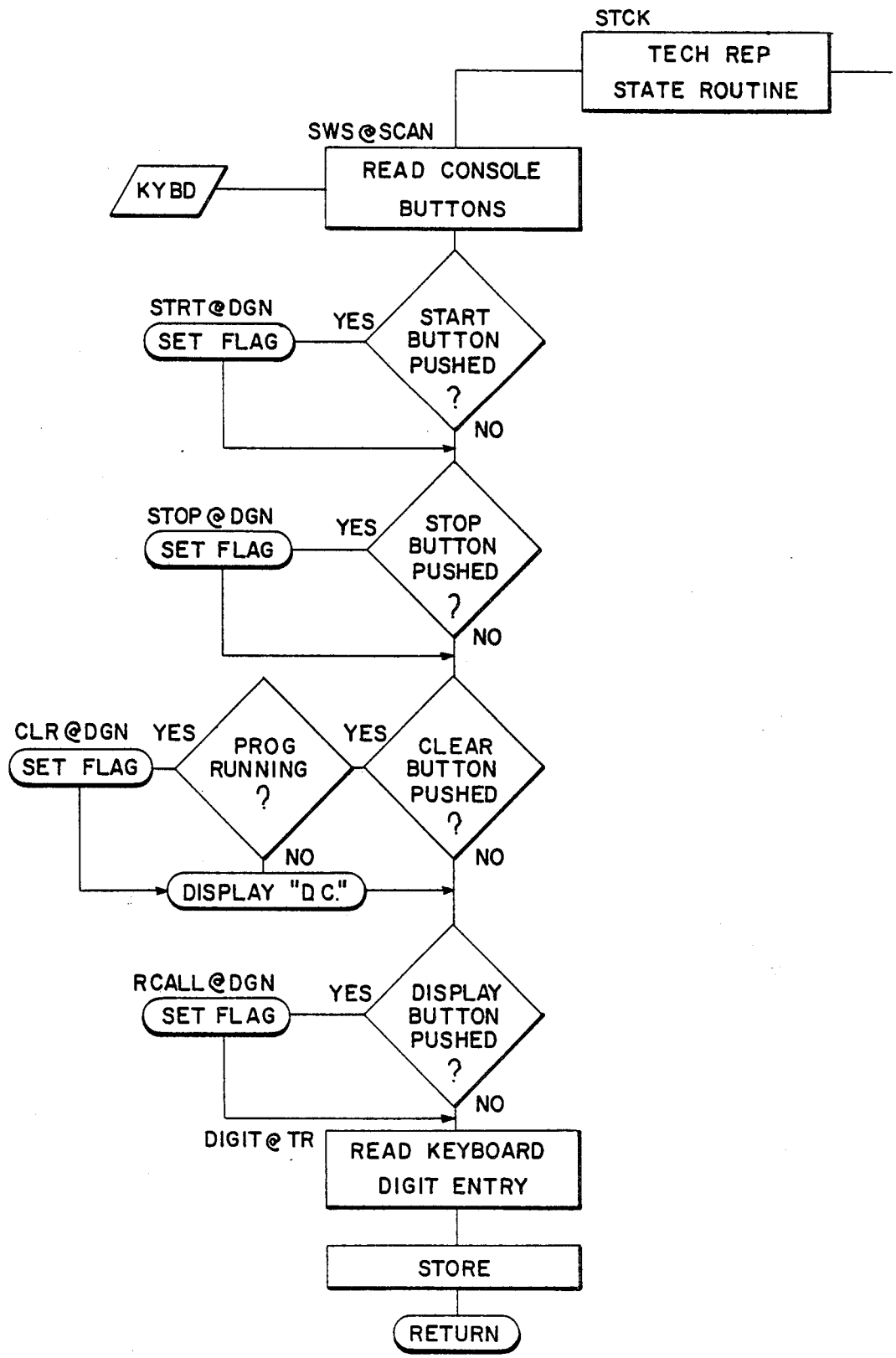
FIGS. 45a and b is a flow chart which illustrates the operation of a diagnostic program for continuously cycling documents through the document handler and, if desired, displaying successive document travel times between various stations therein.
Figure 45B:
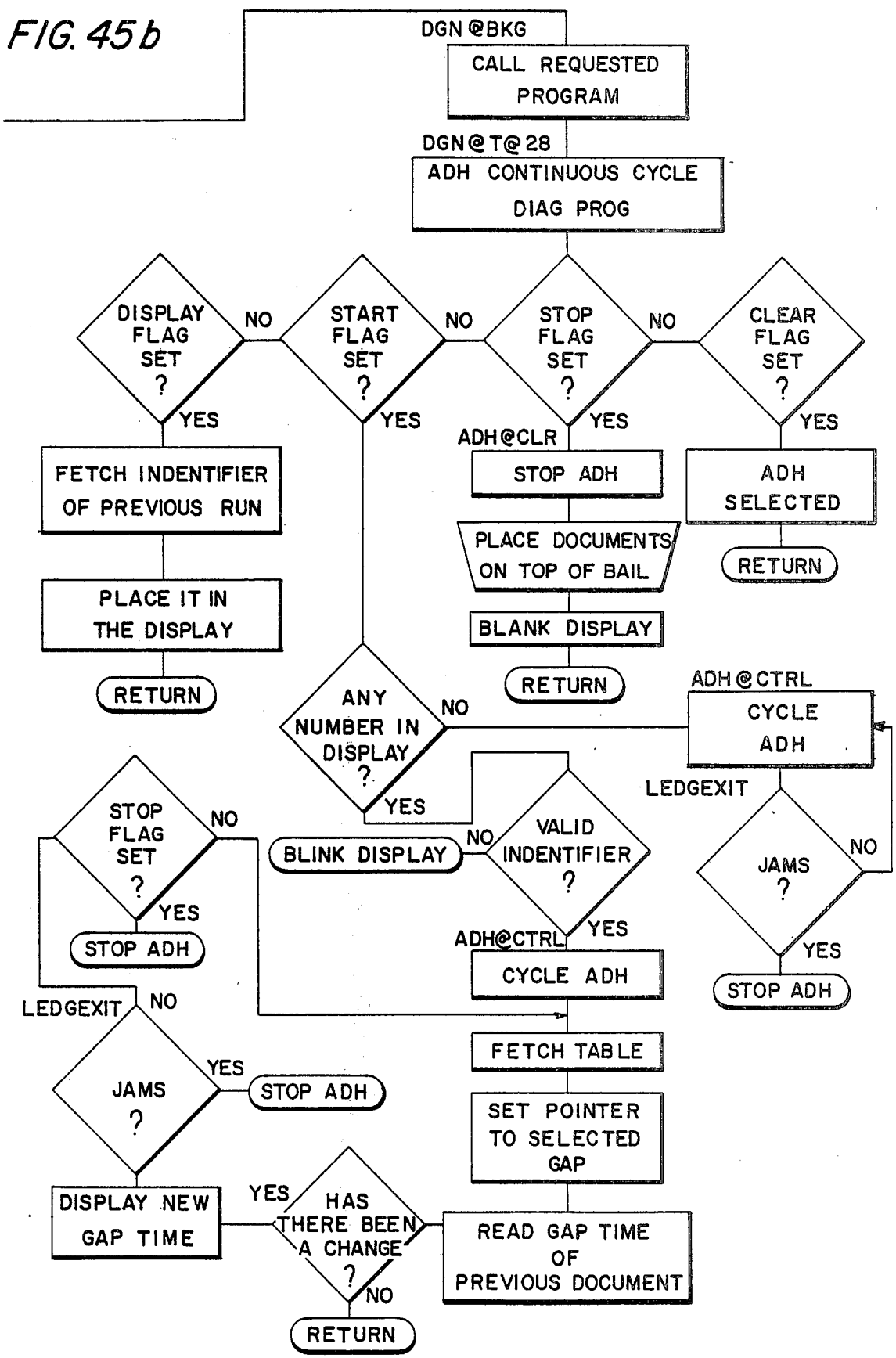

The previous program provides the ability to check the gap times of an earlier run during normal ADH operation. However, in some instances it is desirable to activate or cycle the ADH without making copies in order to check for potential problem areas. The ADH Continuous Cycle Diagnostic program (DVN@T@28 as shown in Table XX) provides this ability. It should be noted that due to the complexity of this routine it is not disclosable to the casual operator and can be accessed only by the service personnel by switching the key switch 828 on. As illustrated in FIG. 45, this routine interacts not only with the start button 805 and display select button 809 as in the previous routine, but also with the clear button 817, stop button 806 and keyboard 808. Pushing each of these buttons will set a specific flag as previously discussed.

By pushing the stop button 805, the ADH will come to a stop and display 230 will blank. At this time the operator should place the test documents on top of separator or bail bar 235 as shown in FIG. 14. After this is done, the clear button 817 is pushed thereby selecting and preparing the document handler 16 for continuously cycling original documents through the ADH paper paths without making copies therefrom.

The operator then decides whether he wishes to display gap times as the documents cycle through the ADH. If so, he enters the desired gap time code number into the keyboard 808. If he wishes to display the same gap time as previously requested, for example, as requested in the ADH Gap Time program (DGN@T@13) previously described, then the display button 809 is pushed which automatically places that gap time number into the display 230. The start button 805 is then pushed. If there is no number in the display the ADH begins to continuously cycle the documents 2 through the paper path under the control of the ADH Control routine (ADH@CTRL) shown in Table XXII. If any jam occurs, as sensed by the sensors 246,280,281, and 282 (see, e.g. the Lead Edge Exit routine of Table XXIII) the ADH will be automatically stopped thereby permitting the user to identify the potential problem areas.

If a number has been entered into the display indicating that it is desired to display selected gap times, the program checks to see if the entered digits correspond to a valid gap time identifier. It will be remembered that there are several gap times in the Gap Table which can be displayed. If it is valid identifier, the ADH is automatically started. The gap time table is then fetched and the pointer is set to the selected gap time desired to be displayed. It will be remembered that the table will contain the times of the previous document run, as these times are being continually updated every time a document travels through the ADH. Therefore, the program will read the gap time of the previous document and compare it with the new gap time of each document as it cycles through the ADH. It will then compare the two gap times to determine if there has been a change. If so, it will display the new gap time. This sequence of events continues until the stop button 806 is pushed. Hence, this routine provides the ability to continually display the gap times for each document as it travels through the handler 16. By visually monitoring the display 230 the service personnel can readily determine whether there is an undesirable fluctuation in the gap times for the various documents. To display and monitor a different gap time, a new number is entered into keyboard 808 and the same sequence as described above is followed.

Document misalignment is often a potential source of problems in the document handler 16, often leading to a jam condition. The ADH skew Test program (DGN@T@29) as shown in Table XXI is utilized to check for proper document alignment. Again this program is entered in the manner as previously described.

Referring to FIG. 46, by pushing the stop button 806, document handler 16 will come to a halt permitting the operator to clear the documents from the ADH 16 and place the test documents on top of bail bar 235. When the appropriate covers (not shown) are closed, an appropriate console light 830 will be activated to indicate that the ADH has been reselected and is ready for further operation.

The operator then enters a one digit station code into the keyboard 808. The station code corresponds to selected stations in document handler 16. For example, station code number 1 corresponds to the station in the document handler with the leading edge of the document 2 underneath exit sensor 281 on its forward path towards platen 35. Other station codes for other stations are defined in a similar manner. In the preferred embodiment there are 5 valid station codes. As previously described, the digit read routine (DIGIT@TR) will read the enter digit and store it in a specified memory location. When the start button 805 is pushed, the controller will read that memory location and determine whether that is a valid code, i.e. in this embodiment whether the digit entered is between the numbers 1 and 5. If so, the controller checks to make sure that there are no jams pending in the document handler 16 and that it is ready to be cycled again. If neither of the above tests are met, the display 230 is blinked to indicate the error. If the tests are met, a software pointer such as described previously, is moved to the address of the first of 5 halt flags which are stored in RAM memory 546. The halt flags correspond to sensors 246, 280, 281 and 282. The controller combines the address of the first halt flag with the station code entered to move the pointer to the halt flag corresponding to the selected station. The correct halt flag is then set.

After the appropriate halt flag has been set, the document handler 16 is then cycled, moving the test documents 2 from paper tray 233 throughout the paper path cycle under the control of the ADH control routine (ADH@CTRL) of Table XXII. When the arrival of the document 2 is detected by sensors 246, 280, 281, 282, the controller checks to see if its corresponding halt flag is set. If so, the ADH is stopped. For example, when a document passes underneath sensor 281 on its forward path to platen 35, the Lead Edge Exit routine (TABLE XXIII) checks to see if its corresponding halt flag (ADH@29@1) is set. If so, the ADH is stopped.

After the document handler 16 has been stopped with the document 2 at the selected station, appropriate indicator lamps 830 on the console 800 are turned on to indicate that the operator may now check for document alignment. By entering new codes into the keyboard 808 the ADH can be recycled to bring the document to another station for inspection. Accordingly, this routine provides the service personnel with the ability to visually check the documents for skew at various locations throughout the document handler 16 thereby insuring proper operation.

It can now be realized that the machine of the present invention has considerably more flexibility than those of the prior art. Not only is it controlled by a computer with a particular program for instructing the components in a timed sequence to make copies, but it includes other operating programs which can be selectively accessed to operate the machine in a different manner. For example, the ADH Continuous Cycle Diagnostic program continuously cycles the documents through document handler 16 to pinpoint potential problem areas without making copies therefrom as normally done when the copy control program (STCK) has been accessed. Other operating programs which perform different functions can be envisioned and they need not necessarily be directed to diagnosing machine malfunctions.

For example, a common machine processor, such as machine processor 12, can be utilized with a plurality of different input and output devices. The same processor can be utilized to make copies from original documents presented to the processor by an automatic document handler or from another input device, such as a laser beam exposure device which presents originals in the form of a modulated beam controlled by stored electronic representations of the matter to be copied. The timing of the machine components may be different depending on which input device is used. Through the use of this invention, a manufacturer can market a common processor and a plurality of input/output device options. The processor would include the control system having a program stored therein for each possible option, with the appropriate program being accessed to control the machine depending upon the option utilized with the processor.

Therefore, while this invention has been described in connection with particular examples thereof, the spirit of this invention should be judged in light of the following claims.

What is claimed is:

1. A method of operating a reproduction machine under the control of a programmable digital computer for actuating reproduction machine components to produce copies from original documents, the method comprising storing at least one diagnostic program in the computer memory;
    activating a diagnostic button on the console;
    setting a service flag indicating a request to activate the diagnostic program;
    displaying an indicator in the console display;
    entering an access code in response to the indicator on the display console;
    determining the validity of the access code and operating the reproduction machine to diagnose machine operation as identified by the access code.

2. The method of claim 1, including the step of providing an error signal on the console if an invalid access code is entered.

* * * * *